US012052918B2

(12) United States Patent
Forrest et al.

(10) Patent No.: US 12,052,918 B2
(45) Date of Patent: Jul. 30, 2024

(54) ORGANIC ELECTROLUMINESCENT DEVICE COMPRISING TWO-DIMENSIONAL EMISSIVE LAYER

(71) Applicant: The Regents of the University of Michigan, Ann Arbor, MI (US)

(72) Inventors: Stephen R. Forrest, Ann Arbor, MI (US); Jongchan Kim, Ann Arbor, MI (US); Siwei Zhang, Ann Arbor, MI (US)

(73) Assignee: The Regents of the University of Michigan

( * ) Notice: Subject to any disclaimer, the term of this patent is extended or adjusted under 35 U.S.C. 154(b) by 489 days.

(21) Appl. No.: 17/357,485

(22) Filed: Jun. 24, 2021

(65) Prior Publication Data

US 2022/0006027 A1 Jan. 6, 2022

Related U.S. Application Data

(60) Provisional application No. 63/060,393, filed on Aug. 3, 2020, provisional application No. 63/043,560, filed on Jun. 24, 2020.

(51) Int. Cl.

| | |
|---|---|
| ***H10K 85/60*** | (2023.01) |
| ***H10K 50/11*** | (2023.01) |
| ***H10K 50/15*** | (2023.01) |
| ***H10K 50/16*** | (2023.01) |

(52) U.S. Cl.

CPC ....... *H10K 85/6572* (2023.02); *H10K 85/631* (2023.02); *H10K 85/654* (2023.02); *H10K 85/6574* (2023.02); *H10K 85/6576* (2023.02); *H10K 50/11* (2023.02); *H10K 50/15* (2023.02); *H10K 50/16* (2023.02)

(58) Field of Classification Search

CPC ............ H10K 85/6572; H10K 85/631; H10K 85/654; H10K 85/6574; H10K 85/6576; H10K 50/11; H10K 50/15; H10K 50/16

USPC ........................................................... 257/40

See application file for complete search history.

(56) References Cited

U.S. PATENT DOCUMENTS

| | | | |
|---|---|---|---|
| 4,769,292 | A | 9/1988 | Tang |
| 5,247,190 | A | 9/1993 | Friend |
| 5,703,436 | A | 12/1997 | Forrest |
| 5,707,745 | A | 1/1998 | Forrest |

(Continued)

FOREIGN PATENT DOCUMENTS

| | | |
|---|---|---|
| EP | 1238981 | 9/2002 |
| JP | 2010135467 | 6/2010 |

(Continued)

OTHER PUBLICATIONS

Baldo et al., "Highly Efficient Phosphorescent Emission from Organic Electroluminescent Devices," Nature, vol. 395, 151-154, (1998).

(Continued)

*Primary Examiner* — Nduka E Ojeh

(74) *Attorney, Agent, or Firm* — Riverside Law LLP

(57) ABSTRACT

An organic light emitting device comprises an anode and a cathode, at least one organic layer configured between the anode and the cathode, and at least one two-dimensional emissive layer configured between the anode and the cathode. A method of fabricating an organic light emitting device is also disclosed.

20 Claims, 22 Drawing Sheets

(56) References Cited

U.S. PATENT DOCUMENTS

| | | | | |
|---|---|---|---|---|
| 5,834,893 | A | 11/1998 | Bulovic | |
| 5,844,363 | A | 12/1998 | Gu | |
| 6,013,982 | A | 1/2000 | Thompson | |
| 6,087,196 | A | 7/2000 | Sturm | |
| 6,091,195 | A | 7/2000 | Forrest | |
| 6,097,147 | A | 8/2000 | Baldo | |
| 6,294,398 | B1 | 9/2001 | Kim | |
| 6,303,238 | B1 | 10/2001 | Thompson | |
| 6,337,102 | B1 | 1/2002 | Forrest | |
| 6,468,819 | B1 | 10/2002 | Kim | |
| 7,279,704 | B2 | 10/2007 | Walters | |
| 7,431,968 | B1 | 10/2008 | Shtein | |
| 7,968,146 | B2 | 6/2011 | Wagner | |
| 10,348,058 | B1 * | 7/2019 | Gwo | H01S 5/2031 |
| 2003/0230980 | A1 | 12/2003 | Forrest | |
| 2004/0174116 | A1 | 9/2004 | Lu | |
| 2013/0026452 | A1 | 1/2013 | Kottas | |
| 2013/0119354 | A1 * | 5/2013 | Ma | C09K 11/06 546/4 |
| 2013/0328041 | A1 * | 12/2013 | Yokoyama | H10K 85/654 546/256 |
| 2016/0020280 | A1 * | 1/2016 | Heo | H01L 31/028 257/27 |
| 2018/0123052 | A1 * | 5/2018 | Zysman-Colman | C07F 9/5728 |
| 2018/0151812 | A1 * | 5/2018 | Peng | H10K 59/35 |
| 2021/0404056 | A1 * | 12/2021 | Roy | C23C 16/0281 |

FOREIGN PATENT DOCUMENTS

| | | |
|---|---|---|
| WO | 2004111066 | 12/2004 |
| WO | 2008044723 | 4/2008 |
| WO | 2008057394 | 5/2008 |
| WO | 2010011390 | 1/2010 |
| WO | 2010111175 | 9/2010 |

OTHER PUBLICATIONS

Baldo et al., "Very high-efficiency green organic light-emitting devices based on electrophosphorescence," Appl. Phys. Lett., vol. 75, No. 3, 4-6 (1999).

Zhang, Y. J., et al., Electrically Switchable Chiral Light-Emitting Transistor. Science 2014, 344 (6185), 725-728. https://doi.org/10.1126/science. 1251329.

Zhang, Y., Lee, J. & Forrest, S. R. Tenfold increase in the lifetime of blue phosphorescent organic light-emitting diodes. Nat. Commun. 5, 5008 (2014), 7 pages.

Zhou, W. et al. Intrinsic Structural Defects in Monolayer Molybdenum Disulfide. Nano Lett. 13, 2615-2622 (2013).

Zhou, X., et al., 2D Layered Material-Based van Der Waals Heterostructures for Optoelectronics. Adv. Funct. Mater. 2018, 28 (14), 1706587. https://doi.org/10.1002/adfm.201706587.

Zhou, Y.; Mei, S.; Sun, D.; Liu, N.; Mei, F.; Xu, J.; Cao, X. Improved Charge Injection and Transport of Light-Emitting Diodes Based on Two-Dimensional Materials. Appl. Sci. 2019, 9, 4140.

Amani, M., et al., A. High Luminescence Efficiency in MoS2 Grown by Chemical Vapor Deposition. ACS Nano 2016, 10 (7), 6535-6541. https://doi.org/10.1021/acsnano.6b03443.

Amani, M., et al., Near-Unity Photoluminescence Quantum Yield in MoS2. Science 2015, 350 (6264), 1065-1068. https://doi.org/10.1126/science.aad2114.

Andrzejewski, D., et al., Flexible Large-Area Light-Emitting Devices Based on WS2 Monolayers. Adv. Opt. Mater. 2020, 8 (20), 2000694. https://doi.org/10.1002/adom.202000694.

Andrzejewski, D., et al., Scalable Large-Area p—i—n Light-Emitting Diodes Based on WS2 Monolayers Grown via MOCVD. ACS Photonics 2019, 6 (8), 1832-1839. https://doi.org/10.1021/acsphotonics.9b00311.

Andrzejewski, D., Hopmann, E., John, M., Kümmell, T. & Bacher, G. WS 2 monolayer-based light-emitting devices in a vertical p—n architecture. Nanoscale 11, 8372-8379 (2019).

Baugher, B. W. H., et al., Optoelectronic Devices Based on Electrically Tunable p—n Diodes in a Monolayer Dichalcogenide. Nat. Nanotechnol. 2014, 9 (4), 262-267. https://doi.org/10.1038/nnano.2014.25.

Berkelbach, T. C., et al., Theory of Neutral and Charged Excitons in Monolayer Transition Metal Dichalcogenides. Phys. Rev. B 2013, 88 (4), 045318. https://doi.org/10.1103/PhysRevB.88.045318.

Brütting, W., Frischeisen, J., Schmidt, T. D., Scholz, B. J. & Mayr, C. Device efficiency of organic light-emitting diodes: Progress by improved light outcoupling. Phys. Status Solidi A 210, 44-65 (2013).

Castellanos-Gomez, A. Why All the Fuss about 2D Semiconductors? Nat. Photonics 2016, 10, 202-204. https://doi.org/10.1038/nphoton.2016.53.

Celebi, K., Heidel, T. D. & Baldo, M. A. Simplified calculation of dipole energy transport in a multilayer stack using dyadic Green's functions. Opt. Express 15, 1762 (2007).

Coburn, C. & Forrest, S. R. Effects of Charge Balance and Exciton Confinement on the Operational Lifetime of Blue Phosphorescent Organic Light-Emitting Diodes. Phys. Rev. Appl. 7, 1-5 (2017).

Flammich, M., et al., Oriented Phosphorescent Emitters Boost OLED Efficiency. Org. Electron. 2011, 12 (10), 1663-1668. https://doi.org/10.1016/j.orgel.2011.06.011.

Forrest, S. The path to ubiquitous and low-cost organic electronic appliances on plastic. Nature 428, 911-918 (2004). https://doi.org/10.1038/nature02498.

Forrest, S., Bradley, D. and Thompson, M. (2003), Measuring the Efficiency of Organic Light-Emitting Devices. Adv. Mater., 15: 1043-1048. https://doi.org/10.1002/adma.200302151.

Giebink, N., D'Andrade, B., Weaver, M., Brown, J., & Forrest, S. "Direct evidence for degradation of polaron excited states in organic light emitting diodes." Journal of Applied Physics, 105(12) (2009).

Gu, J., et al., A Room-Temperature Polariton Light-Emitting Diode Based on Monolayer WS2. Nat. Nanotechnol. 2019, 14 (11), 1024-1028. https://doi.org/10.1038/s41565-019-0543-6.

Gurarslan, A., et al., Surface-Energy-Assisted Perfect Transfer of Centimeter-Scale Monolayer and Few-Layer MoS2 Films onto Arbitrary Substrates. ACS Nano 2014, 8 (11), 11522-11528. https://doi.org/10.1021/nn5057673.

Jurow, M. J., et al., Manipulating the Transition Dipole Moment of CsPbBr3 Perovskite Nanocrystals for Superior Optical Properties. Nano Lett. 2019, 19 (4), 2489-2496. https://doi.org/10.1021/acs.nanolett.9b00122.

Kang, J., et al., Band Offsets and Heterostructures of Two-Dimensional Semiconductors. Appl. Phys. Lett. 2013, 102 (1), 012111. https://doi.org/10.1063/1.4774090.

Kim, H., et al., Highly Stable Near-Unity Photoluminescence Yield in Monolayer MoS2 by Fluoropolymer Encapsulation and Superacid Treatment. ACS Nano 2017, 11 (5), 5179-5185. https://doi.org/10.1021/acsnano.7b02521.

Kim, J., et al., Systematic Control of the Orientation of Organic Phosphorescent Pt Complexes in Thin Films for Increased Optical Outcoupling. Advanced Materials 2019, 1900921.

Kim, J., et al., Using Fourier-Plane Imaging Microscopy for Determining Transition-Dipole-Moment Orientations in Organic Light-Emitting Devices. Phys. Rev. Appl. 2020, 14 (3), 034048. https://doi.org/10.1103/PhysRevApplied. 14.034048.

Lee, B. et al. Surface passivation of InP using an organic thin film. J. Cryst. Growth 503, 9-12 (2018).

Lieb, M. A., et al., Single-Molecule Orientations Determined by Direct Emission Pattern Imaging. J. Opt. Soc. Am. B 2004, 21 (6), 1210-1215. https://doi.org/10.1364/JOSAB.21.001210.

Lu, H., et al., Passivating the Sulfur Vacancy in Monolayer MoS2. APL Mater. 2018, 6 (6), 066104. https://doi.org/10.1063/1.5030737.

Lunt, R. R., Giebink, N. C., Belak, A. A., Benziger, J. B. & Forrest, S. R. Exciton diffusion lengths of organic semiconductor thin films measured by spectrally resolved photoluminescence quenching. J. Appl. Phys. 105, 053711 (2009).

Mak, K. F., et al., Tightly Bound Trions in Monolayer MoS2. Nat. Mater. 2013, 12 (3), 207-211. https://doi.org/10.1038/nmat3505.

Mak, K. F., Lee, C., Hone, J., Shan, J. & Heinz, T. F. Atomically Thin MoS 2: A New Direct-Gap Semiconductor. Phys. Rev. Lett. 105, (2010).

(56) References Cited

OTHER PUBLICATIONS

Mouri, S., et al., Tunable Photoluminescence of Monolayer MoS2 via Chemical Doping. Nano Lett. 2013, 13 (12), 5944-5948. https://doi.org/10.1021/nl403036h.
Novoselov, K. S., et al., 2D Materials and van Der Waals Heterostructures. Science 2016, 353 (6298). https://doi.org/10.1126/science.aac9439.
Pak, J., et al., Intrinsic Optoelectronic Characteristics of MoS2 Phototransistors via a Fully Transparent van Der Waals Heterostructure. ACS Nano 2019, 13 (8), 9638-9646. https://doi.org/10.1021/acsnano.9b04829.
Palummo, M., et al., Exciton Radiative Lifetimes in Two-Dimensional Transition Metal Dichalcogenides. Nano Lett. 2015, 15 (5), 2794-2800. https://doi.org/10.1021/nl503799t.
Park, J., Kim, M.S., Cha, E. et al. Synthesis of uniform single layer WS2 for tunable photoluminescence. Sci Rep 7, 16121 (2017). https://doi.org/10.1038/s41598-017-16251-2.
Peimyoo, N., et al., Chemically Driven Tunable Light Emission of Charged and Neutral Excitons in Monolayer WS2. ACS Nano 2014, 8 (11), 11320-11329. https://doi.org/10.1021/nn504196n.
Plechinger, G., et al., Identification of Excitons, Trions and Biexcitons in Single-Layer WS2. Phys. Status Solidi RRL 2015, 9 (8), 457-461. https://doi.org/10.1002/pssr.201510224.
R.H. Friend & A.D. Yoffe (1987): Electronic properties of intercalation complexes of the transition metal dichalcogenides, Advances in Physics, 36:1, 1-94.
Ross, J. S., et al., Electrical Control of Neutral and Charged Excitons in a Monolayer Semiconductor. Nat. Commun. 2013, 4, 1474. https://doi.org/10.1038/ncomms2498.
Schuller, J. A., et al., Orientation of Luminescent Excitons in Layered Nanomaterials. Nat. Nanotechnol. 2013, 8 (4), 271-276. https://doi.org/10.1038/nnano.2013.20.
Siviniant, J., et al., Chemical Equilibrium between Excitons, Electrons, and Negatively Charged Excitons in Semiconductor Quantum Wells. Phys. Rev. B 1999, 59 (3), 1602-1604. https://doi.org/10.1103/PhysRevB.59.1602.
Song, S. H., Joo, M.-K., Neumann, M., Kim, H. & Lee, Y. H. Probing defect dynamics in monolayer MoS2 via noise nanospectroscopy. Nat. Commun. 8, (2017).
Taminiau, T. H., et al., Quantifying the Magnetic Nature of Light Emission. Nat. Commun. 2012, 3 (1), 979. https://doi.org/10.1038/ncomms1984.
Wang, et al., The highly-efficient light-emitting diodes based on transition metal dichalcogenides: from architecture to performance, Nanoscale Adv., 2020,2, 4323-4340.
Wang, J., et al., Electroluminescent Devices Based on 2D Semiconducting Transition Metal Dichalcogenides. Adv. Mater. 2018, 30 (47), 1802687. https://doi.org/10.1002/adma.201802687.
Wang, Q., et al., Exciton-Polaron-Induced Aggregation of Wide-Bandgap Materials and Its Implication on the Electroluminescence Stability of Phosphorescent Organic Light-Emitting Devices. Adv. Funct. Mater. 2014, 24 (20), 2975-2985. https://doi.org/10.1002/adfm.201303840.
Wang, Q.; Aziz, H., Degradation of Organic/Organic Interfaces in Organic Light-Emitting Devices Due to Polaron-Exciton Interactions. ACS Appl. Mater. Interfaces 2013, 5 (17), 8733-8739. https://doi.org/10.1021/am402537j.
Withers, F. et al. Light-Emitting Diodes by Band-Structure Engineering in van Der Waals Heterostructures. Nat. Mater. 2015, 14 (3), 301-306. https://doi.org/10.1038/nmat4205.
Withers, F., et al., WSe2 Light-Emitting Tunneling Transistors with Enhanced Brightness at Room Temperature. Nano Lett. 2015, 15 (12), 8223-8228. https://doi.org/10.1021/acs.nanolett.5b03740.
Yang, W., et al., Electrically Tunable Valley-Light Emitting Diode (VLED) Based on CVD-Grown Monolayer WS2. Nano Lett. 2016, 16 (3), 1560-1567. https://doi.org/10.1021/acs.nanolett.5b04066.
Yue Qu, Caleb Coburn, Dejiu Fan, and Stephen R. Forrest, Elimination of Plasmon Losses and Enhanced Light Extraction of Top-Emitting Organic Light-Emitting Devices Using a Reflective Subelectrode Grid, ACS Photonics 2017 4 (2), 363-368, DOI: 10.1021/acsphotonics.6b00847.
Zeng, H., et al., Optical Signature of Symmetry Variations and Spin-Valley Coupling in Atomically Thin Tungsten Dichalcogenides. Sci. Rep. 2013, 3 (1), 1608. https://doi.org/10.1038/srep01608.

* cited by examiner

ORGANIC ELECTROLUMINESCENT DEVICE COMPRISING TWO-DIMENSIONAL EMISSIVE LAYER

CROSS-REFERENCE TO RELATED APPLICATIONS

This application claims priority to U.S. Provisional Application No. 63/043,560, filed on Jun. 24, 2020, and U.S. Provisional Application No. 63/060,393, filed on Aug. 3, 2020, both of which are incorporated herein by reference in their entireties.

STATEMENT REGARDING FEDERALLY SPONSORED RESEARCH OR DEVELOPMENT

This invention was made with government support under Grant Number FA9550-17-1-0208, awarded by the Air Force Office of Scientific Research, and Grant Number W911NF-17-1-0312, awarded by the U.S. Army Research Office. The government has certain rights in the invention.

BACKGROUND

Monolayer transition metal dichalcogenide (TMDC) semiconductors have promising optical characteristics such as strong photoluminescence (PL), and fast exciton decay with high chemical and air stability. Despite their outstanding features, however, TMDC photonic devices so far have been limited in size and structure due to the sequence of complex layer transfers during the fabrication as well as the limited size of the TMDC flakes (several μm). A commonly used layer-by-layer fabrication process causes complexity in production, which is inevitable when using flake TMDCs with hexagonal Boron Nitride (hBN) insulators. This limits the opportunity for TMDCs to be fabricated in large scale. Furthermore, the use of hBN buffer layers causes near-field coupling induced surface plasmon polariton (SPP) mode losses due to the proximity of the active layer with the metal contact. The SPP mode loss could be effectively suppressed via thick buffer layers which is difficult to achieve with hBN bulk layers due to limited thickness control. An alternative would be using a dielectric buffer layer, however, the high deposition temperature of dielectrics damages the TMDC active layer during the process.

Alternatively, organic materials used in organic LEDs (OLEDs) and organic photovoltaics (OPVs) are able to be deposited on large area substrates with facile processing and high precision at a relatively low temperature. Opto-electronic devices that make use of organic materials are becoming increasingly desirable for several reasons. Many materials used to make such devices are relatively inexpensive, so organic opto-electronic devices have the potential for cost advantages over inorganic devices. In addition, the inherent properties of organic materials, such as their flexibility, may make them well suited for applications such as fabrication on a flexible substrate. Examples of organic opto-electronic devices include organic light emitting diodes/devices (OLEDs), organic phototransistors, organic photovoltaic cells, and organic photodetectors. In OLEDs, organic materials may have performance advantages over conventional materials. For example, the wavelength at which an organic emissive layer emits light may in some applications be readily tuned with appropriate dopants.

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Alternatively the OLED can be designed to emit white light. In conventional liquid crystal displays emission from a white backlight is filtered using absorption filters to produce red, green and blue emission. The same technique can also be used with OLEDs. The white OLED can be either a single EML device or a stack structure. Color may be measured using CIE coordinates, which are well known to the art.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

Wafer-scale transition metal dichalcogenides (TMD) monolayers offer a potential platform for next generation device applications1. Due to intrinsic (e.g. atom vacancies) and extrinsic defects (e.g. substrates induced defects) (Rhodes, et al. Nat. Mater. 18, 2019, 541-549), typical photoluminescence quantum yield (PLQY) of the pristine TMD monolayers is extremely low (less than 0.1%), hindering their potential for optoelectronic device applications.

What is needed in the art is a light emitting device using organic materials that can be deposited on large area substrates and high precision at a relatively low temperature. The device should have the ability to apply buffer layers without damaging the TMDC active area during the device fabrication. The device should enable sophisticated device structures and exhibit improved efficiency. Also needed in the art are methods of passivation for transition metal dichalcogenides.

SUMMARY

In one aspect, an organic light emitting device comprises an anode and a cathode, at least one organic layer configured between the anode and the cathode, and at least one two-dimensional emissive layer configured between the anode and the cathode. In one embodiment, the two-dimensional emissive layer is a transition metal dichalcogenide (TMDC) active layer. In one embodiment, the two-dimensional emissive layer is an emissive direct bandgap semiconductor. In one embodiment, the emissive direct bandgap semiconductor is Gallium Nitride. In one embodiment, the TMDC active layer is at least one monolayer of $WS_2$.

In one embodiment, wherein the at least one organic layer comprises first and second organic buffer layers, and the at least one monolayer of $WS_2$ is embedded between the first and second organic buffer layers. In one embodiment, the first organic buffer layer is a hole-transporting layer configured between the at least one monolayer of $WS_2$ and the anode. In one embodiment, the hole-transporting layer comprises 1,1-Bis[(di-4-tolylamino)phenyl]cyclohexane. In one embodiment, the second organic buffer layer is an electron transport layer configured between the cathode and the at least one monolayer of $WS_2$. In one embodiment, the electron transport layer comprises 4,6-Bis(3,5-di(pyridin-3-yl)phenyl)-2-methylpyrimidine, 4,6-Bis(3,5-di-3-pyridinylphenyl)-2-methylpyrimidine. In one embodiment, the at least one organic layer comprises a second active layer comprising 4,4'-Bis(N-carbazolyl)-1,1'-biphenyl. In one embodiment, the two-dimensional emissive layer is positioned within the second active layer.

In one embodiment, the two-dimensional emissive layer is positioned at a distance of between 5 nm and 20 nm from a surface of the second active layer. In one embodiment, the at least one two-dimensional emissive layer comprises at least a second two-dimensional emissive layer positioned within the second active layer.

In one aspect, a method of fabricating the organic light emitting device as disclosed herein comprises the step of depositing the two-dimensional emissive layer using chemical-vapor-deposition.

In one aspect, an organic light emitting device comprises a substrate, a first electrode disposed over the substrate, at least one organic layer disposed over the first electrode, at least one two-dimensional emissive layer disposed over the first electrode having a thickness of at most 20 Å, and a second electrode disposed over the at least one two-dimensional emissive layer. In one embodiment, the two-dimensional emissive layer is a transition metal dichalcogenide (TMDC) active layer. In one embodiment, the two-dimensional emissive layer is an emissive direct bandgap semiconductor. In one embodiment, the emissive direct bandgap semiconductor is Gallium Nitride. In one embodiment, the TMDC active layer is at least one monolayer of $WS_2$. In one embodiment, the first electrode is a transparent anode. In one embodiment, the at least one organic layer comprises a hole transport layer and an electron transport layer, the hole transport layer positioned between the first electrode and the at least one two-dimensional emissive layer, and the electron transport layer positioned between the second electrode and the at least one two-dimensional emissive layer.

In one embodiment, the at least one organic layer comprises an organic host layer having first and second surfaces facing the first and second electrodes, with a thickness running between the first surface and the second surface. In one embodiment, the at least one two-dimensional emissive layer is positioned within the organic host layer between the first surface and the second surface. In one embodiment, the device has an EQE of at least 1%. In one embodiment, the at least one two-dimensional emissive layer has a first surface facing the first electrode, the first surface having a surface area of at least 0.2 $mm^2$, wherein the device has uniform color characteristics.

In one aspect, the present disclosure relates to an organic light emitting device (OLED) comprising: an anode; a cathode; and a light emitting layer, disposed between the anode and the cathode, the light emitting layer comprising: a transition metal dichalcogenide monolayer; and a passivation layer comprising a transition metal oxide and an organic electron donor material. In one embodiment, the passivation layer has been irradiated with a laser.

In one embodiment, the transition metal dichalcogenide is selected from the group consisting of $MoS_2$, $WS_2$, $MoSe_2$, and $WSe_2$.

In one embodiment, the light emitting layer comprises a first sublayer comprising the transition metal oxide and a second sublayer comprising the organic electron donating material. In one embodiment, the first sublayer is in contact with the transition metal dichalcogenide monolayer and the second sublayer.

In one embodiment, the OLED is incorporated into a consumer product selected from the group consisting of a flat panel display, a computer monitor, a medical monitor, a television, a billboard, a light for interior or exterior illumination and/or signaling, a heads-up display, a fully or partially transparent display, a flexible display, a laser printer, a telephone, a cell phone, tablet, a phablet, a personal digital assistant (PDA), a wearable device, a laptop computer, a digital camera, a camcorder, a viewfinder, a micro-display that is less than 2 inches diagonal, a 3-D display, a virtual reality or augmented reality display, a vehicle, a video wall comprising multiple displays tiled together, a theater or stadium screen, a light therapy device, and a sign.

In one aspect, the present invention relates to a method of producing a passivation layer, the method comprising the steps of: providing a transition metal dichalcogenide monolayer; depositing a composition comprising a transition metal oxide and an organic electron donor material over the monolayer; and irradiating the composition with light from a light source to form a passivation layer. In one embodiment, the light has a photon energy which is greater than or equal to the difference in energy between the HOMO of the donor material and the LUMO of the transition metal oxide. In one embodiment, the transition metal oxide is selected from the group consisting of $MoO_x$, $WO_x$, and $VO_x$.

In one embodiment, the method further comprises the step of contacting the monolayer with a superacid. In one embodiment, the step of depositing a composition comprising a transition metal oxide and an organic electron donor material over the monolayer comprises the step of depositing a mixture comprising a transition metal oxide and organic electron donor material in a volume ratio between 10:1 and 1:1 over the monolayer. In one embodiment, the step of depositing a composition comprising a transition metal oxide and an organic electron donor material over the monolayer comprises the steps of: depositing a transition metal oxide over the monolayer to form a transition metal oxide sublayer; and depositing the organic electron donor material over the transition metal oxide sublayer to form a donor material sublayer.

In one embodiment, wherein the transition metal oxide is deposited to a thickness of less than or equal to 3 nm. In one embodiment, the donor material is deposited to a thickness of less than or equal to 5 nm. In one embodiment, the passivation layer has a thickness of less than or equal to 100 nm.

In one embodiment, the step of irradiating the composition further comprises the step of generating charged polaron pairs in the composition. In one embodiment, the light source is selected from a group consisting of a laser, a light emitting diode, and an incandescent light bulb.

In one aspect, the present disclosure relates to a method of producing a passivation layer, the method comprising the steps of: providing a transition metal dichalcogenide monolayer; depositing a composition comprising a transition metal oxide over the monolayer; and irradiating the transition metal oxide with ultraviolet light; and irradiating the transition metal oxide with a laser to form a passivation layer. In one embodiment, the laser has a photon energy between 2 eV and 3 eV. In one embodiment, the laser has a photon energy of about 2.3 eV.

In one aspect, the present disclosure relates to an OLED comprising a passivation produced using the methods disclosed here, and to consumer products comprising said OLEDs.

BRIEF DESCRIPTION OF THE DRAWINGS

The foregoing purposes and features, as well as other purposes and features, will become apparent with reference to the description and accompanying figures below, which are included to provide an understanding of the disclosure and constitute a part of the specification, in which like numerals represent like elements, and in which:

FIG. 6K shows the dark area of the device illumination demonstrated with an optical microscope and a graph of diode characteristics with high conductivity as indicated by the JV curve. FIG. 6L shows a graph of normalized emission intensity from the monolayer $WS_2$ with no residual emission from any other organic layers.

(FIG. 15B).

DETAILED DESCRIPTION

Figure 1:
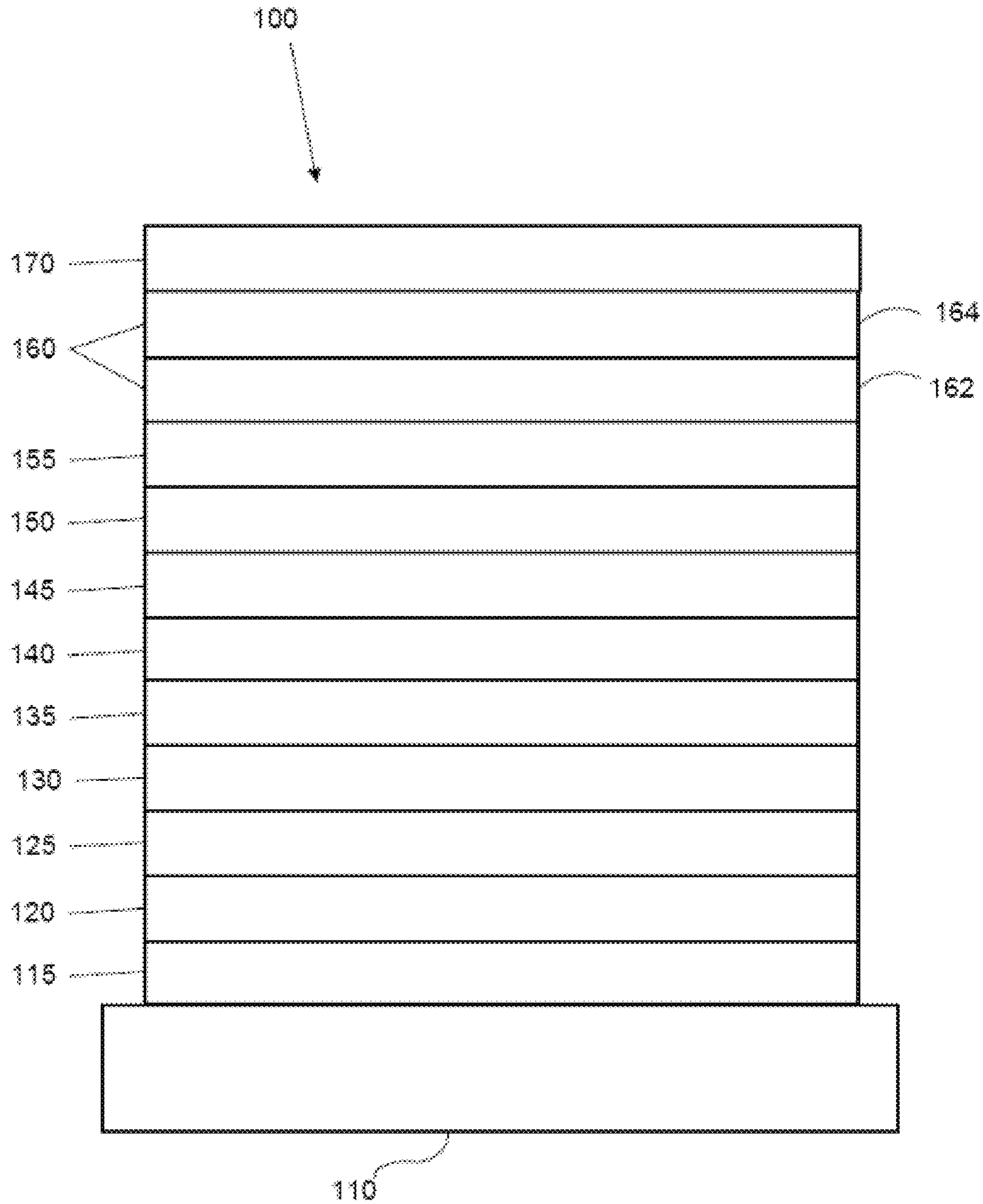
FIG. 1 shows an organic light emitting device.

It is to be understood that the figures and descriptions of the present disclosure have been simplified to illustrate elements that are relevant for a clearer comprehension of the present disclosure, while eliminating, for the purpose of clarity, many other elements found in OLED devices. Those of ordinary skill in the art may recognize that other elements and/or steps are desirable and/or required in implementing the present disclosure. However, because such elements and steps are well known in the art, and because they do not facilitate a better understanding of the present disclosure, a discussion of such elements and steps is not provided herein. The disclosure herein is directed to all such variations and modifications to such elements and methods known to those skilled in the art.

Unless defined otherwise, all technical and scientific terms used herein have the same meaning as commonly understood by one of ordinary skill in the art to which this disclosure belongs. Although any methods and materials similar or equivalent to those described herein can be used in the practice or testing of the present disclosure, the preferred methods and materials are described.

As used herein, each of the following terms has the meaning associated with it in this section.

The articles "a" and "an" are used herein to refer to one or to more than one (i.e., to at least one) of the grammatical object of the article. By way of example, "an element" means one element or more than one element.

"About" as used herein when referring to a measurable value such as an amount, a temporal duration, and the like, is meant to encompass variations of ±20%, ±10%, ±5%, ±1%, and ±0.1% from the specified value, as such variations are appropriate.

Ranges: throughout this disclosure, various aspects of the disclosure can be presented in a range format. It should be understood that the description in range format is merely for convenience and brevity and should not be construed as an inflexible limitation on the scope of the disclosure. Where appropriate, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 2.7, 3, 4, 5, 5.3, and 6. This applies regardless of the breadth of the range.

Referring now in detail to the drawings, in which like reference numerals indicate like parts or elements throughout the several views, in various embodiments, presented herein is a large area transition metal dichalcogenide light emitting device employing organic buffer layers.

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), are incorporated by reference in their entireties. Phosphorescence is described in more detail in U.S. Pat. No. 7,279,704 at cols. 5-6, which are incorporated by reference.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
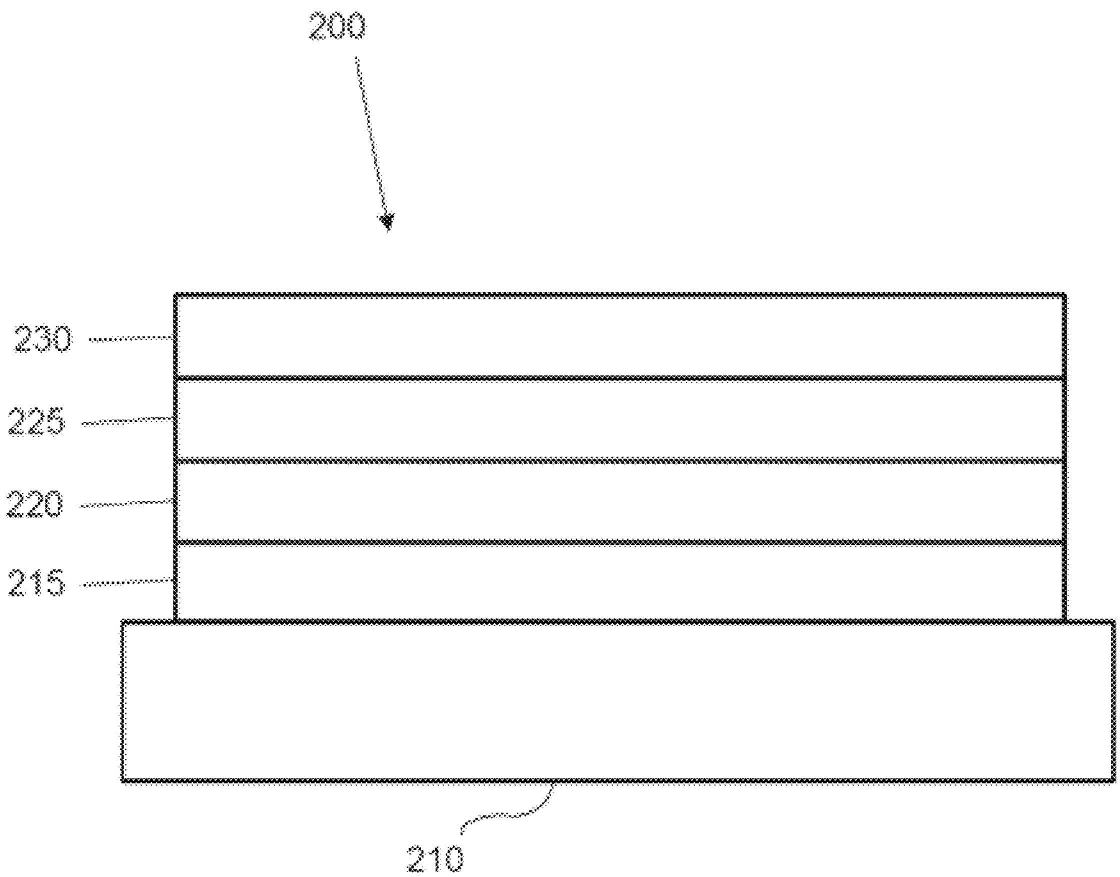
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIG. 1 and FIG. 2 is provided by way of non-limiting example, and it is understood that embodiments of the disclosure may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIG. 1 and FIG. 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and organic vapor jet printing (OVJP). Other methods may also be used. The materials to be deposited may be modified to make them compatible with a particular deposition method. For example, substituents such as alkyl and aryl groups, branched or unbmnched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

An OLED fabricated using devices and techniques disclosed herein may have one or more characteristics selected from the group consisting of being flexible, being rollable, being foldable, being stretchable, and being curved, and may be transparent or semi-transparent. In some embodiments, the OLED further comprises a layer comprising carbon nanotubes.

In some embodiments, the OLED comprises a light emitting compound. In some embodiments, the compound can produce emissions via phosphorescence, fluorescence, thermally activated delayed fluorescence, i.e., TADF (also referred to as E-type delayed fluorescence), triplet-triplet annihilation, or combinations of these processes.

An OLED fabricated according to techniques and devices disclosed herein can be incorporated into one or more of a consumer product, an electronic component module, and a lighting panel. The organic layer can be an emissive layer and the compound can be an emissive dopant in some embodiments, while the compound can be a non-emissive dopant in other embodiments.

The organic layer can also include a host. In some embodiments, two or more hosts are preferred. In some embodiments, the hosts used maybe a) bipolar, b) electron transporting, c) hole transporting or d) wide band gap materials that play little role in charge transport. In some embodiments, the host can include a metal complex. The host can be an inorganic compound.

In some embodiments, an OLED fabricated using devices and techniques disclosed herein further comprises a layer comprising a delayed fluorescent emitter. In some embodiments, the OLED comprises a RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least 10 inch diagonal or 50 square inch area. In some embodiments, the OLED is a lighting panel.

Embodiments described herein include an OLED using a chemical-vapor-deposition (CVD) grown monolayer of $WS_2$ as an active layer, in some embodiments including organic buffer layers, thereby taking advantage of both TMDCs and organics. The limited dimension of TMDC results in a highly oriented transition dipole moment parallel to the substrate plane, showing the potential to achieve an efficient LED due to reduced light power trapped inside the optical waveguide and coupled into SPP mode. A CVD grown monolayer of $WS_2$ enables a large-area device of a size of approximately 0.2 $mm^2$ with uniform color characteristics. Organic buffer layers enable efficient device performance by Forster transferring the excitons generated between the emissive layer and the charge blocking layer which prevents the need for tunneling barriers that have been necessary for charge trapping in previous TMDC LEDs. Embodiments provide a way to implement an inorganic TMDC layer into organic buffer layers, which leads to efficient, stable optoelectronic devices.

Because organic materials used in LEDs and OPVs are able to be deposited in large area substrates with facile processing and high precision at a relatively low temperature, buffer layers comprising organic materials can be applied without damaging the TMDC active area during the device fabrication. In addition, diverse organic materials with different functions such as charge transport as well as blocking layers enable sophisticated device structures that lead to improved efficiency. Furthermore, the high defect density within TMDC films caused by atomic vacancies, which has been limiting the performance of the LEDs using the TMDCs, can be improved by using organic buffer layers because organic molecules are known to passivate the defect states.

Figure 3:
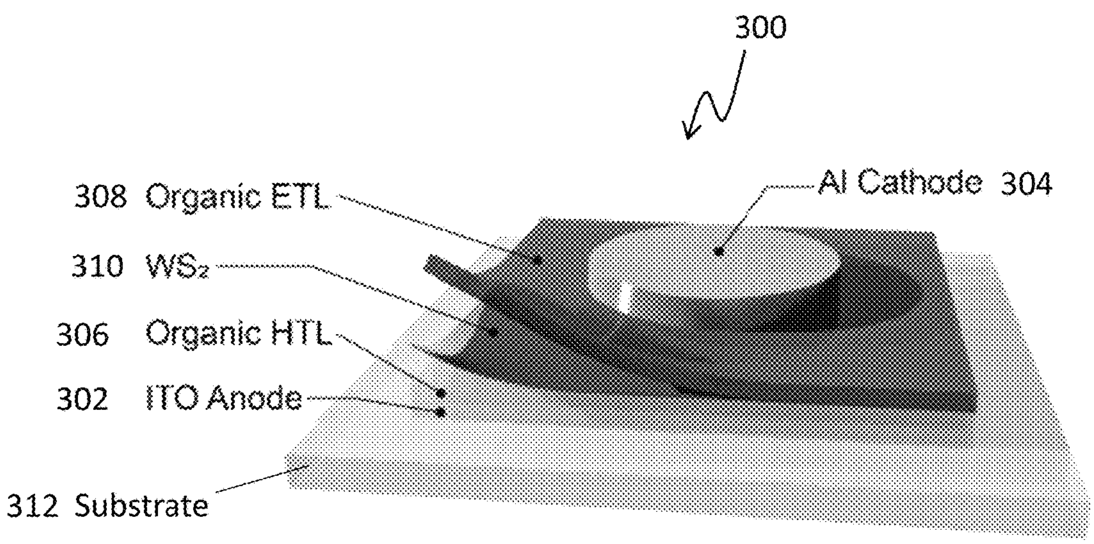
FIG. 3 is a schematic illustration of an LED with a TMDC active layer according to one embodiment, having a monolayer of $WS_2$ embedded between the organic buffer layers.

With reference now to FIG. 3, a schematic illustration of an LED with a TMDC active layer is shown according to one embodiment, having a monolayer of $WS_2$ embedded between the organic buffer layers. The organic light emitting device 300 includes an anode 302, a cathode 304, organic buffer layers 306, 308 configured between the anode 302 and the cathode 304, and a two-dimensional emissive layer 310, which in the depicted example is a monolayer transition metal dichalcogenide (TMDC) active layer configured between the anode 302 and the cathode 304. The TMDC active layer 310 can be a monolayer of $WS_2$. The first 306 and second 308 organic buffer layers have the monolayer of $WS_2$ 310 embedded therebetween. The first organic buffer layer 306 can be a hole-transporting layer configured between the monolayer of $WS_2$ 310 and the anode 302. The second organic buffer layer 306 can be an electron transport layer 308 configured between the cathode 304 and the monolayer of $WS_2$ 310. In one embodiment, the monolayer of $WS_2$ or other two-dimensional emissive layer 310 may be positioned within the organic host layer. The organic host layer may have a thickness of between 1 nm and 1000 nm, or between 2 nm and 750 nm, or between 5 nm and 500 nm. The device as depicted is deposited on substrate 312, which may in some embodiments be a transparent substrate, for example comprising Si. In some embodiments, one or both electrodes 302 and 304 may be transparent. In the depicted embodiment, the cathode 304 is depicted as a cylindrical element partially covering the underlying layers 302, 306, 310, and 308, but in other embodiments the cathode 304 or anode 302 may comprise a conductive material formed as one or more parallel strips or in any other suitable shape partially covering the underlying layers, or alternative the cathode 304 or anode 302 may comprise a conductive transparent material substantially or completely covering the underlying layers.

As used herein, the terms "two-dimensional layer" or "two-dimensional emissive layer" refer to monolayers, multilayers, heterostructures, and/or one or more layered thin films whose individual or total thicknesses vary from a single atomic layer to tens of nanometers. A two-dimensional material may have a thickness of less than 5 nm, less than 10 nm, less than 20 nm, less than 30 nm, less than 50 nm, less than 75 nm, or less than 100 nm. In some embodiments, the term "two-dimensional" is understood to mean that the thickness of the material or layer is orders of magnitude smaller than the wavelength(s) of light with which the material or layer is interacting. Exemplary two-dimensional materials include, but are not limited to, transition metal dichalcogenides (for example WΩ), graphene, and black phosphorus. In some embodiments, a two-dimensional layer or material may be formed partly or entirely of a semiconductor, for example a direct bandgap semiconductor, or more specifically a direct bandgap inorganic semiconductor, such as Gallium Nitride. In one embodiment, any direct bandgap inorganic semiconductor may be used, for example a group III-V direct bandgap semiconducting alloy, or a group II-VI direct bandgap semiconducting alloy.

The one or more organic layers 306, 308 may comprise any suitable material. In one embodiment, organic ETL 308 may comprise 4,6-Bis(3,5-di(pyridin-3-yl)phenyl)-2-methylpyrimidine, 4,6-Bis(3,5-di-3-pyridinylphenyl)-2-methylpyrimidine (B3PymPm). In one embodiment, organic HTL 306 may comprise 1,1-Bis[(di-4-tolylamino)phenyl] cyclohexane (TAPC).

Figure 31:
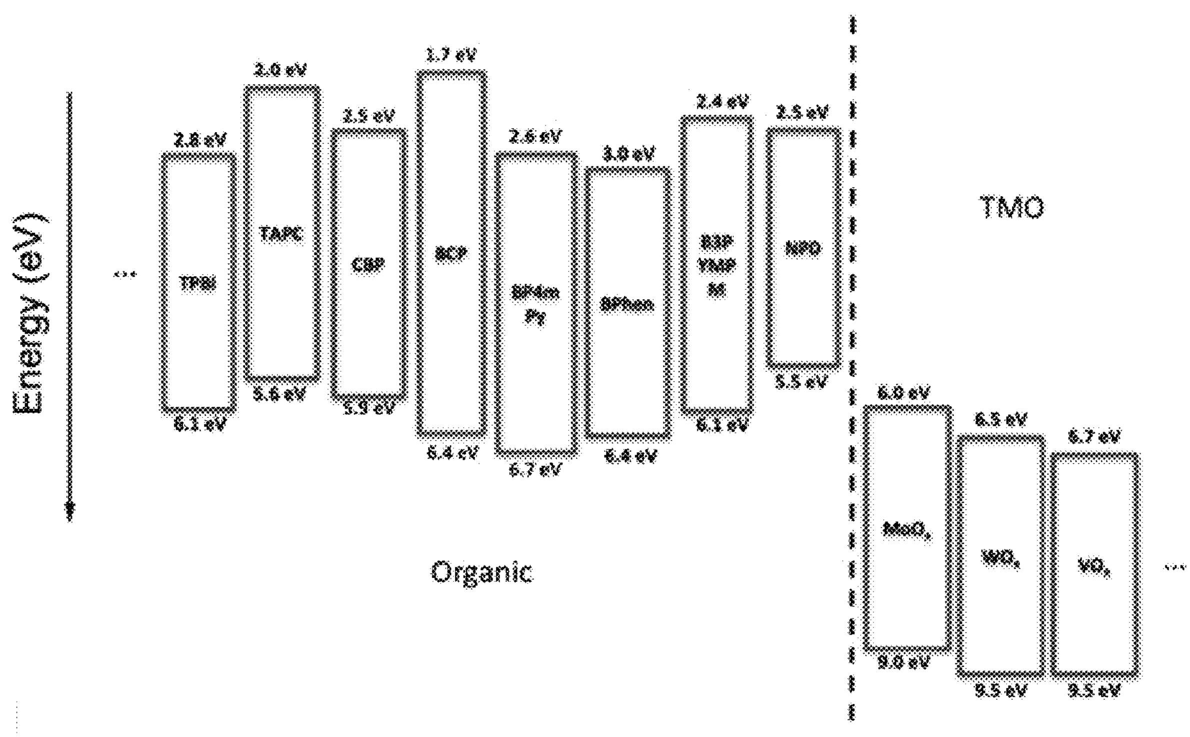
FIG. 31 is an energy diagram showing the energy levels of organic materials and transition mental oxides.
Figure 32:
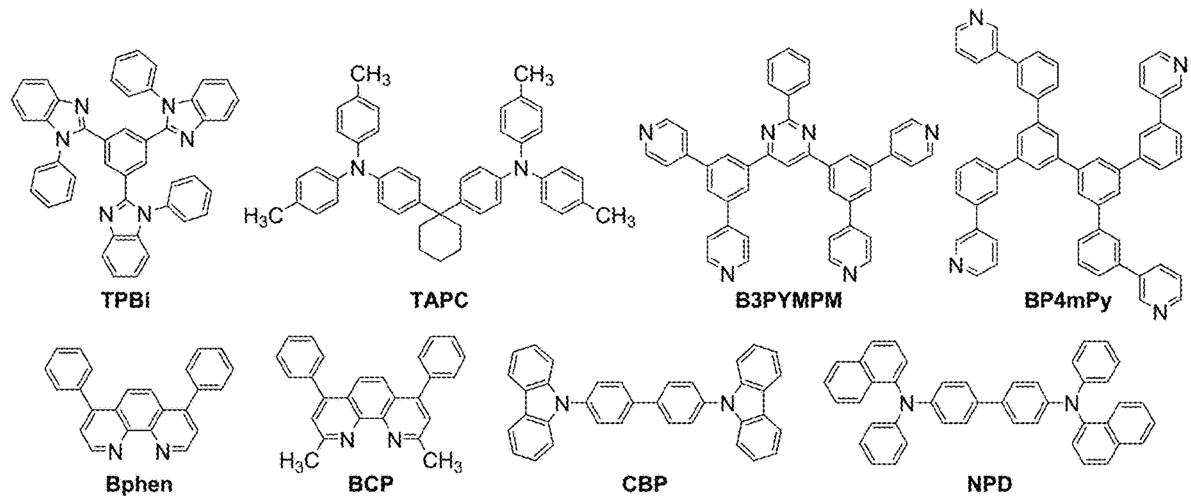
FIG. 32 depicts the chemical structures of the organic materials listed in FIG. 31.

In one embodiment, the transition metal oxide is selected from the group consisting of $MoO_x$, $WO_x$, and $VO_x$. In one embodiment, the organic electron donor material comprises an organic compound. Exemplary organic compounds include, but are not limited to, any host, electron transport material, or hole transport material described herein. In one embodiment, the donor material has a highest occupied molecular orbital (HOMO) energy level that is lower in energy than the lowest unoccupied molecular orbital (LUMO) of the transition metal oxide (or, the lowest-energy limit of the conduction band). Exemplary donor materials and their HOMO and LUMO energy levels are presented in FIG. 31 and FIG. 32. In some embodiments, other donors selected to form a passivation layer, given proper energy alignment and the photon energy of soaking light source. In one embodiment, the donor material is one of the following compounds:

TPBi

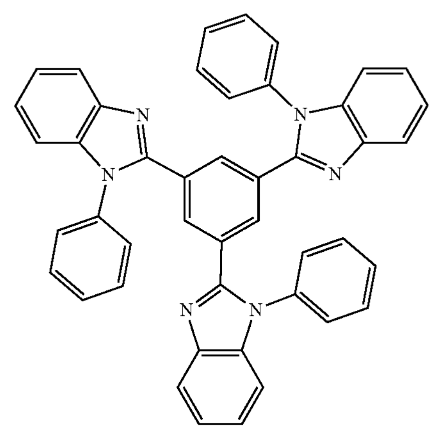

-continued

TAPC

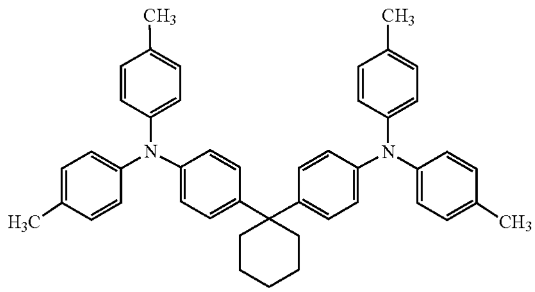

B3PYMPM

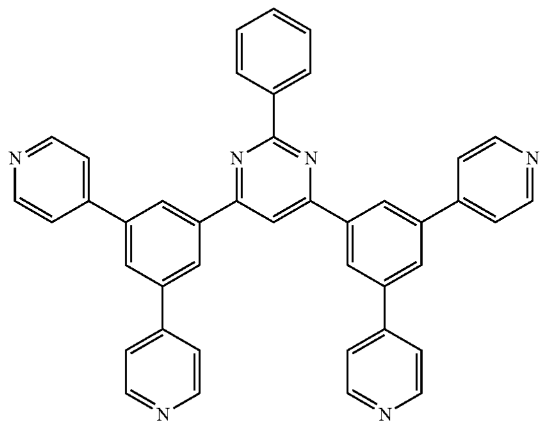

BP4mPy

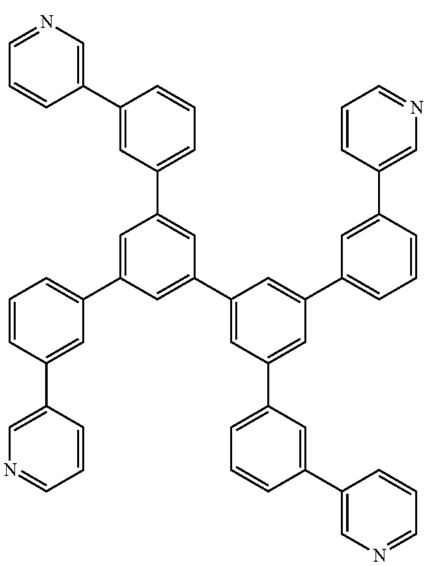

Bphen

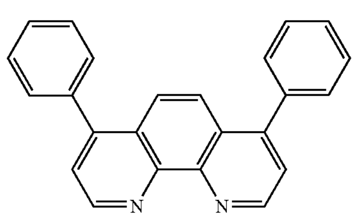

-continued

BCP

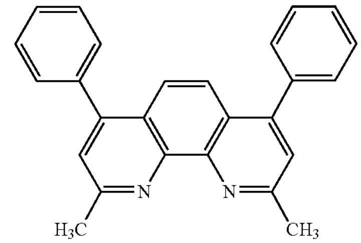

CBP

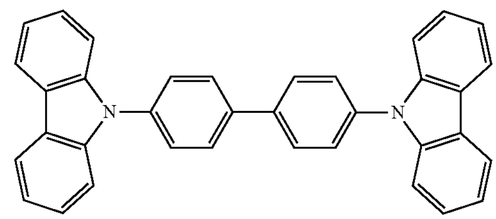

NPD

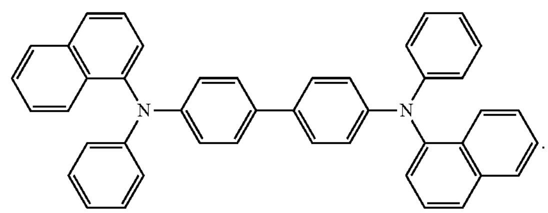

In one embodiment, the transition metal oxide is represented by $MO_x$, where M is a transition metal, O is oxygen, and x is a number greater than 0 which represents the relative amount of oxygen in the material. In one embodiment, x may be an integer. In one embodiment, x is a non-integer. In one embodiment, the passivation layer comprises more than one transition metal oxide. In one embodiment, the passivation layer comprises a nonstoichiometric metal oxide. Exemplary transition metal oxide acceptors include, but are not limited to, molybdenum oxides ($MoO_x$; $2 \leq x \leq 3$), tungsten oxides ($WO_x$), rhenium oxide ($ReO_x$), ruthenium oxide ($RuO_x$), manganese oxides ($MnO_x$), or the like. In one embodiment, the transition metal in the transition metal dichalcogenide is the same transition metal as in the transition metal oxide. In one embodiment, the transition metal in the transition metal dichalcogenide differs from the transition metal in the transition metal oxide.

In one embodiment, the transition metal oxide is a semiconductor. In one embodiment, the transition metal oxide has a characteristic conduction band (CB) with a minimum energy corresponding to the material's lowest unoccupied molecular orbital (LUMO). In one embodiment, the difference in energy between the HOMO of the donor material and the lowest energy limit of the conduction band of the transition metal oxide can be expressed as the energy offset, $\Delta E_{CT}$.

In one embodiment, the thickness of the passivation layer is about 10 nm.

In one embodiment, the passivation layer comprises charged polarons. In one embodiment, the passivation layer comprises polaron pairs formed from the acceptor molecule and the donor molecule. In one embodiment, the passivation layer comprises radical cations of the donor molecule and partially-reduced donor material.

In some embodiments, a device as disclosed herein may comprise an emissive layer having an emissive material and optionally a host material, wherein the host material may in some embodiments comprise CBP. In one embodiment, the host material may comprise mCBP or any other host material that is optically transparent in the emission zone of the emissive material. In one embodiment, the emissive layer is positioned in an organic host material such that the emissive layer, which may be an inorganic emissive layer, emits the light. In some embodiments, the host has an energy gap wider than the bandgap of the emissive layer.

Figure 9A:
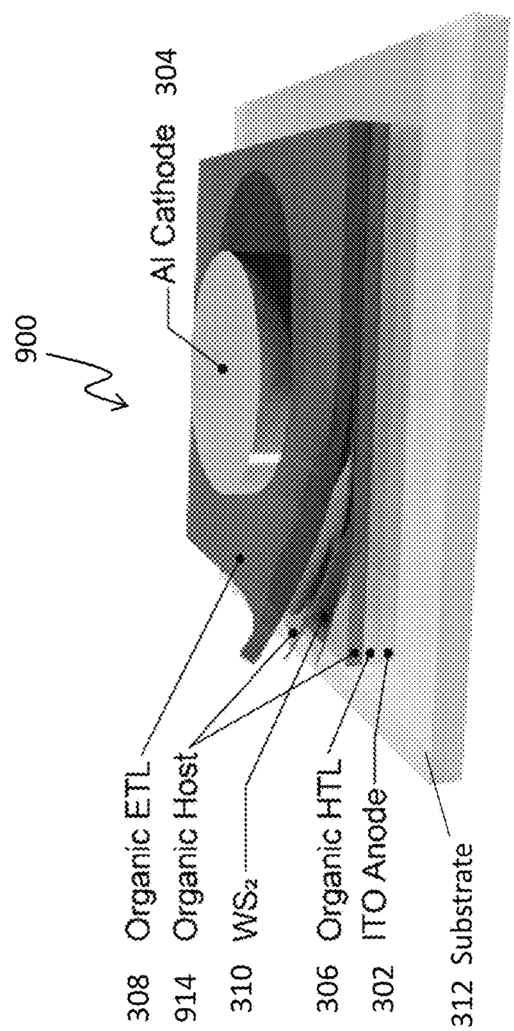
FIG. 9A is a schematic illustration of the hybrid LED comprising a monolayer $WS_2$ active layer sandwiched between organic conducting and excition generating layers.

One exemplary embodiment of an LED 900 with an inorganic or TMDC active layer 310 positioned within an organic host layer 914 is shown in FIG. 9A, The organic host layer or host matrix may be characterized in different embodiments, either as a single organic host layer with the TMDC active layer 310 positioned within, or alternatively as top and bottom organic host sublayers positioned on opposite sides of the TMDC active layer 310. In some embodiments the top and bottom organic sublayers may comprise the same or similar materials, but in other embodiments the material composition of the top and bottom organic host sublayers may be different. The organic host layer or sublayers may comprise any suitable organic host material, including but not limited to CBP. In some embodiments, the TMDC active layer may be positioned within the organic host later at a distance from one surface of the organic host layer of less than 10 nm, less than 7 nm, less than 6 nm, less than 5 nm, less than 4 nm, less than 3 nm, or about 3 nm. In one embodiment, the two-dimensional active layer may be positioned at a distance of about 3 nm from the surface of the organic host layer facing the electron transport layer. In one embodiment, multiple inorganic two-dimensional active layers may be positioned within the organic host layer. In one embodiment, the two-dimensional active layer may be positioned within the organic host layer at a depth having the highest density of excitons.

The construction of the organic host layer/inorganic active layer may be varied for example based on the materials used in the two layers and in the surrounding layers in the rest of the LED. In one embodiment, an inorganic active layer may be positioned with the host layer at a depth determined to have the maximum exciton density as determined by an exciton density profile of the device. The introduction of an inorganic active layer into an OLED structure within an organic host layer, for example using dry transfer, enables a variety of material selections to be combined with organic thin films in a hybrid LED. Using an organic host matrix separates charge conduction from the guest emission processes, allowing for improved performance of each material in serving its intended purpose. Excitons are efficiently formed in the conductive host layer, and then transferred to the luminescent active material (for example $mWS_2$) which is positioned near the maximum exciton density within the Førster radius.

The use of a host matrix differentiates the disclosed device structure from previously reported TMDC LEDs where the TMDCs were located directly between hole- and electron-transport layers. As detailed in the cited publications, heterointerfaces are prone to charge/exciton accumulation. The coexistence of a high density of excitons and charges may result in degradation of the active material or even morphological instabilities. The use of a host matrix enables positioning of the TMDC at a distance from the heterointerface with benefits to device stability.

Examples of organic host materials are not particularly limited, and any organic compounds may be used as long as the triplet energy of the host is larger than that of the emissive layer. Any host material may be used with any emissive layer so long as the triplet criteria is satisfied.

In some embodiments, the hosts used maybe a) bipolar, b) electron transporting, c) hole transporting or d) wide band gap materials that play little role in charge transport. In some embodiments, the host can include a metal complex. The host can be a triphenylene containing benzo-fused thiophene or benzo-fused furan. Any substituent in the host can be an unfused substituent independently selected from the group consisting of $C_nH_{2n+1}$, $OC_nH_{2n+1}$, $OAr_1$, $N(C_nH_{2n+1})_2$, $N(Ar_1)(Ar_2)$, $CH{=}CH{-}C_nH_{2n+1}$, $C{\equiv}C{-}C_nH_{2n+1}$, $Ar_1$, $Ar_1{-}Ar_2$, and $C_nH_{2n}{-}Ar_1$, or the host has no substitutions. In the preceding substituents n can range from 1 to 10; and $Ar_1$ and $Ar_2$ can be independently selected from the group consisting of benzene, biphenyl, naphthalene, triphenylene, carbazole, and heteroaromatic analogs thereof. The host can be an inorganic compound. For example a Zn containing inorganic material e.g. ZnS.

In one aspect, the host compound contains at least one of the following groups selected from the group consisting of aromatic hydrocarbon cyclic compounds such as benzene, biphenyl, triphenyl, triphenylene, tetraphenylene, naphthalene, anthracene, phenalene, phenanthrene, fluorene, pyrene, chrysene, perylene, and azulene; the group consisting of aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and the group consisting of 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Each option within each group may be unsubstituted or may be substituted by a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acids, ether, ester, nitrile, isonitrile, sulfanyl, sulfinyl, sulfonyl, phosphino, and combinations thereof.

In one aspect, the host compound contains at least one of the following groups in the molecule:

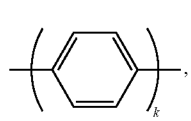,
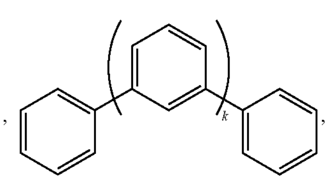,
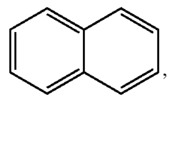,
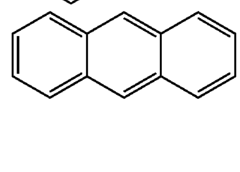,

-continued

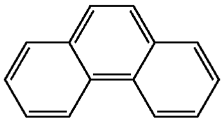

,

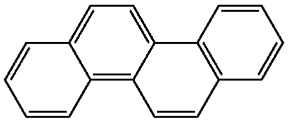

,

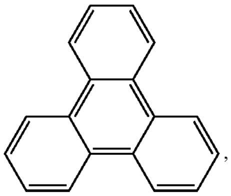

,

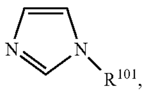

,

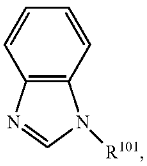

,

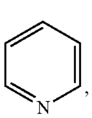

,

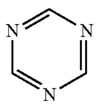

,

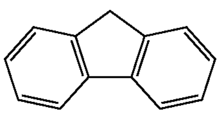

,

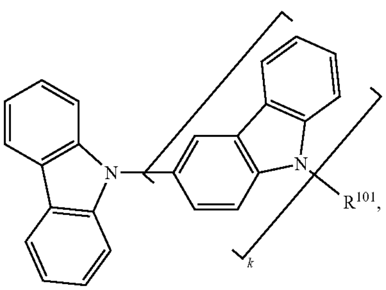

,

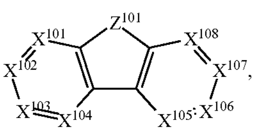

,

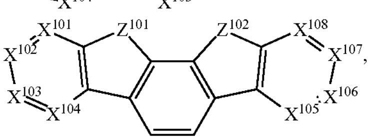

,

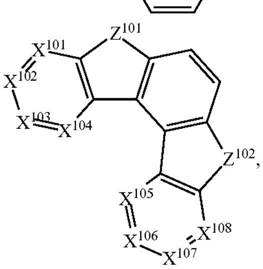

,

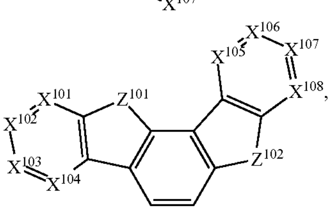

,

-continued

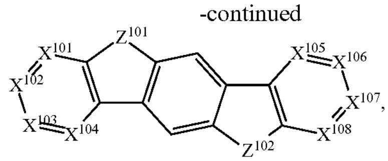

, and

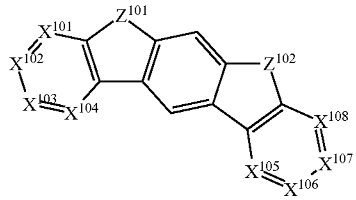

wherein $R^{101}$ is selected from the group consisting of hydrogen, deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, boryl, heteroaryl, acyl, carboxylic acids, ether, ester, nitrile, isonitrile, sulfanyl, sulfinyl, sulfonyl, phosphino, and combinations thereof. k is an integer from 0 to 20 or 1 to 20. $X^{101}$ to $X^{108}$ are independently selected from C (including CH) or N. $Z^{101}$ and $Z^{102}$ are independently selected from $NR^{101}$, O, or S.

The terms "halo," "halogen," and "halide" are used interchangeably and refer to fluorine, chlorine, bromine, and iodine.

The term "acyl" refers to a substituted carbonyl radical (C(O)—$R_s$).

The term "ester" refers to a substituted oxycarbonyl (—O—C(O)—$R_s$ or —C(O)—O—$R_s$) radical.

The term "ether" refers to an —$OR_s$ radical.

The terms "sulfanyl" or "thio-ether" are used interchangeably and refer to a —$SR_s$ radical.

The term "sulfinyl" refers to a —S(O)—$R_s$ radical.

The term "sulfonyl" refers to a —$SO_2$—$R_s$ radical.

The term "phosphino" refers to a —$P(R_s)_3$ radical, wherein each $R_s$ can be same or different.

The term "silyl" refers to a —$Si(R_s)_3$ radical, wherein each $R_s$ can be same or different.

The term "boryl" refers to a —$B(R_s)_2$ radical or its Lewis adduct—$B(R_s)_3$ radical, wherein $R_s$ can be same or different.

In each of the above, $R_s$ can be hydrogen or a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, and combination thereof. Preferred $R_s$ is selected from the group consisting of alkyl, cycloalkyl, aryl, heteroaryl, and combination thereof.

The term "alkyl" refers to and includes both straight and branched chain alkyl radicals. Preferred alkyl groups are those containing from one to fifteen carbon atoms and includes methyl, ethyl, propyl, 1-methylethyl, butyl, 1-methylpropyl, 2-methylpropyl, pentyl, 1-methylbutyl, 2-methylbutyl, 3-methylbutyl, 1,1-dimethylpropyl, 1,2-dimethylpropyl, 2,2-dimethylpropyl, and the like. Additionally, the alkyl group is optionally substituted.

The term "cycloalkyl" refers to and includes monocyclic, polycyclic, and spiro alkyl radicals. Preferred cycloalkyl groups are those containing 3 to 12 ring carbon atoms and includes cyclopropyl, cyclopentyl, cyclohexyl, bicyclo [3.1.1]heptyl, spiro[4.5]decyl, spiro[5.5]undecyl, adamantyl, and the like. Additionally, the cycloalkyl group is optionally substituted.

The terms "heteroalkyl" or "heterocycloalkyl" refer to an alkyl or a cycloalkyl radical, respectively, having at least one carbon atom replaced by a heteroatom. Optionally the at least one heteroatom is selected from O, S, N, P, B, Si and Se, preferably, O, S or N. Additionally, the heteroalkyl or heterocycloalkyl group is optionally substituted.

The term "alkenyl" refers to and includes both straight and branched chain alkene radicals. Alkenyl groups are essentially alkyl groups that include at least one carbon-carbon double bond in the alkyl chain Cycloalkenyl groups are essentially cycloalkyl groups that include at least one carbon-carbon double bond in the cycloalkyl ring. The term "heteroalkenyl" as used herein refers to an alkenyl radical having at least one carbon atom replaced by a heteroatom. Optionally the at least one heteroatom is selected from O, S, N, P, B, Si, and Se, preferably, O, S, or N. Preferred alkenyl, cycloalkenyl, or heteroalkenyl groups are those containing two to fifteen carbon atoms. Additionally, the alkenyl, cycloalkenyl, or heteroalkenyl group is optionally substituted.

The term "alkynyl" refers to and includes both straight and branched chain alkyne radicals. Preferred alkynyl groups are those containing two to fifteen carbon atoms. Additionally, the alkynyl group is optionally substituted.

The terms "aralkyl" or "arylalkyl" are used interchangeably and refer to an alkyl group that is substituted with an aryl group. Additionally, the aralkyl group is optionally substituted.

The term "heterocyclic group" refers to and includes aromatic and non-aromatic cyclic radicals containing at least one heteroatom. Optionally the at least one heteroatom is selected from O, S, N, P, B, Si, and Se, preferably, O, S, or N. Hetero-aromatic cyclic radicals may be used interchangeably with heteroaryl. Preferred hetero-non-aromatic cyclic groups are those containing 3 to 7 ring atoms which includes at least one hetero atom, and includes cyclic amines such as morpholino, piperidino, pyrrolidino, and the like, and cyclic ethers/thio-ethers, such as tetrahydrofuran, tetrahydropyran, tetrahydrothiophene, and the like. Additionally, the heterocyclic group may be optionally substituted.

The term "aryl" refers to and includes both single-ring aromatic hydrocarbyl groups and polycyclic aromatic ring systems. The polycyclic rings may have two or more rings in which two carbons are common to two adjoining rings (the rings are "fused") wherein at least one of the rings is an aromatic hydrocarbyl group, e.g., the other rings can be cycloalkyls, cycloalkenyls, aryl, heterocycles, and/or heteroaryls. Preferred aryl groups are those containing six to thirty carbon atoms, preferably six to twenty carbon atoms, more preferably six to twelve carbon atoms. Especially preferred is an aryl group having six carbons, ten carbons or twelve carbons. Suitable aryl groups include phenyl, biphenyl, triphenyl, triphenylene, tetraphenylene, naphthalene, anthracene, phenalene, phenanthrene, fluorene, pyrene, chrysene, perylene, and azulene, preferably phenyl, biphenyl, triphenyl, triphenylene, fluorene, and naphthalene. Additionally, the aryl group is optionally substituted.

The term "heteroaryl" refers to and includes both single-ring aromatic groups and polycyclic aromatic ring systems that include at least one heteroatom. The heteroatoms include, but are not limited to O, S, N, P, B, Si, and Se. In many instances, O, S, or N are the preferred heteroatoms. Hetero-single ring aromatic systems are preferably single rings with 5 or 6 ring atoms, and the ring can have from one to six heteroatoms. The hetero-polycyclic ring systems can have two or more rings in which two atoms are common to two adjoining rings (the rings are "fused") wherein at least one of the rings is a heteroaryl, e.g., the other rings can be cycloalkyls, cycloalkenyls, aryl, heterocycles, and/or heteroaryls. The hetero-polycyclic aromatic ring systems can have from one to six heteroatoms per ring of the polycyclic aromatic ring system. Preferred heteroaryl groups are those containing three to thirty carbon atoms, preferably three to twenty carbon atoms, more preferably three to twelve carbon atoms. Suitable heteroaryl groups include dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine, preferably dibenzothiophene, dibenzofuran, dibenzoselenophene, carbazole, indolocarbazole, imidazole, pyridine, triazine, benzimidazole, 1,2-azaborine, 1,3-azaborine, 1,4-azaborine, borazine, and aza-analogs thereof. Additionally, the heteroaryl group is optionally substituted.

The term "polyaromatic" refers to and includes any unsaturated cyclic hydrocarbons containing two or more aryl or heteroaryl rings. Polyaromatic groups include fused aromatic groups.

Of the aryl and heteroaryl groups listed above, the groups of triphenylene, naphthalene, anthracene, dibenzothiophene, dibenzofuran, dibenzoselenophene, carbazole, indolocarbazole, imidazole, pyridine, pyrazine, pyrimidine, triazine, and benzimidazole, and the respective aza-analogs of each thereof are of particular interest.

The terms alkyl, cycloalkyl, heteroalkyl, heterocycloalkyl, alkenyl, cycloalkenyl, heteroalkenyl, alkynyl, aralkyl, heterocyclic group, aryl, and heteroaryl, as used herein, are independently unsubstituted, or independently substituted, with one or more general substituents.

In many instances, the general substituents are selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, and combinations thereof.

In some instances, the preferred general substituents are selected from the group consisting of deuterium, fluorine, alkyl, cycloalkyl, heteroalkyl, alkoxy, aryloxy, amino, silyl, alkenyl, cycloalkenyl, heteroalkenyl, aryl, heteroaryl, nitrile, isonitrile, sulfanyl, and combinations thereof.

In some instances, the preferred general substituents are selected from the group consisting of deuterium, fluorine, alkyl, cycloalkyl, alkoxy, aryloxy, amino, silyl, aryl, heteroaryl, sulfanyl, and combinations thereof.

In yet other instances, the more preferred general substituents are selected from the group consisting of deuterium, fluorine, alkyl, cycloalkyl, aryl, heteroaryl, and combinations thereof.

The terms "substituted" and "substitution" refer to a substituent other than H that is bonded to the relevant position, e.g., a carbon or nitrogen. For example, when R1 represents mono-substitution, then one R1 must be other than H (i.e., a substitution). Similarly, when R1 represents di-substitution, then two of R1 must be other than H.

Similarly, when R1 represents no substitution, R1, for example, can be a hydrogen for available valencies of ring atoms, as in carbon atoms for benzene and the nitrogen atom in pyrrole, or simply represents nothing for ring atoms with fully filled valencies, e.g., the nitrogen atom in pyridine. The maximum number of substitutions possible in a ring structure will depend on the total number of available valencies in the ring atoms.

As used herein, "combinations thereof" indicates that one or more members of the applicable list are combined to form a known or chemically stable arrangement that one of ordinary skill in the art can envision from the applicable list. For example, an alkyl and deuterium can be combined to form a partial or fully deuterated alkyl group; a halogen and alkyl can be combined to form a halogenated alkyl substituent; and a halogen, alkyl, and aryl can be combined to form a halogenated arylalkyl. In one instance, the term substitution includes a combination of two to four of the listed groups. In another instance, the term substitution includes a combination of two to three groups. In yet another instance, the term substitution includes a combination of two groups. Preferred combinations of substituent groups are those that contain up to fifty atoms that are not hydrogen or deuterium, or those which include up to forty atoms that are not hydrogen or deuterium, or those that include up to thirty atoms that are not hydrogen or deuterium. In many instances, a preferred combination of substituent groups will include up to twenty atoms that are not hydrogen or deuterium.

The "aza" designation in the fragments described herein, i.e. aza-dibenzofuran, aza-dibenzothiophene, etc. means that one or more of the C—H groups in the respective aromatic ring can be replaced by a nitrogen atom, for example, and without any limitation, azatriphenylene encompasses both dibenzo[f,h]quinoxaline and dibenzo[f,h]quinoline. One of ordinary skill in the art can readily envision other nitrogen analogs of the aza-derivatives described above, and all such analogs are intended to be encompassed by the terms as set forth herein.

As used herein, "deuterium" refers to an isotope of hydrogen. Deuterated compounds can be readily prepared using methods known in the art. For example, U.S. Pat. No. 8,557,400, Patent Pub. No. WO 2006/095951, and U.S. Pat. Application Pub. No. US 2011/0037057, which are hereby incorporated by reference in their entireties, describe the making of deuterium-substituted organometallic complexes. Further reference is made to Ming Yan, et al., Tetrahedron 2015, 71, 1425-30 and Atzrodt et al., Angew. Chem. Int. Ed. (Reviews) 2007, 46, 7744-65, which are incorporated by reference in their entireties, describe the deuteration of the methylene hydrogens in benzyl amines and efficient pathways to replace aromatic ring hydrogens with deuterium, respectively.

It is to be understood that when a molecular fragment is described as being a substituent or otherwise attached to another moiety, its name may be written as if it were a fragment (e.g. phenyl, phenylene, naphthyl, dibenzofuryl) or as if it were the whole molecule (e.g. benzene, naphthalene, dibenzofuran). As used herein, these different ways of designating a substituent or attached fragment are considered to be equivalent.

In some instance, a pair of adjacent substituents can be optionally joined or fused into a ring. The preferred ring is a five, six, or seven-membered carbocyclic or heterocyclic ring, includes both instances where the portion of the ring formed by the pair of substituents is saturated and where the portion of the ring formed by the pair of substituents is unsaturated. As used herein, "adjacent" means that the two substituents involved can be on the same ring next to each other, or on two neighboring rings having the two closest available substitutable positions, such as 2, 2' positions in a biphenyl, or 1, 8 position in a naphthalene, as long as they can form a stable fused ring system.

In one aspect, the present disclosure relates to an organic light emitting device (OLED) comprising an anode; a cathode; and a light emitting layer, disposed between the anode and the cathode, the light emitting layer comprising: a transition metal dichalcogenide monolayer; and a passivation layer comprising a transition metal oxide and an organic electron donor material. In one embodiment, the passivation layer has been irradiated with a laser.

In one embodiment, the transition metal dichalcogenide monolayer comprises a transition metal dichalcogenide. In one embodiment, a transition metal dichalcogenide is a compound formed from one transition metal atom and two chalcogenide atoms. In one embodiment, the transition metal dichalcogenide has the molecular formula $MX_2$, wherein M represents a transition metal and X represents a chalcogen.

Devices fabricated in accordance with embodiments of the disclosure can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the disclosure can be incorporated into a wide variety of consumer products that have one or more of the electronic component modules (or units) incorporated therein. A consumer product comprising an OLED that includes the compound of the present disclosure in the organic layer in the OLED is disclosed. Such consumer products would include any kind of products that include one or more light source(s) and/or one or more of some type of visual displays. Some examples of such consumer products include flat panel displays, computer monitors, medical monitors, televisions, billboards, lights for interior or exterior illumination and/or signaling, heads-up displays, fully or partially transparent displays, flexible displays, laser printers, telephones, mobile phones, tablets, phablets, personal digital assistants (PDAs), wearable devices, laptop computers, digital cameras, camcorders, viewfinders, micro-displays (displays that are less than 2 inches diagonal), 3-D displays, virtual reality or augmented reality displays, vehicles, video walls comprising multiple displays tiled together, theater or stadium screen, a light therapy device, and a sign. Various control mechanisms may be used to control devices fabricated in accordance with the present disclosure, including passive matrix and active matrix. Many of the devices are intended for use in a temperature range comfortable to humans, such as 18 C to 30 C, and more preferably at room temperature (20-25 C), but could be used outside this temperature range, for example, from −40 C to 80 C.

In one embodiment, the OLED described herein may be incorporated into a consumer product selected from the group consisting of a flat panel display, a computer monitor, a medical monitor, a television, a billboard, a light for interior or exterior illumination and/or signaling, a heads-up display, a fully or partially transparent display, a flexible display, a laser printer, a telephone, a cell phone, tablet, a phablet, a personal digital assistant (PDA), a wearable device, a laptop computer, a digital camera, a camcorder, a viewfinder, a micro-display that is less than 2 inches diagonal, a 3-D display, a virtual reality or augmented reality display, a vehicle, a video wall comprising multiple displays tiled together, a theater or stadium screen, a light therapy device, and a sign.

Although certain embodiments of the disclosure are discussed in relation to one particular device or type of device (for example OLEDs) it is understood that the disclosed improvements to light outcoupling properties of a substrate may be equally applied to other devices, including but not limited to PLEDs, OPVs, charge-coupled devices (CCDs), photosensors, or the like.

In one embodiment, the light emitting layer includes a stack of light emitting sublayers. In another embodiment, the light emitting layer includes light emitting sublayers that are arranged in a horizontally adjacent pattern, e.g., to from adjacent sub-pixels or an electronic display. For example, the light emitting body can includes separate red and green light emitting sublayers in a stacked or side-by-side (i.e., adjacent) arrangement.

The emitting layer can further include one or more phosphorescent emitter compounds doped into a host material, wherein the phosphorescent emitter compound has a peak light emission wavelength in a range from 400 nm to 650 nm. In some instances, the light emitting layer can also include a fluorescent emitter compound or a thermal-assisted delayed fluorescent (TADF) emitter compound. For example, the emitting layer can include fluorescent or TADF compound with a peak light emission wavelength in a range from 430 nm to 500 nm.

In one embodiment, the electronic light display is a white-light organic electroluminescent device (WOLED).

Devices of the present disclosure may comprise one or more electrodes, some of which may be fully or partially transparent or translucent. In some embodiments, one or more electrodes comprise indium tin oxide (ITO) or other transparent conductive materials. In some embodiments, one or more electrodes may comprise flexible transparent and/or conductive polymers.

The term "transition metal" as used herein, refers to chemical elements from the groups 3 through 12 columns of the periodic table, most notably Titanium (Ti), Vanadium (V), Chromium (Cr), Manganese (Mn), Iron (Fe), Cobalt (Co), Nickel (Ni), Copper (Cu), Zinc (Zn), Zirconium (Zr), Niobium (Nb), Molybdenum (Mo), Technetium (Tc), Ruthenium (Ru), Rhodium (Rh), Palladium (Pd), Silver (Ag), Cadmium (Cd), Hafnium (Hf), Tantalum (Ta), Tungsten (W), Rhenium (Re), Osmium (Os), Iridium (Ir), Platinum (Pt), Gold (Au), and Mercury (Hg). According to the present techniques, the chalcogen sources employed are preferably elemental chalcogens which do not contain unwanted impurities, such as carbon, oxygen and halogens.

The term "chalcogens," as used herein, refers to chemical elements from the group 16 column of the periodic table, most notably sulfur (S), selenium (Se) and tellurium (Te). According to the present techniques, the chalcogen sources employed are preferably elemental chalcogens which do not contain unwanted impurities, such as carbon, oxygen and halogens.

Exemplary transition metal dichalcogenides include, but are not limited to, $MoS_2$, $TiS_2$, $WS_2$, $VS_2$, $TiSe_2$, $MoSe_2$, $WSe_2$, $TaSe_2$, $NbSe_2$, $NiTe_2$, and $Bi_2Te_3$. In one embodiment, the transition metal dichalcogenide comprises $MoS_2$. In one embodiment, the transition metal dichalcogenide comprises $WS_2$.

In one embodiment, the transition metal dichalcogenide monolayer has a thickness of about 1 unit cell. In one embodiment, the transition metal transition metal dichalcogenide monolayer has a thickness of about 6.5 Å.

Non-limiting examples of the host materials that may be used in an OLED in combination with materials disclosed herein are exemplified below together with references that disclose those materials: EP2034538, EP2034538A, EP2757608, JP2007254297, KR20100079458, KR20120088644, KR20120129733, KR20130115564, TW201329200, US20030175553, US20050238919, US20060280965, US20090017330, US20090030202, US20090167162, US20090302743, US20090309488, US20100012931, US20100084966, US20100187984, US2010187984, US2012075273, US2012126221, US2013009543, US2013105787, US2013175519, US2014001446, US20140183503, US20140225088, US2014034914, U.S. Pat. No. 7,154,114, WO2001039234, WO2004093207, WO2005014551, WO2005089025, WO2006072002, WO2006114966, WO2007063754, WO2008056746, WO2009003898, WO2009021126, WO2009063833, WO2009066778, WO2009066779, WO2009086028, WO2010056066, WO2010107244, WO2011081423, WO2011081431, WO2011086863, WO2012128298, WO2012133644, WO2012133649, WO2013024872, WO2013035275, WO2013081315, WO2013191404, WO2014142472, US20170263869, US20160163995, U.S. Pat. No. 9,466,803,

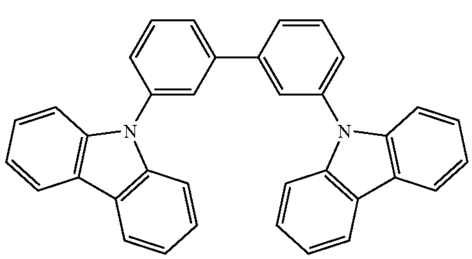

,
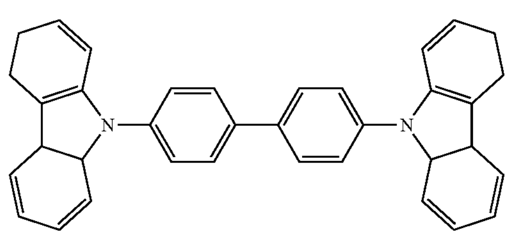

,

-continued
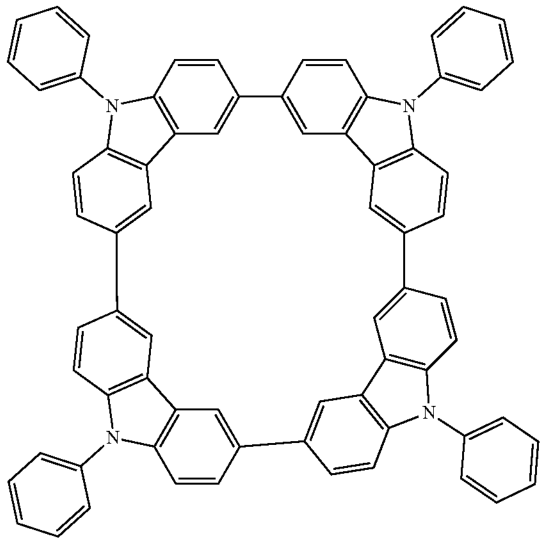
,
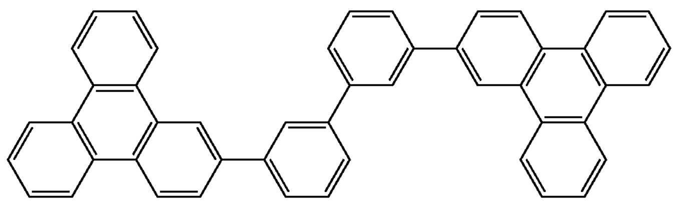
,
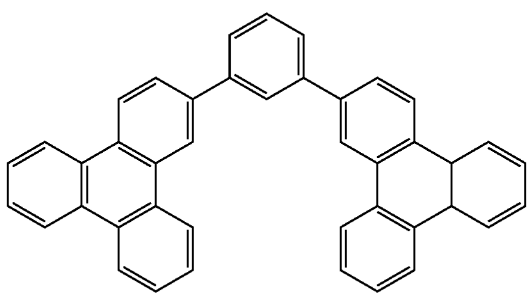
,
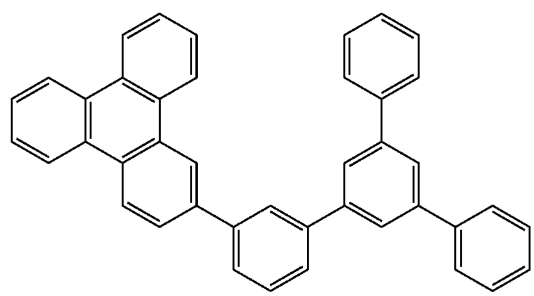
,
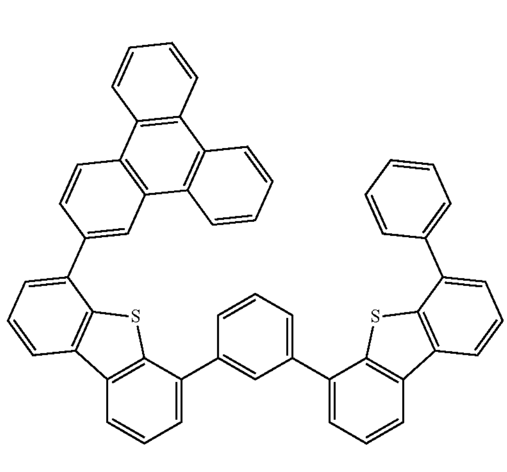
,
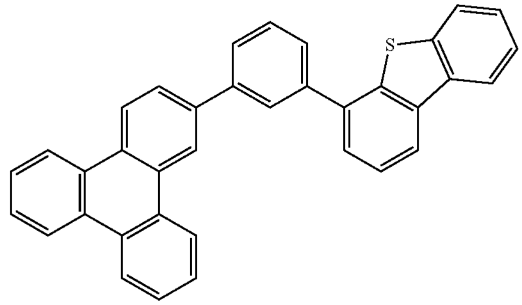
, -continued
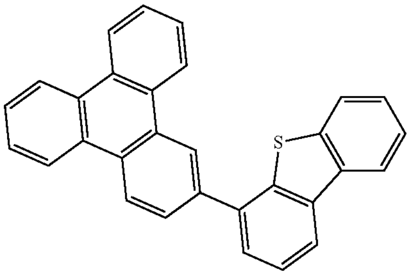,
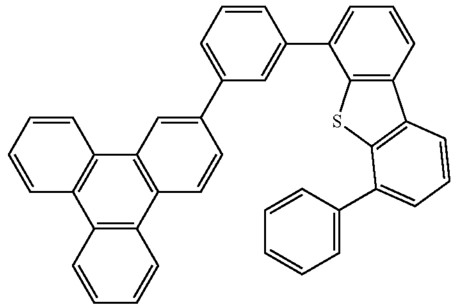,
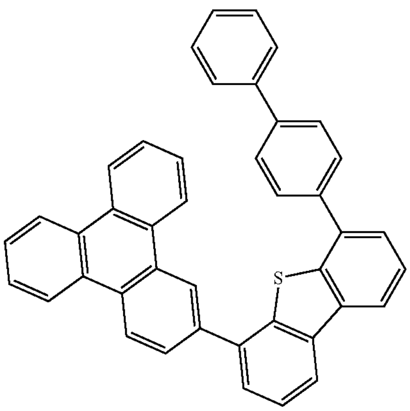,
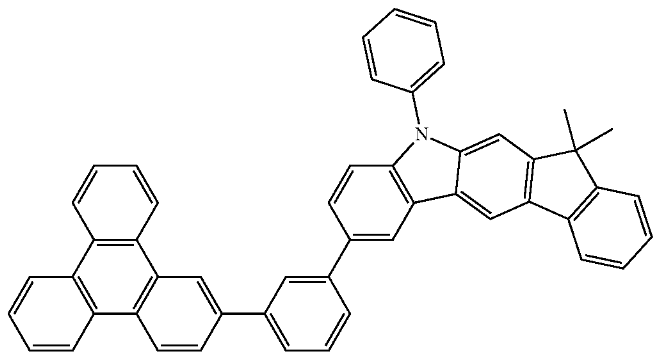,
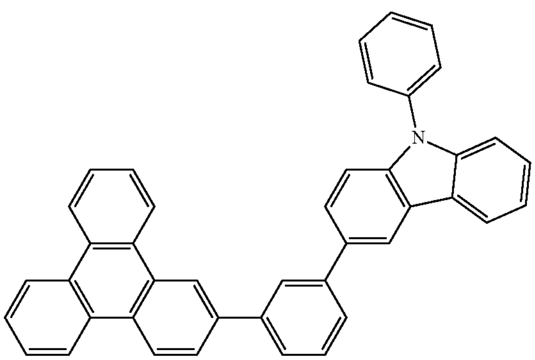,
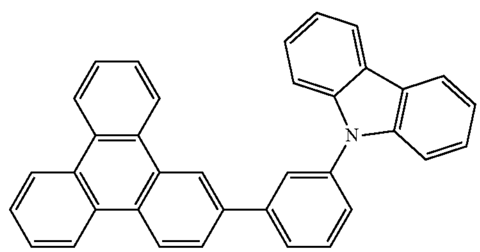,
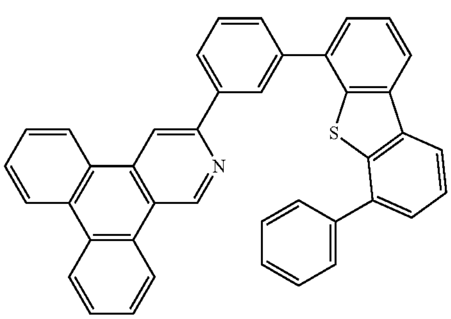,
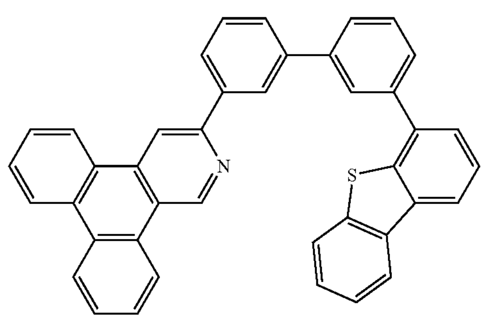,
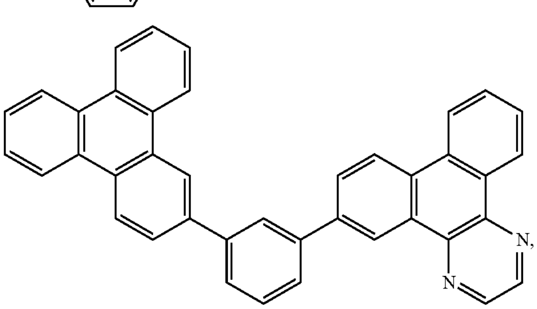,
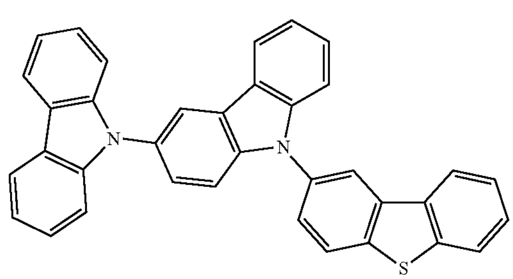, -continued
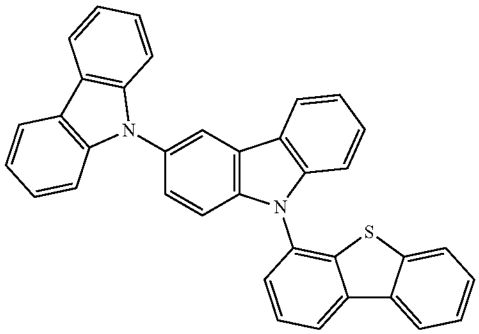
,
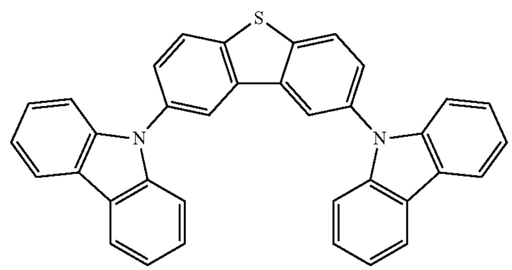
,
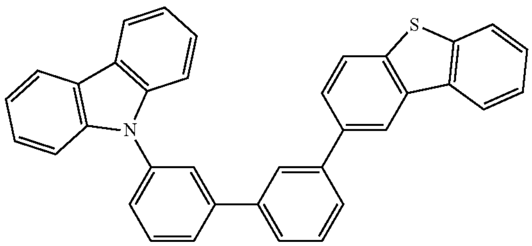
,
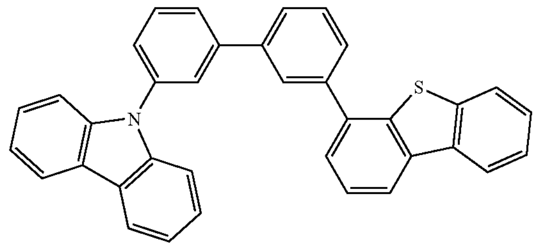
,
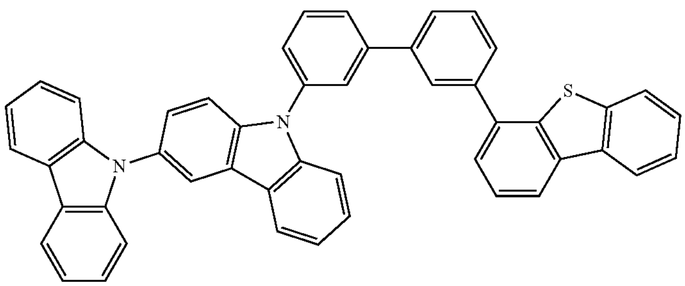
,
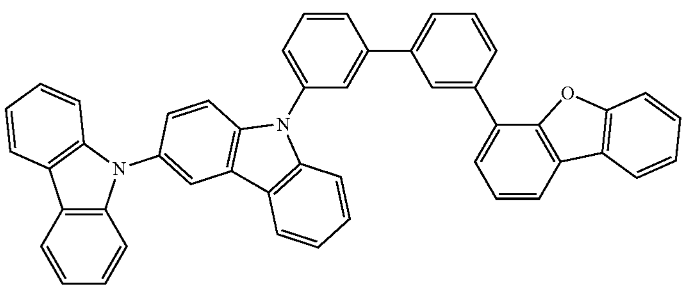
,
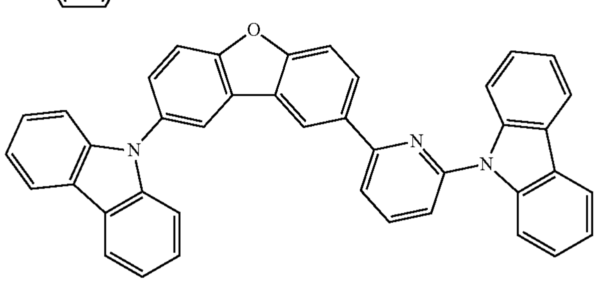
,
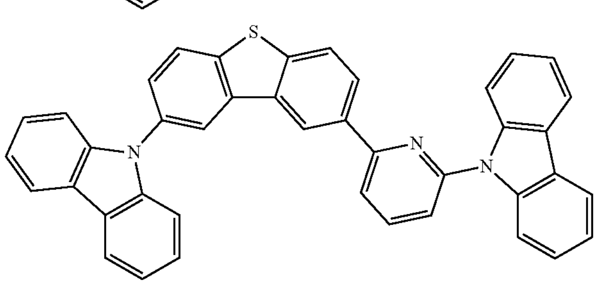
, -continued
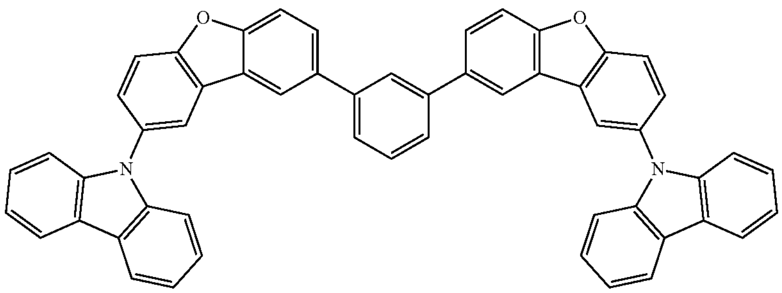
,
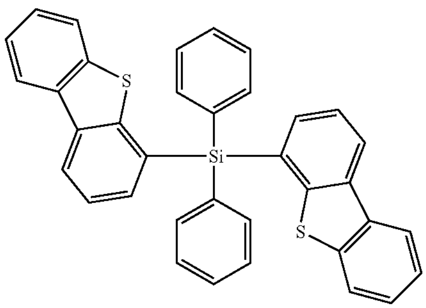
,
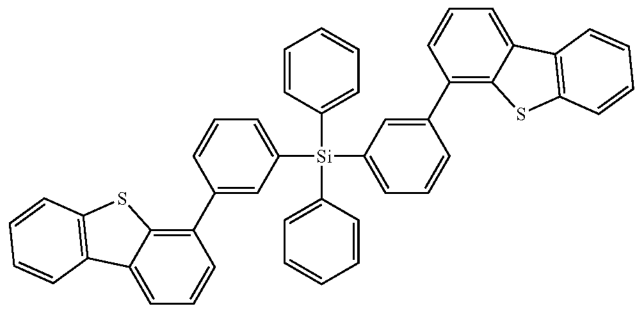
,
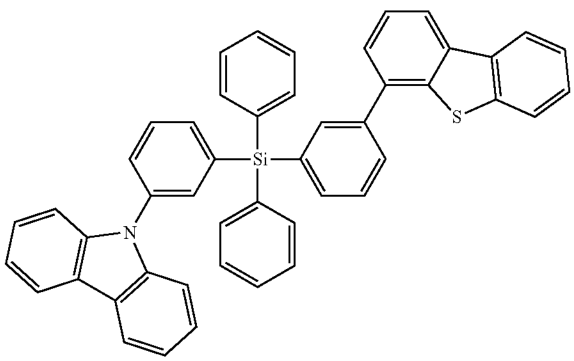
,
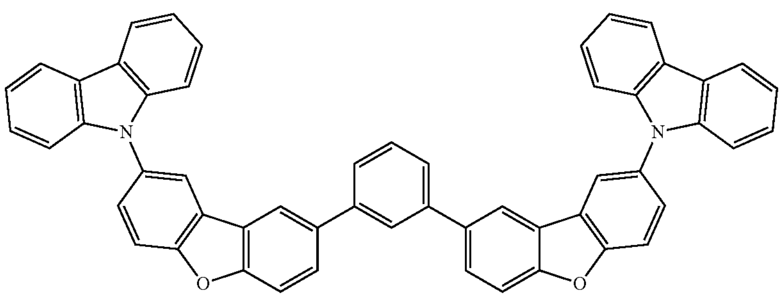
,
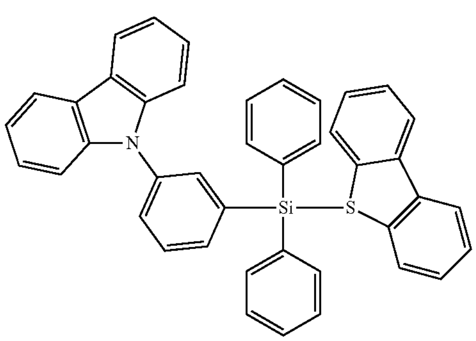
,
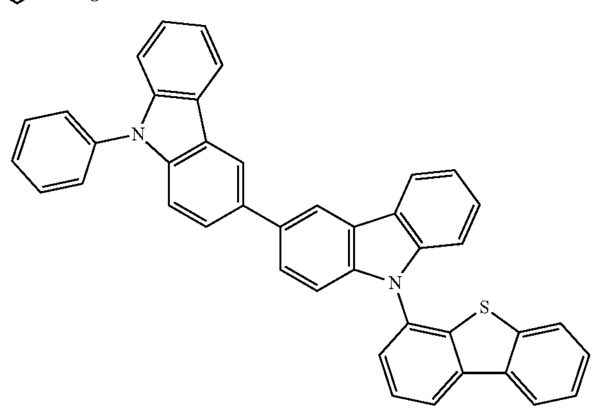
, -continued
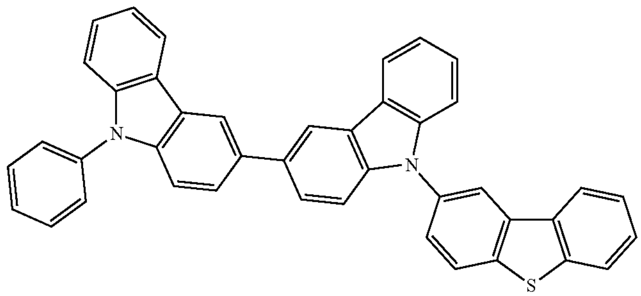
,
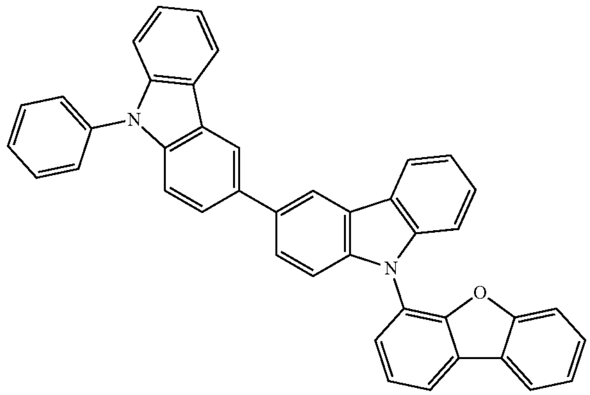
,
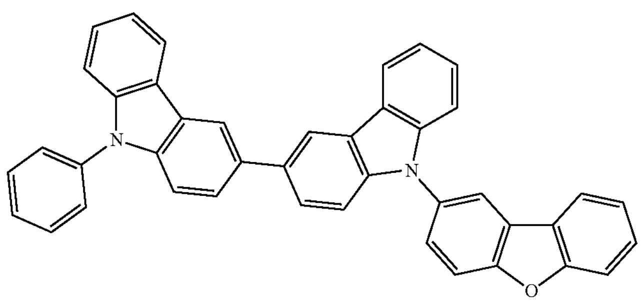
,
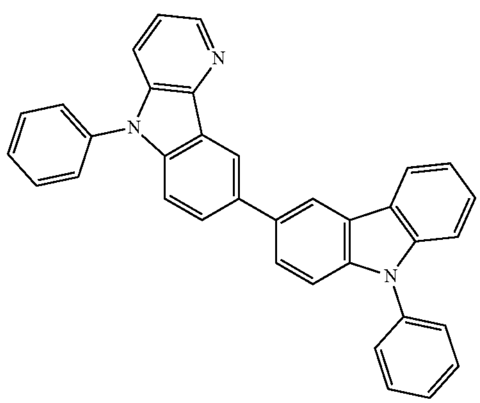
,
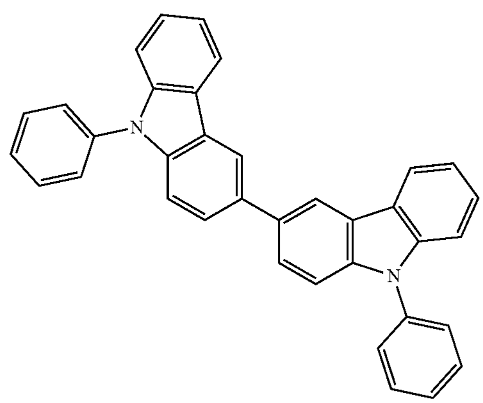
,
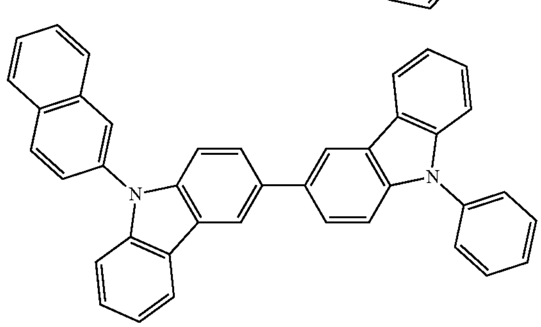
, -continued
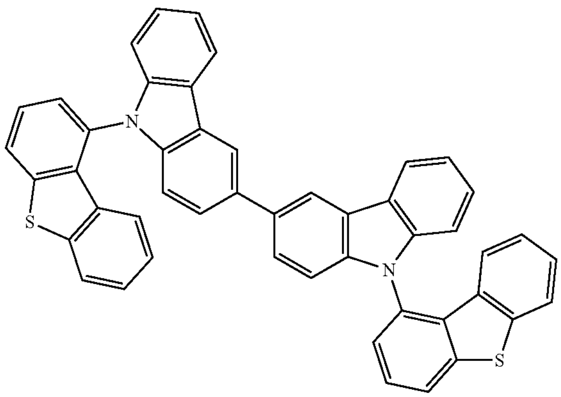
,
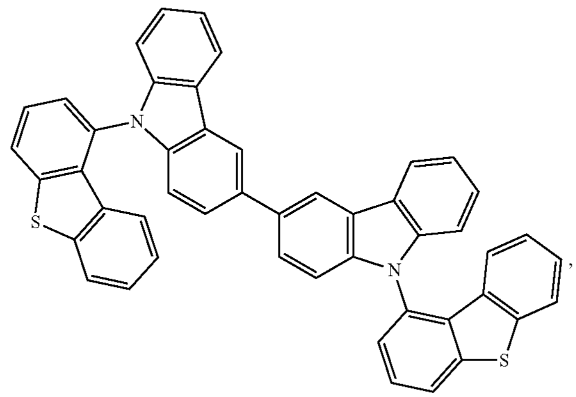
,
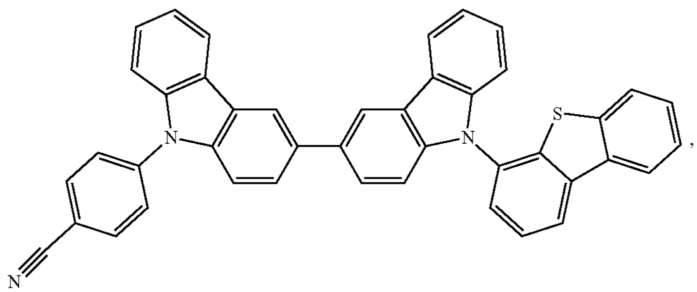
,
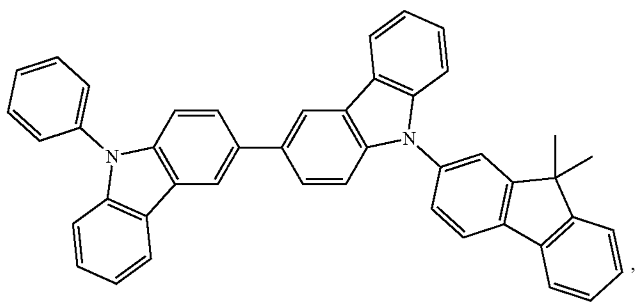
,
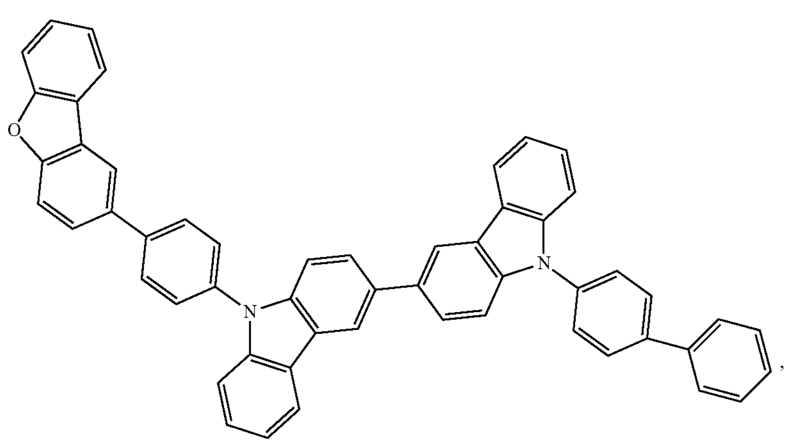
, -continued
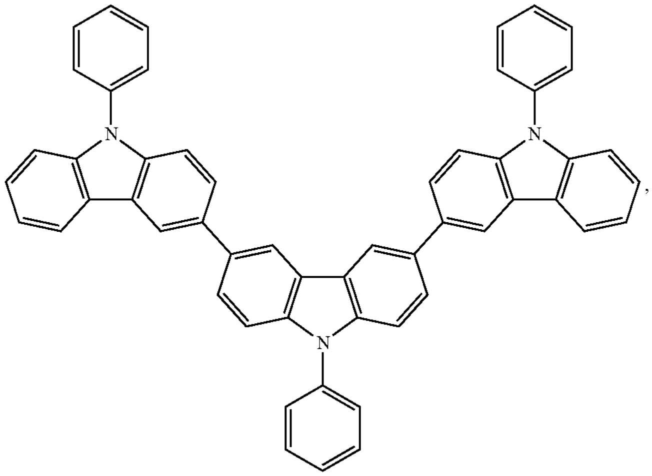
,
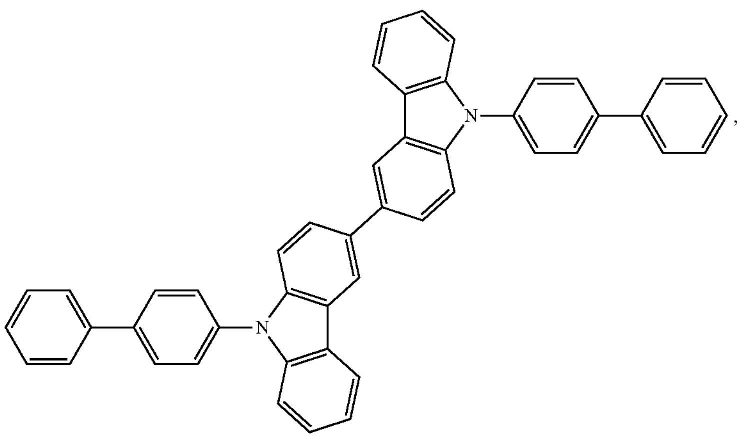
,
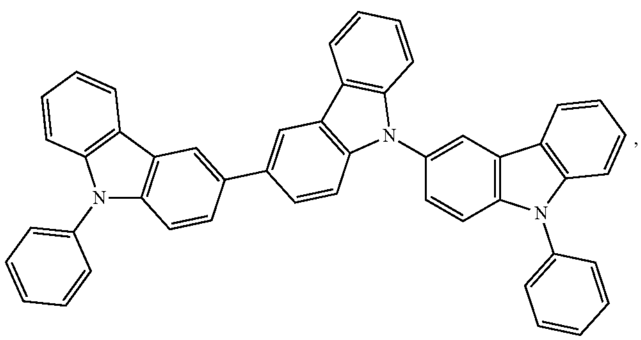
,
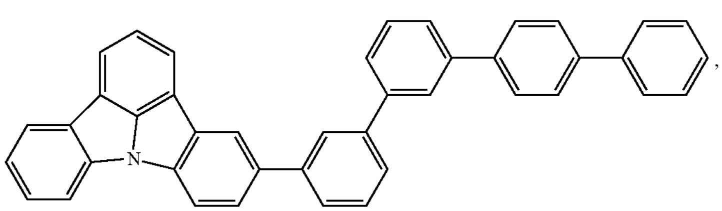
, -continued
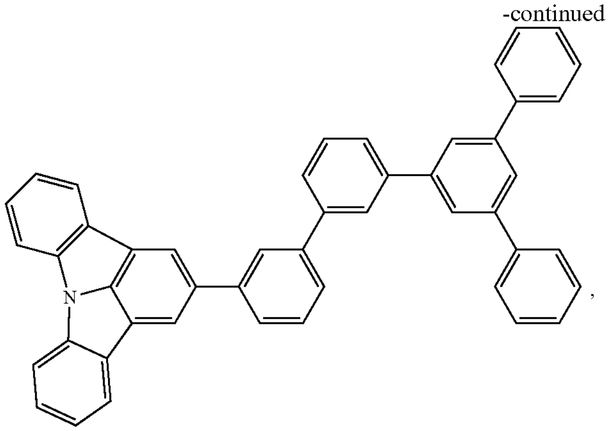
,
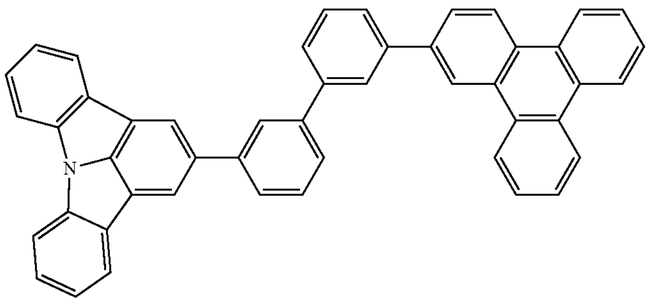
,
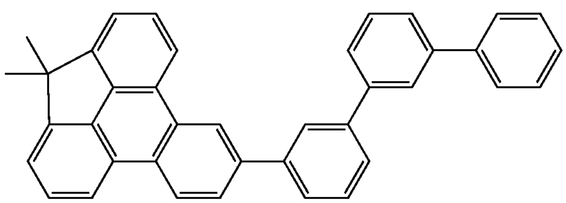
,
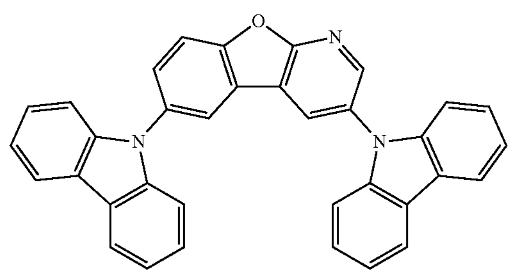
,
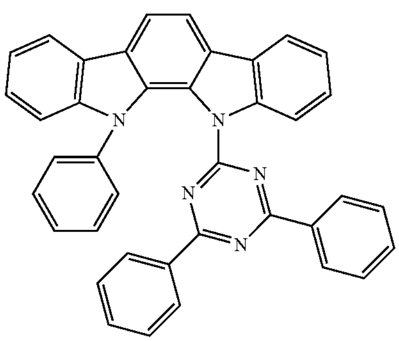
,
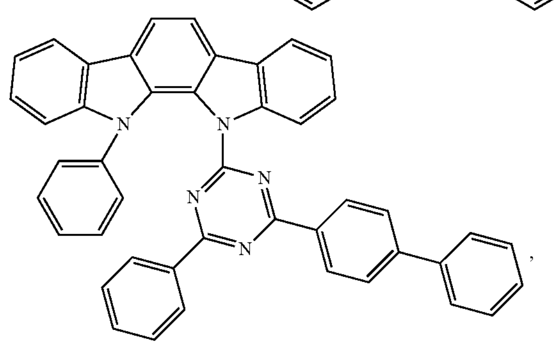
,
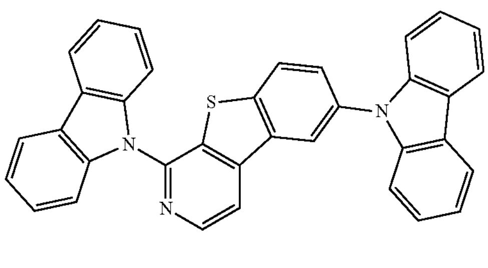
,
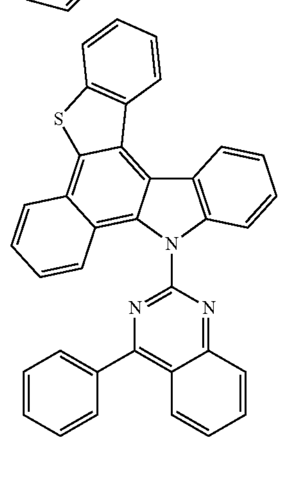
,
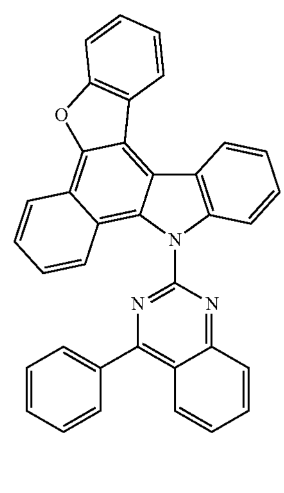
, -continued
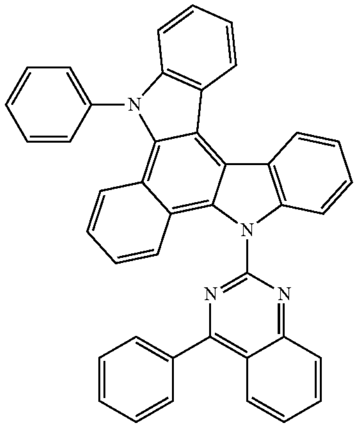,
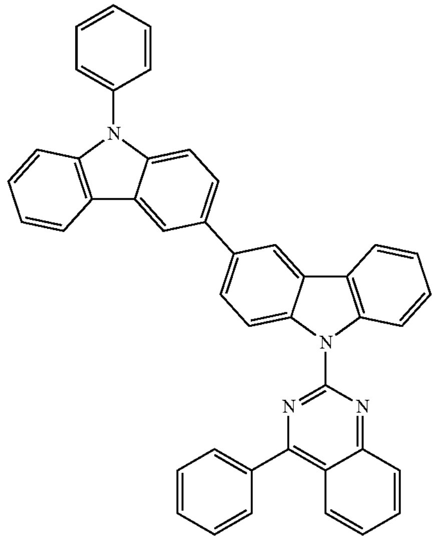,
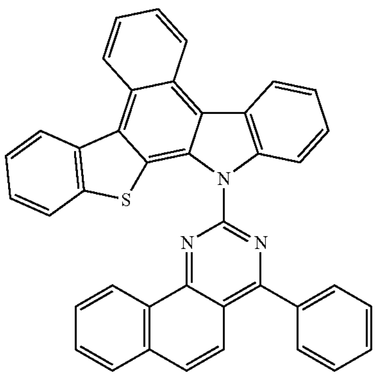,
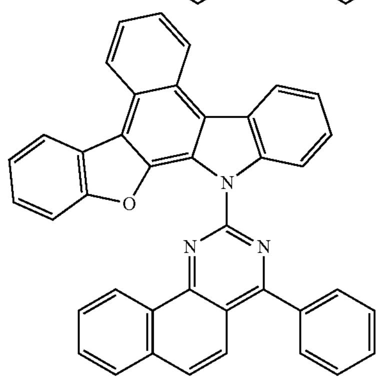,
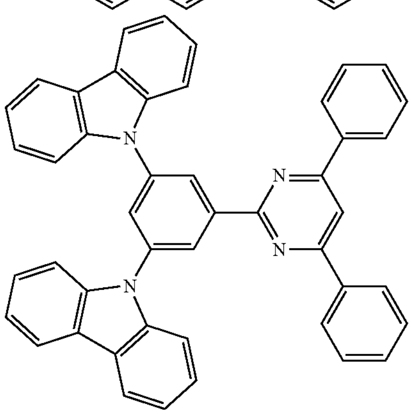,
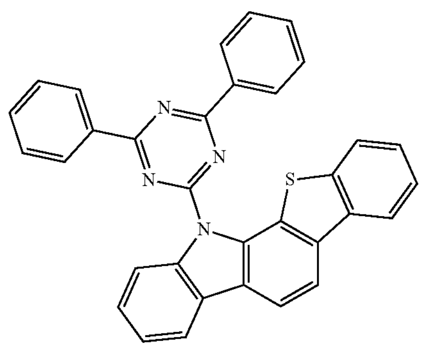,
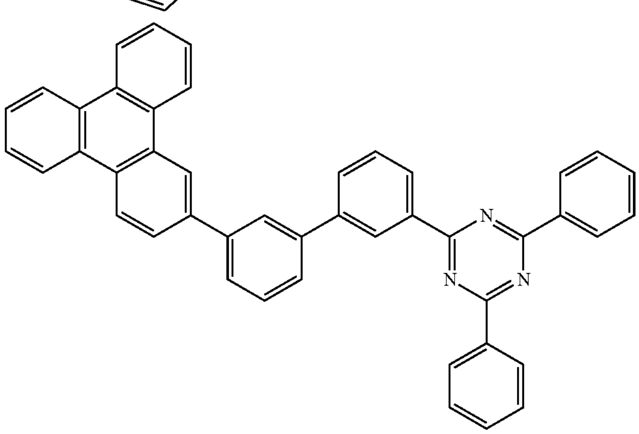, -continued
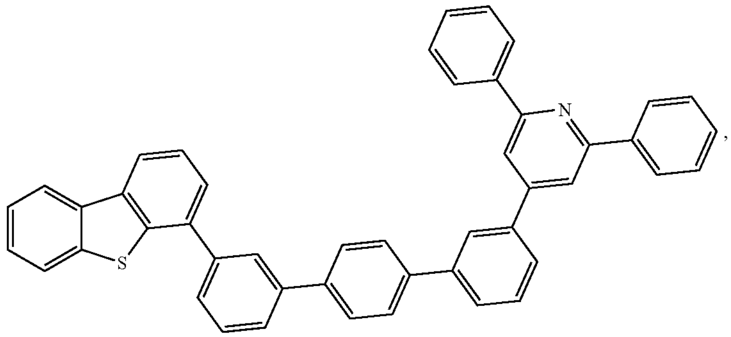
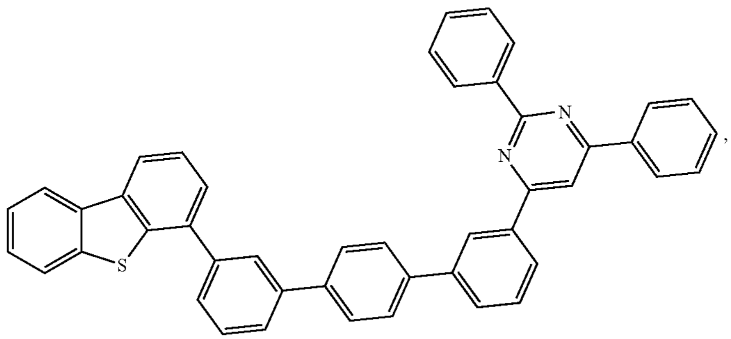
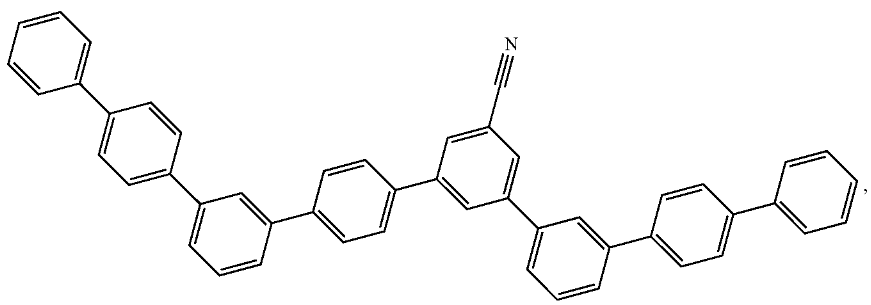
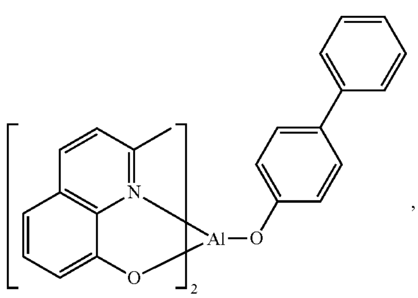
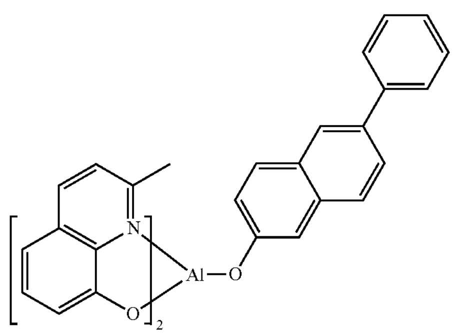
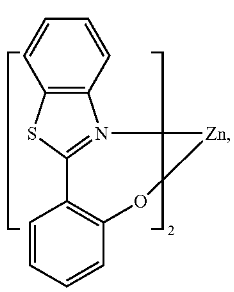
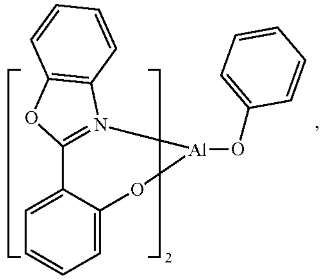
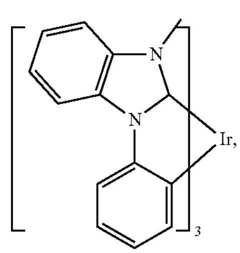

-continued
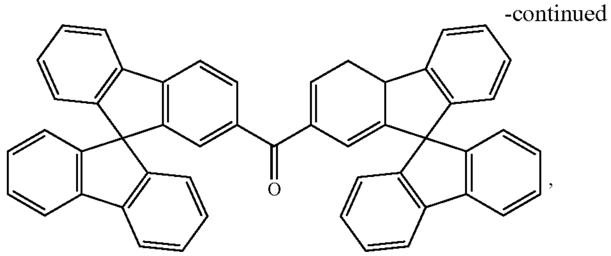
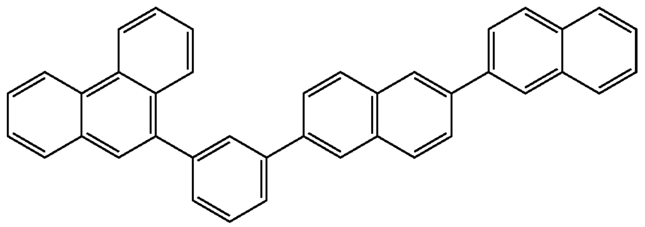
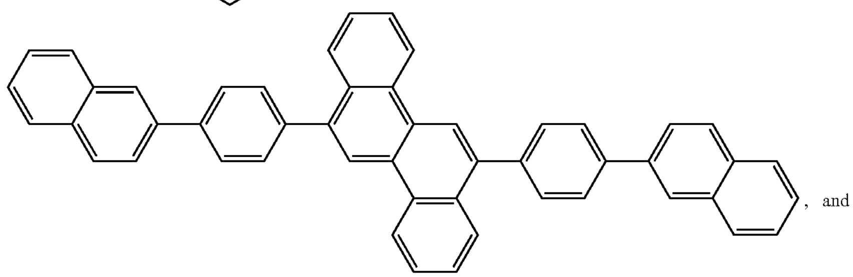
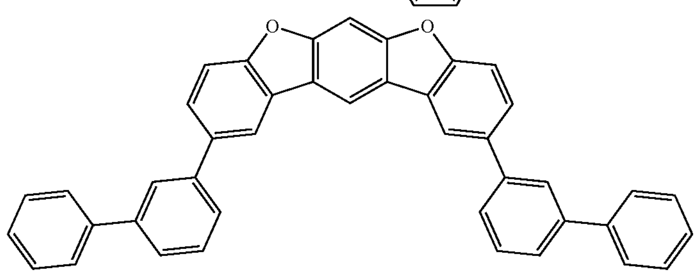
In some embodiments, the host comprises
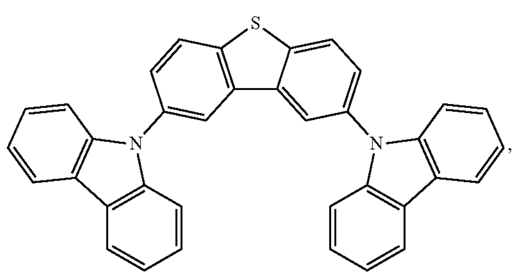
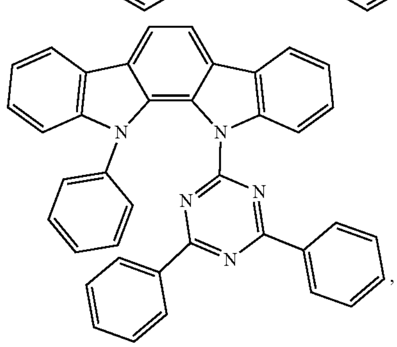
-continued
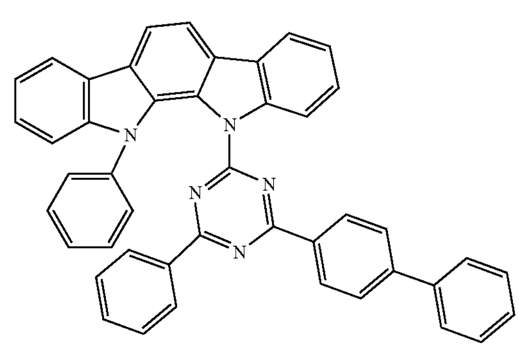

-continued
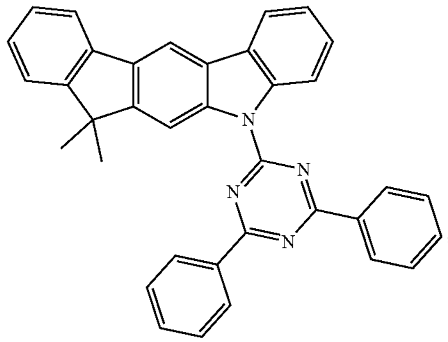
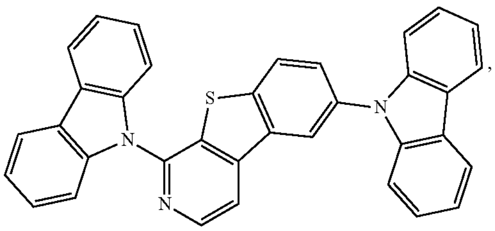
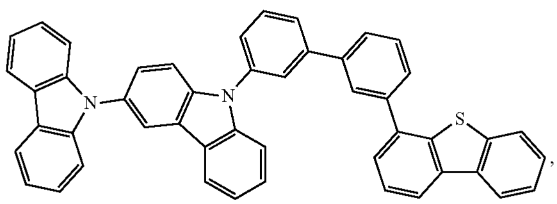
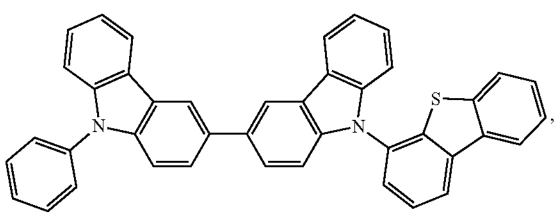
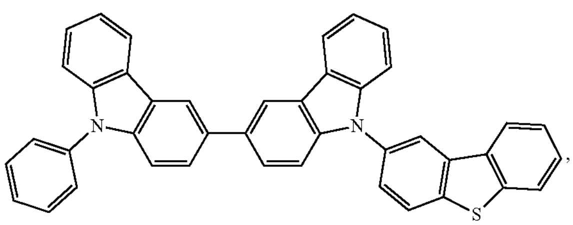
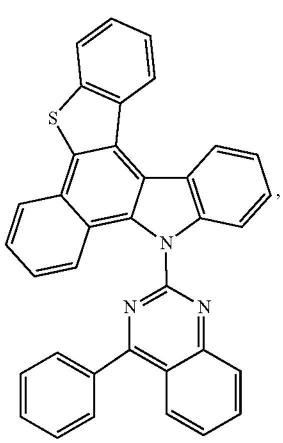
-continued
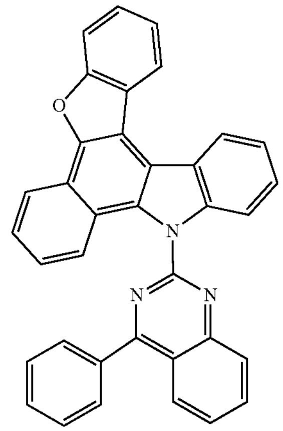
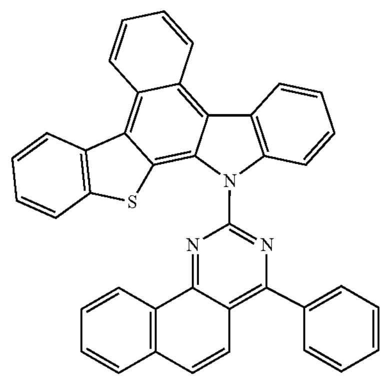
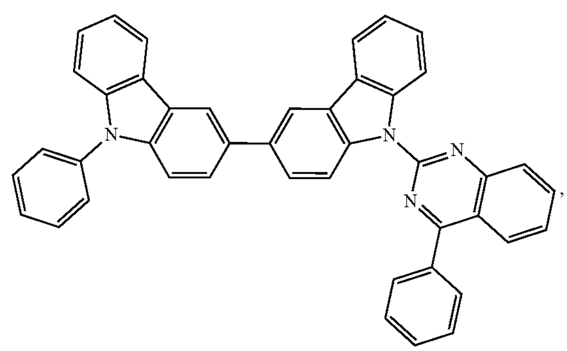
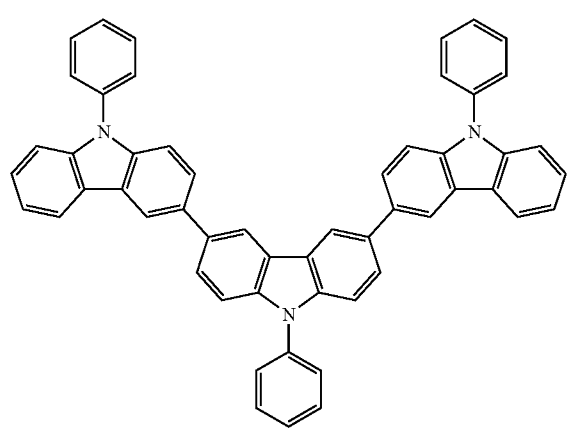

-continued
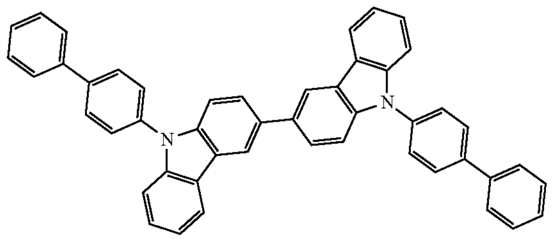
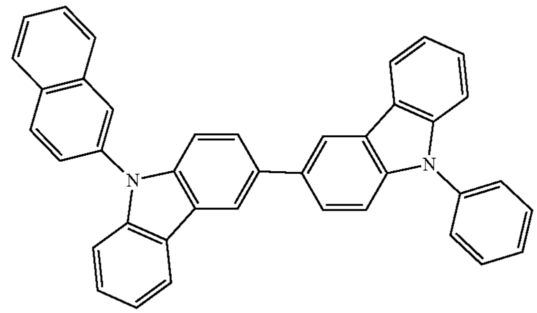
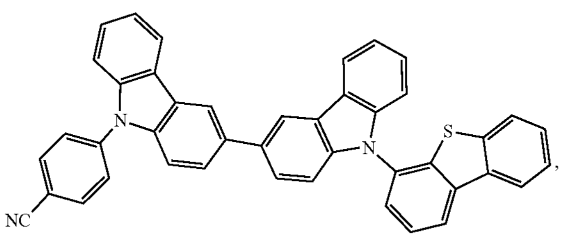
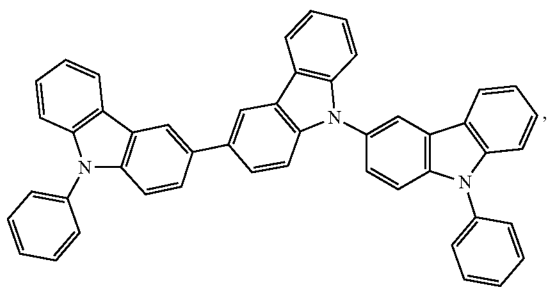
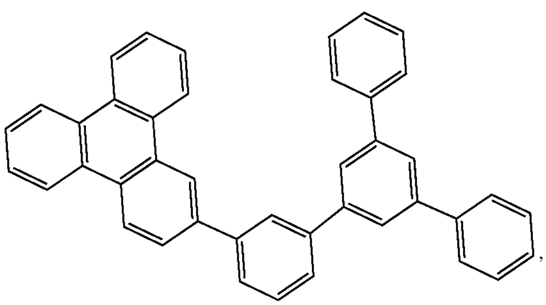
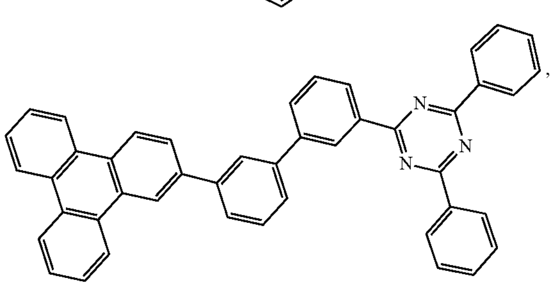
-continued
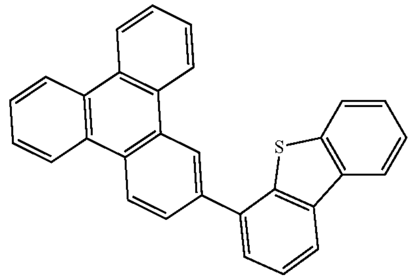
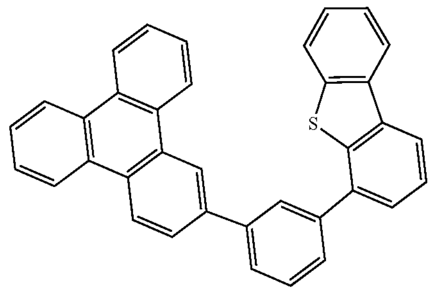
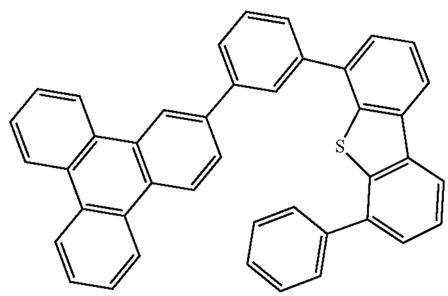
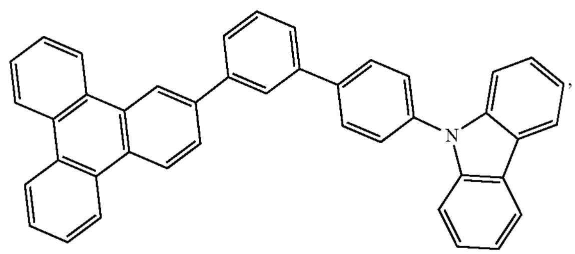
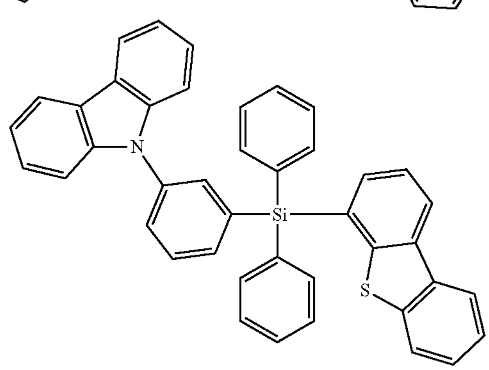
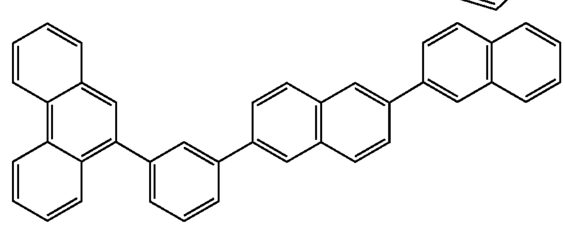
or combinations thereof.

In some embodiments, the emissive layer may be positioned between a hole transport layer and an electron transport layer, where one side of the emissive layer is an EML-ETL interface and the other side of the emissive layer is an EML-HTL interface. In various embodiments, intermediate layers may be positioned between the HTL or ETL and the EML. In some embodiments, a thin layer of TMDC may be positioned within the emissive layer, at a distance x from the HTL. In some embodiments, the distance x may be in a range from 1 nm to 500 nm, or from 1 nm to 100 nm, or between 2 nm and 80 nm, or between 3 nm and 50 nm, or between 5 nm and 20 nm, or between 10 nm and 15 nm, or about 12 nm. In some embodiments, the thin TMDC layer may be a monolayer, for example a $WS_2$ monolayer. In some embodiments, the TMDC layer may be a thin layer of a TMDC material wherein the transition dipole moments of the molecules of the material may be at least 50% aligned parallel to the emissive layer, or at least 60%, at least 70%, at least 80%, at least 90%, at least 95%, or 100% aligned parallel to the emissive layer. In some embodiments, the thin TMDC layer may have a thickness of at most 20 Å, at most 15 Å, at most 10 Å, at most 8 Å, at most 6 Å, at most 4 Å, at most 2 Å, at most 1 Å, or at most 0.5 Å.

Although particular exemplary embodiments of the disclosure are described as achieving an external quantum efficiency (EQE) of about 1%, it is understood that the systems and methods disclosed herein could be used to achieve a device EQE of at least 0.5%, at least 1%, at least 2%, at least 5%, at least 10%, at least 15%, at least 20%, at least 30%, at least 40%, at least 50%, at least 75%, at least 90%, at least 95%, or up to 100%.

More examples for each of these layers are available and will be apparent to those having ordinary skill in the art. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

Various materials may be used for the various emissive and non-emissive layers and arrangements disclosed herein. Examples of suitable materials are disclosed in U.S. Patent Application Publication No. 2017/0229663, which is incorporated by reference in its entirety.

Conductivity Dopants

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

Non-limiting examples of the conductivity dopants that may be used in an OLED in combination with materials disclosed herein are exemplified below together with references that disclose those materials: EP01617493, EP01968131, EP2020694, EP2684932, US20050139810, US20070160905, US20090167167, US2010288362, WO06081780, WO2009003455, WO2009008277, WO2009011327, WO2014009310, US2007252140, US2015060804, US20150123047, and US2012146012.

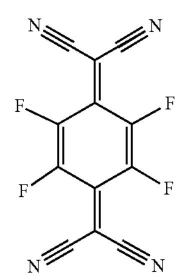

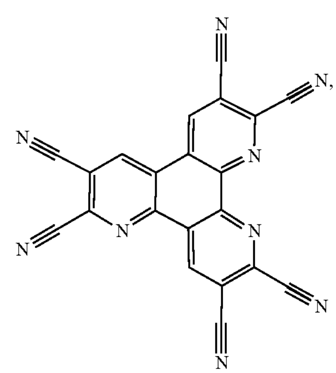

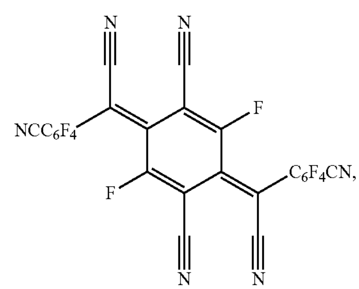

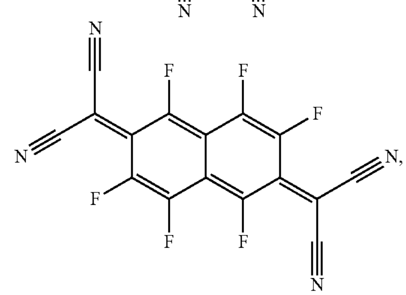

-continued

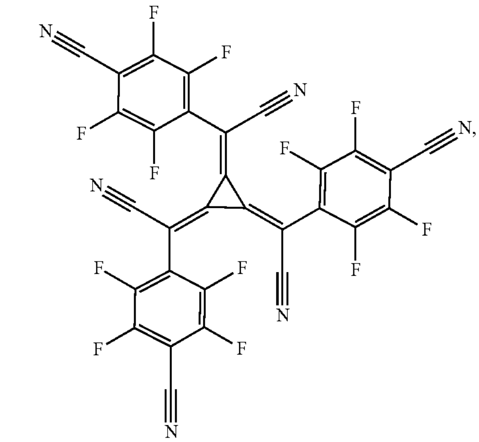

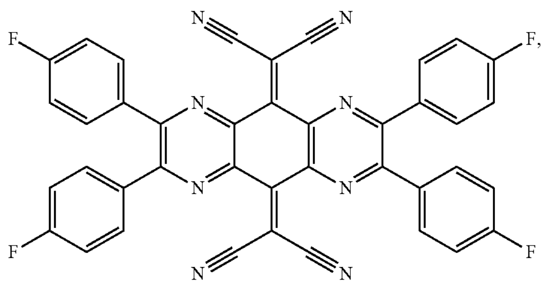

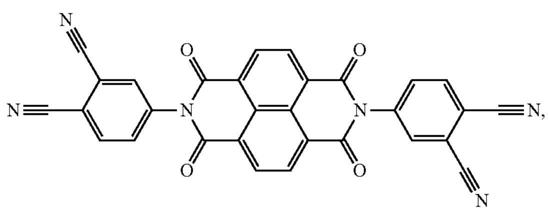

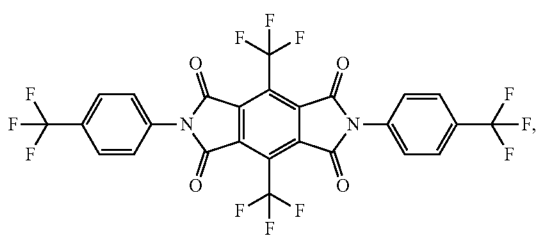

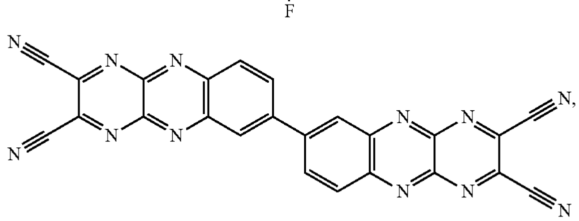

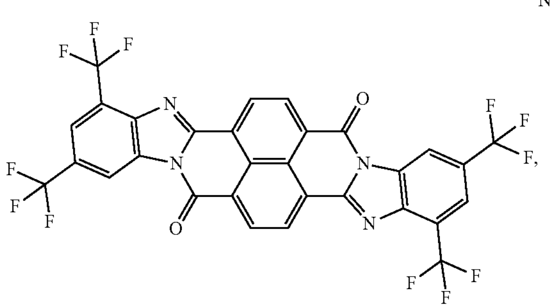

-continued

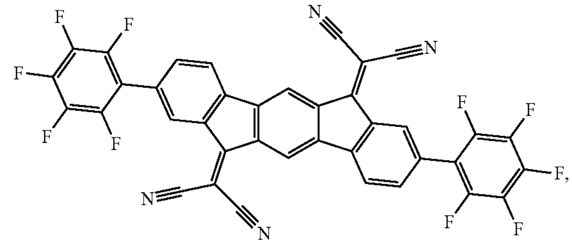

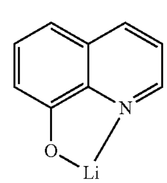

, and

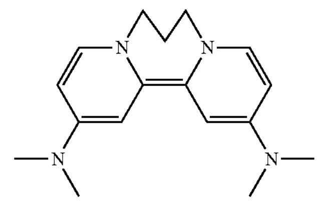

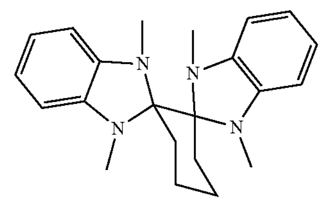

HIL/HTL

A hole injecting/transporting material to be used in the present invention is not particularly limited, and any compound may be used as long as the compound is typically used as a hole injecting/transporting material. Examples of the material include, but are not limited to: a phthalocyanine or porphyrin derivative; an aromatic amine derivative; an indolocarbazole derivative; a polymer containing fluorohydrocarbon; a polymer with conductivity dopants; a conducting polymer, such as PEDOT/PSS; a self-assembly monomer derived from compounds such as phosphoric acid and silane derivatives; a metal oxide derivative, such as $MOO_x$; a p-type semiconducting organic compound, such as 1,4,5,8,9,12-Hexaazatriphenylenehexacarbonitrile; a metal complex, and a cross-linkable compounds.

Examples of aromatic amine derivatives used in HIL or HTL include, but not limit to the following general structures:

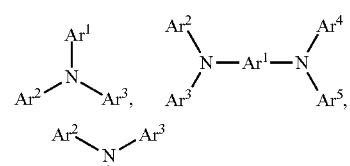

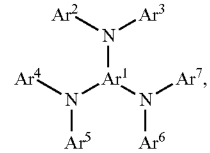

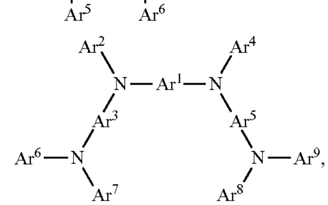

and

-continued

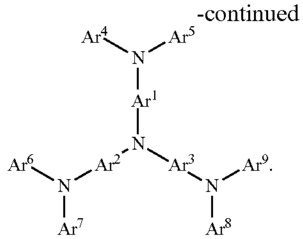

Each of $Ar^1$ to $Ar^9$ is selected from the group consisting of aromatic hydrocarbon cyclic compounds such as benzene, biphenyl, triphenyl, triphenylene, naphthalene, anthracene, phenalene, phenanthrene, fluorene, pyrene, chrysene, perylene, and azulene; the group consisting of aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and the group consisting of 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Each Ar may be unsubstituted or may be substituted by a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acids, ether, ester, nitrile, isonitrile, sulfanyl, sulfinyl, sulfonyl, phosphino, and combinations thereof.

In one aspect, $Ar^{101}$ to $Ar^9$ is independently selected from the group consisting of:

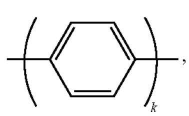,
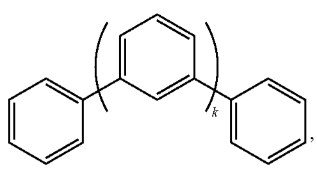,
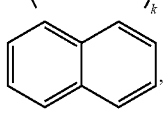,
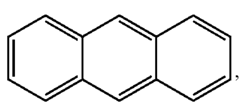,
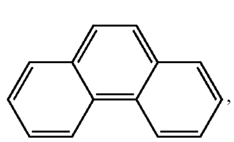,
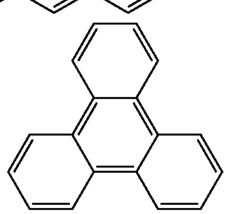,

-continued

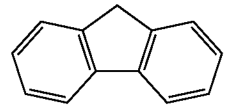, and

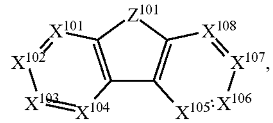, wherein k is an integer from 1 to 20; $X^{101}$ to $X^{108}$ is C (including CH) or N; $Z^{101}$ is $NAr^1$, O, or S; $Ar^1$ has the same group defined above.

Examples of metal complexes used in HIL or HTL include, but are not limited to the following general formula:

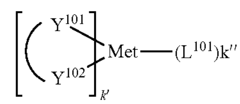

wherein Met is a metal, which can have an atomic weight greater than 40; $(Y^{101}\text{-}Y^{102})$ is a bidentate ligand, $Y^{101}$ and $Y^{102}$ are independently selected from C, N, O, P, and S; $L^{101}$ is an ancillary ligand; k' is an integer value from 1 to the maximum number of ligands that may be attached to the metal; and k'+k" is the maximum number of ligands that may be attached to the metal.

In one aspect, $(Y^{101}\text{-}Y^{102})$ is a 2-phenylpyridine derivative. In another aspect, $(Y^{101}\text{-}Y^{102})$ is a carbene ligand. In another aspect, Met is selected from Ir, Pt, Os, and Zn. In a further aspect, the metal complex has a smallest oxidation potential in solution vs. $Fc^+/Fc$ couple less than about 0.6 V.

Non-limiting examples of the HIL and HTL materials that may be used in an OLED in combination with materials disclosed herein are exemplified below together with references that disclose those materials: CN102702075, DE102012005215, EP01624500, EP01698613, EP01806334, EP01930964, EP01972613, EP01997799, EP02011790, EP02055700, EP02055701, EP1725079, EP2085382, EP2660300, EP650955, JP07-073529, JP2005112765, JP2007091719, JP2008021687, JP2014-009196, KR20110088898, KR20130077473, TW201139402, U.S. Ser. No. 06/517,957, US20020158242, US20030162053, US20050123751, US20060182993, US20060240279, US20070145888, US20070181874, US20070278938, US20080014464, US20080091025, US20080106190, US20080124572, US20080145707, US20080220265, US20080233434, US20080303417, US2008107919, US20090115320, US20090167161, US2009066235, US2011007385, US20110163302, US2011240968, US2011278551, US2012205642, US2013241401, US20140117329, US2014183517, U.S. Pat. Nos. 5,061,569, 5,639,914, WO05075451, WO07125714, WO08023550, WO08023759, WO2009145016, WO2010061824, WO2011075644, WO2012177006, WO2013018530, WO2013039073, WO2013087142, WO2013118812, WO2013120577, WO2013157367, WO2013175747, WO2014002873, WO2014015935, WO2014015937, WO2014030872, WO2014030921, WO2014034791, WO2014104514, WO2014157018.

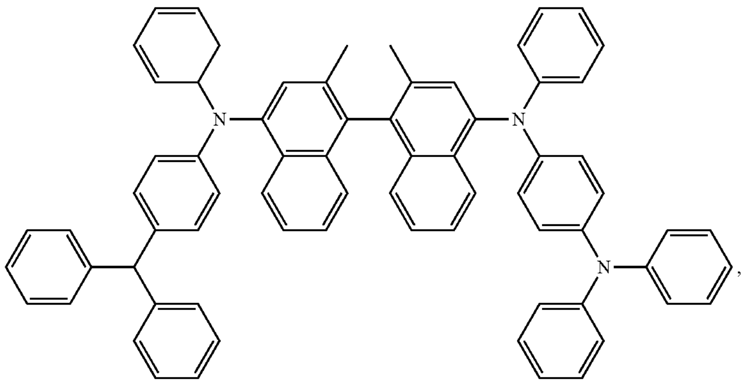
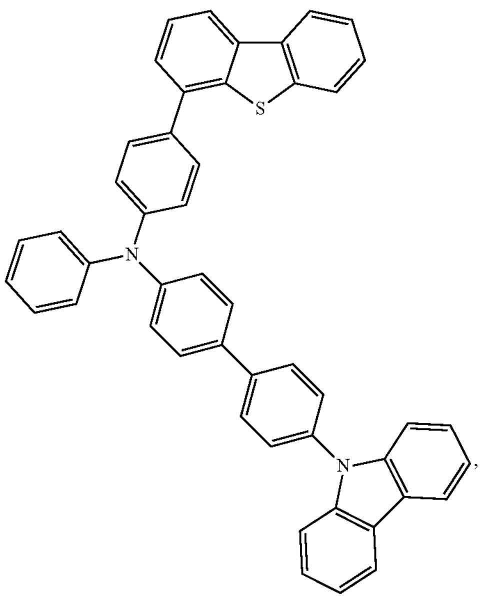
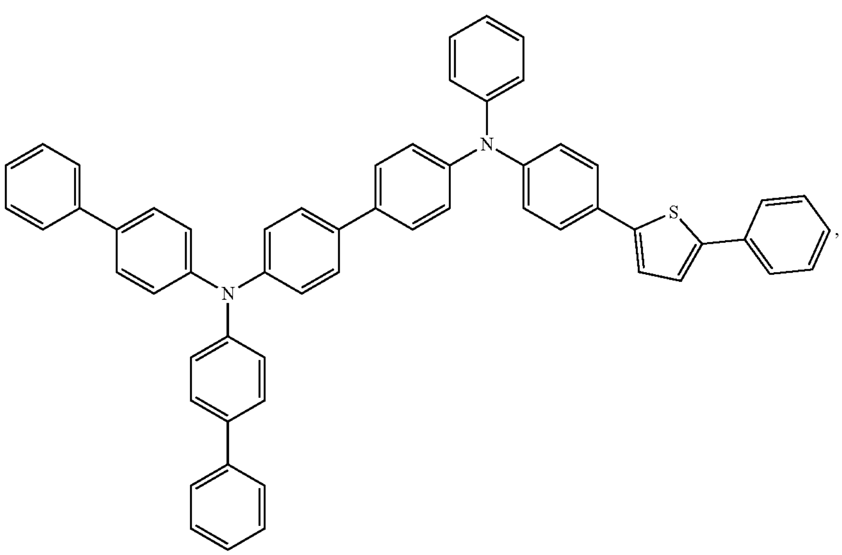

-continued
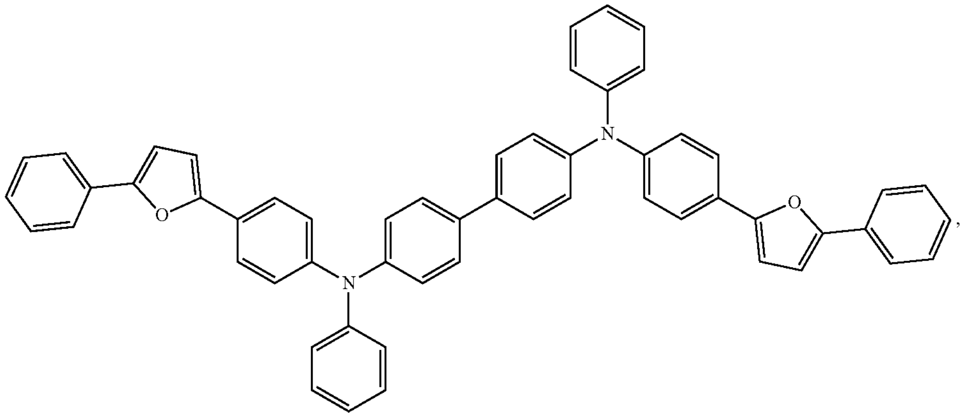
,
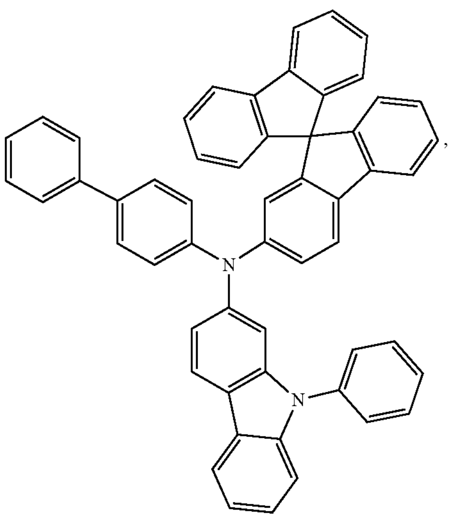
,
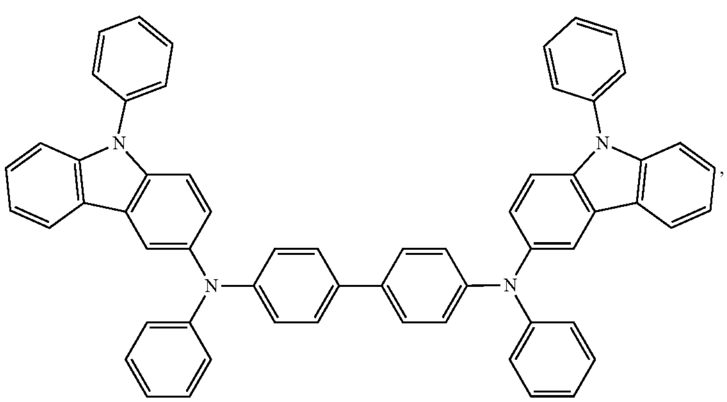
,

-continued
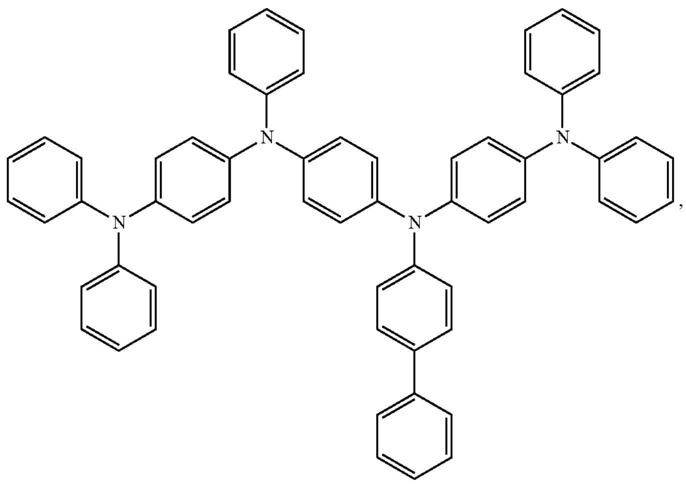
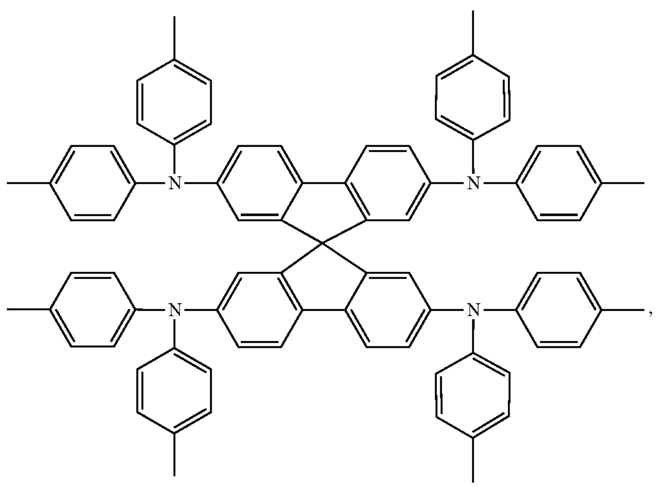
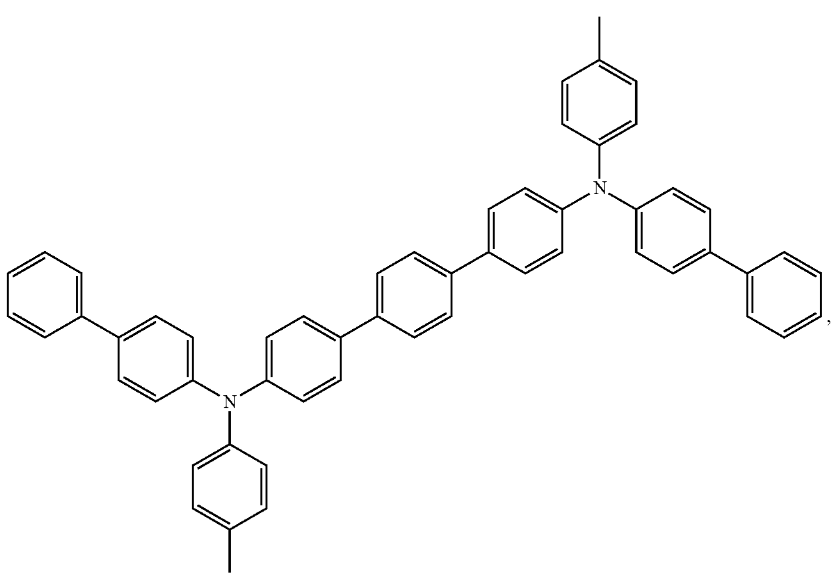

-continued
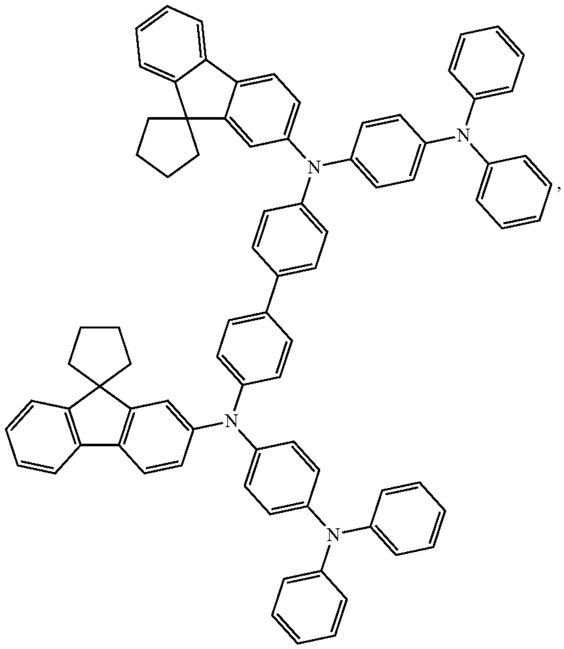
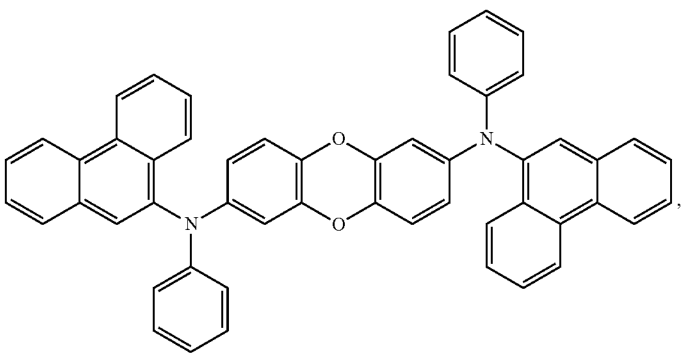
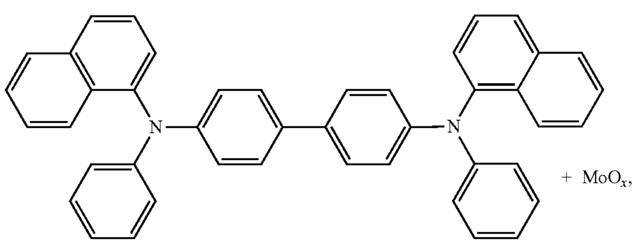
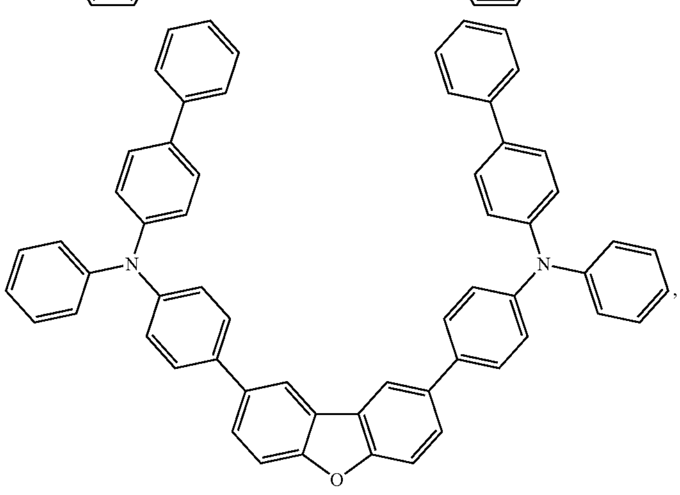
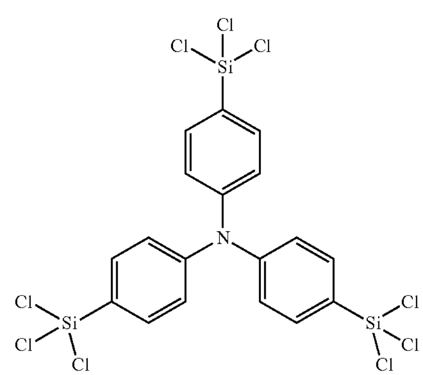

-continued
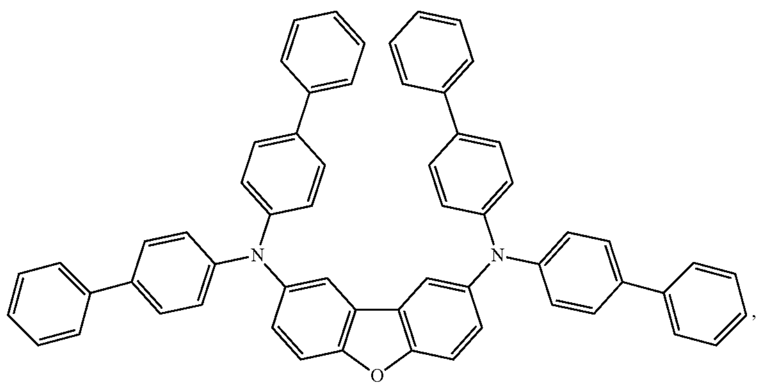
,
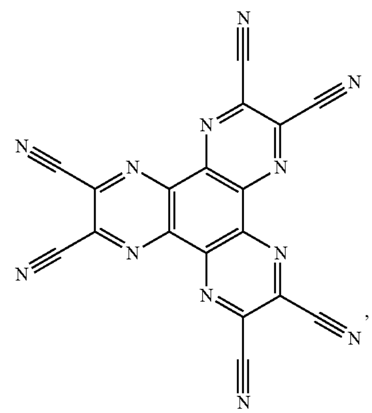
,
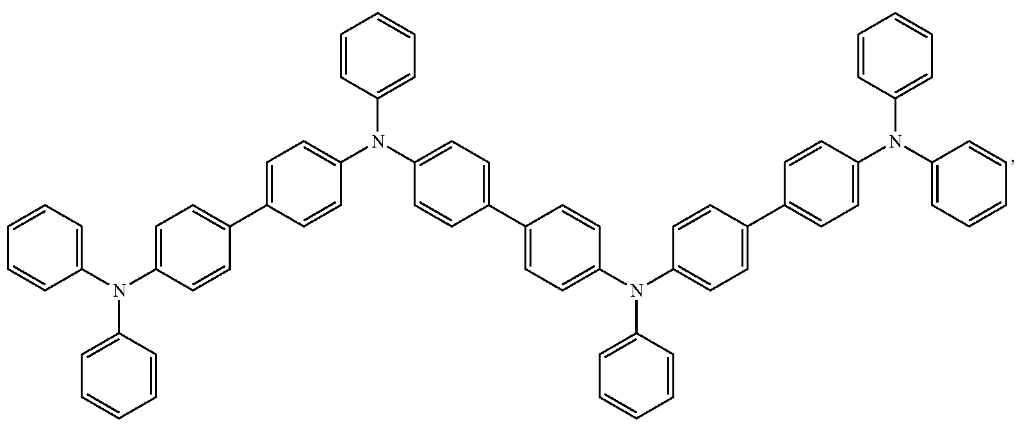
,
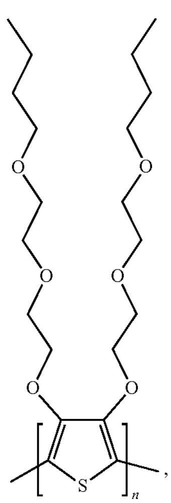
,
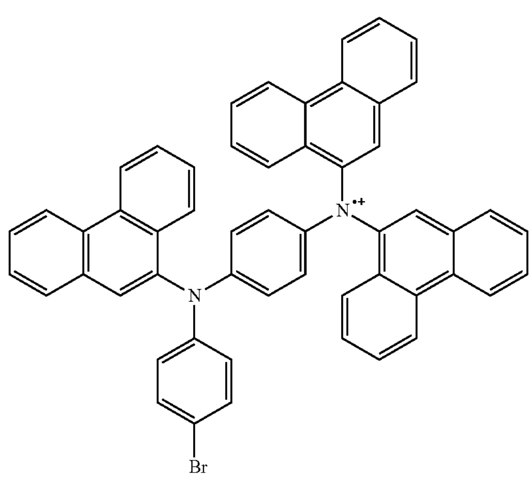
, -continued
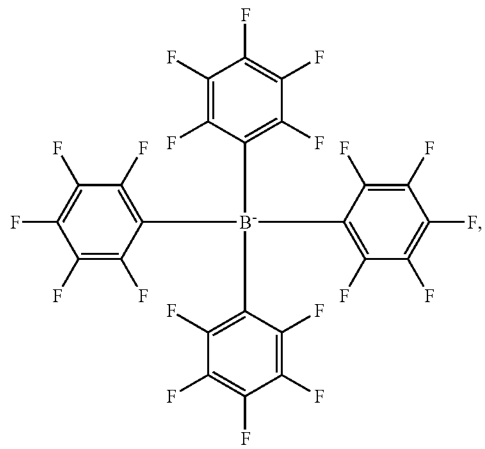
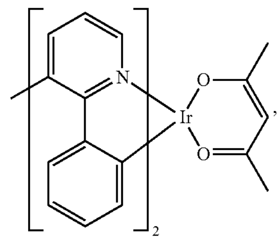
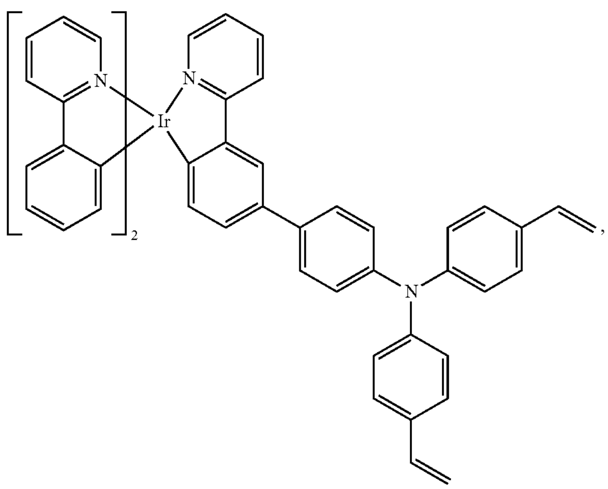
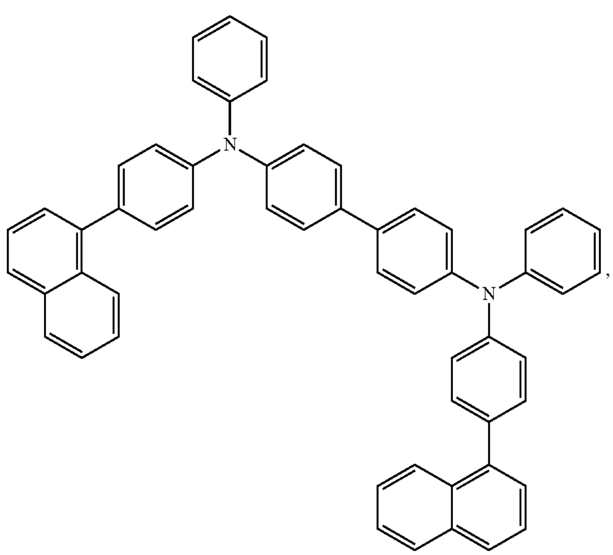

-continued
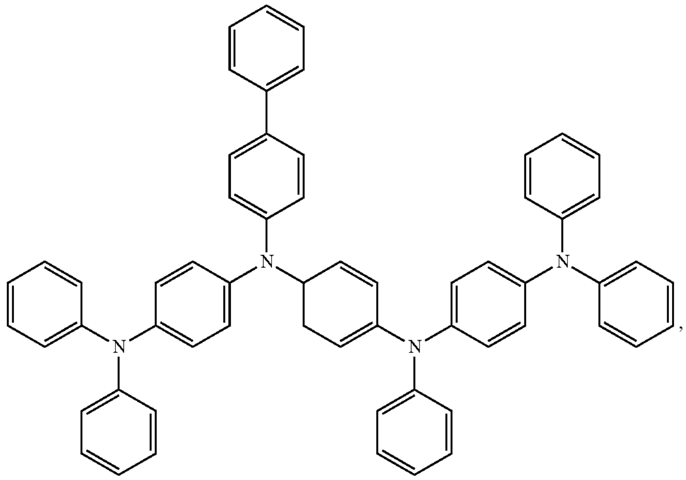
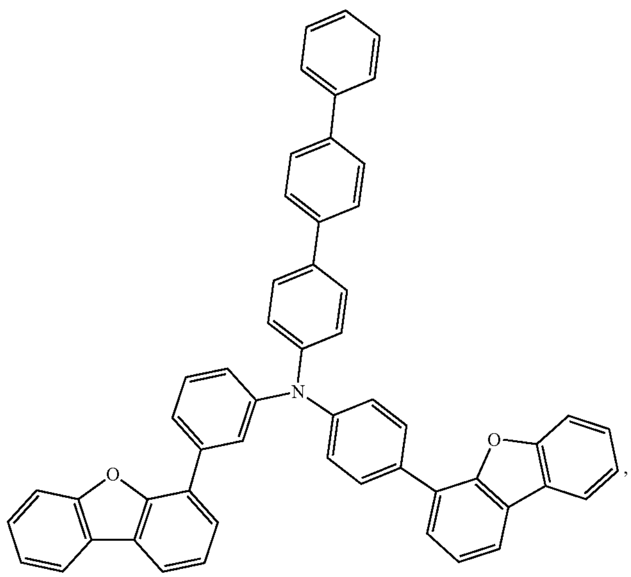
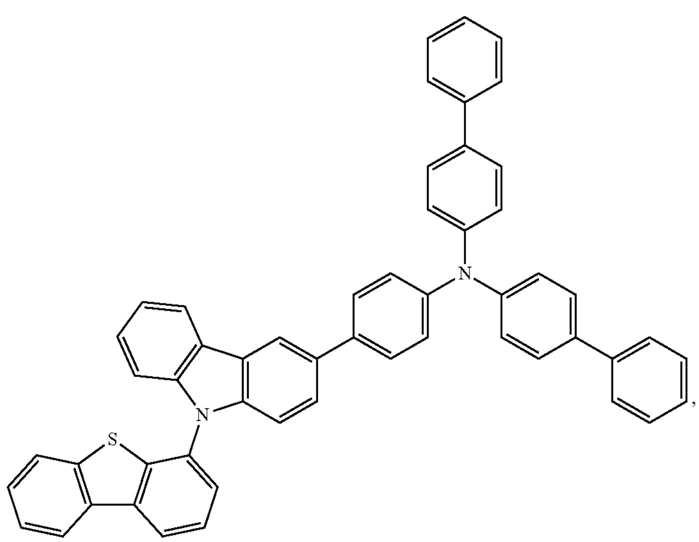

-continued
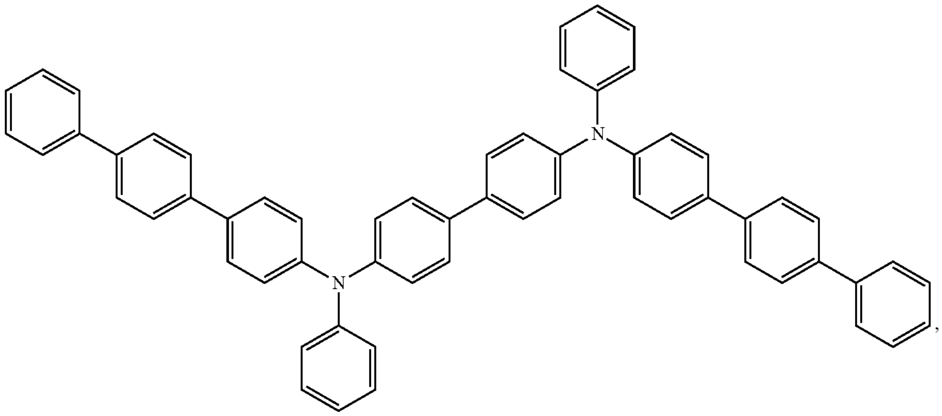
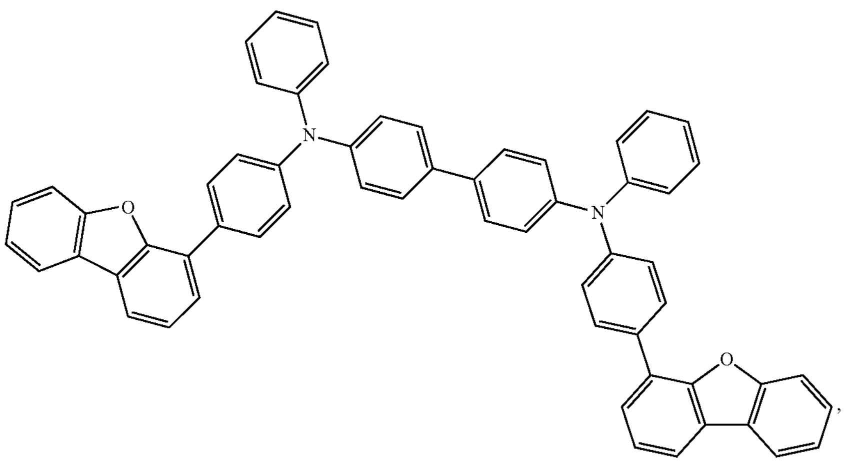
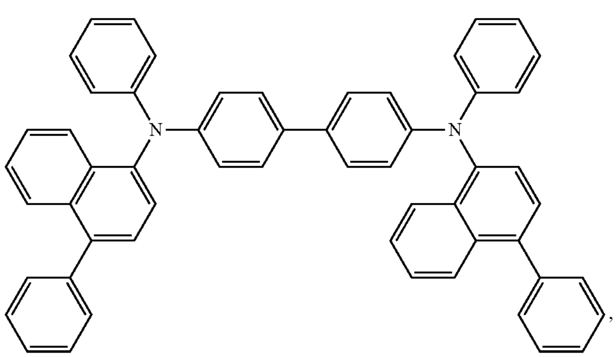

-continued
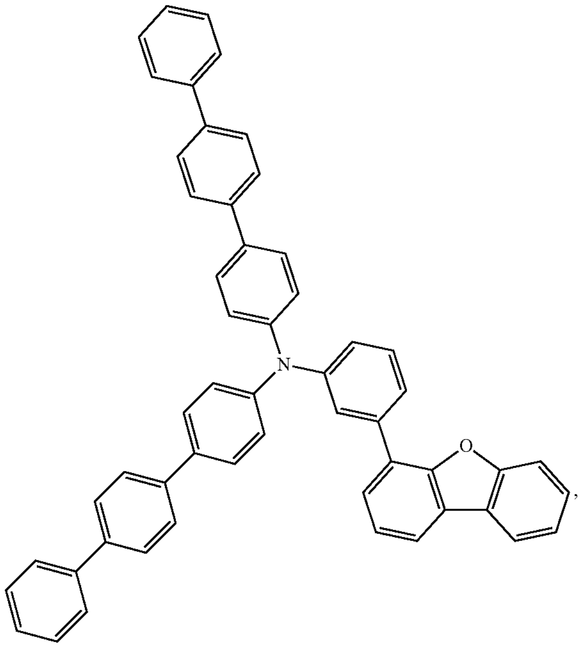
,
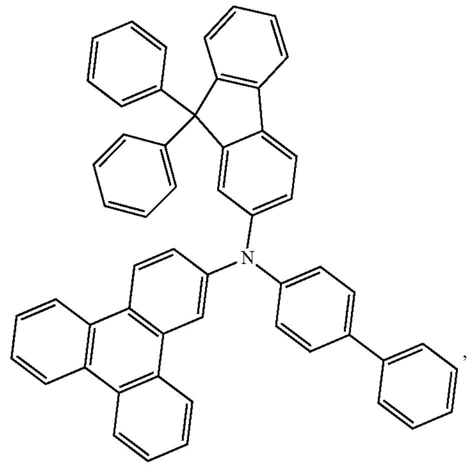
,
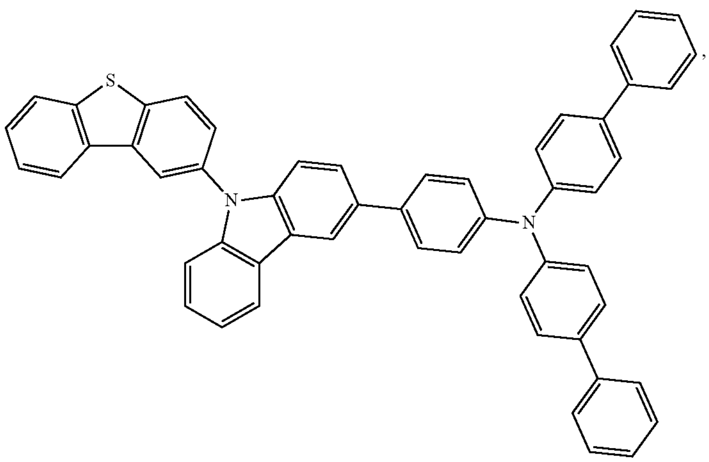
,
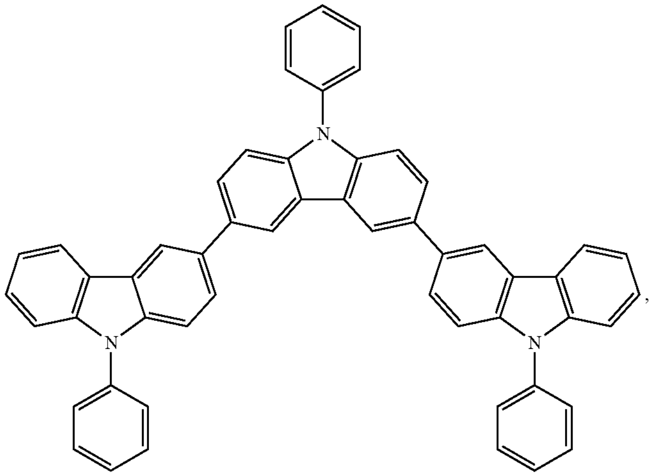
,

-continued
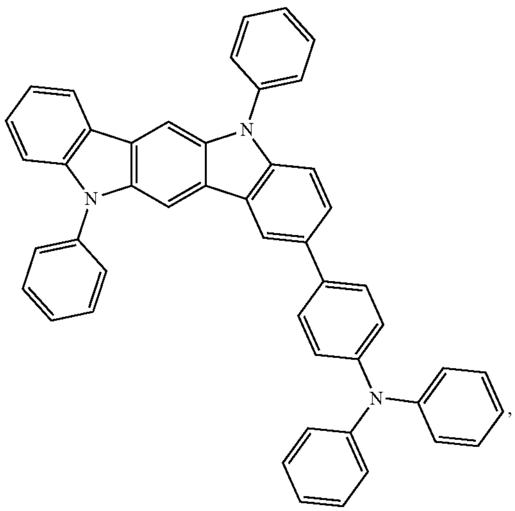
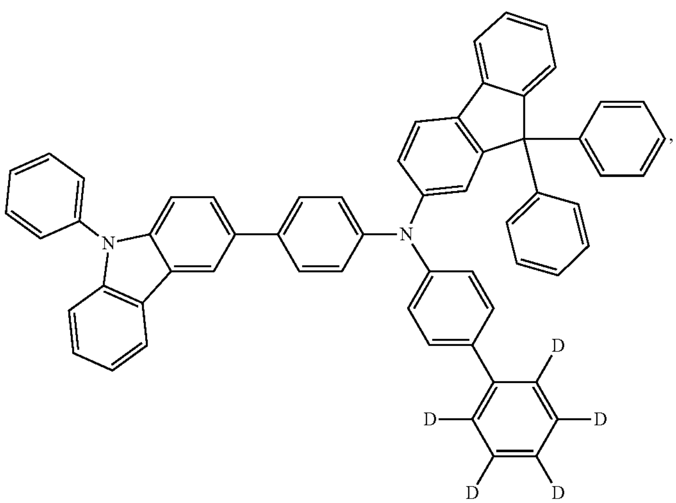
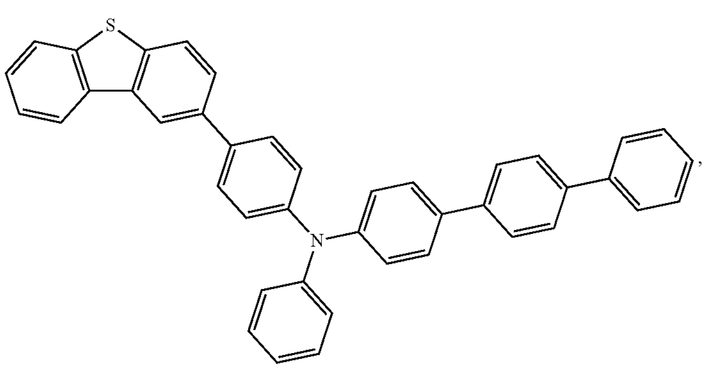

-continued
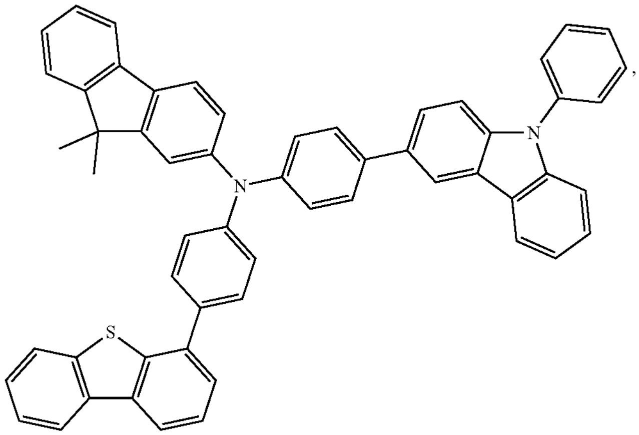
,
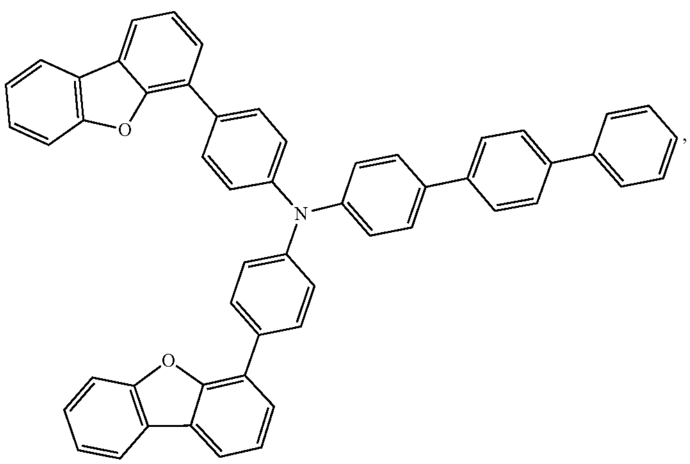
,
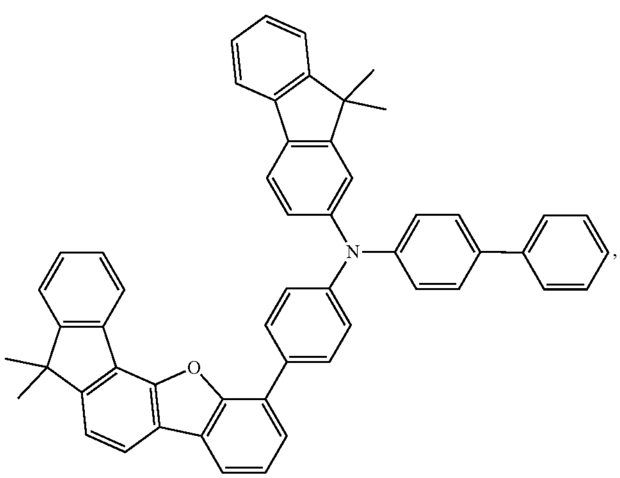
,
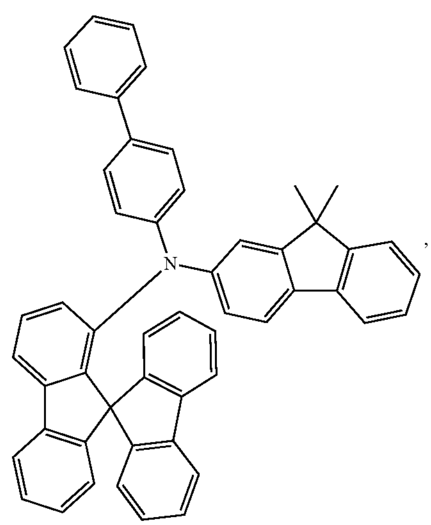
,

-continued
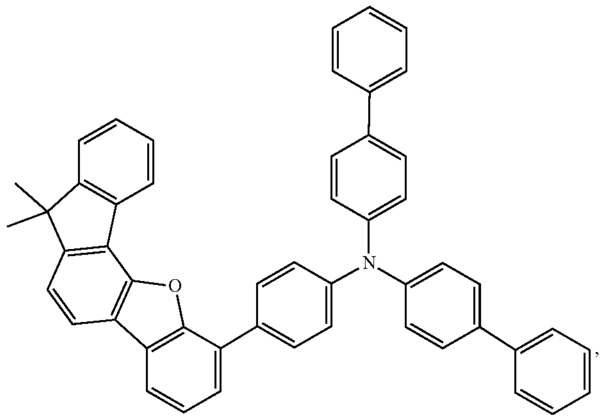
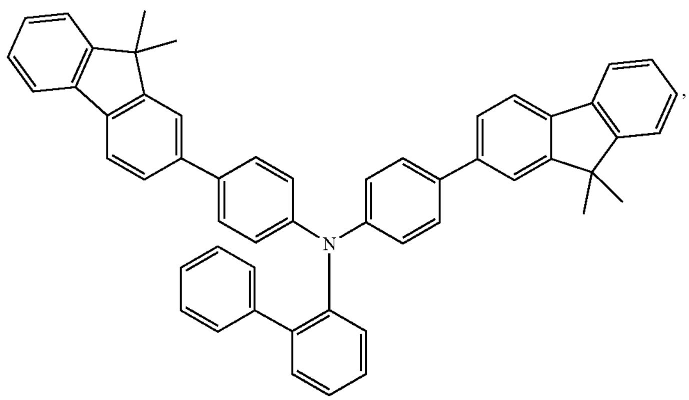
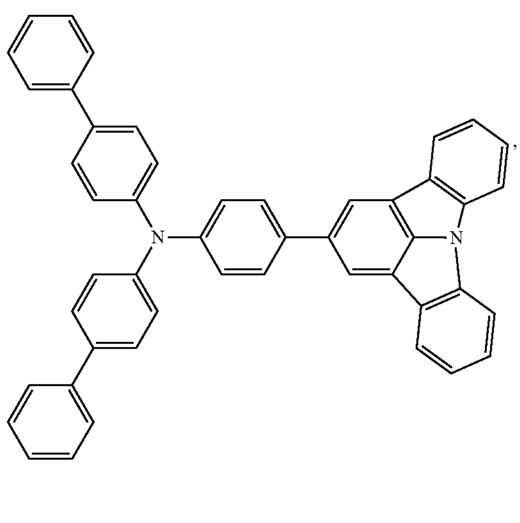
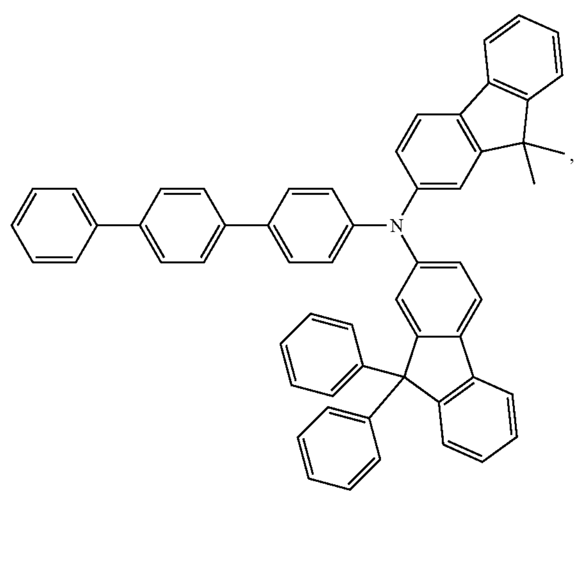

-continued
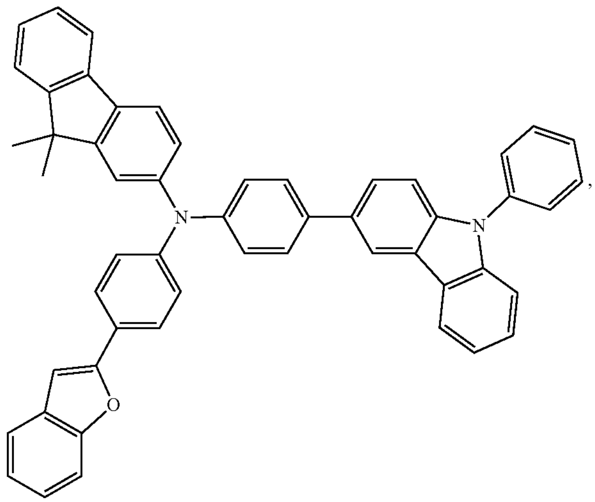
,
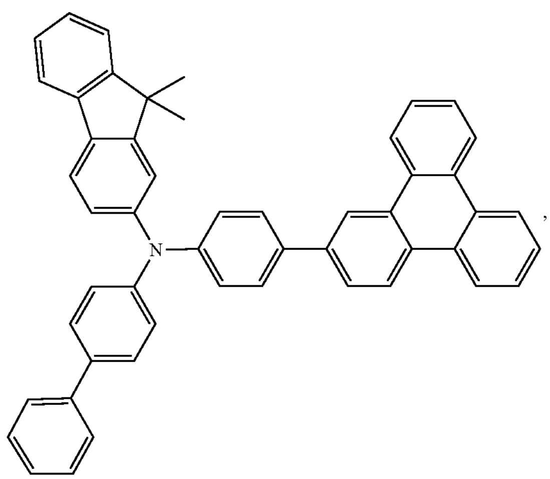
,
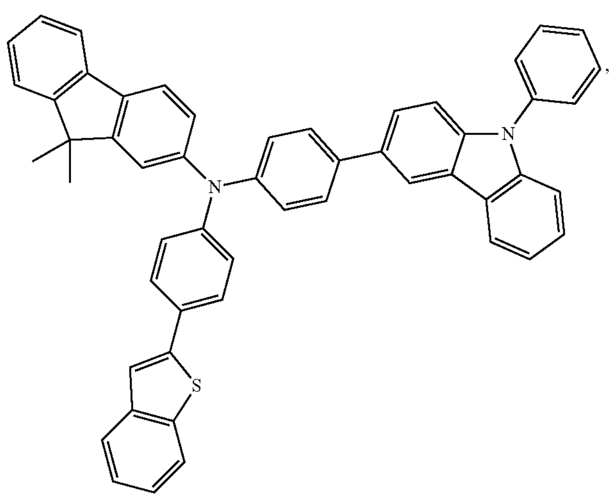
,

-continued
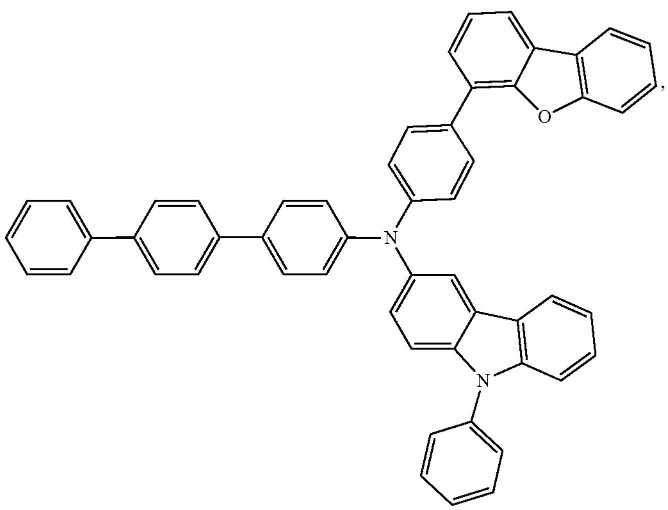
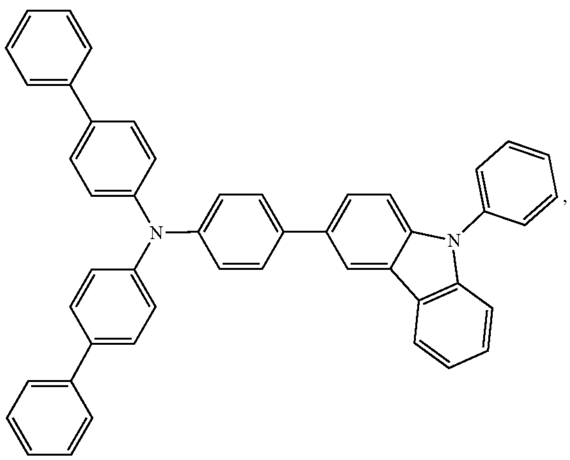
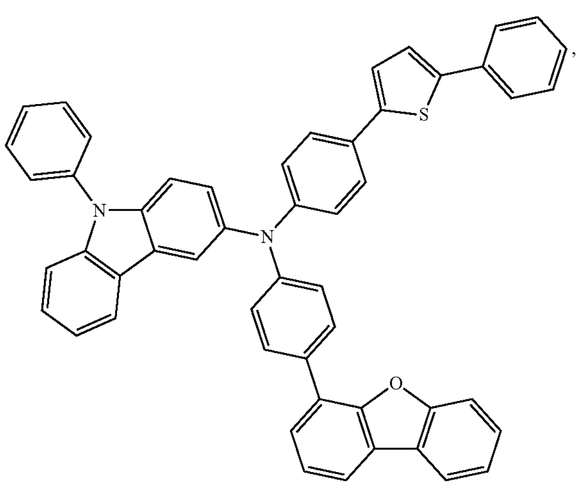

-continued
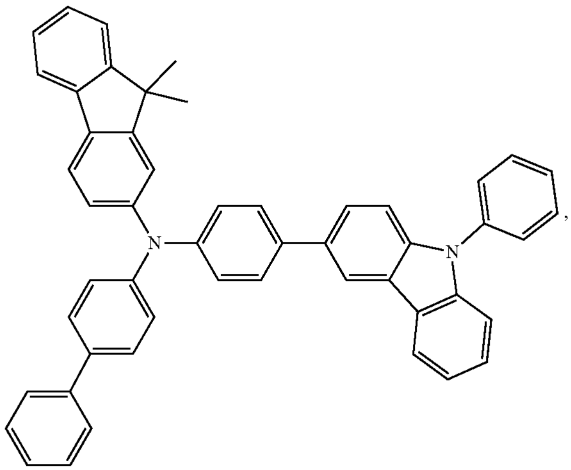
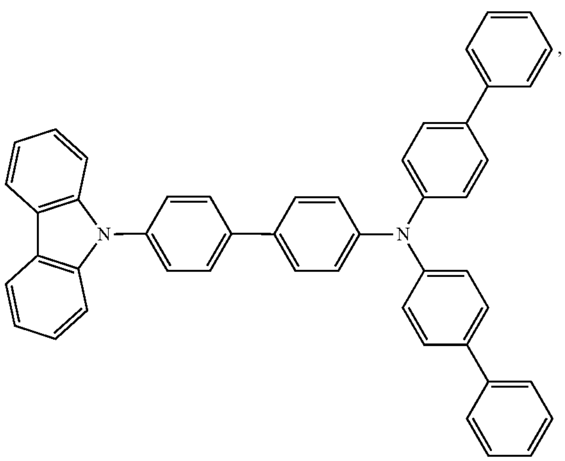
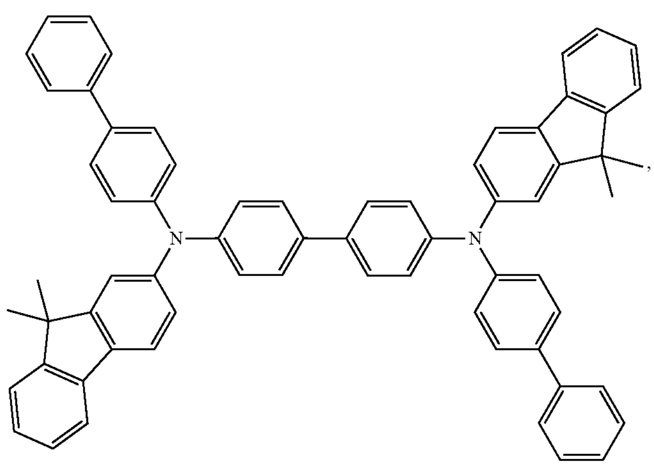

-continued
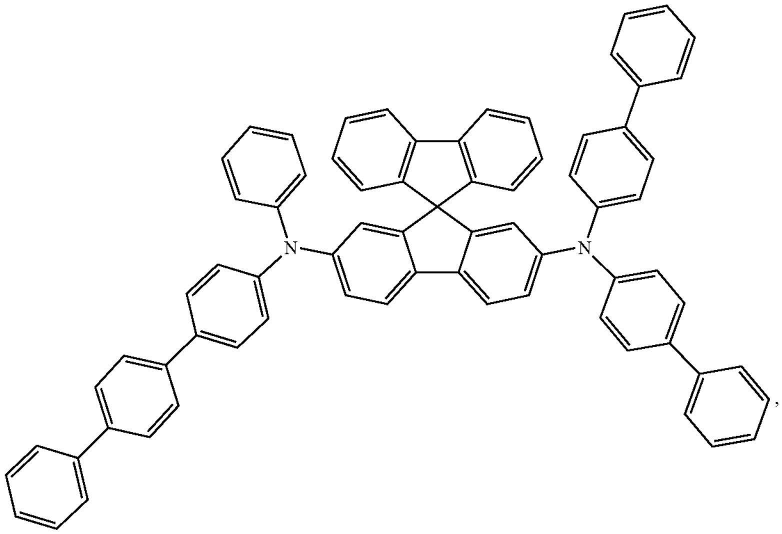
,
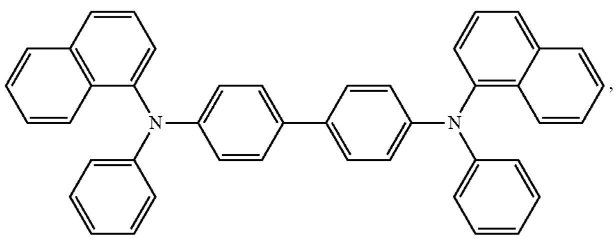
,
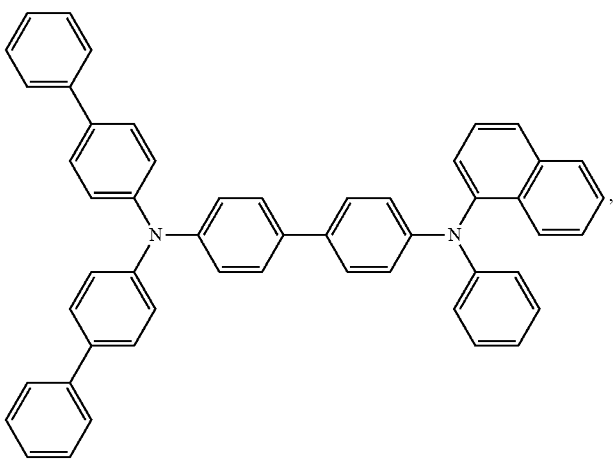
,
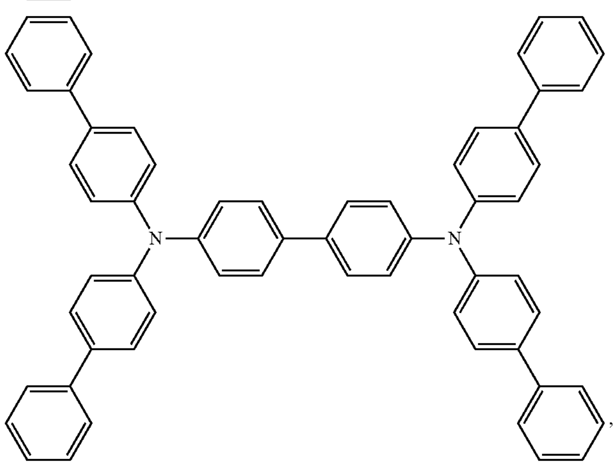
,

-continued
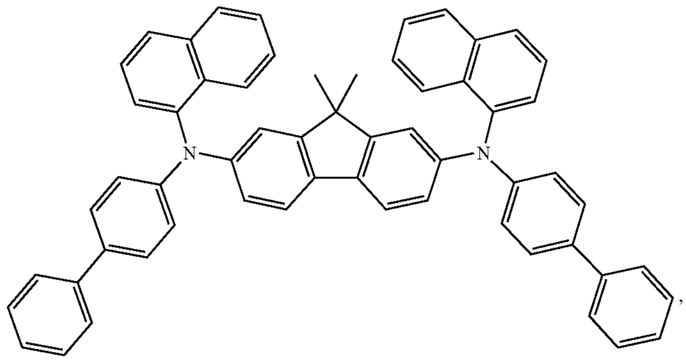,
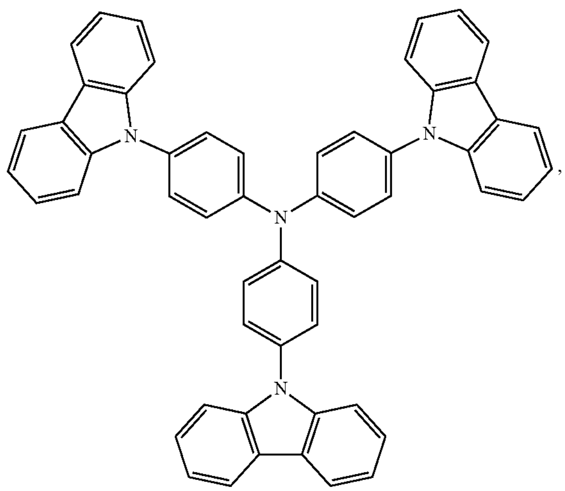,
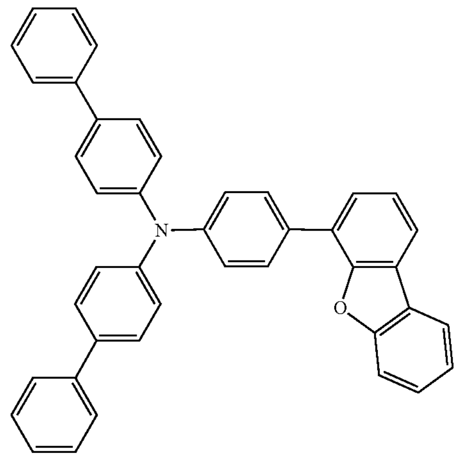,
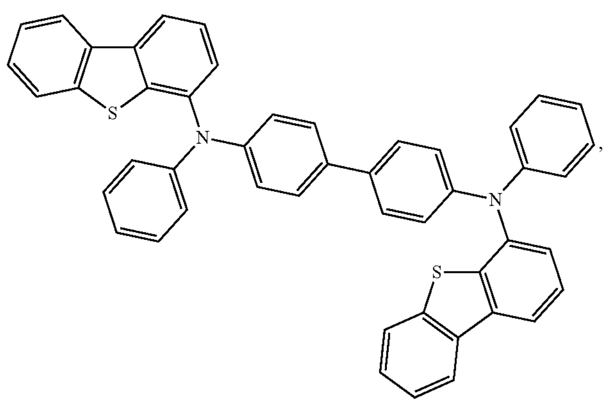,
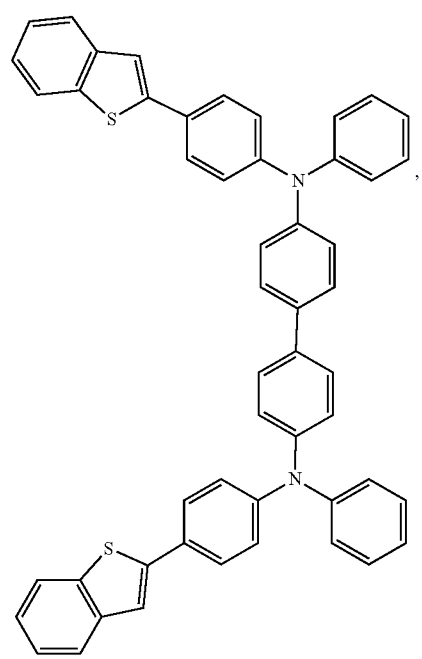, and

-continued

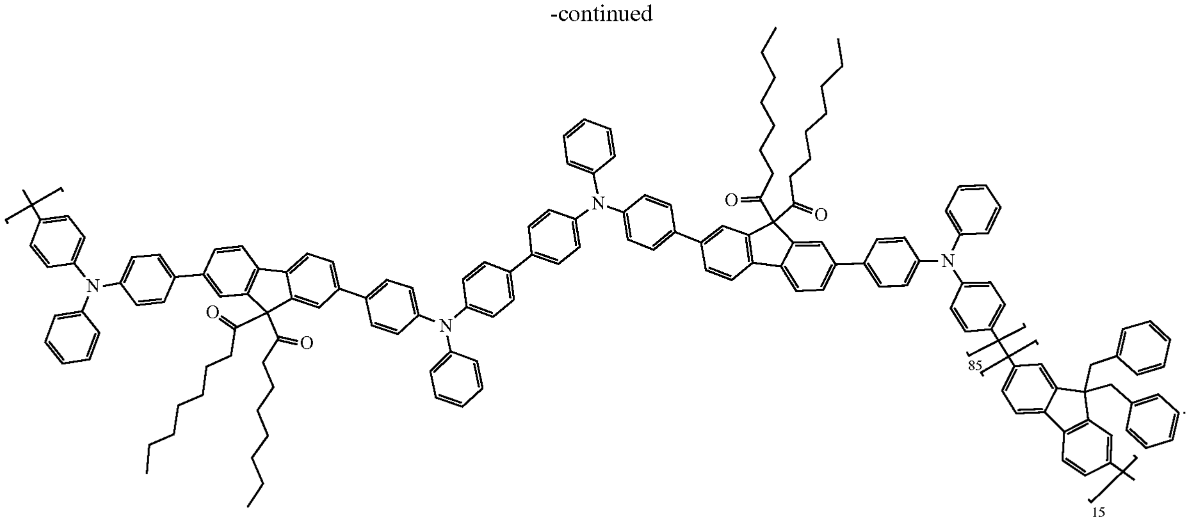

EBL

An electron blocking layer (EBL) may be used to reduce the number of electrons and/or excitons that leave the emissive layer. The presence of such a blocking layer in a device may result in substantially higher efficiencies, and/or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and/or higher triplet energy than one or more of the hosts closest to the EBL interface. In one aspect, the compound used in EBL contains the same molecule or the same functional groups used as one of the hosts described below.

Host

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

Examples of metal complexes used as host are preferred to have the following general formula:

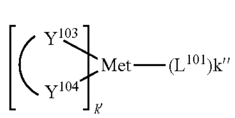

wherein Met is a metal; ($Y^{103}$-$Y^{104}$) is a bidentate ligand, $Y^{103}$ and $Y^{104}$ are independently selected from C, N, O, P, and S; $L^{101}$ is an another ligand; k' is an integer value from 1 to the maximum number of ligands that may be attached to the metal; and k'+k" is the maximum number of ligands that may be attached to the metal.

In one aspect, the metal complexes are:

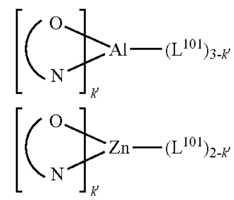

wherein (O—N) is a bidentate ligand, having metal coordinated to atoms O and N.

In another aspect, Met is selected from Ir and Pt. In a further aspect, ($Y^{103}$-$Y^{104}$) is a carbene ligand.

In one aspect, the host compound contains at least one of the following groups selected from the group consisting of aromatic hydrocarbon cyclic compounds such as benzene, biphenyl, triphenyl, triphenylene, tetraphenylene, naphthalene, anthracene, phenalene, phenanthrene, fluorene, pyrene, chrysene, perylene, and azulene; the group consisting of aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and the group consisting of 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Each option within each group may be unsubstituted or may be substituted by a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acids, ether, ester, nitrile, isonitrile, sulfanyl, sulfinyl, sulfonyl, phosphino, and combinations thereof.

In one aspect, the host compound contains at least one of the following groups in the molecule:

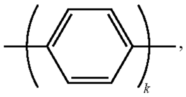,
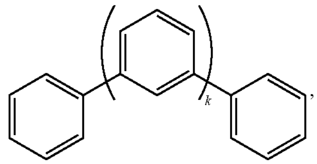,
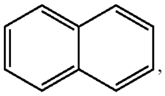,
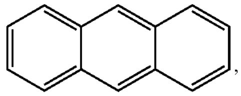,
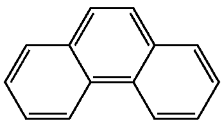,
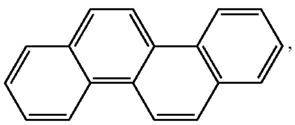,
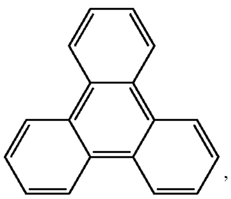,
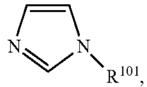

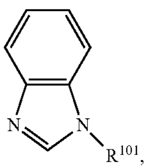

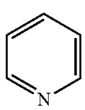

,
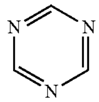

,
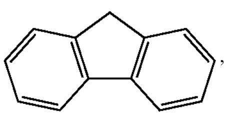,
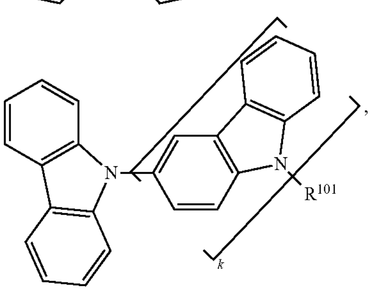

,
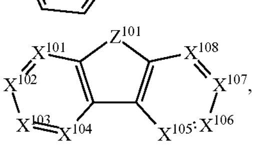

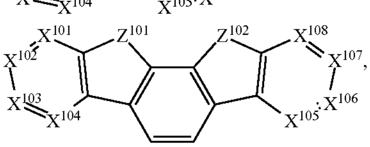

-continued

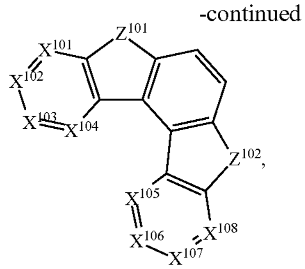

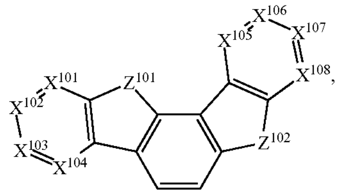

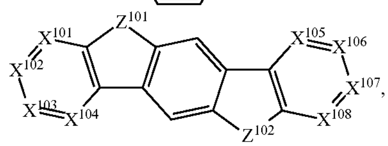

and
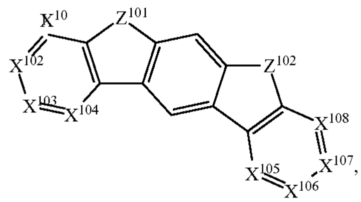

wherein $R^{101}$ is selected from the group consisting of hydrogen, deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acids, ether, ester, nitrile, isonitrile, sulfanyl, sulfinyl, sulfonyl, phosphino, and combinations thereof, and when it is aryl or heteroaryl, it has the similar definition as Ar's mentioned above. k is an integer from 0 to 20 or 1 to 20. $X^{101}$ to $X^{108}$ are independently selected from C (including CH) or N. $Z^{101}$ and $Z^{102}$ are independently selected from $NR^{101}$, O, or S.

Non-limiting examples of the host materials that may be used in an OLED in combination with materials disclosed herein are exemplified below together with references that disclose those materials: EP2034538, EP2034538A, EP2757608, JP2007254297, KR20100079458, KR20120088644, KR20120129733, KR20130115564, TW201329200, US20030175553, US20050238919, US20060280965, US20090017330, US20090030202, US20090167162, US20090302743, US20090309488, US20100012931, US20100084966, US20100187984, US2010187984, US2012075273, US2012126221, US2013009543, US2013105787, US2013175519, US2014001446, US20140183503, US20140225088, US2014034914, U.S. Pat. No. 7,154,114, WO2001039234, WO2004093207, WO2005014551, WO2005089025, WO2006072002, WO2006114966, WO2007063754, WO2008056746, WO2009003898, WO2009021126, WO2009063833, WO2009066778, WO2009066779, WO2009086028, WO2010056066, WO2010107244, WO2011081423, WO2011081431, WO2011086863, WO2012128298, WO2012133644, WO2012133649, WO2013024872, WO2013035275, WO2013081315, WO2013191404, WO2014142472, US20170263869, US20160163995, U.S. Pat. No. 9,466,803,

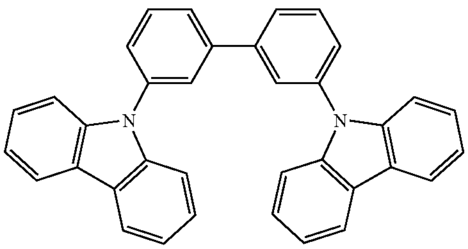,
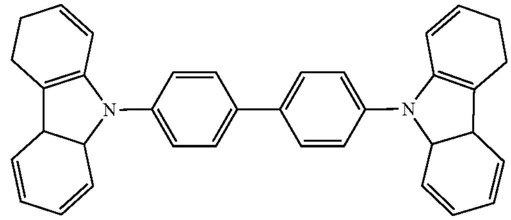,
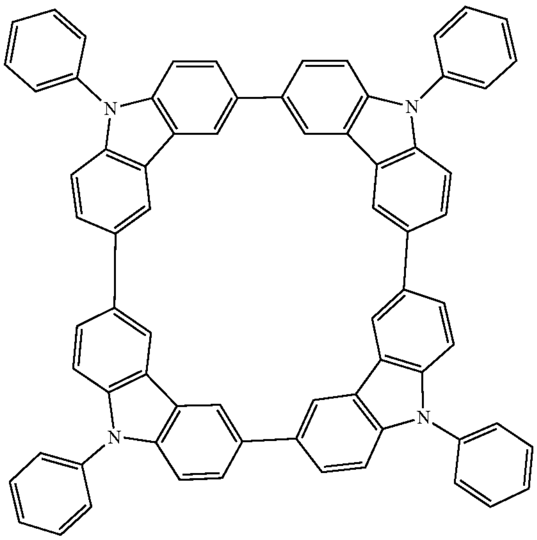,
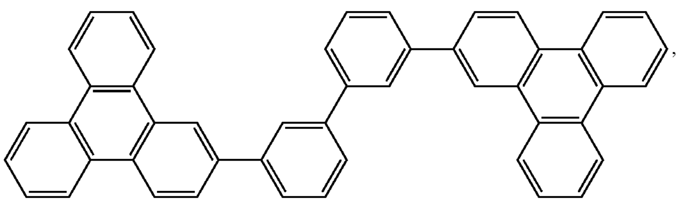,
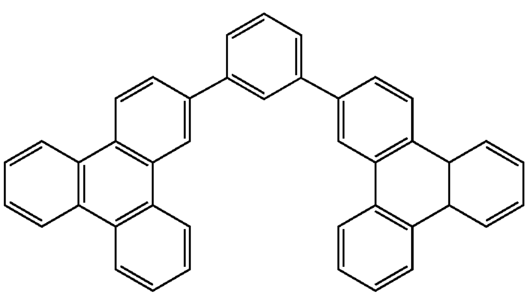,
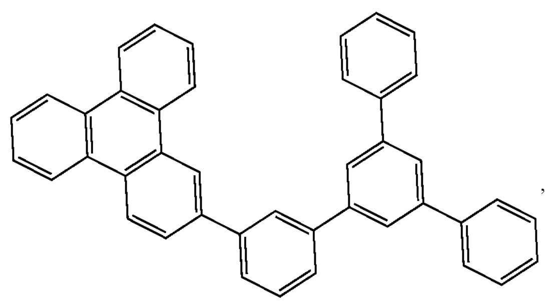,
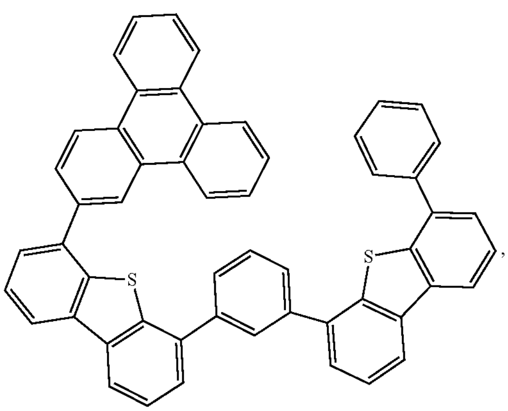,
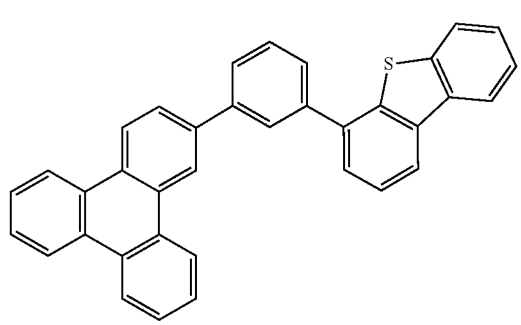, -continued
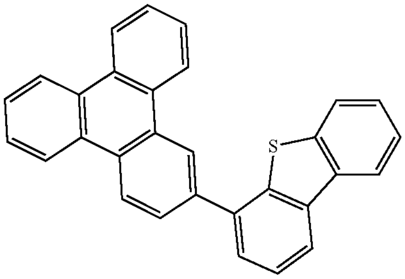
,
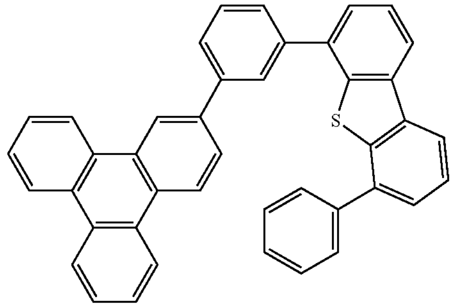
,
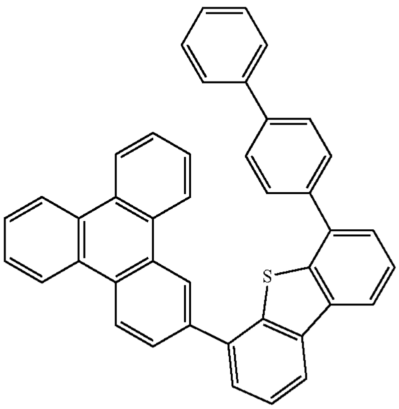
,
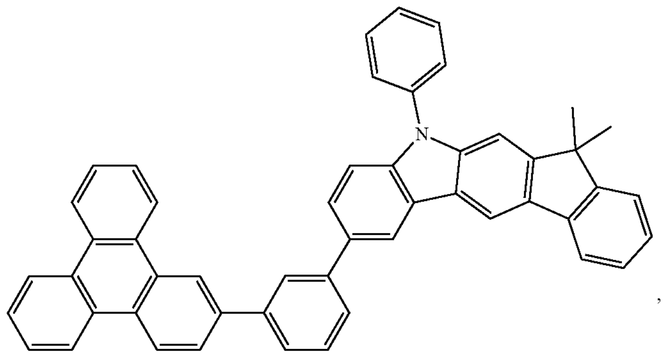
,
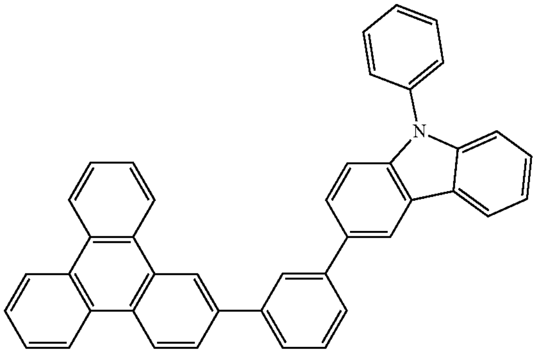
,
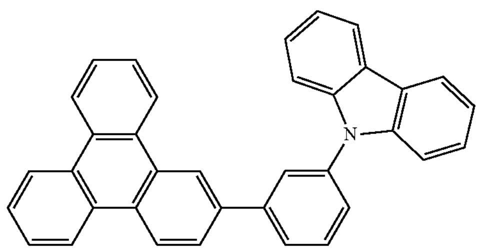
,
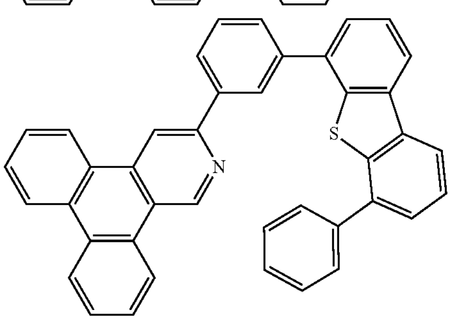
,
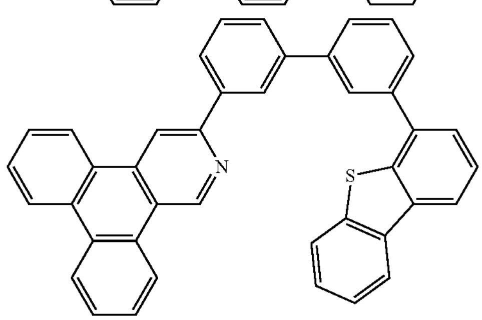
,
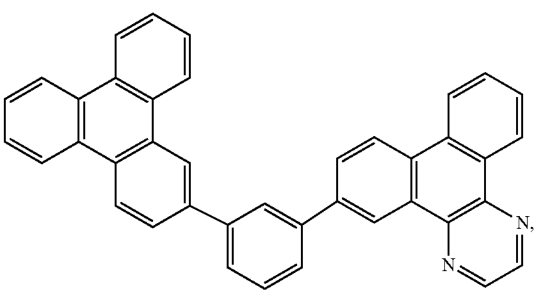
,
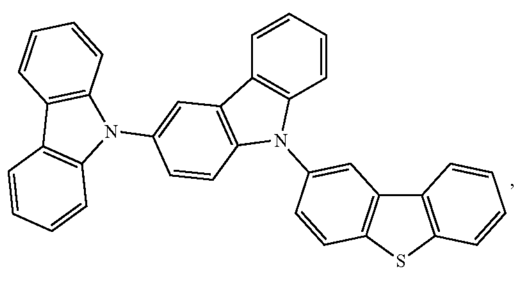
, -continued
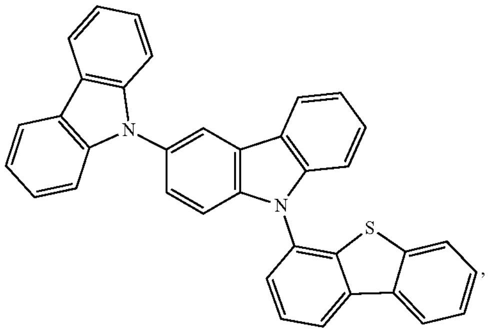
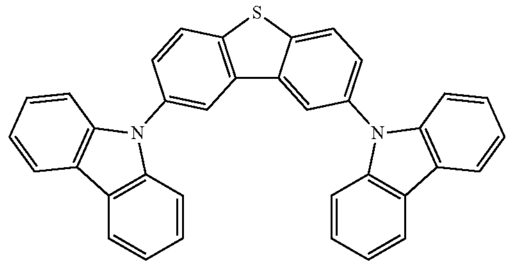
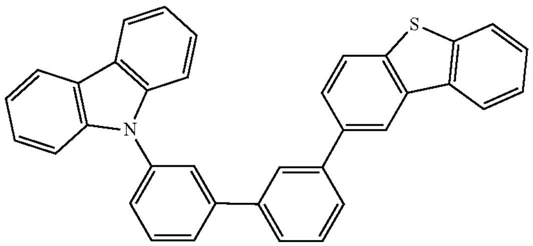
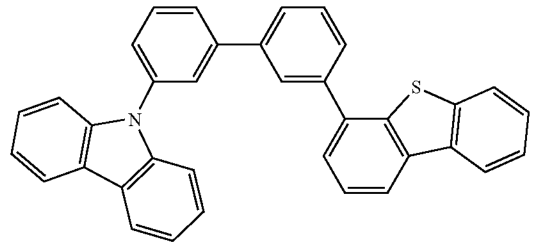
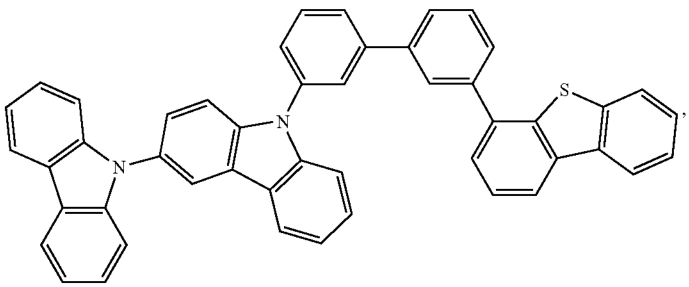 [SMILES: c1cc(-c2cccc(-n3c4ccccc4c4cc(-n5c6ccccc6c6ccccc65)ccc43)c2)cc(-c2cccc3c2oc2ccccc23)c1]
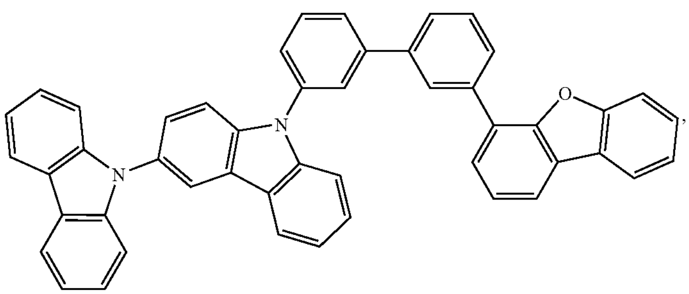
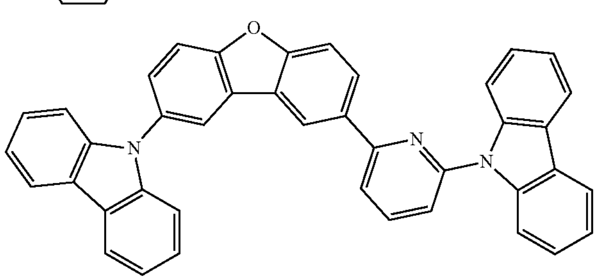
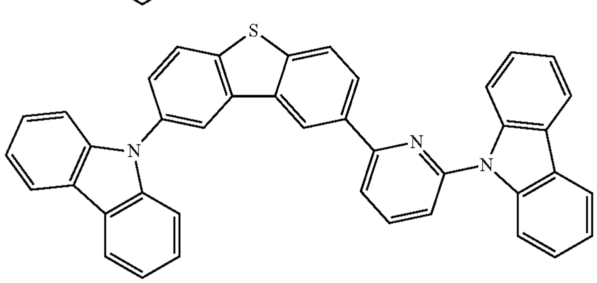

-continued
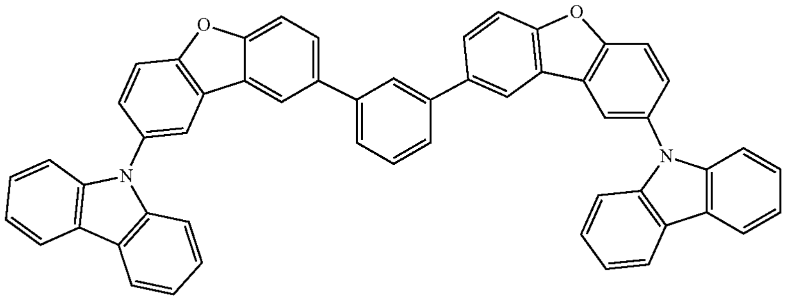
,
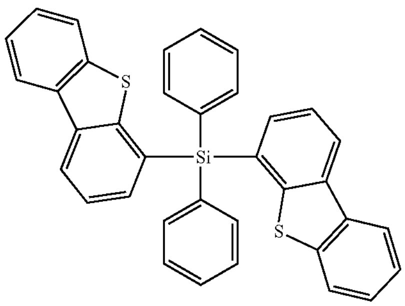
,
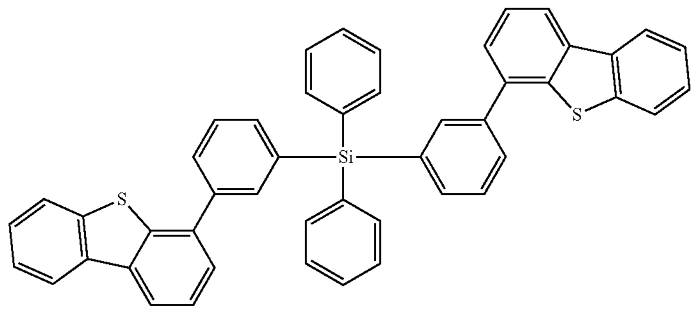
,
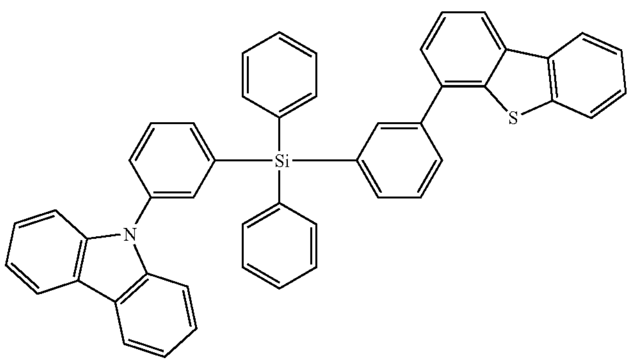
,
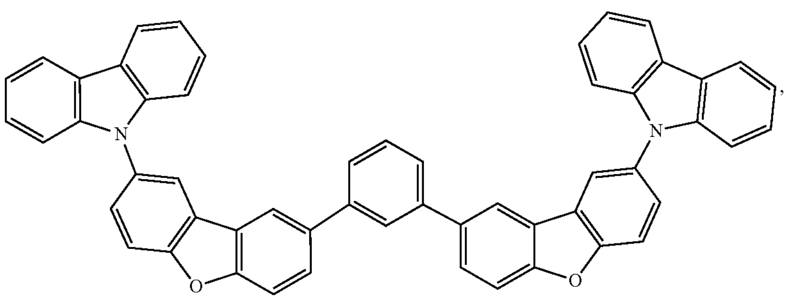
,
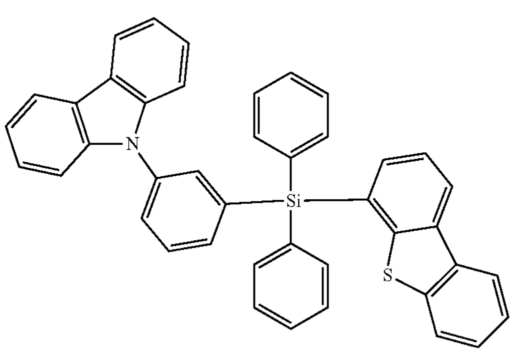
,
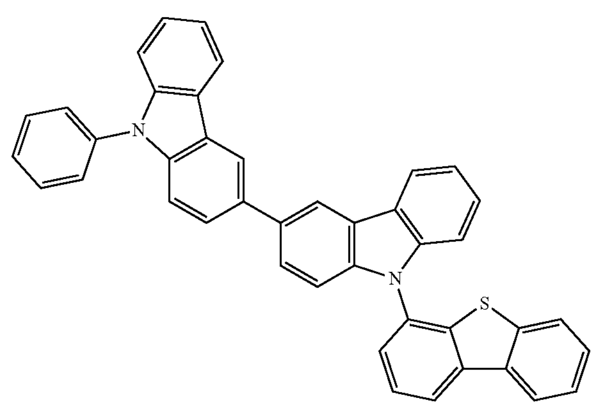
, -continued
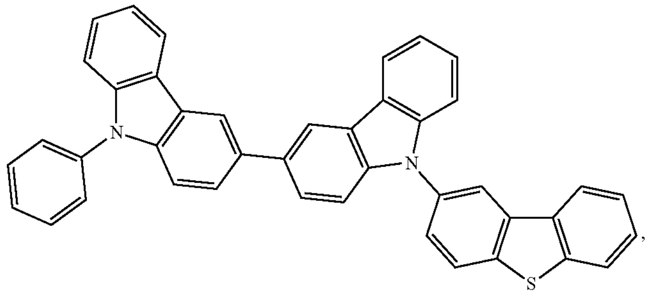
,
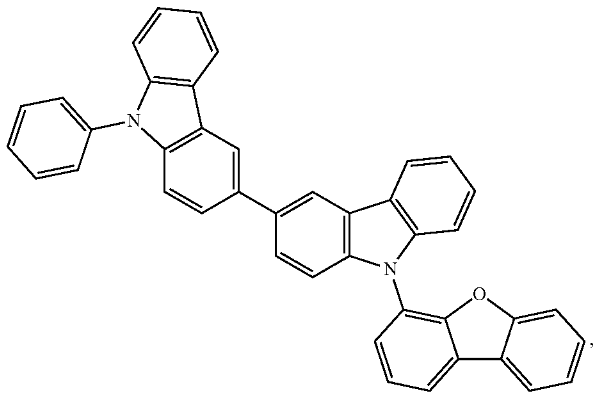
,
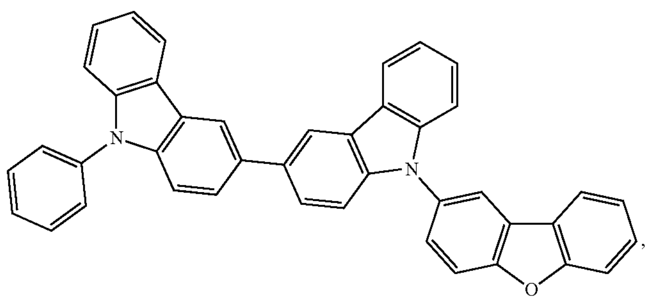
,
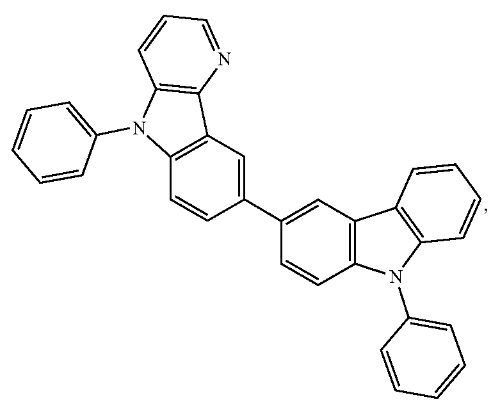
,
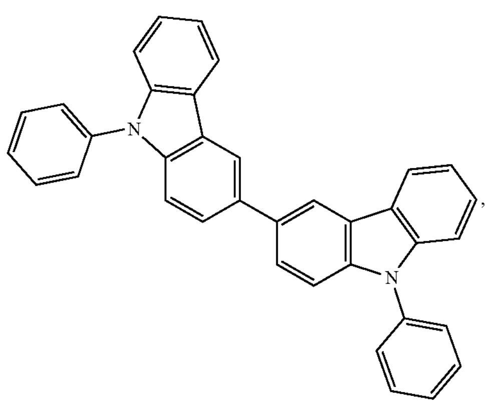
,
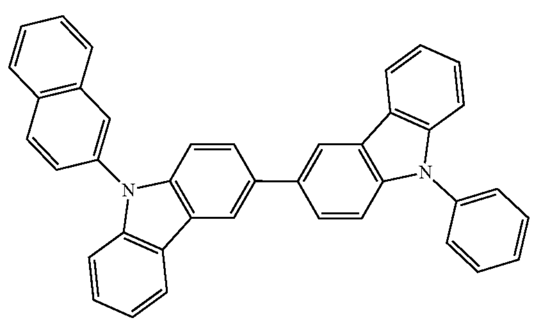
, -continued
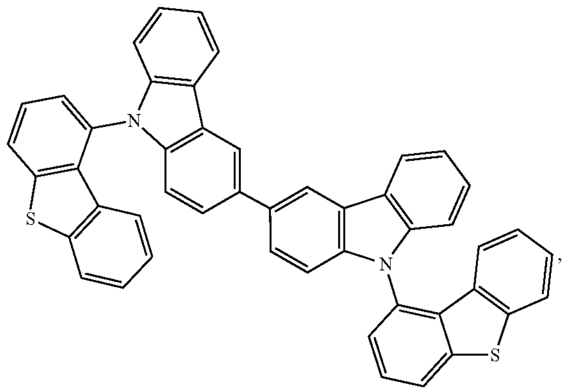
,
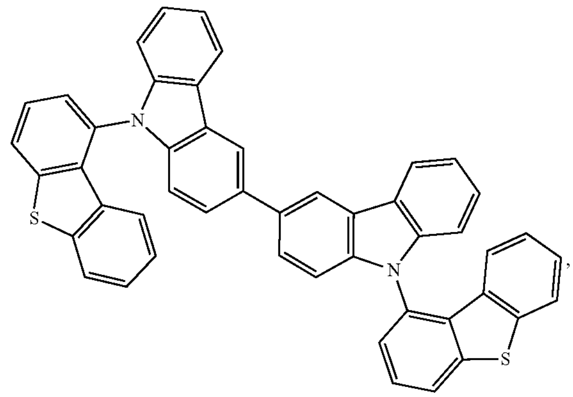
,
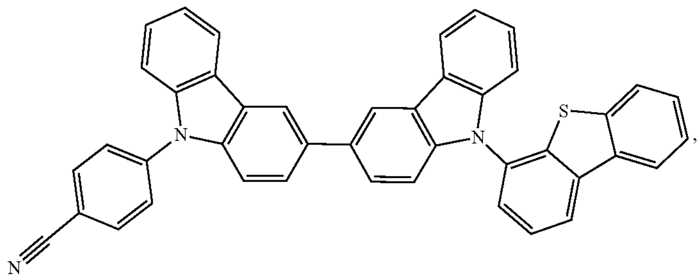
,
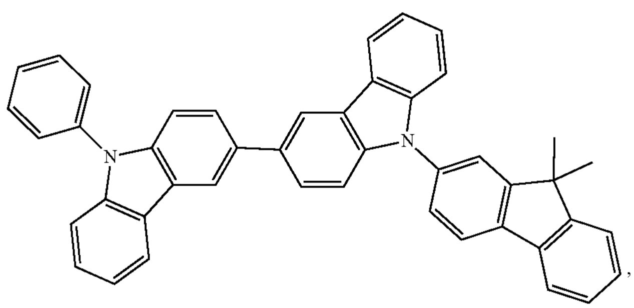
,
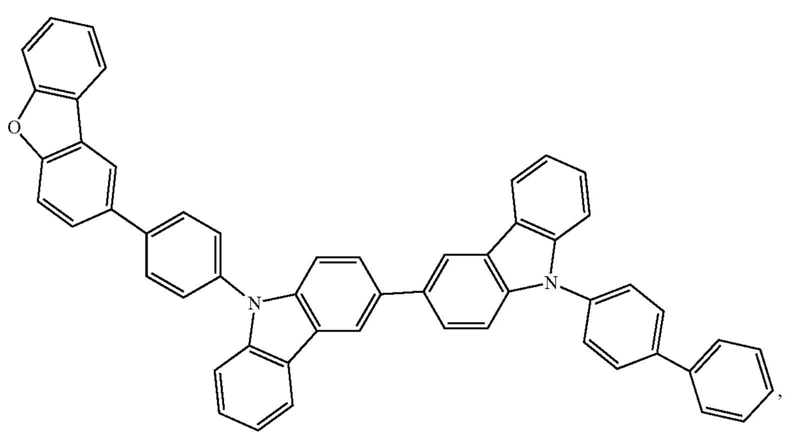
, -continued
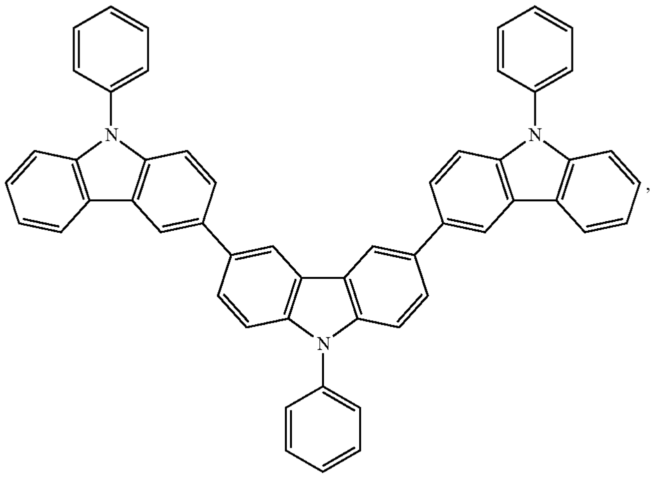
,
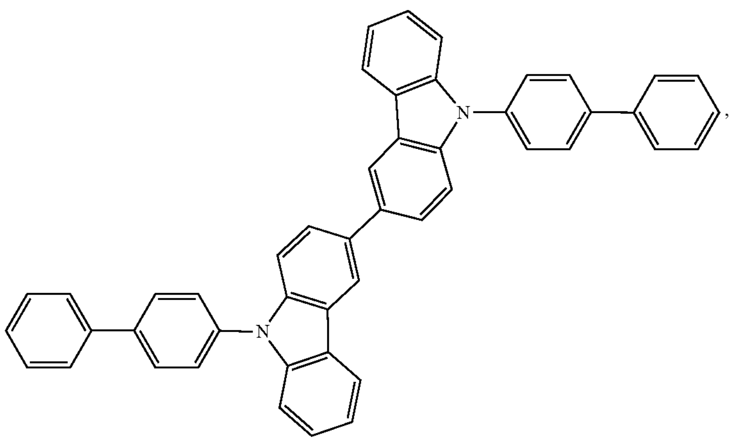
,
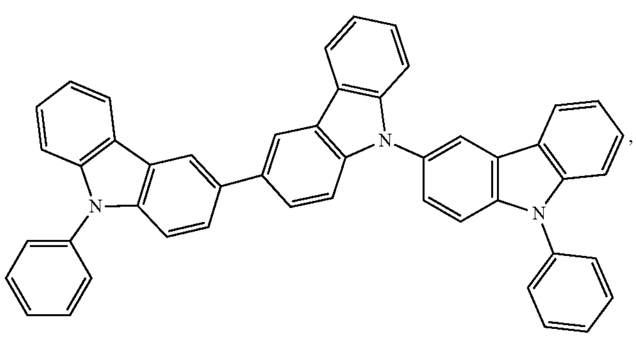
,
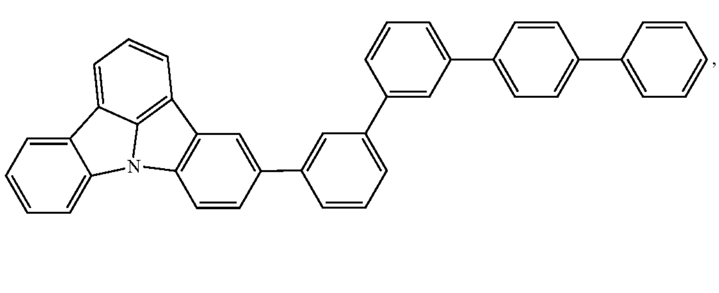
, -continued
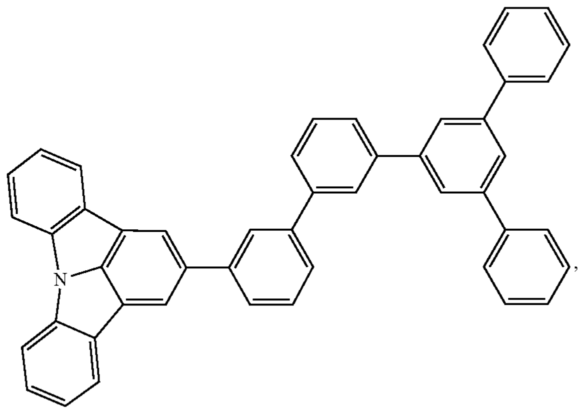,
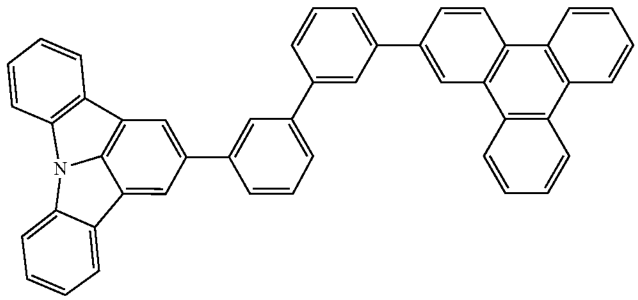,
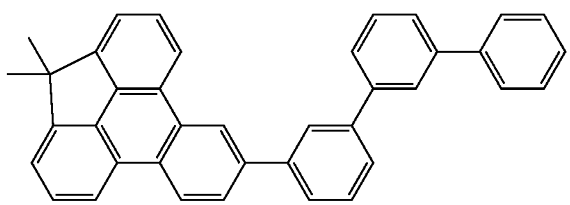,
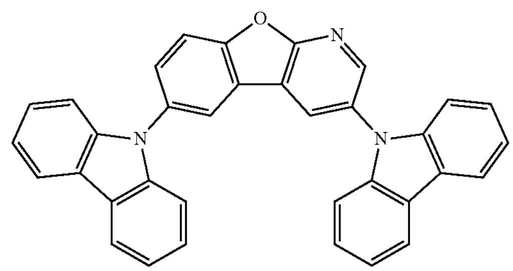,
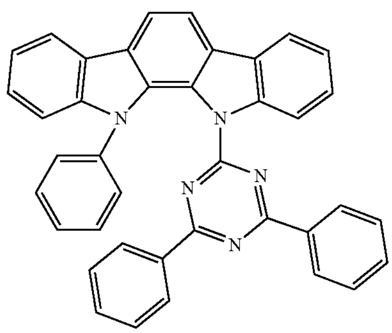,
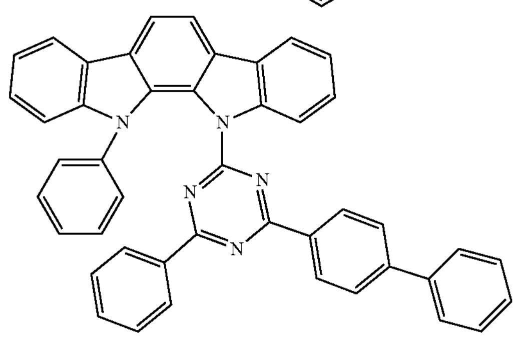,
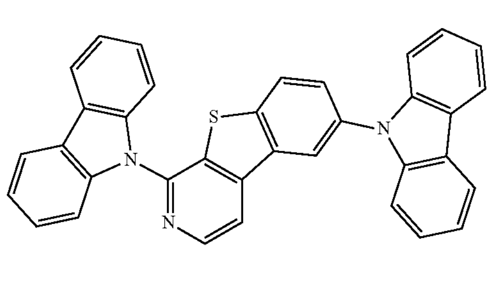,
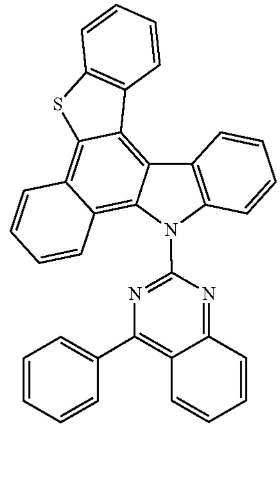, -continued
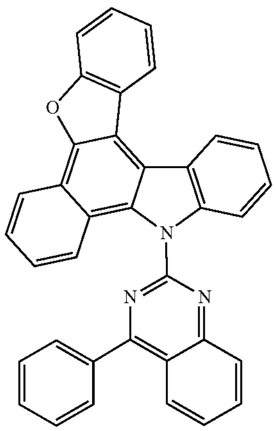,
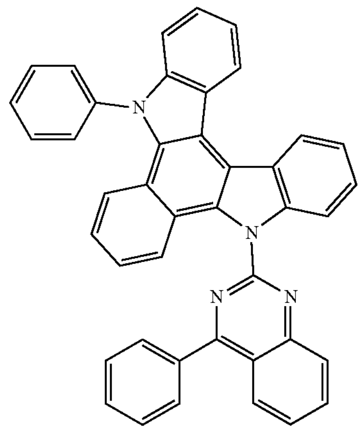,
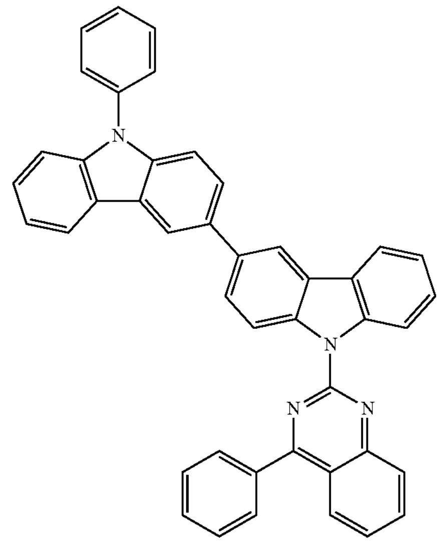,
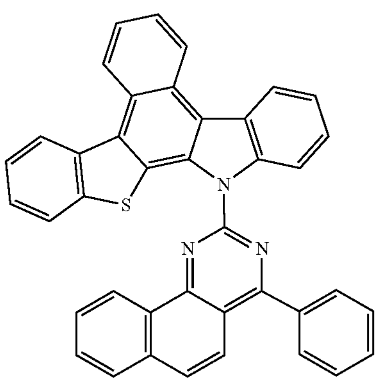,
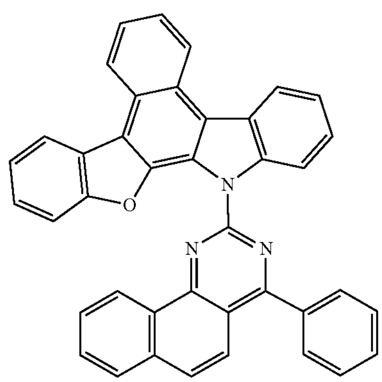,
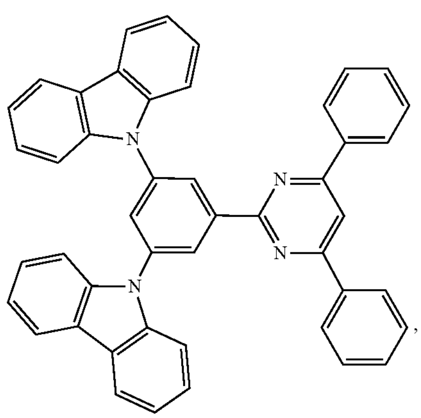,
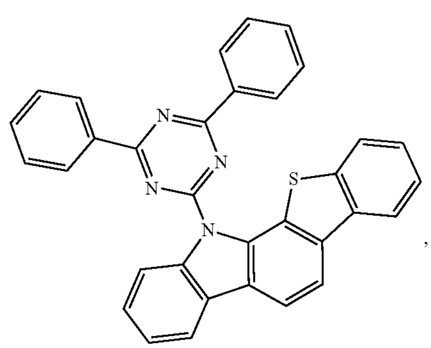, -continued
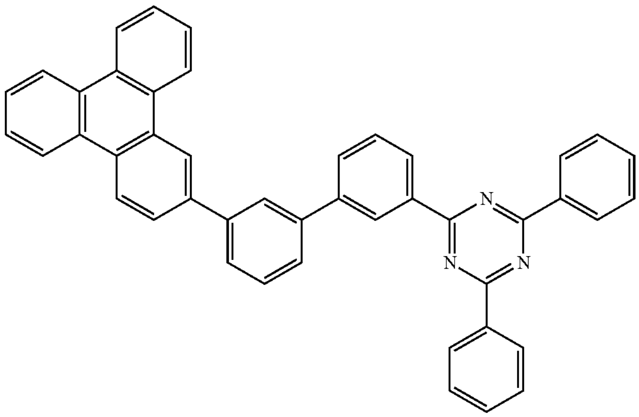
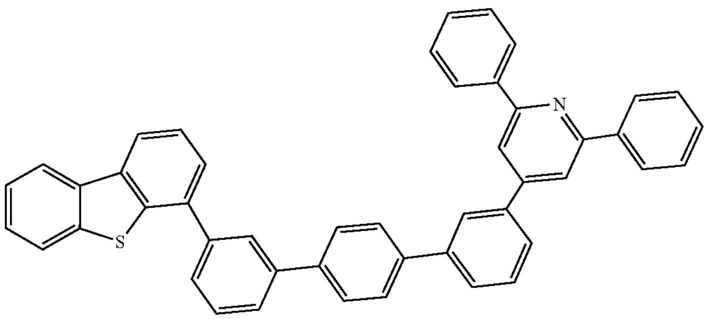
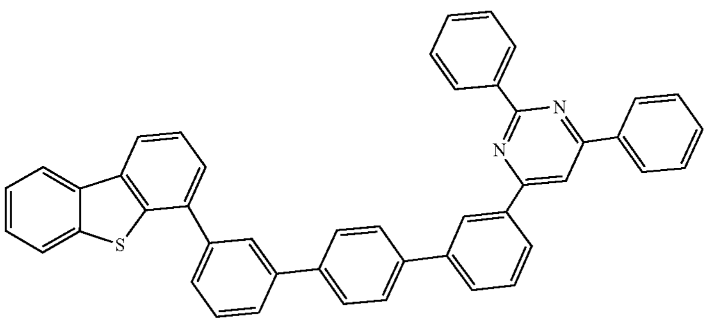
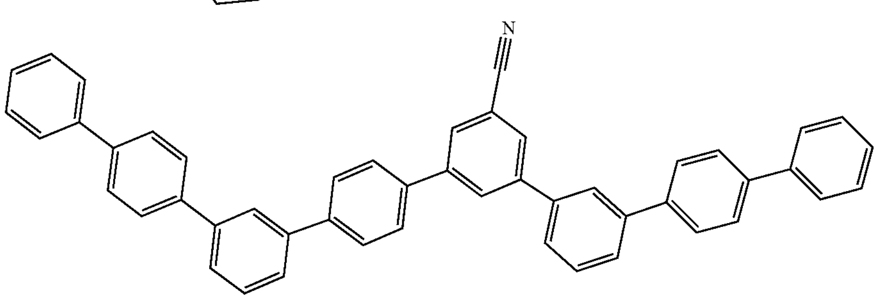
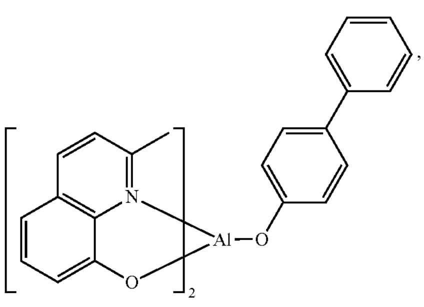
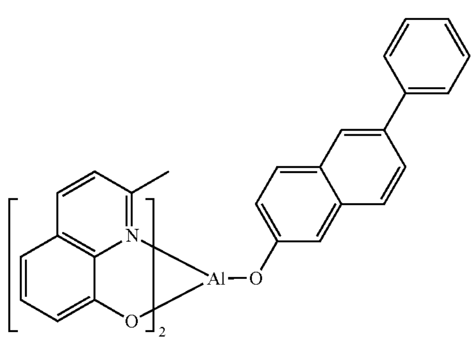

-continued

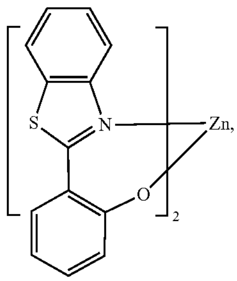

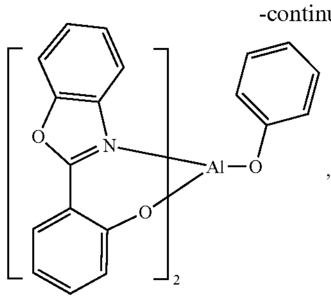

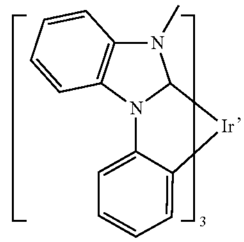

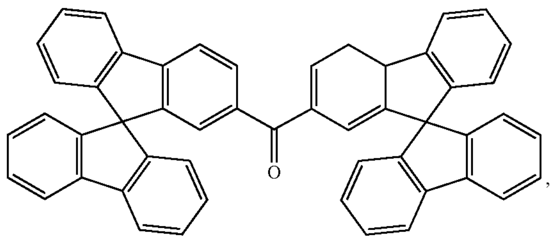

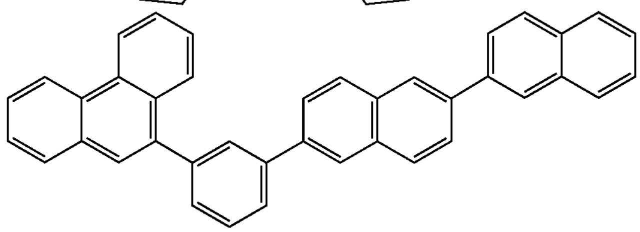

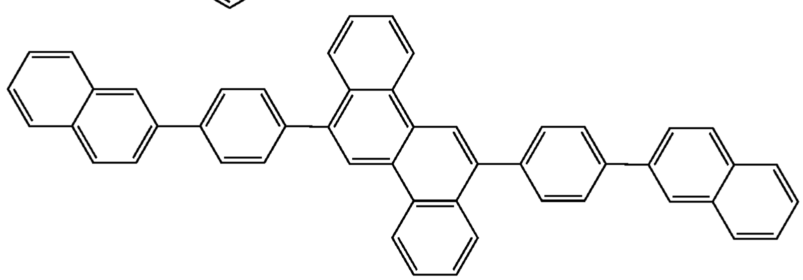

and

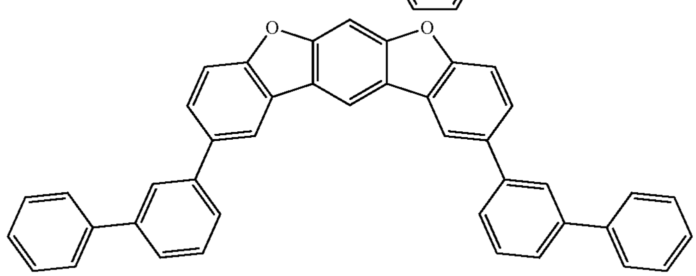

Additional Emitters

One or more additional emitter dopants may be used in conjunction with the compound of the present disclosure. Examples of the additional emitter dopants are not particularly limited, and any compounds may be used as long as the compounds are typically used as emitter materials. Examples of suitable emitter materials include, but are not limited to, compounds which can produce emissions via phosphorescence, fluorescence, thermally activated delayed fluorescence, i.e., TADF (also referred to as E-type delayed fluorescence), triplet-triplet annihilation, or combinations of these processes.

Non-limiting examples of the emitter materials that may be used in an OLED in combination with materials disclosed herein are exemplified below together with references that disclose those materials: CN103694277, CN1696137, EB01238981, EP01239526, EP01961743, EP1239526, EP1244155, EP1642951, EP1647554, EP1841834, EP1841834B, EP2062907, EP2730583, JP2012074444, JP2013110263, JP4478555, KR1020090133652, KR20120032054, KR20130043460, TW201332980, U.S. Ser. No. 06/699,599, U.S. Ser. No. 06/916,554, US20010019782, US20020034656, US20030068526, US20030072964, US20030138657, US20050123788, US20050244673, US2005123791, US2005260449, US20060008670, US20060065890, US20060127696, US20060134459, US20060134462, US20060202194, US20060251923, US20070034863, US20070087321, US20070103060, US20070111026, US20070190359, US20070231600, US2007034863, US2007104979, US2007104980, US2007138437, US2007224450, US2007278936, US20080020237, US20080233410, US20080261076, US20080297033, US200805851, US2008161567, US2008210930, US20090039776, US20090108737, US20090115322, US20090179555, US2009085476, US2009104472, US20100090591, US20100148663, US20100244004, US20100295032, US2010102716, US2010105902, US2010244004, US2010270916, US20110057559, US20110108822, US20110204333, US2011215710, US2011227049, US2011285275, US2012292601, US20130146848, US2013033172, US2013165653, US2013181190, US2013334521, US20140246656, US2014103305, U.S. Pat. Nos. 6,303,238, 6,413,656, 6,653,654, 6,670,645, 6,687,266, 6,835,469, 6,921,915, 7,279,704, 7,332,232, 7,378,162, 7,534,505, 7,675,228, 7,728,137, 7,740,957, 7,759,489, 7,951,947, 8,067,099, 8,592,586, 8,871,361, WO06081973, WO06121811, WO07018067, WO07108362, WO07115970, WO07115981, WO08035571, WO2002015645, WO2003040257, WO2005019373, WO2006056418, WO2008054584, WO2008078800, WO2008096609, WO2008101842, WO2009000673, WO2009050281, WO2009100991, WO2010028151, WO2010054731, WO2010086089, WO2010118029, WO2011044988, WO2011051404, WO2011107491, WO2012020327, WO2012163471, WO2013094620, WO2013107487, WO2013174471, WO2014007565, WO2014008982, WO2014023377, WO2014024131, WO2014031977, WO2014038456, WO2014112450.
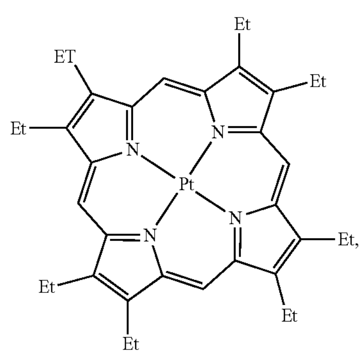
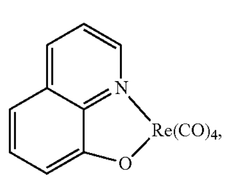
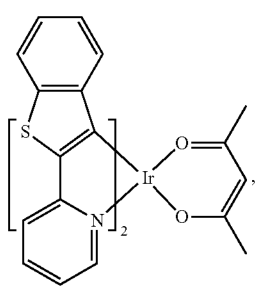
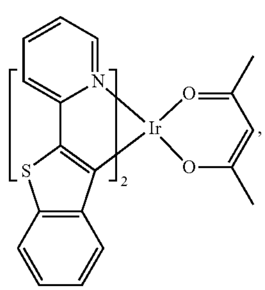
-continued
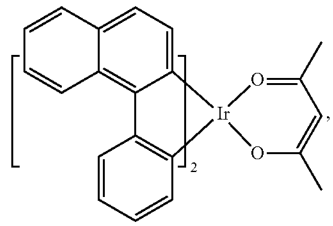
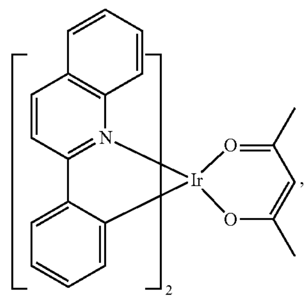
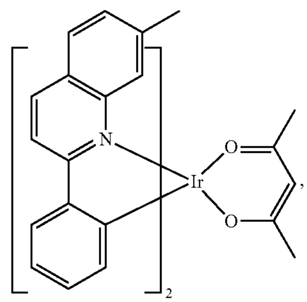
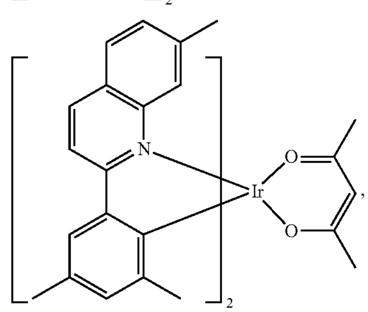
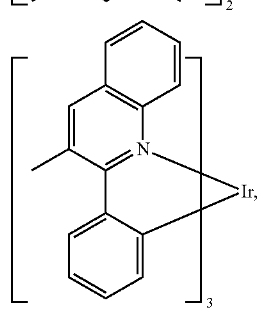
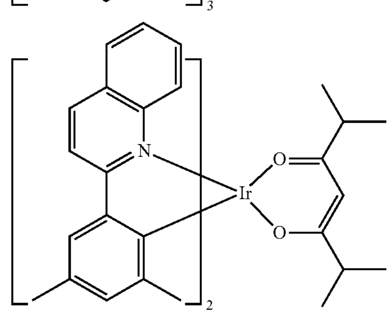

-continued
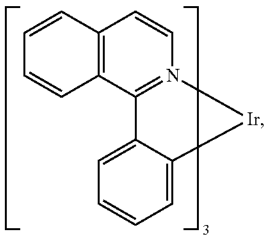
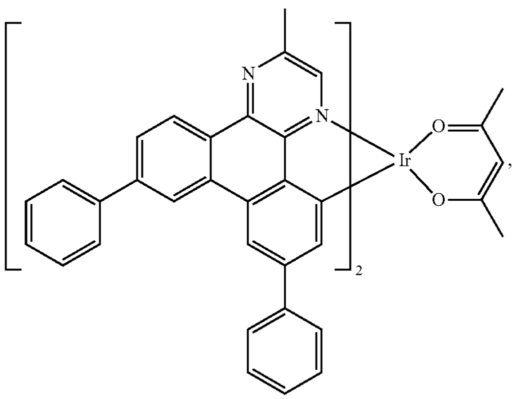
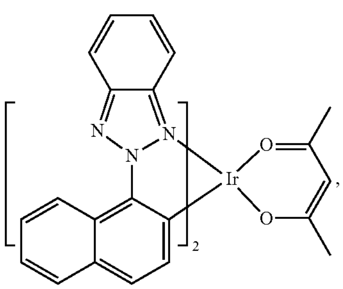
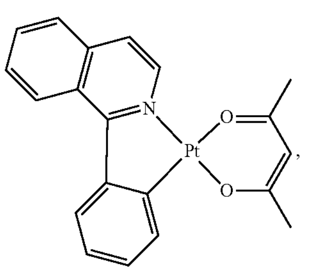
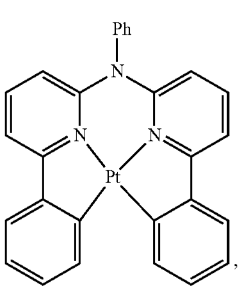
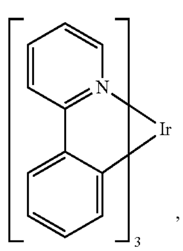
-continued
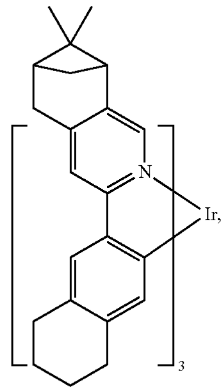
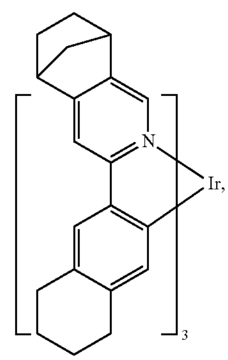
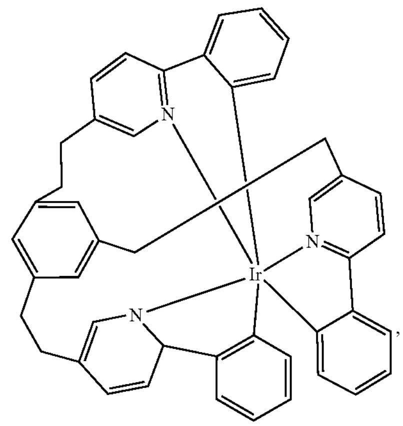
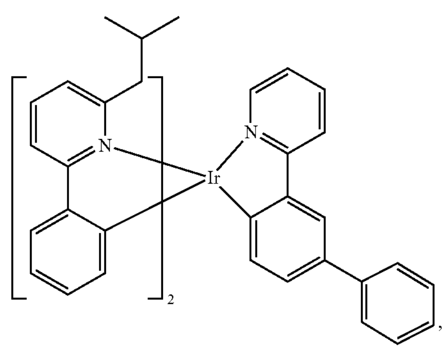
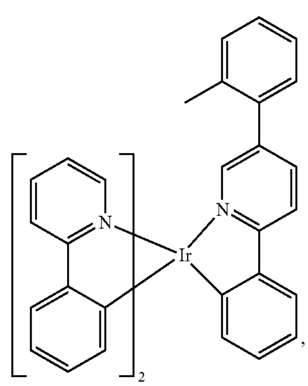

-continued
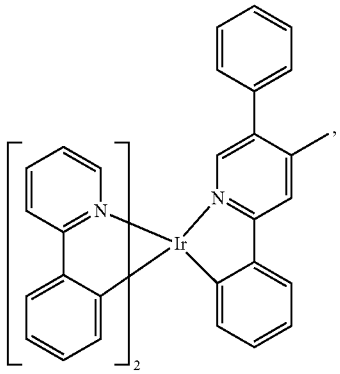
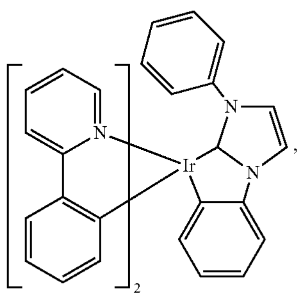
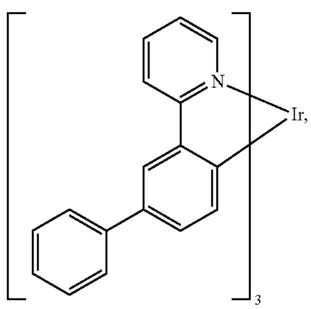
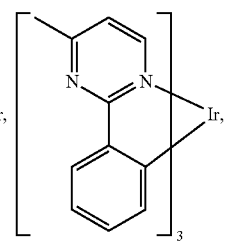
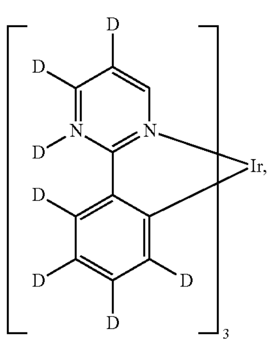
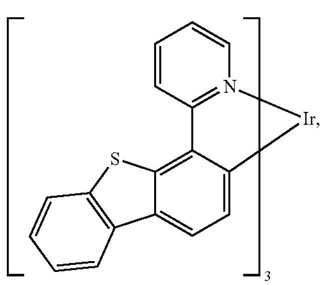
-continued
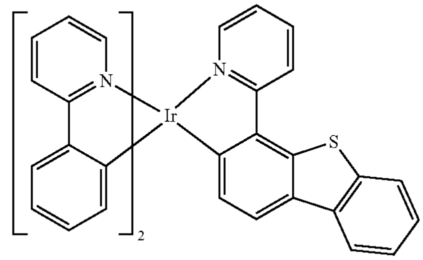
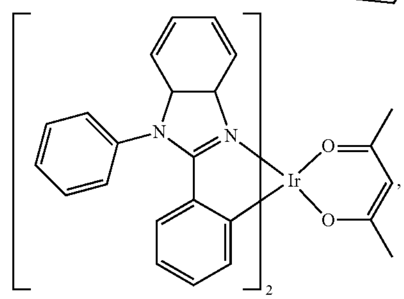
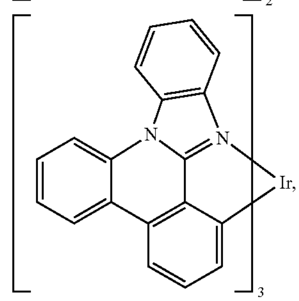
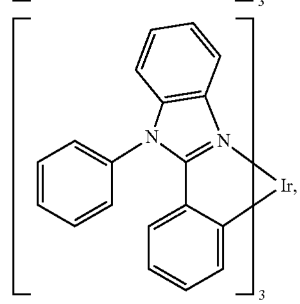
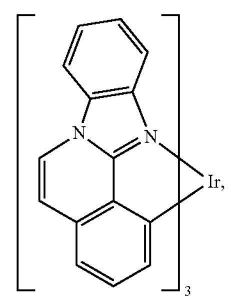
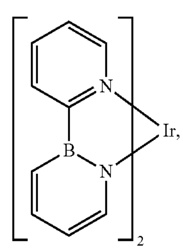
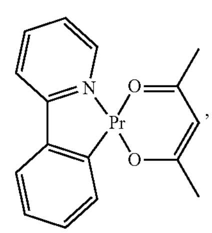
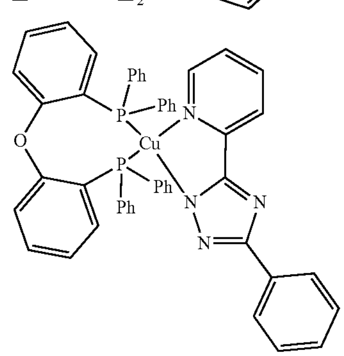

-continued
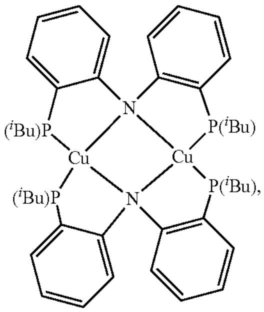
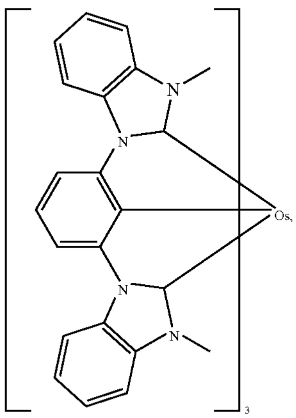
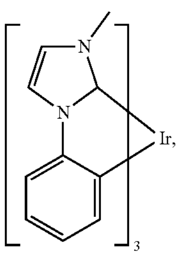
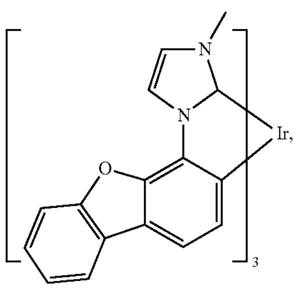
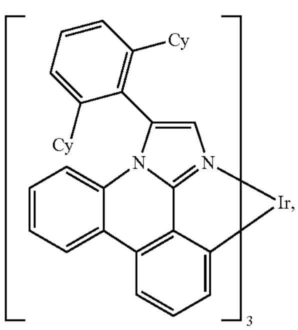
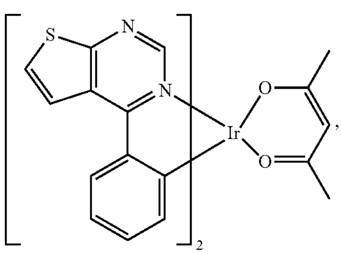
-continued
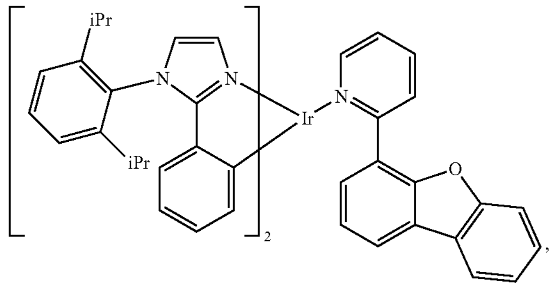
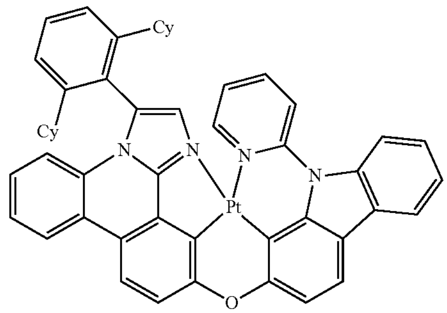
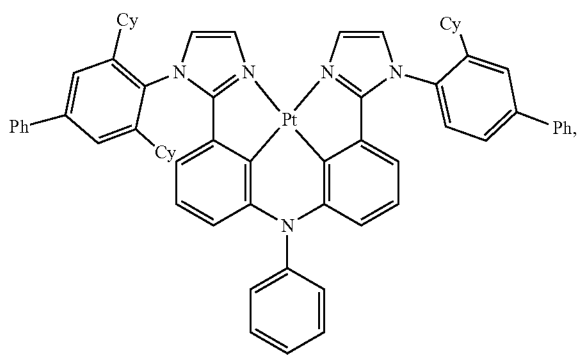
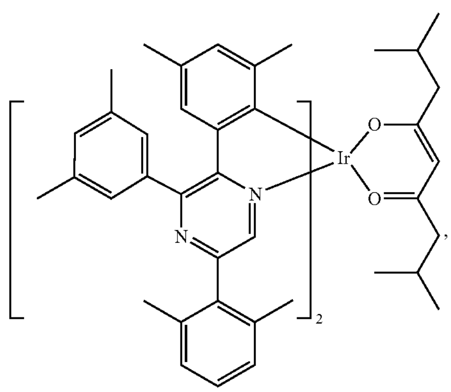
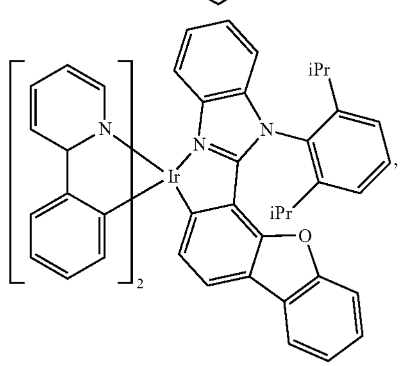

-continued
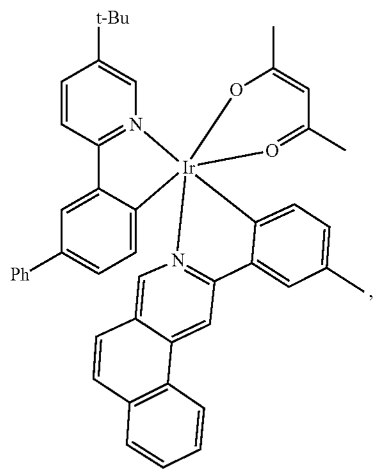
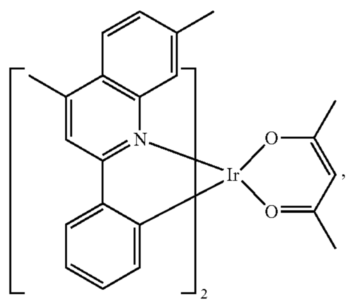
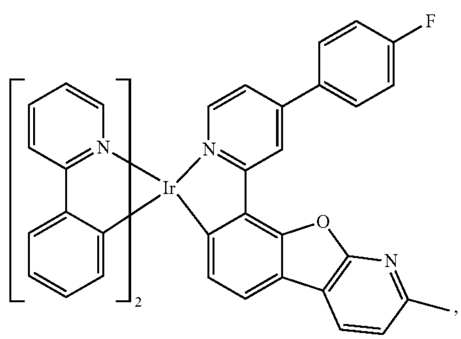
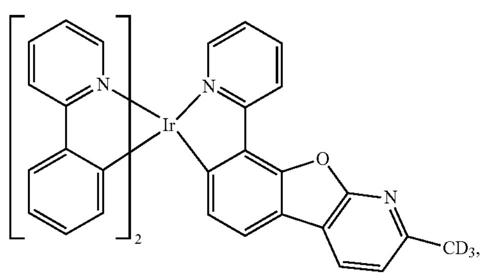
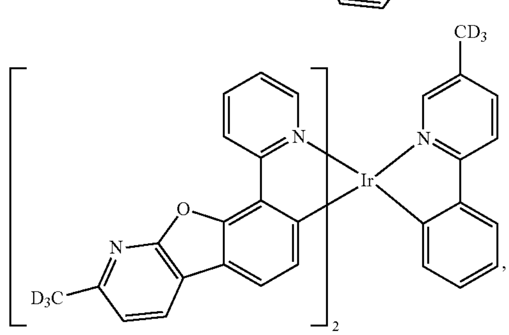
-continued
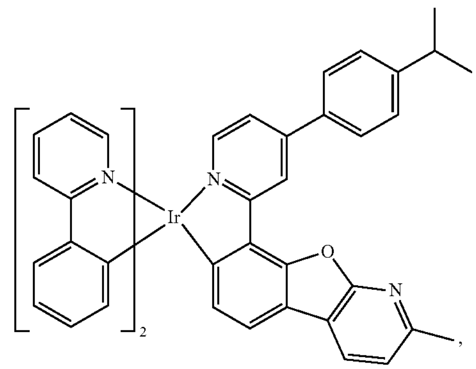
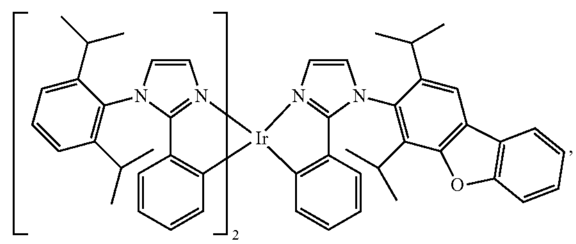
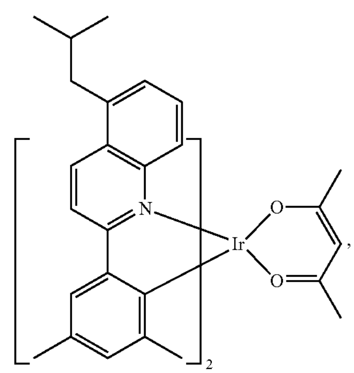
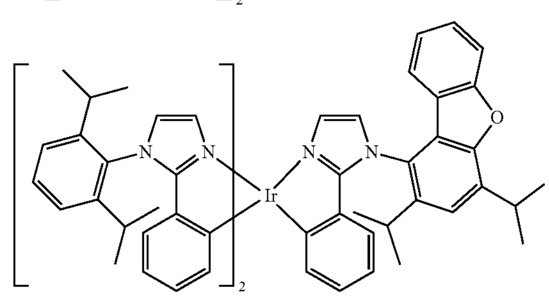
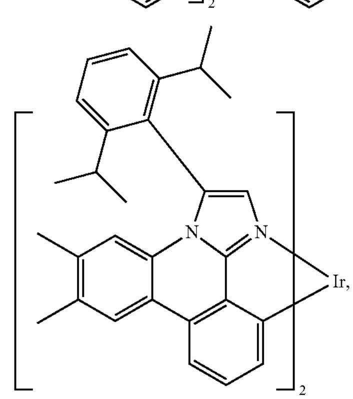

-continued
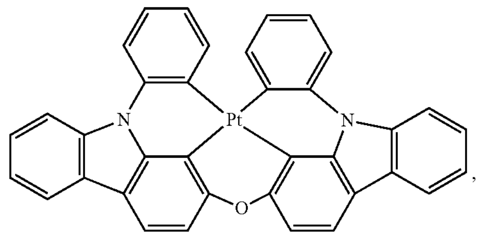
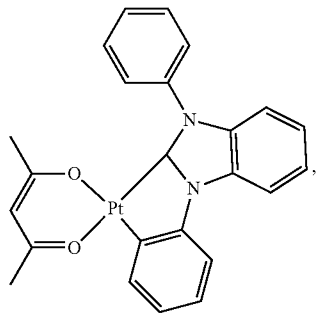
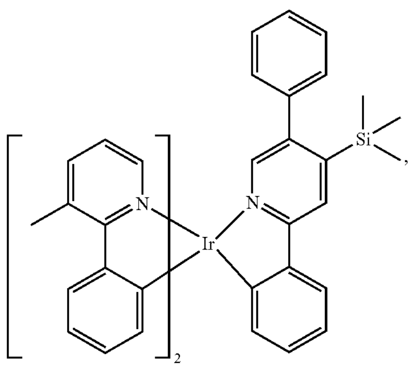
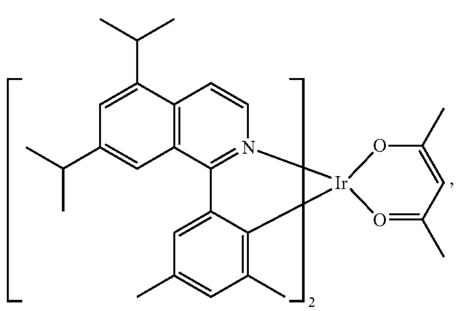
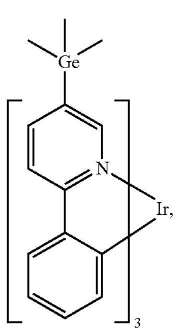
-continued
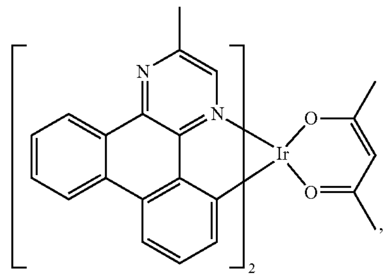
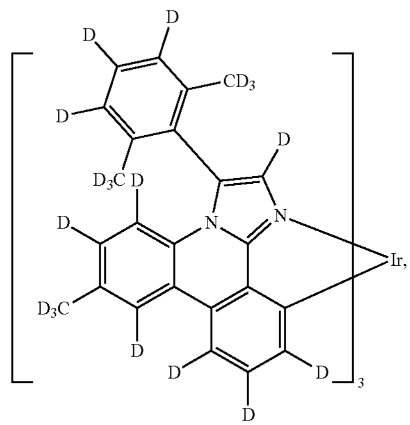
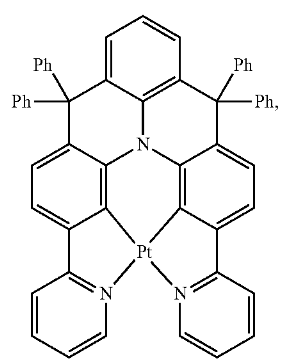
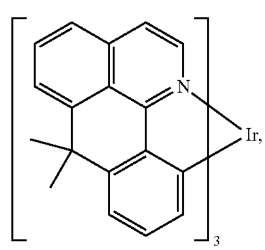
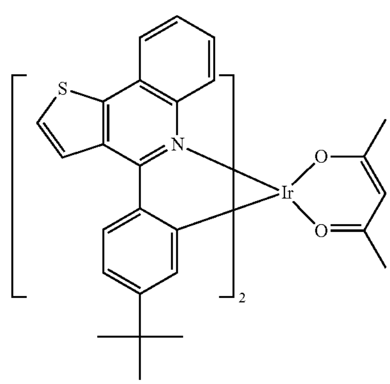

-continued
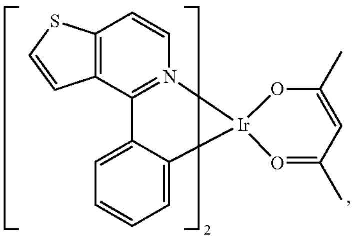
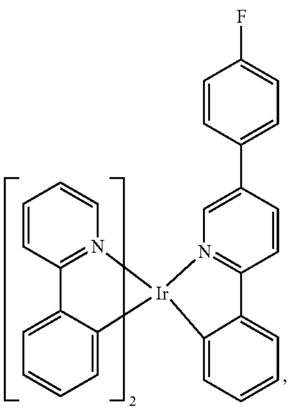
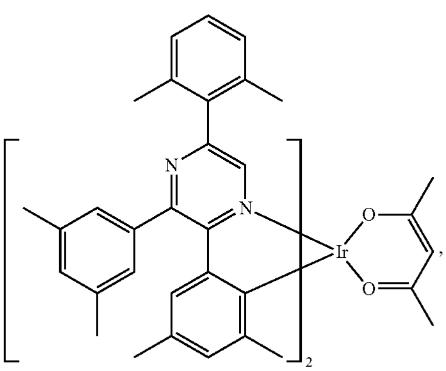
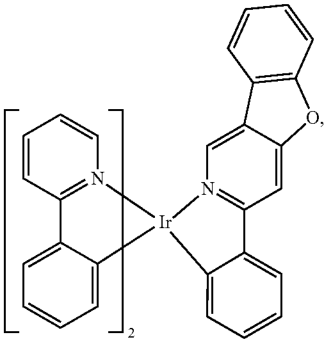
-continued
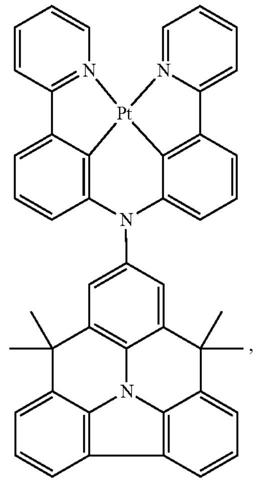
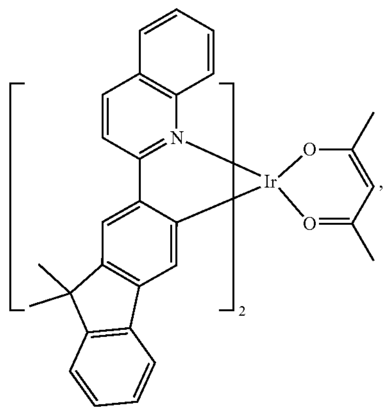
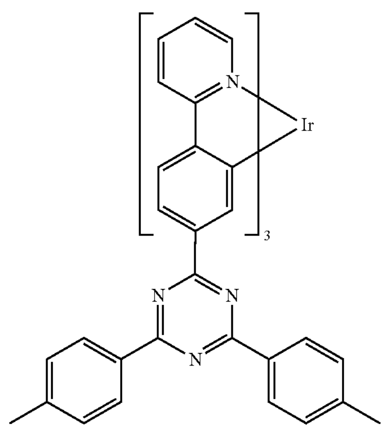
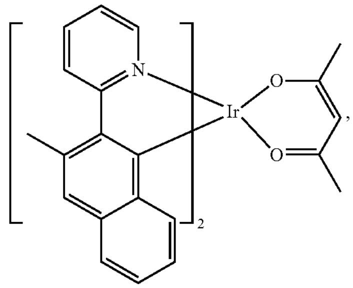

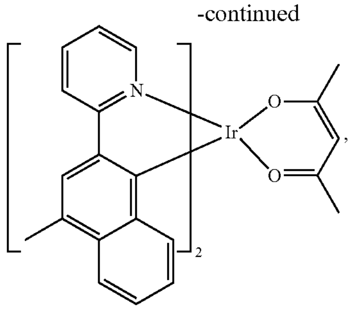
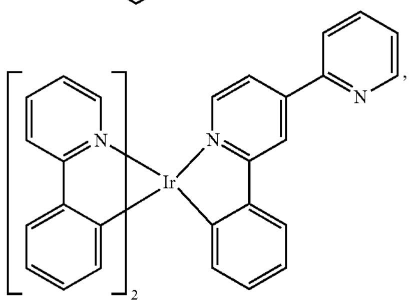
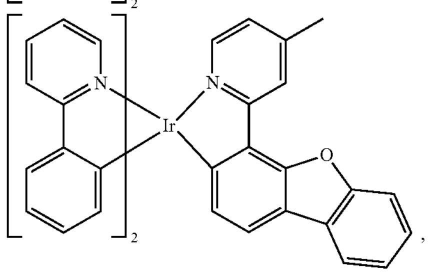
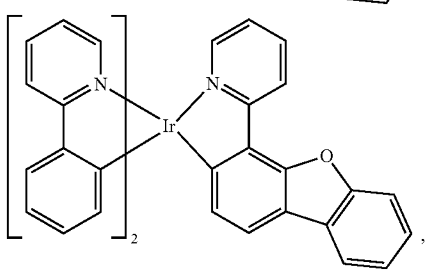
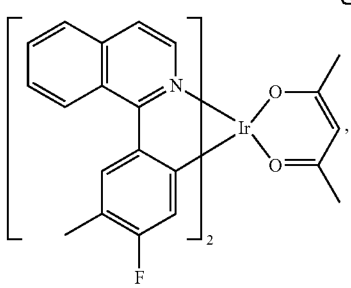
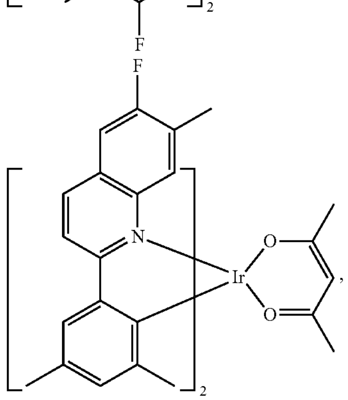
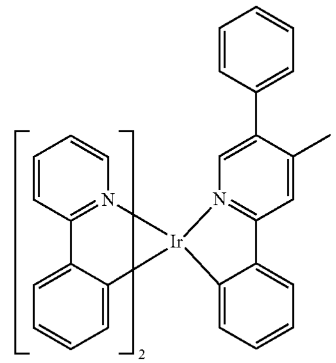
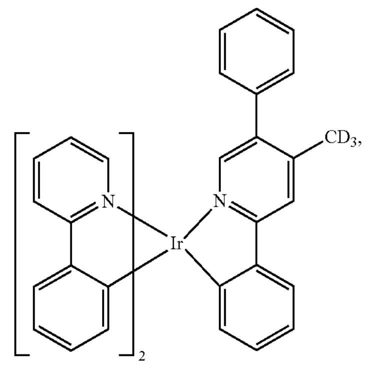
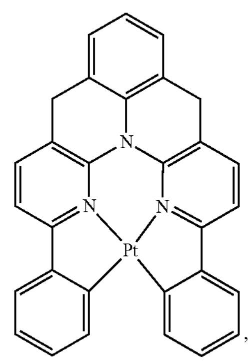
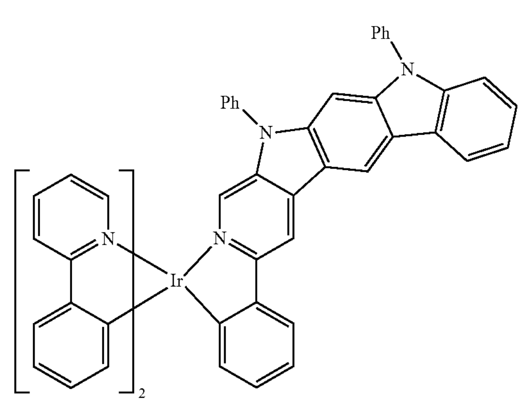

-continued
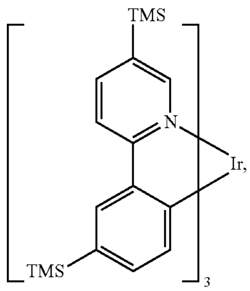
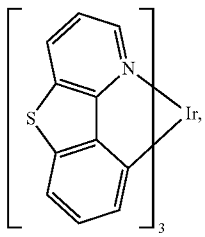
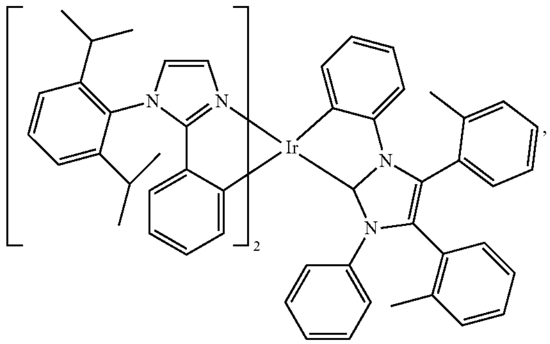
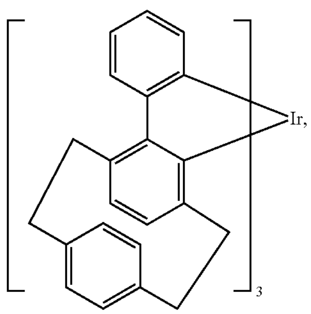
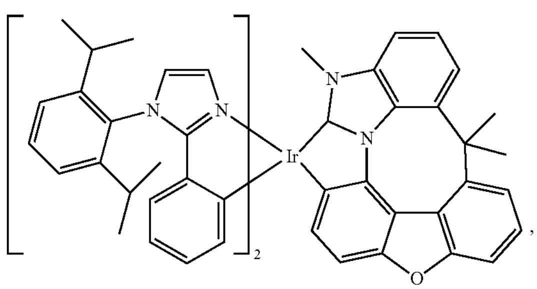
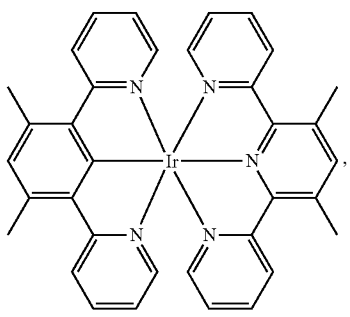
-continued
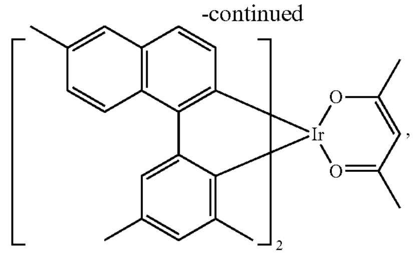
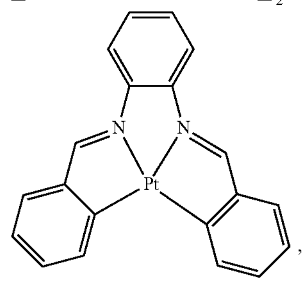
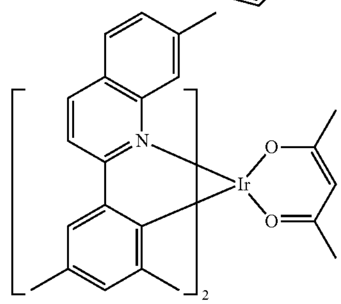
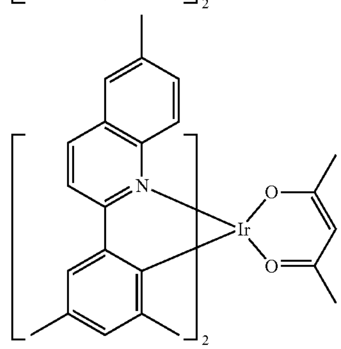
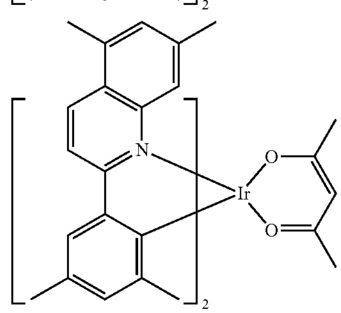
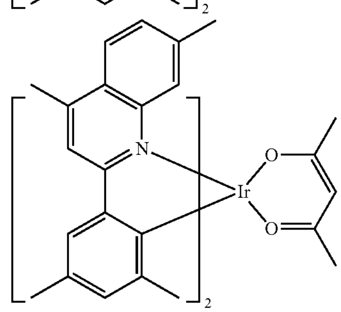

-continued
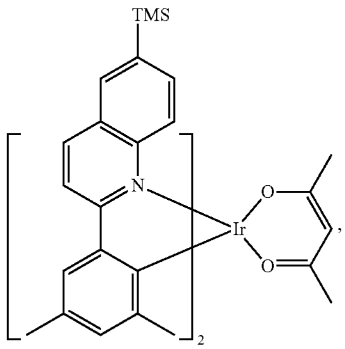
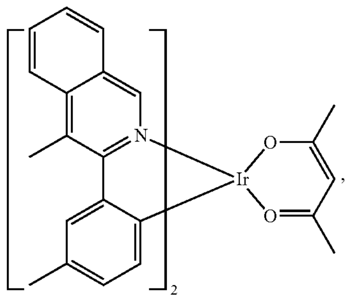
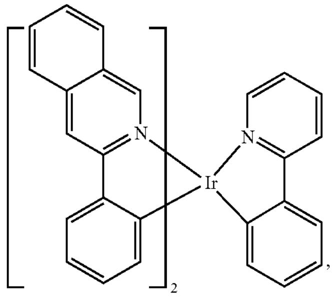
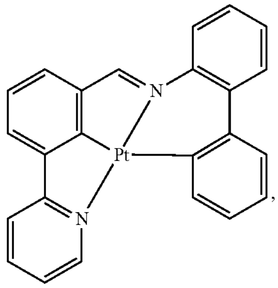
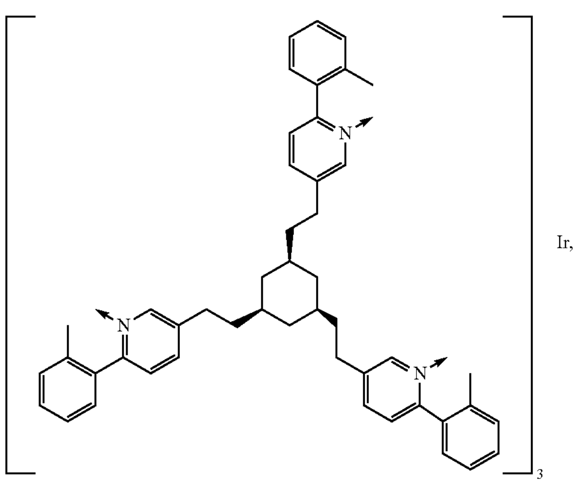
-continued
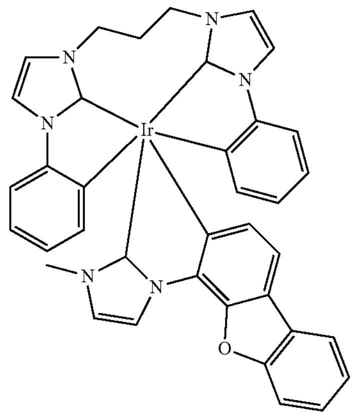
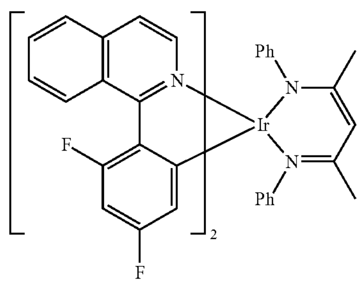
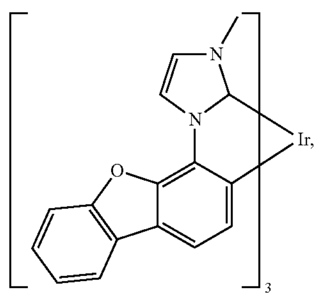
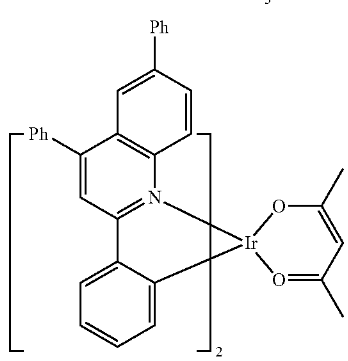
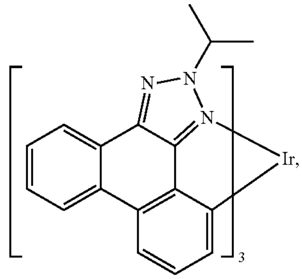

-continued

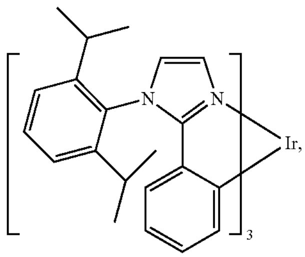

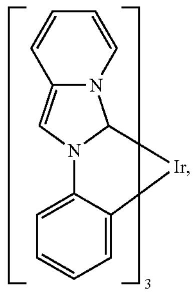

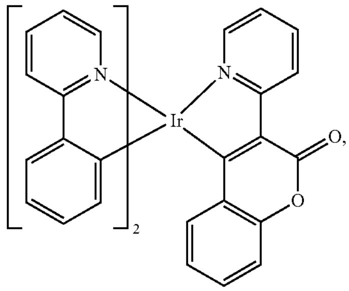

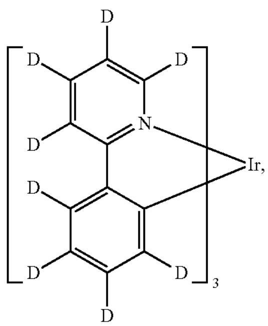

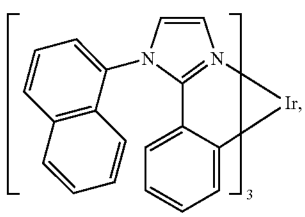

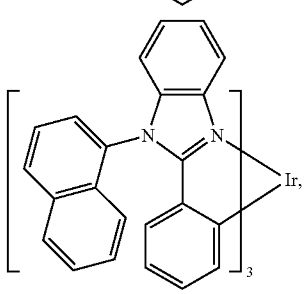

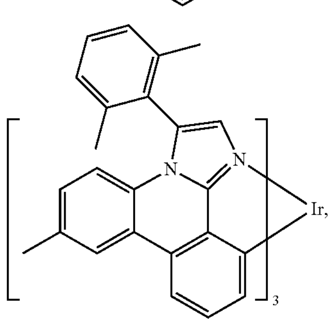

-continued

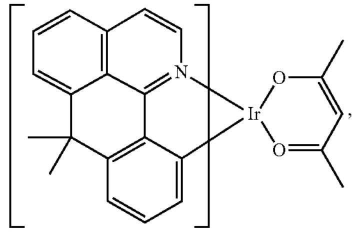

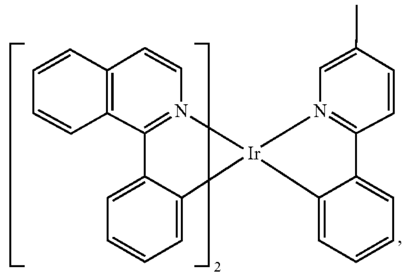

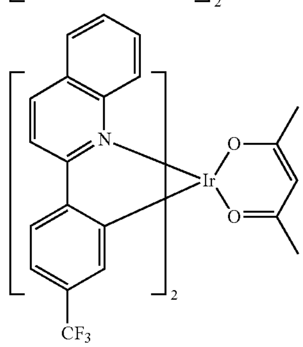

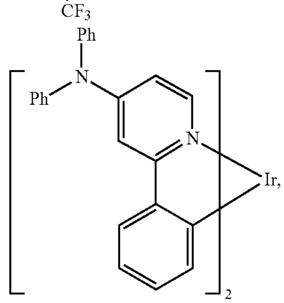

and

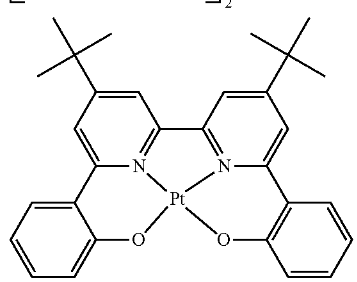

HBL

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and/or higher triplet energy than the emitter closest to the HBL interface. In some embodiments, the HBL material has a lower HOMO (further from the vacuum level) and/or higher triplet energy than one or more of the hosts closest to the HBL interface.

In one aspect, compound used in HBL contains the same molecule or the same functional groups used as host described above.

In another aspect, compound used in HBL contains at least one of the following groups in the molecule:

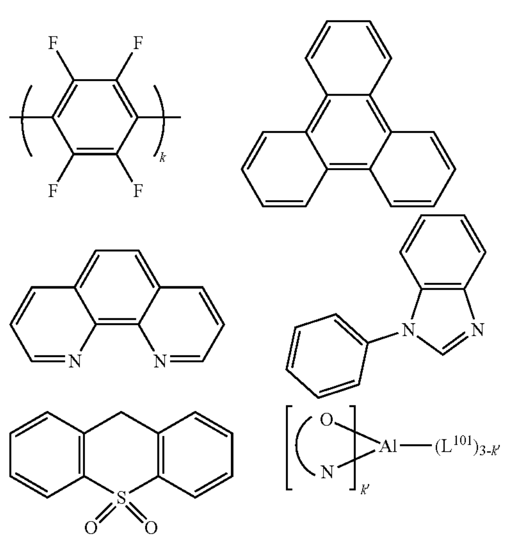

wherein k is an integer from 1 to 20; $L^{101}$ is an another ligand, k' is an integer from 1 to 3.

ETL

Electron transport layer (ETL) may include a material capable of transporting electrons. Electron transport layer may be intrinsic (undoped), or doped. Doping may be used to enhance conductivity. Examples of the ETL material are not particularly limited, and any metal complexes or organic compounds may be used as long as they are typically used to transport electrons.

In one aspect, compound used in ETL contains at least one of the following groups in the molecule:

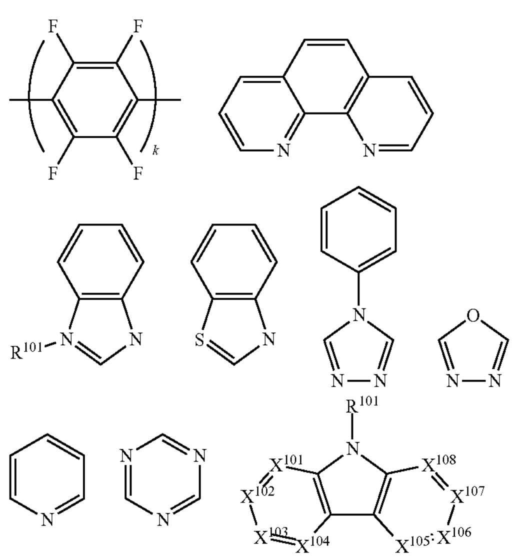

-continued

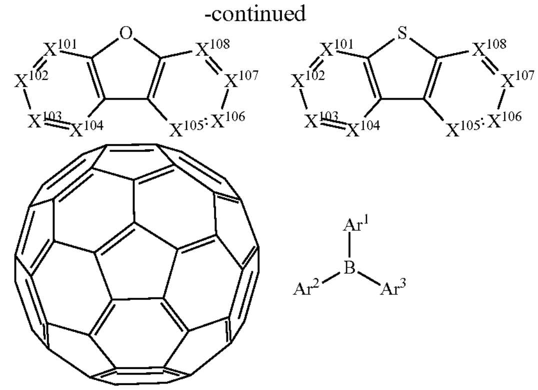

wherein $R^{101}$ is selected from the group consisting of hydrogen, deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acids, ether, ester, nitrile, isonitrile, sulfanyl, sulfinyl, sulfonyl, phosphino, and combinations thereof, when it is aryl or heteroaryl, it has the similar definition as Ar's mentioned above. $Ar^1$ to $Ar^3$ has the similar definition as Ar's mentioned above. k is an integer from 1 to 20. $X^{101}$ to $X^{108}$ is selected from C (including CH) or N.

In another aspect, the metal complexes used in ETL contains, but not limit to the following general formula:

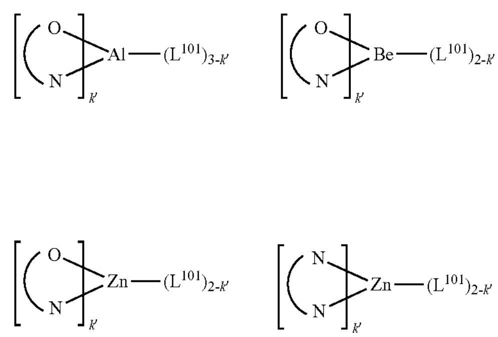

wherein (O—N) or (N—N) is a bidentate ligand, having metal coordinated to atoms O, N or N, N; $L^{101}$ is another ligand; k' is an integer value from 1 to the maximum number of ligands that may be attached to the metal.

Non-limiting examples of the ETL materials that may be used in an OLED in combination with materials disclosed herein are exemplified below together with references that disclose those materials: CN103508940, EP01602648, EP01734038, EP01956007, JP2004-022334, JP2005149918, JP2005-268199, KR0117693, KR20130108183, US20040036077, US20070104977, US2007018155, US20090101870, US20090115316, US20090140637, US20090179554, US2009218940, US2010108990, US2011156017, US2011210320, US2012193612, US2012214993, US2014014925, US2014014927, US20140284580, U.S. Pat. Nos. 6,656,612, 8,415,031, WO2003060956, WO2007111263, WO2009148269, WO2010067894, WO2010072300, WO2011074770, WO2011105373, WO2013079217, WO2013145667, WO2013180376, WO2014104499, WO2014104535, -continued
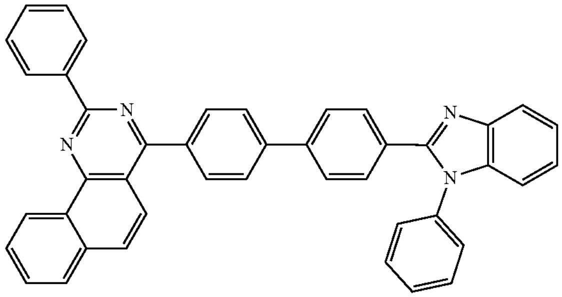
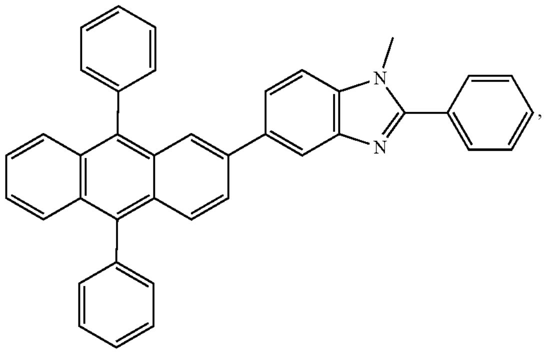
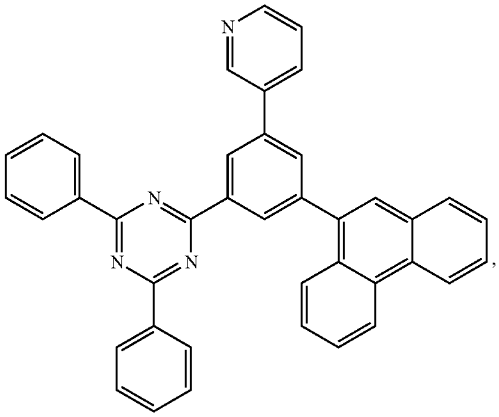
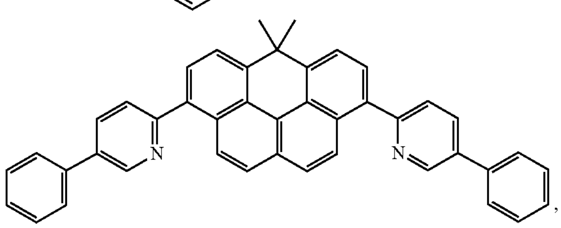
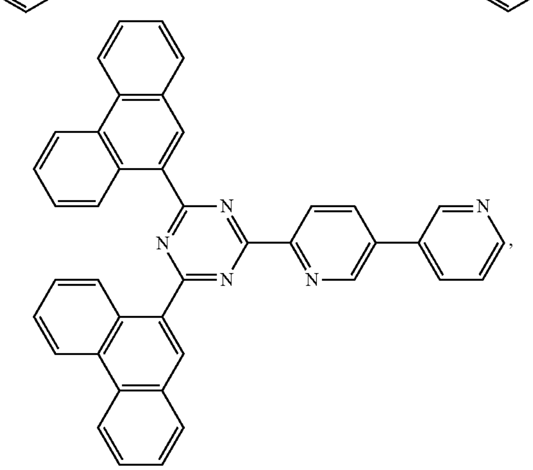
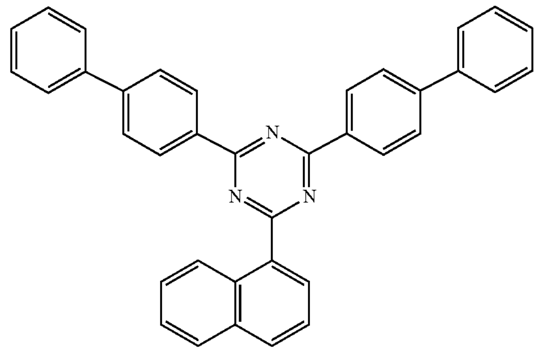
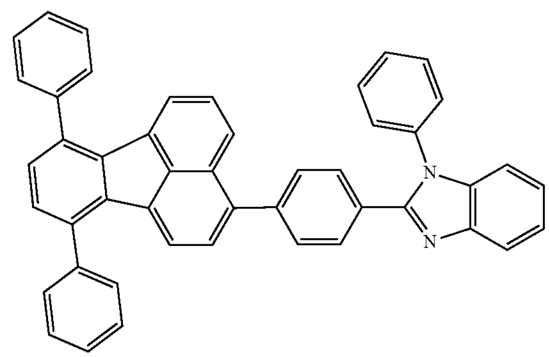
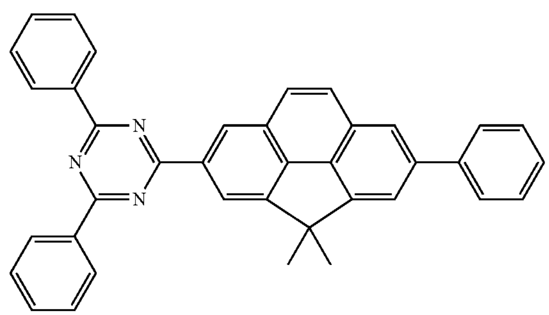
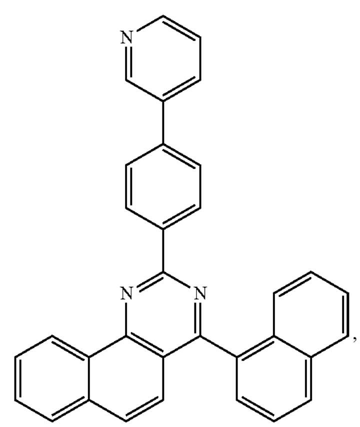

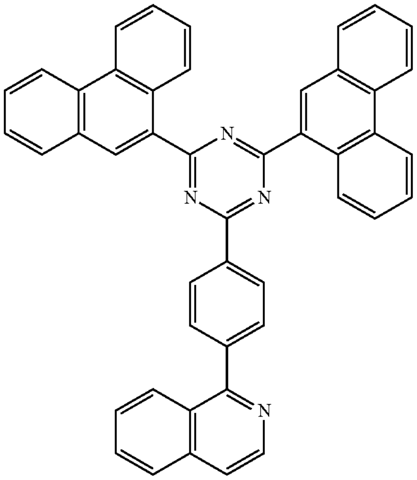
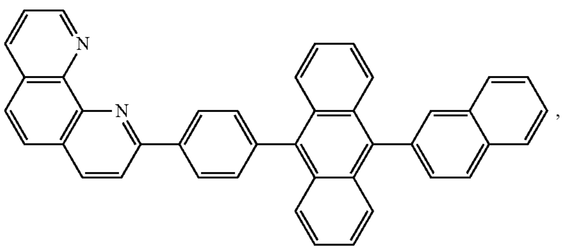
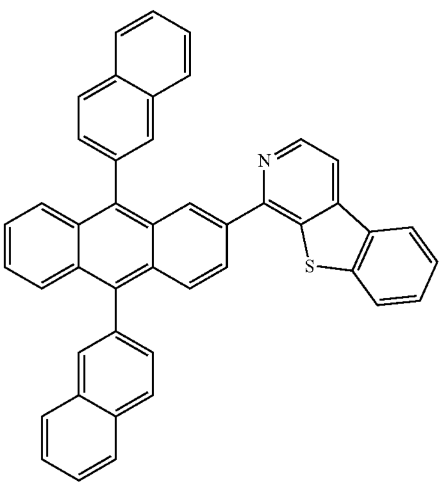
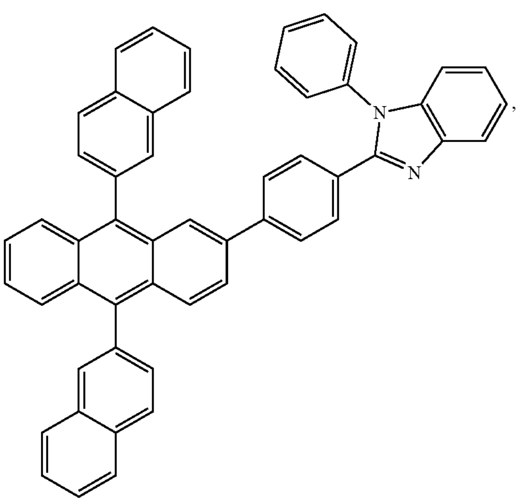
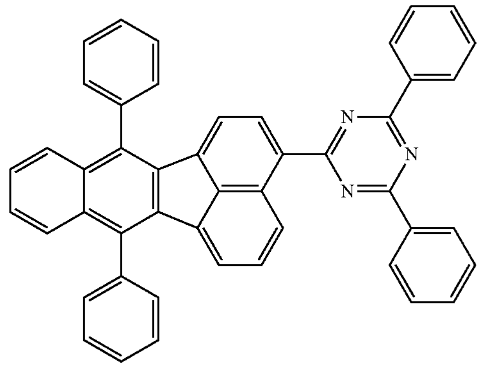
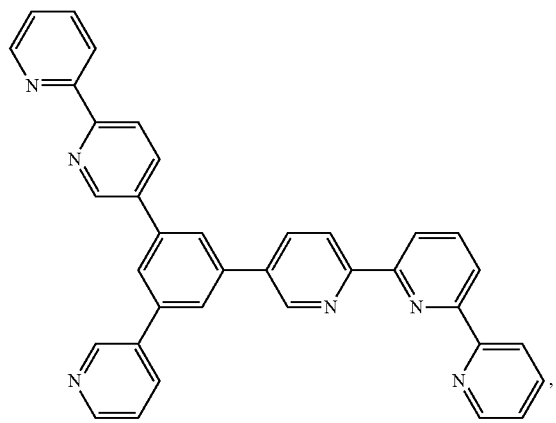
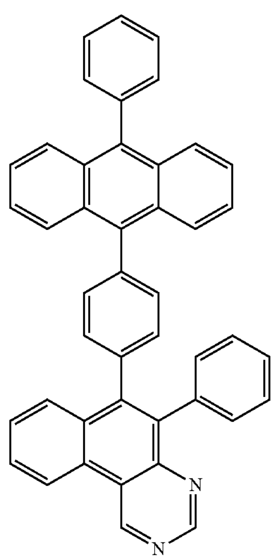

-continued
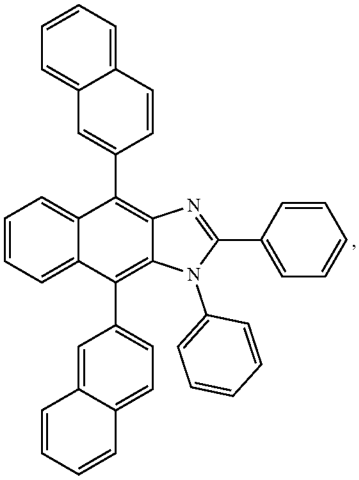
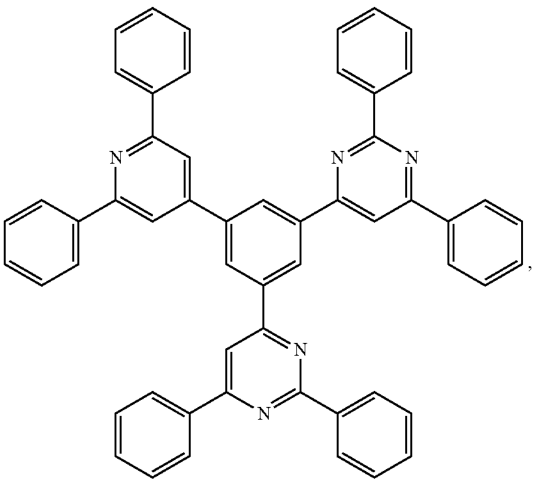
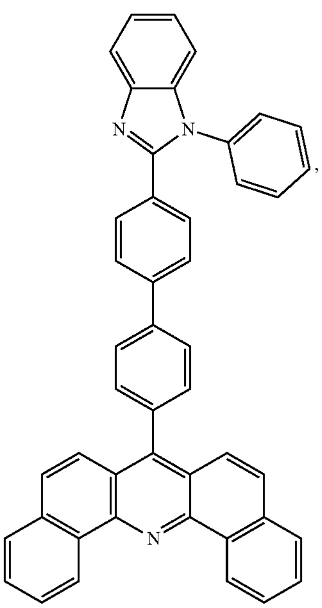
-continued
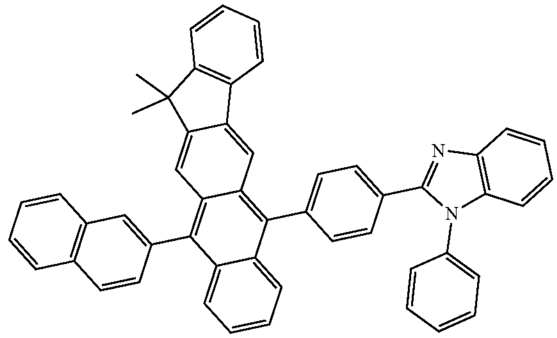
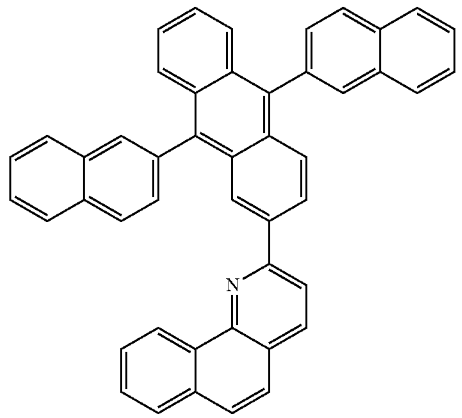
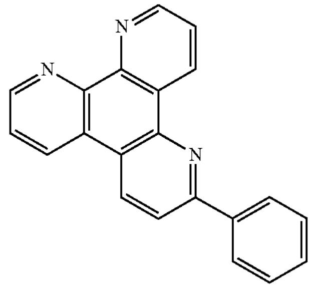
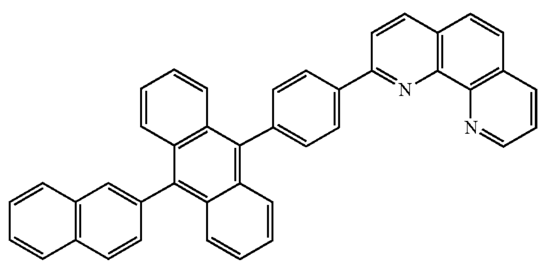
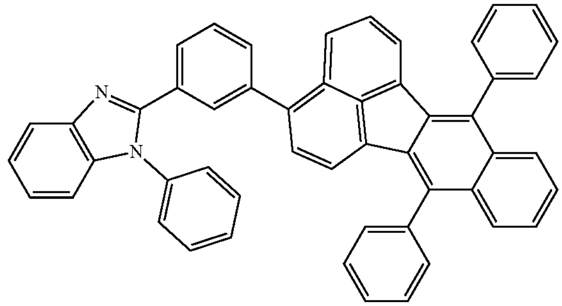

-continued
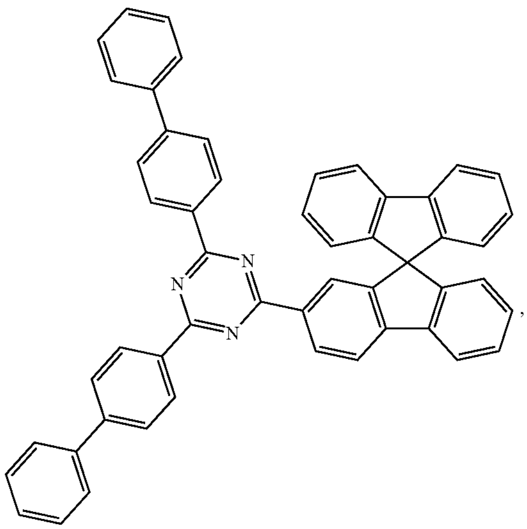
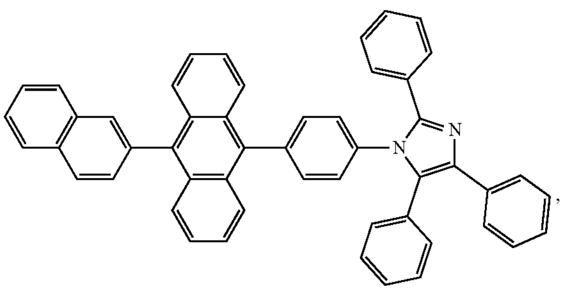
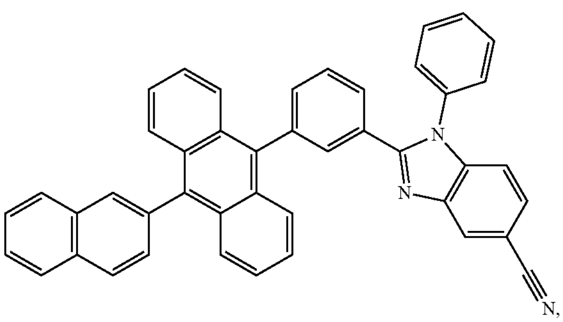
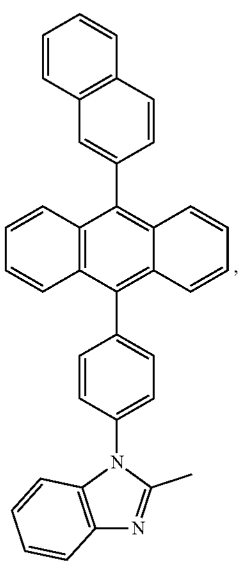
-continued
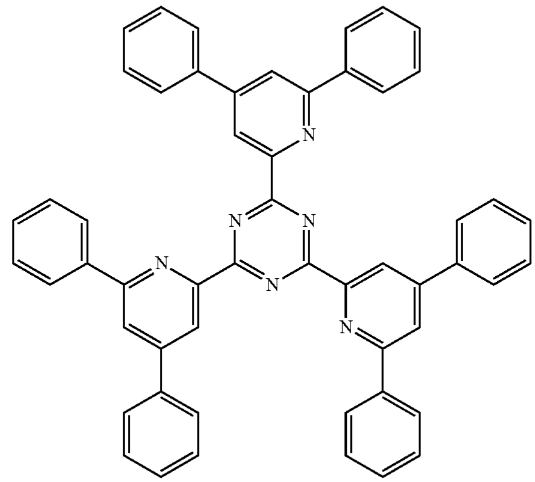
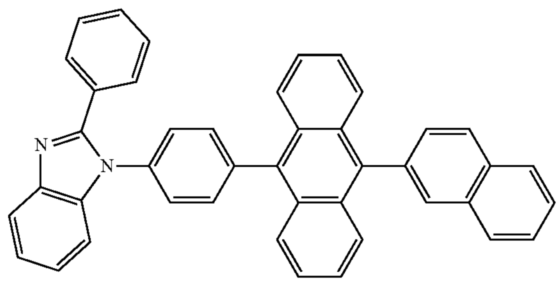
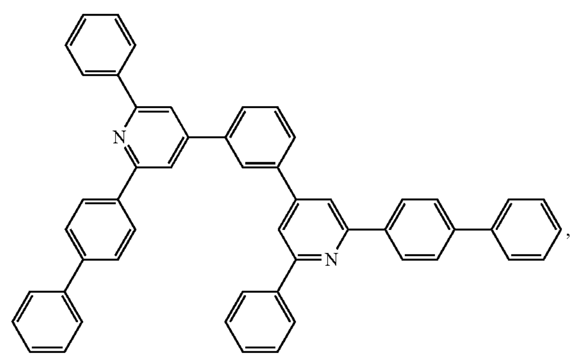
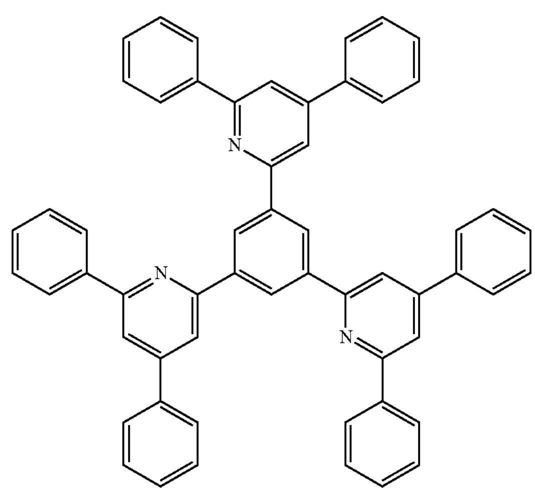

-continued

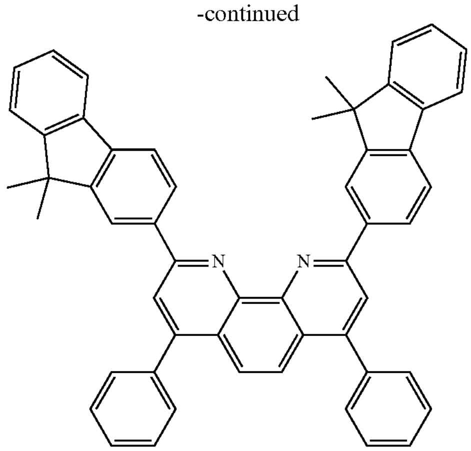

, and

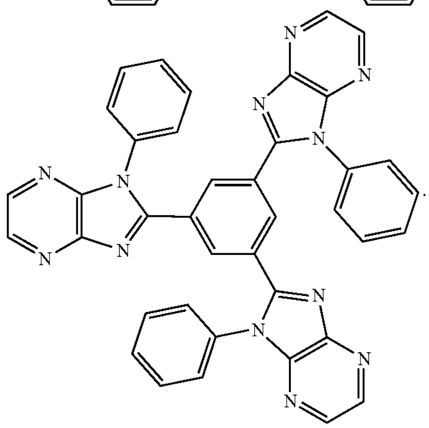

Charge Generation Layer (CGL)

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

In any above-mentioned compounds used in each layer of the OLED device, the hydrogen atoms can be partially or fully deuterated. Thus, any specifically listed substituent, such as, without limitation, methyl, phenyl, pyridyl, etc. may be undeuterated, partially deuterated, and fully deuterated versions thereof. Similarly, classes of substituents such as, without limitation, alkyl, aryl, cycloalkyl, heteroaryl, etc. also may be undeuterated, partially deuterated, and fully deuterated versions thereof.

As previously disclosed, OLEDs and other similar devices may be fabricated using a variety of techniques and devices. For example, in OVJP and similar techniques, one or more jets of material is directed at a substrate to form the various layers of the OLED.

Methods of the Disclosure

Figure 4:
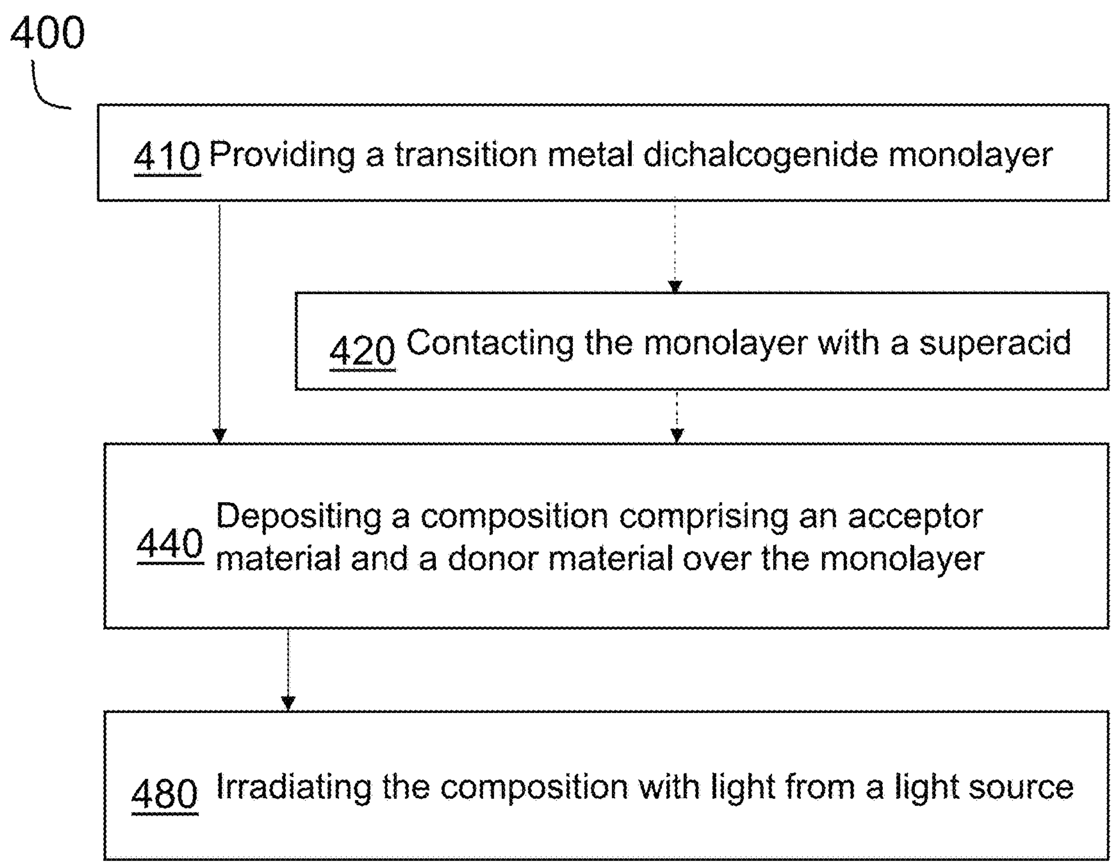
FIG. 4 is a schematic demonstrating an exemplary method of producing a passivation layer.

In one aspect, the present disclosure relates to a method of passivating a transition metal dichalcogenide. Exemplary method 400 is provided in FIG. 4. In step 410, a transition metal dichalcogenide monolayer is provided. In step 440, a composition comprising an transition metal oxide and a donor material is deposited over the monolayer. In step 480, the composition is irradiated with light from a light source.

In one embodiment, the light has a photon energy which is greater than or equal to the difference in energy between the HOMO of the donor material and the LUMO of the transition metal oxide.

There is no particular limit to the method of producing the transition metal dichalcogenide monolayer. In one embodiment, the transition metal dichalcogenide monolayer is produced via exfoliation, such as via adhesive exfoliation or via liquid-phase exfoliation. In one embodiment, the transition metal dichalcogenide monolayer is produced via chemical vapor deposition from suitable precursors, as would be understood by those of skill in the art. In one embodiment, the transition metal dichalcogenide monolayer is produced using molecular beam epitaxy.

In one embodiment, the method further comprises step 420, in which the monolayer is contacted with a superacid. As used herein, a "superacid" is understood to mean an acid with an acidity greater than or equal to that of concentrated sulfuric acid. Exemplary superacids include, but are not limited to, fluoroantimonic acid ($HF:SbF_5$), magic acid ($HSO_3F:SbF_5$), fluoroboric acid ($HF:BF_3$), fluorosulfuric acid ($FSO_3H$), hydrogen fluoride (HF), triflic acid ($HOSO_2CF_3$), perchloric acid ($HClO_4$), and bis(trifluoromethane)sulfonimide (bistriflimide; TFSI). In one embodiment, step 420 further comprises the step of annealing the monolayer at a temperature of about 100° C.

The step of depositing a composition comprising a transition metal oxide and an organic electron donor material over the monolayer may be performed using any method known to those of skill in the art. In one embodiment, the composition is deposited via vacuum thermal evaporation (VTE), spin-coating using solution processable compounds and/or precursors, or any other deposition method.

In one embodiment, the composition comprising a transition metal oxide and an organic electron donor material is deposited to a thickness between 1 nm and 50 nm. In one embodiment, the thickness I between 1 nm and 25 nm. In one embodiment, the thickness is between about 5 nm and about 15 nm. In one embodiment, the thickness is about 10 nm.

In one embodiment, the step of depositing a composition comprising a transition metal oxide and an organic electron donor material over the monolayer comprises the step of: depositing a mixture comprising an transition metal oxide and a donor material in a volume ratio between 10:1 and 1:1 over the monolayer. In one embodiment, the volume ratio of transition metal oxide to donor material is between 9:1 and 1:1. In one embodiment, the volume ratio is between 8:1 and 1:1. In one embodiment, the volume ratio is between 7:1 and 1:1. In one embodiment, the volume ratio is between 6:1 and 1:1. In one embodiment, the volume ratio is between 5:1 and 1:1. In one embodiment, the volume ratio is between 5:1 and 2:1. In one embodiment, the volume ratio is between about 3:1 and about 4:1. In one embodiment, the volume ratio is about 4:1. In one embodiment, the volume ratio is about 3:1.

In one embodiment, the step of depositing a composition comprising a transition metal oxide and an organic electron donor material over the monolayer comprises the steps of: depositing an transition metal oxide over the monolayer to form an transition metal oxide sublayer; and depositing a donor material over the transition metal oxide layer to form a donor material sublayer.

In one embodiment, the transition metal oxide sublayer is deposited to a thickness of less than or about equal to 10 mu. In one embodiment, the transition metal oxide sublayer thickness is less than or about equal to 9 nm. In one embodiment, the transition metal oxide sublayer thickness is less than or about equal to 8 nm. In one embodiment, the transition metal oxide sublayer thickness is less than or about equal to 7 nm. In one embodiment, the transition metal oxide sublayer thickness is less than or about equal to 6 nm. In one embodiment, the transition metal oxide sublayer thickness is less than or about equal to 5 nm. In one embodiment, the transition metal oxide sublayer thickness is less than or about equal to 4 nm. In one embodiment, the transition metal oxide sublayer thickness is less than or about equal to 3 nm. In one embodiment, the transition metal oxide sublayer thickness is less than or about equal to 2 nm. In one embodiment, the transition metal oxide sublayer thickness is less than or about equal to 1 nm.

In one embodiment, the donor material sublayer is deposited to a thickness of less than or about equal to 10 nm. In one embodiment, the donor material sublayer thickness is less than or about equal to 9 nm. In one embodiment, the donor material sublayer thickness is less than or about equal to 8 nm. In one embodiment, the donor material sublayer thickness is less than or about equal to 7 nm. In one embodiment, the donor material sublayer thickness is less than or about equal to 6 nm. In one embodiment, the donor material sublayer thickness is less than or about equal to 5 nm. In one embodiment, the donor material sublayer thickness is less than or about equal to 4 nm. In one embodiment, the donor material sublayer thickness is less than or about equal to 3 nm. In one embodiment, the donor material sublayer thickness is less than or about equal to 2 nm. In one embodiment, the donor material sublayer thickness is less than or about equal to 1 nm.

There is no particular limit to the light source used in this method. In one embodiment, the light source is capable of producing light with a photon energy which is greater than or equal to the difference in energy between the HOMO of the donor material and the LUMO of the transition metal oxide. The light source may be lamp such as an xenon arc or deuterium lamp, or a laser such as continuous wave lasers: i.e., argon-ion, krypton-ion, helium-neon, helium-cadmium, IR lasers, solid state lasers such as Nd-YAG lasers, or other lasers. Pulsed lasers may also be used such as nitrogen lasers or mode-locked lasers, diode lasers, or lasers placed in an array. The light source may also be a laser light emitting diode (LLED), a light emitting diode, or an incandescent light bulb. In one embodiment, the step of irradiating the composition with light from a light source comprises the step of subjecting the composition to a laser soak with a continuous wave laser.

In one embodiment, the light is collimated. In one embodiment, the light is scattered or disperse. In one embodiment, the light is of uniform or near-uniform photon energy. In one embodiment, the light comprises a range of photon energies. In one embodiment, the light comprises infrared light (about 1 eV-2 eV). In one embodiment, the light comprises visible light (about 2 eV-3 eV). In one embodiment, the light comprises ultraviolet light (about 3 eV to about 10 eV).

In one embodiment, the light source is applied for as much time is required for the transition metal dichalcogenide layer to become passivated. In one embodiment, the degree of passivation of the transition metal dichalcogenide layer may be estimated by measuring the intensity of photoluminescence (PL) of the transition metal dichalcogenide monolayer over the course of the light treatment. In one embodiment, the passivation is complete when the increasing photoluminescent intensity reaches a plateau. In one embodiment, the time required to reach complete passivation may depend on any or all of the choice of transition metal oxide, donor material, thickness of the passivation layer, light source, and/or irradiation conditions.

There is no particular limit to the environmental conditions of the irradiation step. In one embodiment, the step of irradiating the composition with light from a light source can be performed under ambient conditions: room temperature (20 to 25° C.), atmospheric pressure (about 1 atm), exposed to air. In one embodiment, the irradiation step is performed at a temperature below 20° C. In one embodiment, the irradiation step is performed a temperature greater than 20° C. In one embodiment, the irradiation step is performed in a reduced pressure environment. In one embodiment, the irradiation step is performed in a vacuum. In one embodiment, the irradiation steps are performed under elevated pressure.

In one aspect, the present invention relates to a method of passivating a transition metal dichalcogenide, the method comprising the steps of: providing a transition metal dichalcogenide monolayer; depositing an transition metal oxide over the monolayer; irradiating the transition metal oxide with ultraviolet light; and irradiating the transition metal oxide with a laser.

In one embodiment, the transition metal oxide is any transition metal oxide described herein. In one embodiment, the transition metal oxide is $MOO_x$. In one embodiment, the transition metal oxide is deposited to a thickness of about 5 nm.

In one embodiment, the ultraviolet light has a photon energy of greater than 3 eV. In one embodiment, the ultraviolet light has a photon energy between about 3 eV and about 10 eV. In one embodiment, the ultraviolet light has a photon energy between 3 eV and 5 eV.

In one embodiment, the ultraviolet light is from a UV LED. In one embodiment, the ultraviolet light is from a natural source, such as the sun. In one embodiment, the ultraviolet light is from a UV lamp. In one embodiment, the ultraviolet light is from a UV-C lamp.

In one embodiment the transition metal oxide is irradiated with ultraviolet light for at least 1 hour. In one embodiment, the transition metal oxide is irradiated with ultraviolet light for at least 1.5 hours. In one embodiment, the transition metal oxide is irradiated with ultraviolet light for at least 2 hours. In one embodiment, the irradiation of the transition metal oxide with ultraviolet light has little or no passivation effect. In one embodiment, the irradiation of the transition metal oxide with ultraviolet light has little or no impact on the photoluminescence of the transition metal dichalcogenide monolayer.

In one embodiment, the transition metal oxide is then irradiated with a laser, such as any laser described herein. In one embodiment, the transition metal oxide is irradiated with a laser which produces light having a photon energy of between 2 eV and 3 eV. In one embodiment, the laser photon energy is about 2.3 eV.

In one aspect, the present invention also relates to a method of passivating a transition metal dichalcogenide, the method comprising the steps of: providing a transition metal dichalcogenide monolayer; and depositing a composition comprising a transition metal oxide and an organic electron donor material over the monolayer. In some embodiments, the step of irradiating the composition, as described herein, may be omitted. In one embodiment, the non-irradiated material may have a passivation effect.

In one aspect, the present disclosure relates to an organic light emitting device (OLED) comprising: an anode; a cathode; and a light emitting layer disposed between the anode and the cathode; wherein the light emitting layer comprises a transition metal dichalcogenide monolayer having a passivation layer produced using the methods described herein.

A method of the disclosure may then include the step of depositing various light emitting device or OLED layers over the thin polymer film to form an OLED body. Layers may include one or more electrodes, organic emissive layers, electron- or hole-blocking layers, electron- or hole-transport layers, buffer layers, or any other suitable layers known in the art. In some embodiments, one or more of the electrode layers may comprise a transparent flexible material. In some embodiments, both electrodes may comprise a flexible material and one electrode may comprise a transparent flexible material.

Any substrate known to those of skill in the art is contemplated herein. Suitable substrates include, but are not limited to, sapphire, fused silica glass, plastics, quartz, and the like. There is no particular limit to the composition or properties of the substrate.

Emissive layers may be deposited via any suitable process, including but not limited to vacuum thermal evaporation, OVJP, etc. Films may be deposited at a rate of about 0.5 Å/s, 1.0 Å/s, 2.0 Å/s, 3.0 Å/s, 5.0 Å/s, or any other suitable rate.

EXPERIMENTAL EXAMPLES

The disclosure is now described with reference to the following Examples. These Examples are provided for the purpose of illustration only and the disclosure should in no way be construed as being limited to these Examples, but rather should be construed to encompass any and all variations which become evident as a result of the teaching provided herein.

Without further description, it is believed that one of ordinary skill in the art can, using the preceding description and the following illustrative examples, make and utilize the disclosed device and practice the claimed methods. The following working examples therefore, specifically point out the preferred embodiments of the present disclosure, and are not to be construed as limiting in any way the remainder of the disclosure.

Experiment #1

Figure 5A:
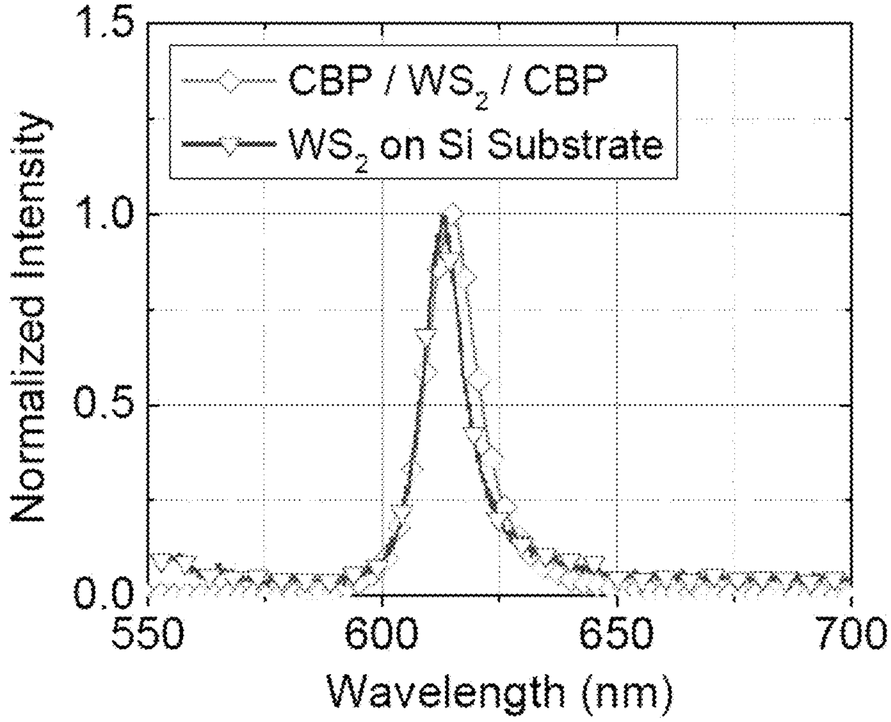
FIG. 5A shows results of photoluminescence spectra of a CVD grown $WS_2$ layer transferred onto a Si substrate and onto an organic film comprising 4,4'-Bis(N-carbazolyl)-1,1'-biphenyl (CBP) according to one embodiment.
Figure 5B:
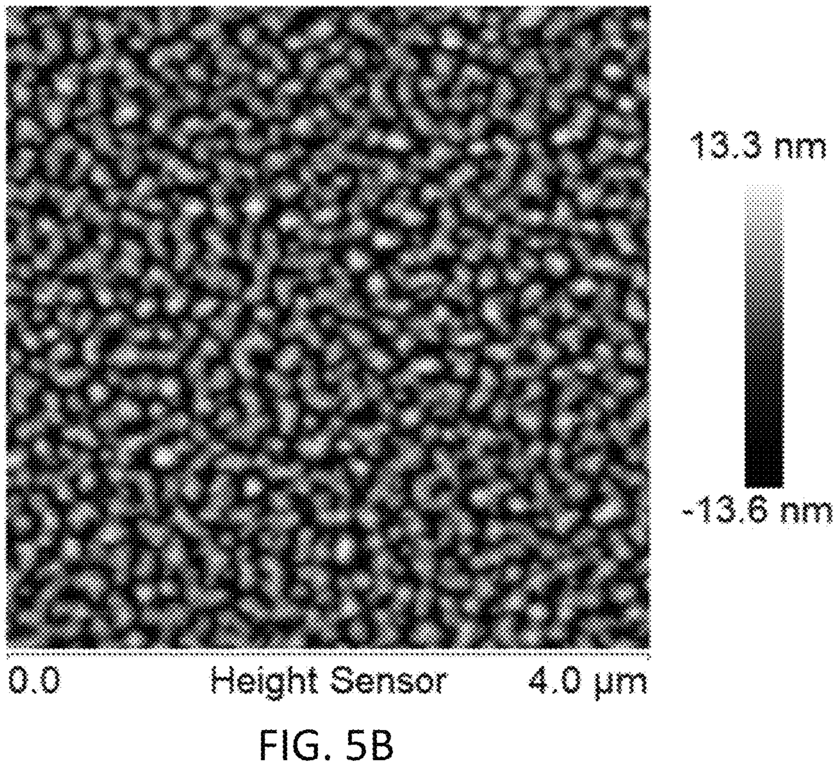
FIG. 5B and FIG. 5C show a measured surface profile of an as-deposited CBP film with and without $WS_2$ on the top measured by an atomic force microscope according to one embodiment.
Figure 5C:
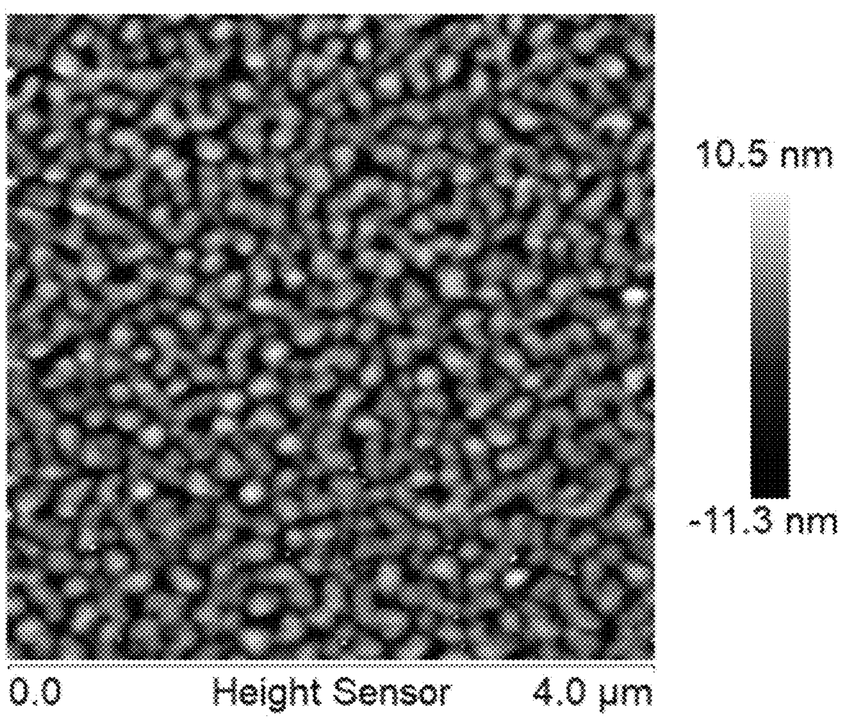

With reference now to FIG. 5A, according to one embodiment, photoluminescence spectra of the CVD grown $WS_2$ layer transferred onto a Si substrate and onto an organic film comprising, 4,4'-Bis(N-carbazolyl)-1,1'-biphenyl (CBP) was measured showing no significant difference. A measured surface profile of an as-deposited CBP film with and without $WS_2$ on the top, measured with an atomic force microscope, is shown in FIGS. 5B and 5C. No significant difference between the two profiles was observed indicating a good contact of $WS_2$ with the CBP host matrix, which enables an efficient charge and exciton transfer between CBP host matrix and the monolayer $WS_2$.

Figure 6A:
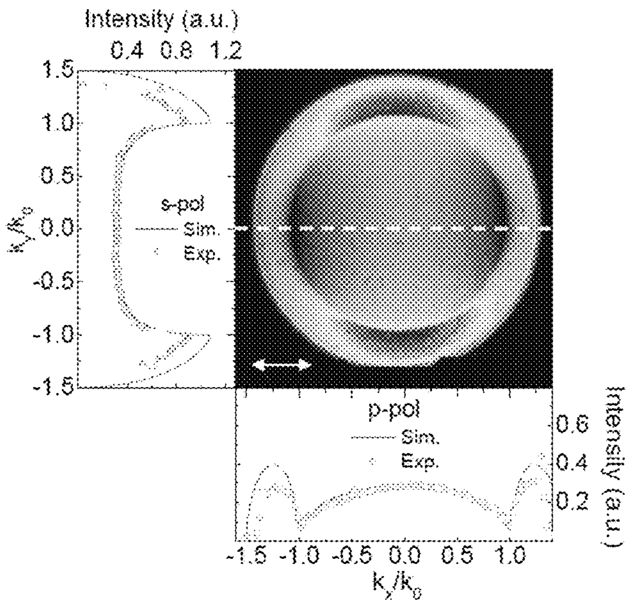
FIG. 6A and FIG. 6B are graphs showing results of fitting a measured BFP image (FIG. 6A) with a simulation (FIG. 6B) over a specified momentum range according to one embodiment.
Figure 6B:
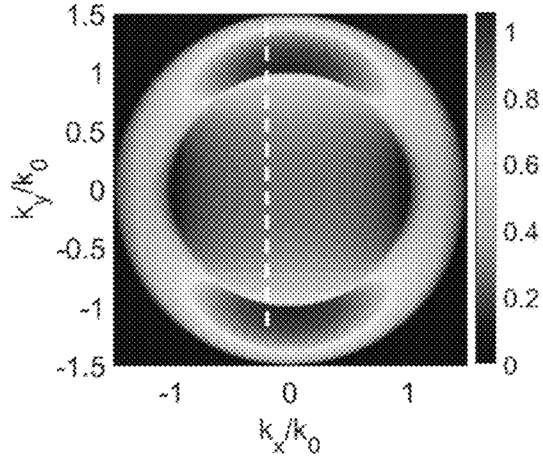
Figure 6C:
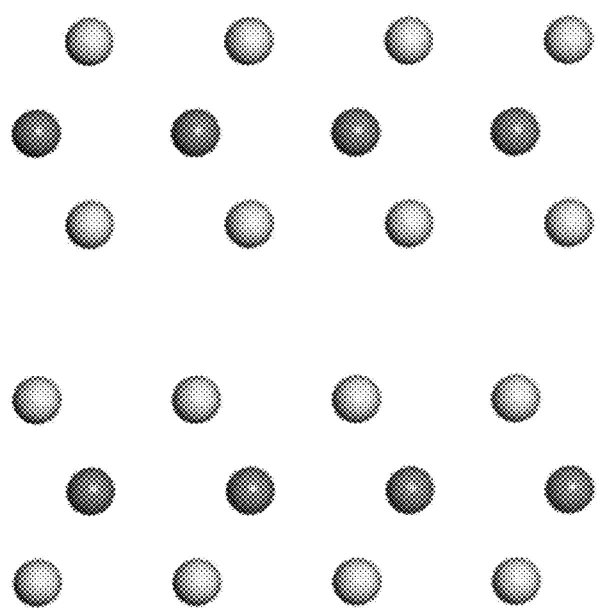
FIG. 6C shows the K-valley direction of a monolayer of $WS_2$, which is parallel with transition dipole moment vectors according to one embodiment.
Figure 6D:
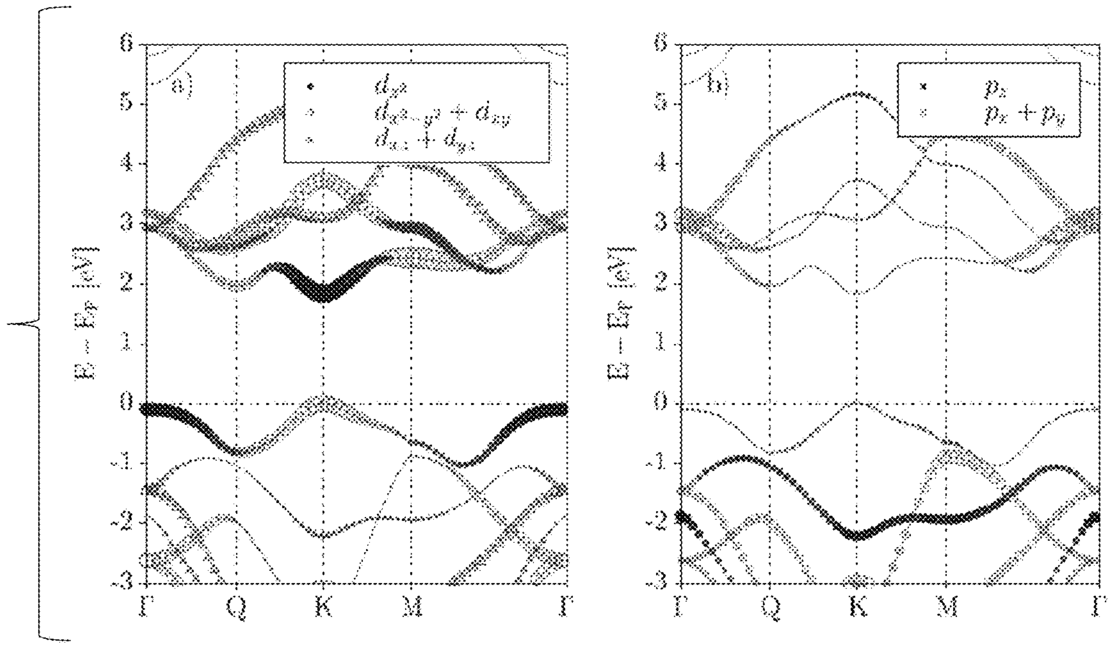
FIG. 6D shows a calculated band diagram for a monolayer of $WS_2$ according to one embodiment.

The ratio of horizontally aligned transition dipole moment vectors in the active layer was measured via back focal plane (BFP) image spectroscopy, as shown in FIG. 6A, FIG. 6B, FIG. 6C, and FIG. 6D. Fitting the measured BFP image (FIG. 6A) with the simulation (FIG. 6B) over the momentum range of $-1.1<k_x/k_0<1.1$ gives $\theta_{hor}=0.88\pm0.02$ for $WS_2$ transferred onto the CBP film. Here, $\theta_{hor}$ corresponds to the fractional contribution of the molecules of $WS_2$ oriented with a net transition dipole moment direction lying in the horizontal plane parallel to the substrate; thus, the fraction in the vertical direction is 0.46. An isotropic thin film gives $\theta_{hor}=0.67$. The discrepancy at the high-k region ($k_x/k_0>1.1$) is due to imaging artifacts, for example low detector sensitivity. FIG. 6C shows the K-valley direction of a monolayer $WS_2$, which is parallel with transition dipole moment vectors. A calculated band diagram for a monolayer $WS_2$ is shown in FIG. 6D, demonstrating that both the conduction band minima and the valence band maxima is found at the K-valley point.

Figure 6E:
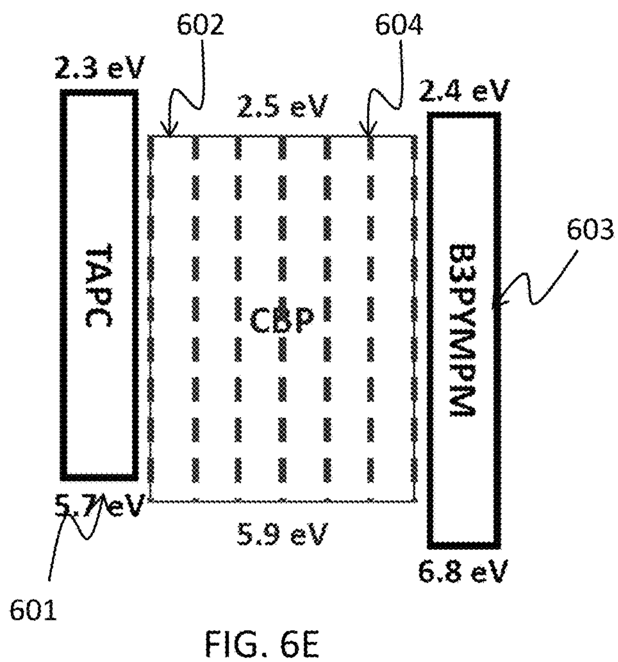
FIG. 6E is a diagram of slabs of PtOEP deposited in the EML at 2.5 nm intervals from the hole transport layer (HTL)-emissive layer (EML) interface to the EML-electron transport layer (ETL) interface according to one embodiment.
Figure 6F:
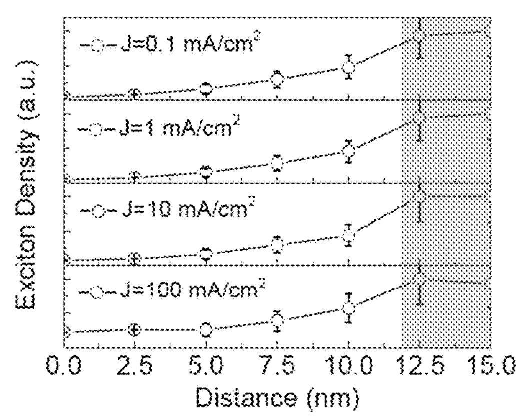
FIG. 6F shows an exciton density profile, illustrating that the excitons are formed in the EML-ETL interface and diffuse in the HTL layer direction at higher current (exciton) densities according to one embodiment.
Figure 6H:
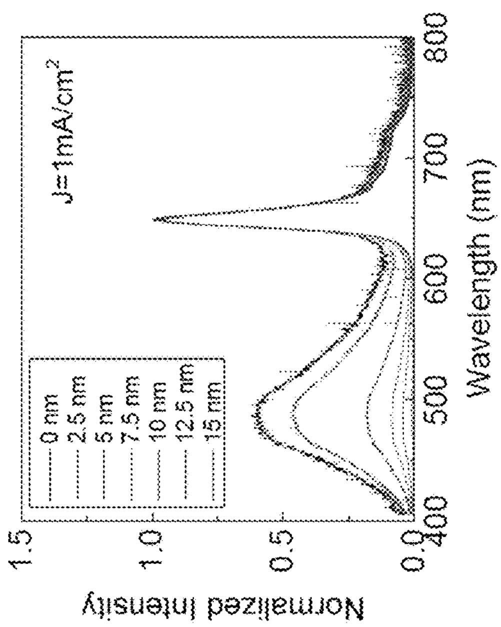
FIG. 6G and FIG. 6H show results illustrating that this leads to the decreased EQE as the PtOEP slab moves further from the EML-ETL interface toward the EML-HTL interface according to one embodiment.
Figure 6G:
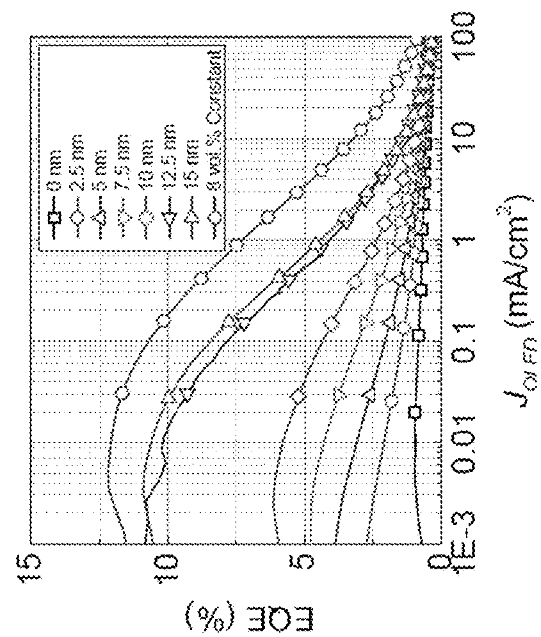

Since $WS_2$ monolayer is approximately 6 Å thick, charge trapping of the $WS_2$ monolayer is inefficient. Thus, excitons should be generated elsewhere and Førster transferred into the $WS_2$ monolayer. Therefore, an exciton density profile is necessary to determine the position of the $WS_2$ monolayer within the emissive layer. The delta sensing layer method was used to map the exciton density profile following Equation 1 below:

$$I_{sense}=F_N(x)\eta_{oc}(x)\Phi(x)E_{ph} \qquad \text{Equation 1}$$

where $I_{sense}$ is the measured intensity, $F_N(x)$ is the density of the excitons, $\eta_{oc}(x)$ is the outcoupling efficiency, $\Phi(x)$ is the sensing layer PL quantum yield and $E_{ph}$ is the average photon energy from the sensing molecule. A 0.5 Å thick slab of Platinum Octaethylporphyrin (PtOEP) is used as the sensing layer due to the similarity of its energy levels with those of $WS_2$. Since same amount of PtOEP was used for each slab sensing layer, $\Phi(x)$ and $E_{ph}$ are identical at all positions. Thus, $F_N(x)$ could be derived by measuring the external quantum efficiencies (EQE) and calculating $\eta_{oc}(x)$. With reference to FIG. 6E, a slab of PtOEP 604 was placed in the emissive layer (EML) at different positions between the interface with the hole transport layer (HTL) 601 and the interface with the electron transport layer (ETL) 603 at 2.5 nm intervals. The exciton density profile in FIG. 6F shows that the excitons are formed at the EML-ETL interface and diffuse toward the HTL at higher current (exciton) densities. This leads to decreased EQE as the PtOEP slab moves further from the EML-ETL interface as shown in FIG. 6G. Also, as the PtOEP slab moves away from the EML-ETL interface, CBP emission rises because the generated excitons in the EML-ETL interface could not be efficiently collected via exciton diffusion due to the limited diffusion length. Thus, a device was fabricated having a sheet of monolayer $WS_2$ at x=12 nm, to efficiently collect the generated excitons with a $WS_2$ active layer.

Figure 6K:
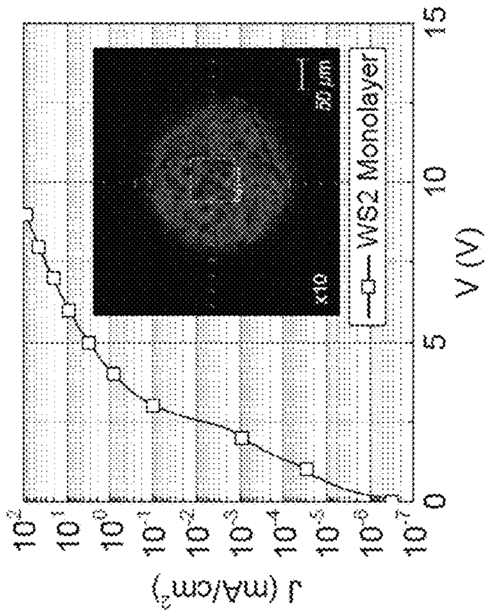
FIG. 6J, FIG. 6K, and FIG. 6L are graphs showing results of a device with a peak $\eta_{EQE}$=0.3±0.3% and the highest device EQE of 1% (FIG. 6J) according to one embodiment.
Figure 6J:
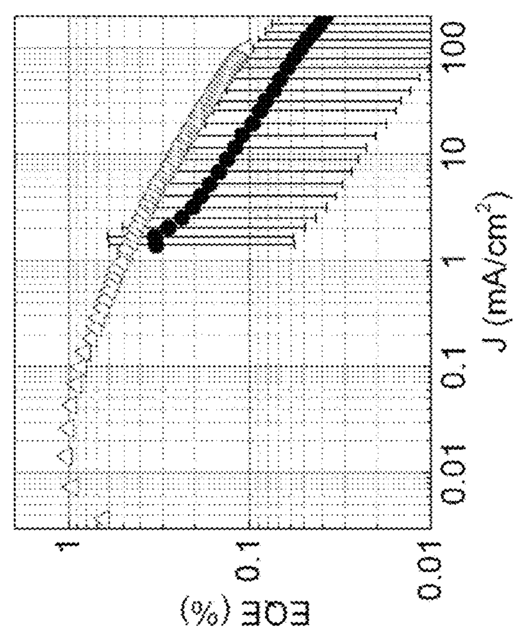
Figure 6L:
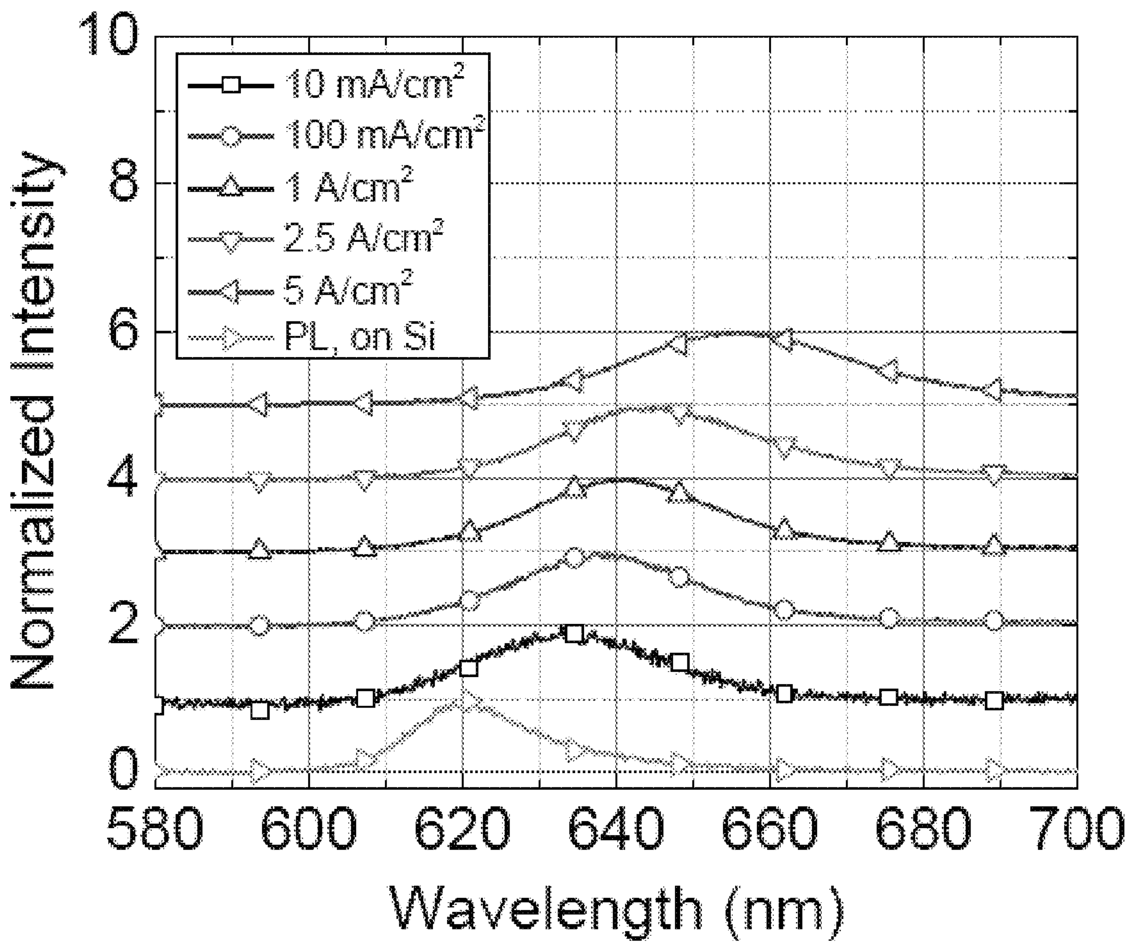

The device results are shown in FIG. 6J, FIG. 6K, and FIG. 6L with a peak $\eta_{EQE}=0.3\pm0.3\%$ and the highest device EQE of 1% (FIG. 6J). The local defects or overlapped edges of the grains caused EQE variation from 1% to 0.01% within the same batch of growth. The local defects and overlapped edges of the grains are shown by the dark area of the device illumination demonstrated with an optical microscope as shown in FIG. 6K, inset. The device showed diode characteristics with high conductivity as the JV curve in FIG. 6K indicates. As shown in FIG. 6L, the emission from the monolayer $WS_2$ had no residual emission from any other organic layers, demonstrating efficient exciton generation at the EML-ETL interface followed by the Førster transfer into the $WS_2$ active layer.

Experiment #2

Introduction

Two-dimensional (2D) layered materials show unusual physical properties that range from those of a wide-bandgap insulator to a semiconductor, a semimetal or metal. Monolayer transition metal dichalcogenides (TMDCs), a subclass of 2D layered materials, have promising optical characteristics such as efficient photoluminescence (PL), fast exciton decay, and high chemical and air stability. As a result, TMDCs have been used in various optoelectronic devices, showing distinct characteristics from conventional bulk semiconductors. For example, light emitting devices (LEDs) based on hexagonal boron nitrides (h-BN) insulators combined with TMDCs as the active luminescent materials have been demonstrated. However, the LEDs require a sequence of complex layer transfers during fabrication, and are constrained by the limited size of the 2D semiconductor flakes (several μm). Recently, a large area TMDC-based LED has been demonstrated, although its external quantum efficiency was low (~$10^{-4}$%) compared to LEDs based on exfoliated TMDCs.

The present experimental example demonstrates centimeter-scale LEDs using a monolayer of red emitting $WS_2$ ($mWS_2$) embedded within organic transport and host layers with an efficiency comparable to much smaller, exfoliated-TMDC-based LEDs. The organic layers enable simplified deposition and precise placement of the TMDC within the structure to optimize the device characteristics. A 1 $cm^2$, chemical-vapor-deposition (CVD) grown $mWS_2$ was transferred onto a pre-deposited organic stack of the 4,4'-bis(N-carbazolyl)-1,1'-biphenyl (CBP) host/4,4'-cyclohexylidenebis N,N-bis(4-methylphenyl)benzenamine (TAPC) hole transport layer/$MoO_x$, hole injection layer/indium tin oxide (ITO) anode. This was followed by deposition of the remainder of the host layer, thereby burying the $mWS_2$. The device was completed with a 4,6-bis(3,5-di(pyridin-3-yl)phenyl)-2-methylpyrimidine (B3PYMPM) electron transport layer and an Al cathode. Embedding a monolayer TMDC within the host enables efficient radiative emission via Førster transfer of excitons from the organic layers, while separating the TMDC from the heterointerface to avoid quenching at the heterointerface, especially at high current densities. The LEDs showed an average external quantum efficiency of 0.3±0.3%, with the highest value of 1%.

Device Fabrication

OLEDs were grown on glass substrates with a pre-deposited and patterned 150 nm thick ITO anode. The ITO-coated substrates were treated in a UV-ozone chamber for 15 min prior to organic film deposition. The organic film layers comprising 4,4'-bis(N-carbazolyl)-1,1'-biphenyl (CBP) 12 nm/4,4'-cyclohexylidenebis[N,N-bis(4-methylphenyl)benzenamine] (TAPC) 50 nm/$MoO_3$ 2 nm were grown by vacuum thermal evaporation (VTE) in a chamber with a base pressure of $1\times10^{-7}$ torr. The $mWS_2$ was dry-transferred onto the CBP surface following the procedure described in FIG. 7. After transfer, the sample was left in the VTE chamber for 2 h. The device was completed by depositing 100 nm Al/1.5 nm LiQ/55 nm 4,6-Bis(3,5-di (pyridin-3-yl)phenyl)-2-methylpyrimidine (B3PYMPM)/3 nm CBP on top of the $mWS_2$.

The CVD grown monolayer $WS_2$ 715 on a $SiO_2$ substrate 716 (collectively 711) was purchased. The $mWS_2$ on $SiO_2$ substrate 711 was immersed in 100 mL of a solution 712 comprising bis(trifluoromethane)-sulfonimide (TFSI): Dichloroethane (DCE) (0.2 mg/mL) and heated for 50 mins at 100° C. as shown in image 701 of FIG. 7. After the TFSI treatment, the sample surface was blow dried with an $N_2$ gun. Then, the Polydimethylsiloxane (PDMS) 713 was attached on top of the $mWS_2$ 715 as shown in images 702 and 703 of FIG. 7. Then, the PDMS and attached Si substrate were immersed into a KOH solution 714 (14 g KOH in 200 mL DI water) and 60° C. heat was applied to etch the $SiO_2$. Once the $SiO_2$/Si substrate 716 dropped off, the $mWS_2$ 715 and attached PDMS 713 was removed (image 705, FIG. 7) and the sample surface was thoroughly blow dried with an $N_2$ gun. Then the $mWS_2$ 715 on PDMS 713 was gently pressed onto the organic surface 716 using an automated transfer stage and peel off the PDMS, leaving the $mWS_2$ 715 on the organic surface 716.

Device Characterization and Measurement

The voltage-current density-EQE characteristics of the LEDs were measured using a parameter analyzer and a calibrated photodiode following standard procedures. The emission spectra were measured using a calibrated spectrometer connected to the device via an optical fiber.

The orientation of the TDM of the $mWS_2$ was measured using Fourier plane imaging microscopy following previously reported procedures.

The photoluminescence spectrum of $mWS_2$ in the EOD was fit using two Lorentzian curves following Equation 2:

$$f(\lambda)=\frac{A\cdot\gamma^2}{(\lambda-\lambda_0)^2+\gamma^2} \quad \text{Equation 2}$$

at center wavelengths of $\lambda_0$=617 nm and 628 nm, γ is the half-width at half-maximum, and A is the constant for the peak height. A least-squares algorithm was used to fit the measured photoluminescence data with the two Lorentzian curves.

Figure 8A:
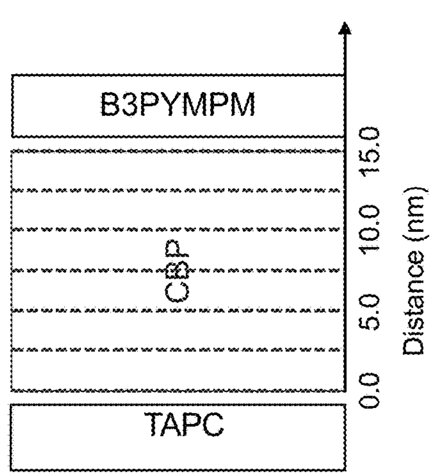
FIG. 8A is an illustration showing the placement of the PtOEP MSLs within an emissive layer.
Figure 8B:
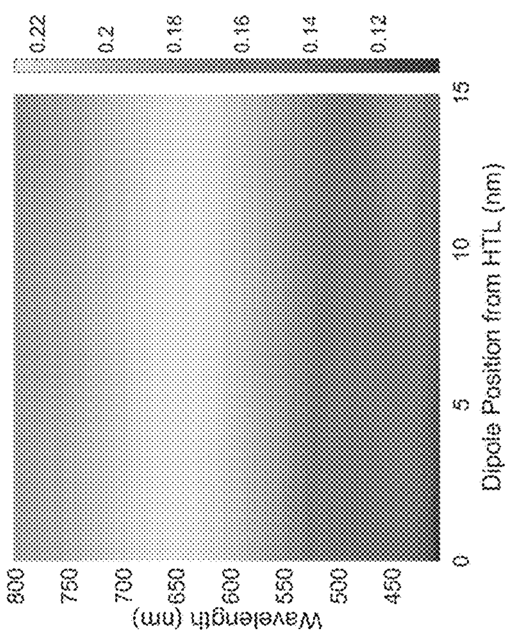
FIG. 8B is a graph of calculated outcoupling efficiency of the sensing layers at various positions in the emissive layer in FIG. 8A.

The exciton density at the position x, N (x), was mapped across the emissive layer using the sensing layer method. Ultrathin (~1Å) red phosphorescent (Pt-octaethylporphyrin, PtOEP) layers were deposited at locations shown in FIG. 8A in a series of otherwise identical OLEDs. The emission spectra from the PtOEP sensing layer from each position (x) and the CBP organic host is given by Equation 3:

$$I_{total}(\lambda,x)=a_{PtOEP}(x)\cdot I_{PtOEP}(\lambda)a_{CBP}(x)\cdot I_{CBP}(\lambda) \quad \text{Equation 3}$$

where $I_{total}(\lambda, x)$ is the total emission spectrum comprising the spectra of PtOEP ($I_{PtOEP}(\lambda)$) and CBP host matrix ($I_{CBP}(\lambda)$), with the relative weights of $a_{PtOEP}(x)$ and $a_{CBP}(x)$, respectively. Then, the outcoupled exciton density at position x, $N(x)\cdot\eta_{out}(x)$, becomes as shown in Equation 4:

$$N(x)\cdot\eta_{out}(x)=\frac{J_0}{q}\cdot\eta_{EQE}(x)\cdot\frac{a_{PtOEP}(x)\cdot\int I_{PtOEP}(\lambda)/\lambda d\lambda}{a_{PtOEP}(x)\cdot\int I_{PtOEP}(\lambda)/\lambda d\lambda+a_{CBP}(x)\cdot\int I_{CBP}(\lambda)/\lambda d\lambda} \quad \text{Equation 4}$$

where $J_0$ is the current density, $\eta_{out}(x)$ and $\eta_{EQE}(x)$ are the outcoupling and external quantum efficiencies of the sensing layer at position x. The $\eta_{out}(x)$ is calculated based on Green's function analysis in FIG. 8B. The range of ~3 nm Førster energy transfer limits the spatial resolution of the measurement.

Results

Figure 9B:
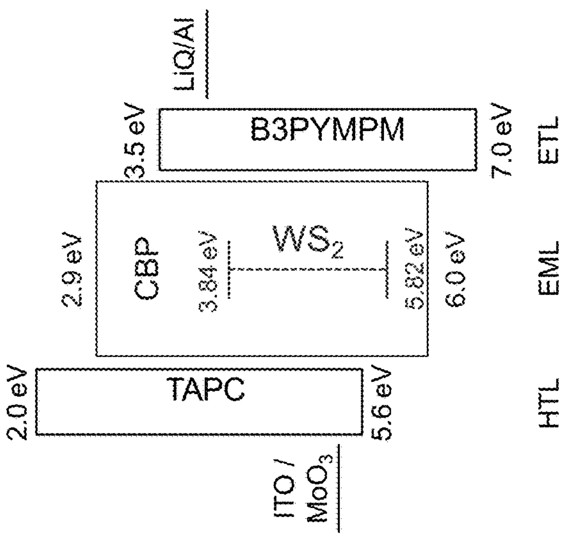
FIG. 9B shows the frontier orbital energies of the materials in eV in the device of FIG. 9A.

FIG. 9A shows the structure of a hybrid LED with the frontier energy levels in FIG. 9B. Organic hole injection/transport layers (HIL and HTL) comprising 2 nm thick $MoO_3$ and 50 nm thick TAPC were deposited on top of the transparent anode (150 nm thick ITO), and then an organic host layer comprising 12 nm thick neat CBP was deposited. An $mWS_2$ was transferred onto the organic host by the method described in FIG. 7 and the accompanying description above. After transfer, a 3 nm thick capping host (CBP)

layer was deposited, along with a 55 nm electron transport layer (ETL) and the top A1 contact.

Figure 10A:
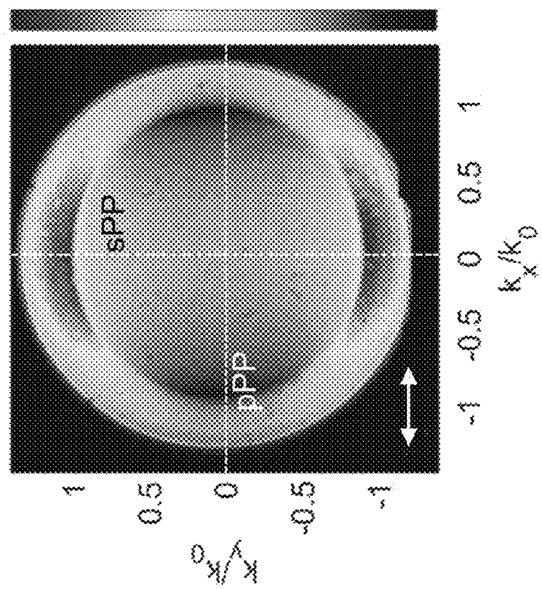
FIG. 10A shows measured Fourier plane imaging microscopy polar plots for the monolayer $WS_2$ in the CBP host matrix.
Figure 10B:
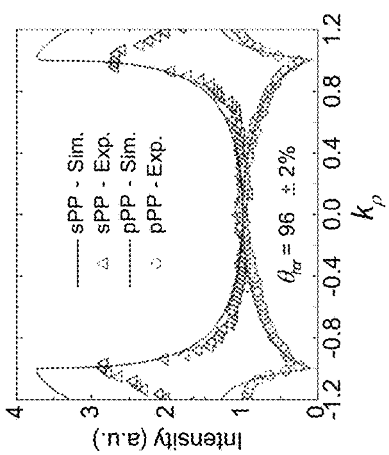
FIG. 10B shows intensity profiles of the polar plot in the pPP and sPP (data points) along with the simulated fits (solid lines).
Figure 10C:
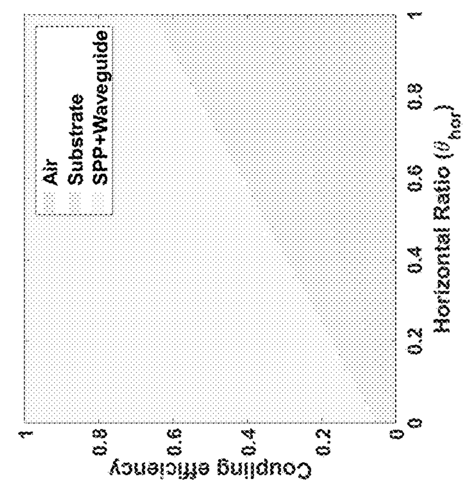
FIG. 10C shows a calculated distribution of the emitted power into different modes depending on the average orientation of the transition dipole moment within the emissive layer, based on Green's function analysis.

The percentage of transition dipole moments (TDM), $\theta_{hor}$, of the $mWS_2$ in the CBP host aligned parallel to the substrate plane was measured via Fourier plane imaging microscopy (FIM). When $\theta_{hor}$=100%, all TDMs are oriented parallel to the substrate, $\theta_{hor}$=67% for random, and $\theta_{hor}$=0% for a perfect vertical alignment. FIG. 10A shows the polar emission pattern obtained from the $mWS_2$ embedded within the CBP host matrix measured by FIM. The intensity profiles (data points) in the p-polarized plane (pPP) and s-polarized plane (sPP) are fit to theory (solid line) in FIG. 10B. The data show $\theta_{hor}$=96±2%, corresponding to near perfect horizontal orientation of the $mWS_2$ TDM. This leads to an exceptionally high light outcoupling efficiency of the LED, as shown in FIG. 10C.

Figure 11A:
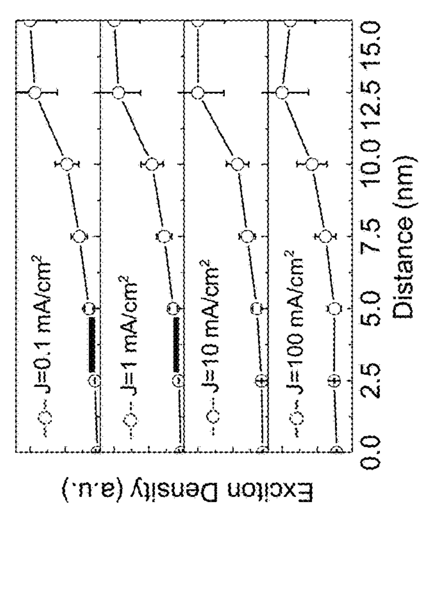
FIG. 11A is a measured exciton density profile at different current densities.
Figure 11B:
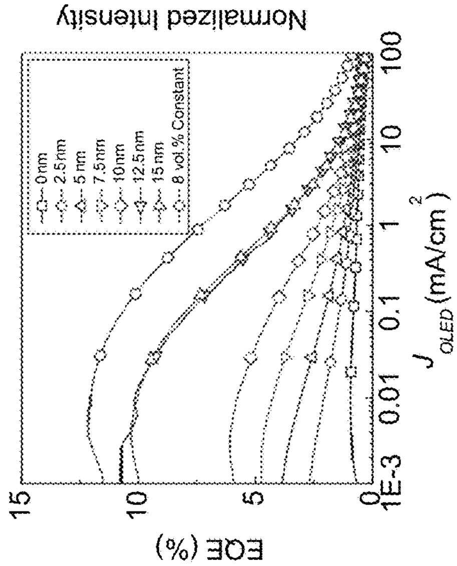
FIG. 11B is a J-EQE characteristics of the samples with the sensing layer at each different positions.
Figure 11C:
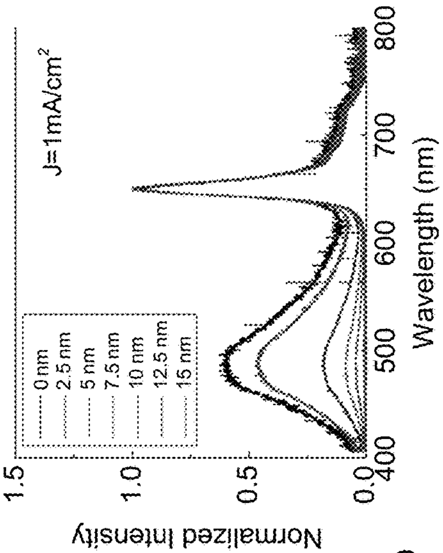
FIG. 11C is an electroluminescence spectrum of samples with the sensing layer at different positions at J=1 $mA/cm^2$.

The optimal position of the $mWS_2$ within the emission layer is determined by measuring the exciton density profile. To do this, an ultrathin (0.5 Å) layer of the phosphor, Pt-octaethylporphyrin (PtOEP) was deposited at 2.5 nm intervals in a series of devices, starting from the hole transport layer (HTL)/emissive layer (EML) interface, to the EML/electron transport layer (ETL) interface (see FIG. 8A). The frontier energy levels of PtOEP align with those of $mWS_2$. Hence, the emission intensity from the PtOEP at a fixed current density (J) is proportional to the exciton density at its location. The measured exciton density profiles for various J are shown in FIG. 11A, with the peak near the EML/ETL interface. The peak position changes from x=15 nm to 12.5 nm at J=100 $mA/cm^2$ due to increased exciton quenching near the heterointerface at high J. FIG. 11B shows the external quantum efficiency (EQE) of each sensing layer sample, showing a decreasing efficiency as the sensing layer moves farther from the interface due to the reduced exciton density. The measured spectra of the samples are shown in FIG. 11D. From this data, it was determined that the $mWS_2$ should be positioned ~3 nm away from the EML/ETL interface to enable harvesting of the highest density of excitons while preventing exciton quenching at J.

Figure 7:
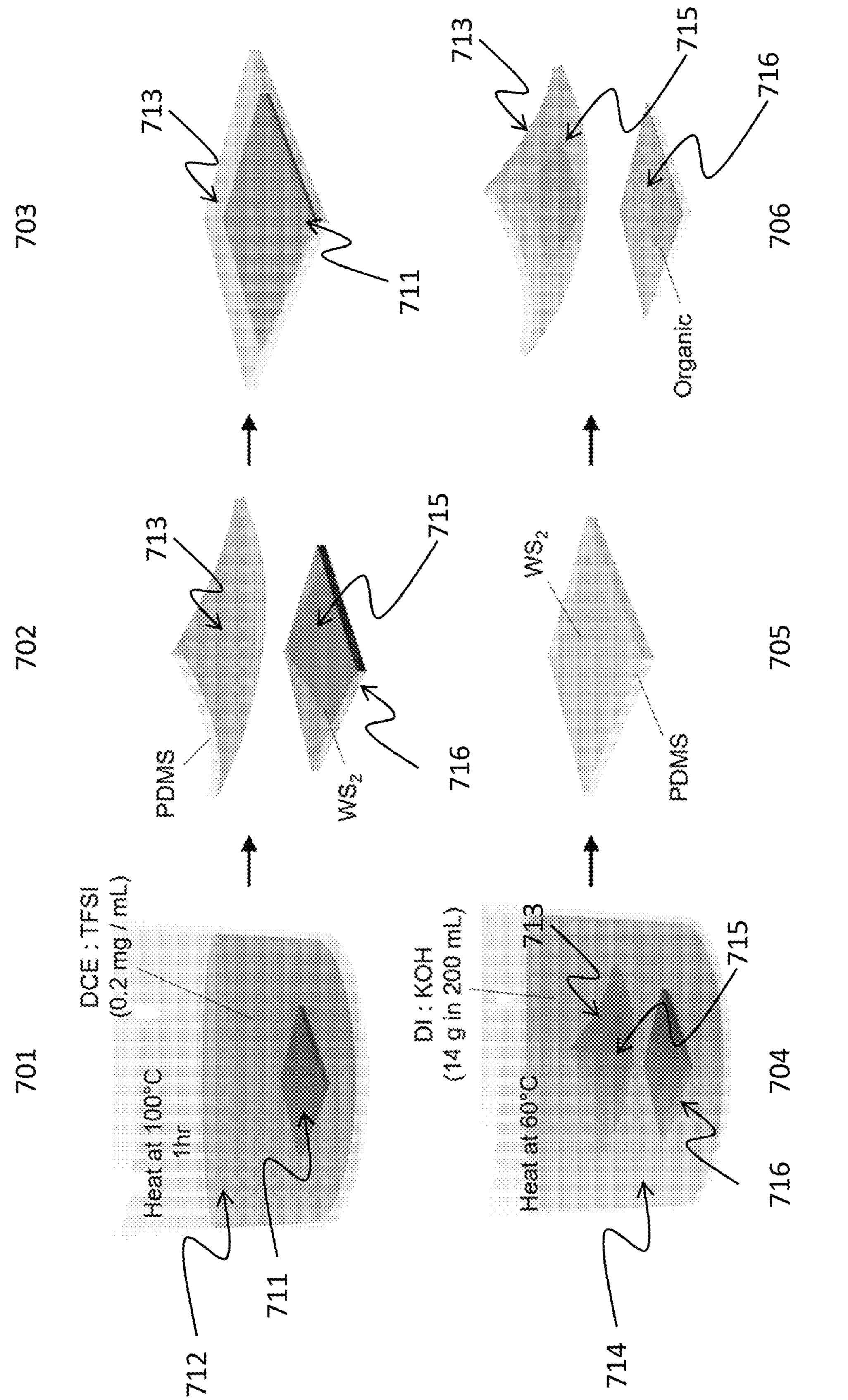
FIG. 7 is a schematic illustration of the monolayer $WS_2$ dry transfer procedure.
Figure 12A:
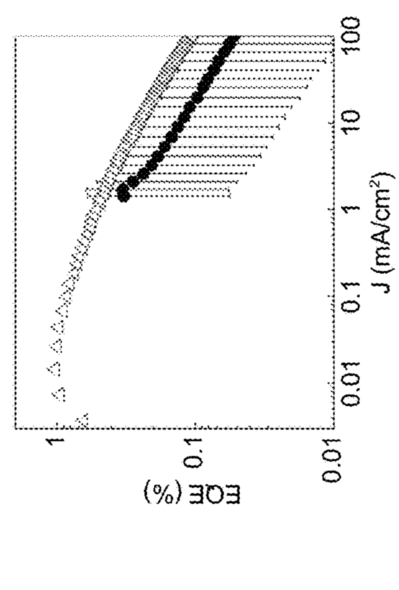
FIG. 12A shows J-EQE characteristics of a hybrid LED. The average and the highest EQE data are shown in black and red data points, respectively.
Figure 12B:
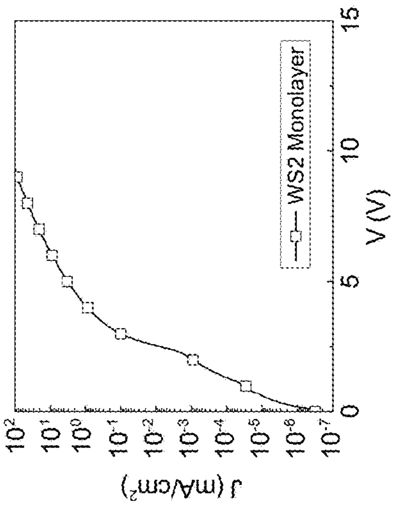
FIG. 12B shows J-V characteristics of a hybrid LED.
Figure 12C:
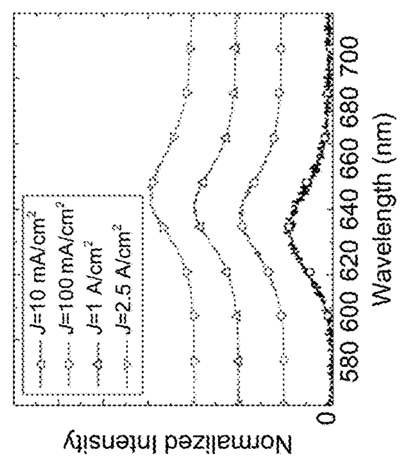
FIG. 12C shows current dependent electroluminescence spectrum of a hybrid LED.
Figure 13A:
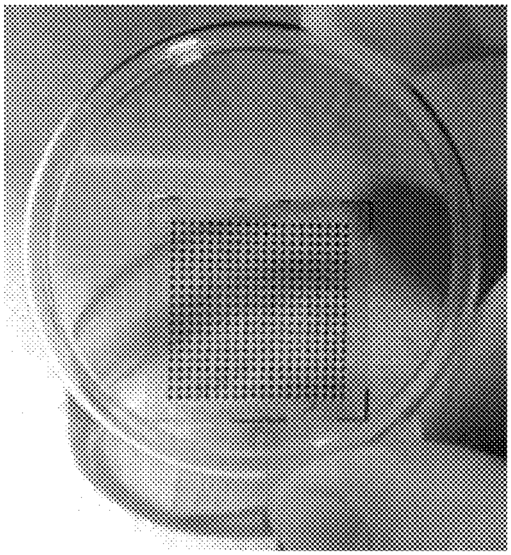
FIG. 13A shows a photograph of LEDs grown on a 2.5×2.5 $cm^2$ glass substrate.
Figure 13B:
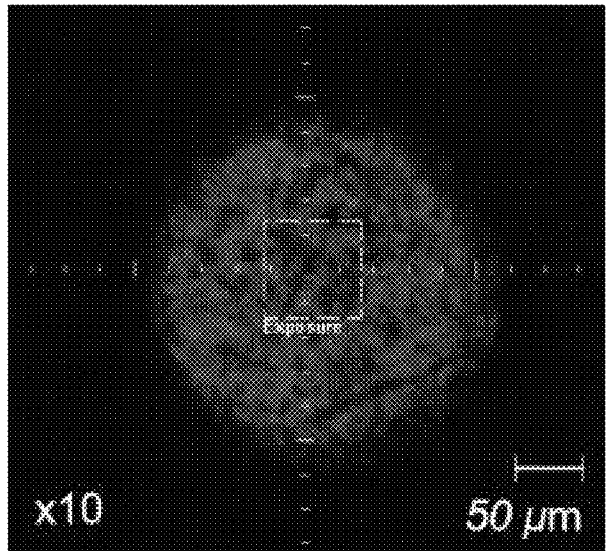
FIG. 13B shows a photograph of a device electroluminescence. The diameter of the device is 250 μm.

With the structural design in FIG. 9A, a hybrid LED was fabricated following the procedure in FIG. 7, with the performance given in FIG. 12A-FIG. 12C. FIG. 12A shows EQE v. J, with an average peak EQE=0.3±0.3%, and the highest efficiency device with EQE=1%. FIG. 13A shows an array of 0.2 $mm^2$ devices. FIG. 12B shows the J-V characteristics with a microscopic image of the device electroluminescence shown in FIG. 13B. The electroluminescence spectra at various J are shown in FIG. 12C, exhibiting a pronounced hypsochromic shift with current in the device. Note that the EQE in FIG. 12A increases with current at J<0.0 $lmA/cm^2$. As shown in FIG. 12B, the device shows a noticeable leakage current at V<2.5V, causing a significant quantity of charges to be lost rather than generate excitons. Thus, as the injected current surpasses the leakage current, EQE also increases.

Figure 14A:
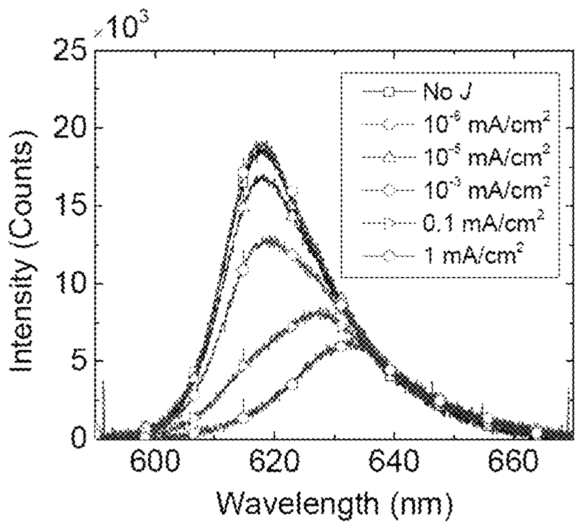
FIG. 14A and FIG. 14B show photoluminescence of a monolayer $WS_2$ within an electron-only (FIG. 14A) and within a hole-only-device (FIG. 14B) with varied injection current.
Figure 14B:
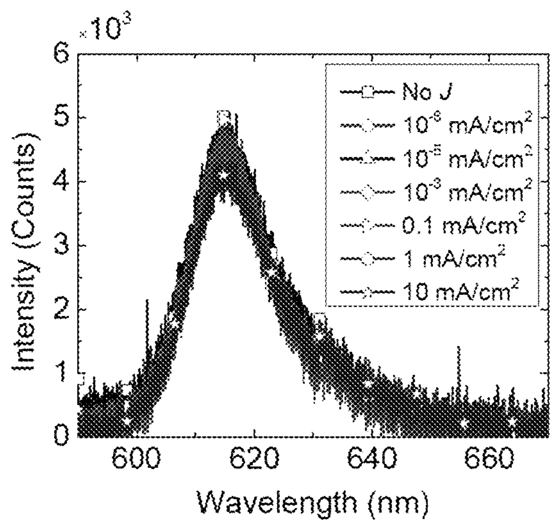

FIG. 14A and FIG. 14B show the photoluminescence of the $mWS_2$ embedded within electron- and hole-only-devices (EOD and HOD, respectively) at several current densities. The device structure of the EOD was 150 nm ITO (UV-ozone untreated)/50 nm B3PYMPM/12 nm CBP/monolayer $WS_2$/3 nm CBP/55 nm B3PYMPM/1.5 nm LiQ/100 nm A1. The device structure of the HOD was 150 nm ITO (UV-ozone treated)/2 nm $MoO_3$/50 nm TAPC/12 nm CBP/monolayer $WS_2$/3 nm CBP/45 nm TAPC/5 nm $MoO_3$/100 nm A1.

Figure 15A:
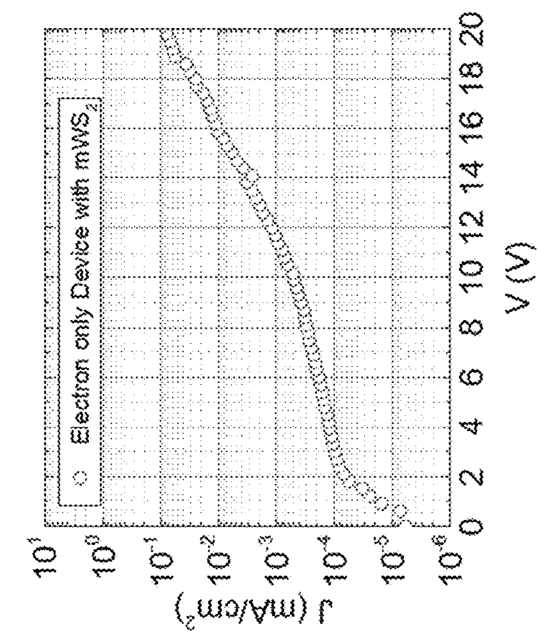
FIG. 15A and FIG. 15B are graphs of J-V characteristics of $mWS_2$ in the electron-only (FIG. 15A) and hole-only-device.
Figure 15B:
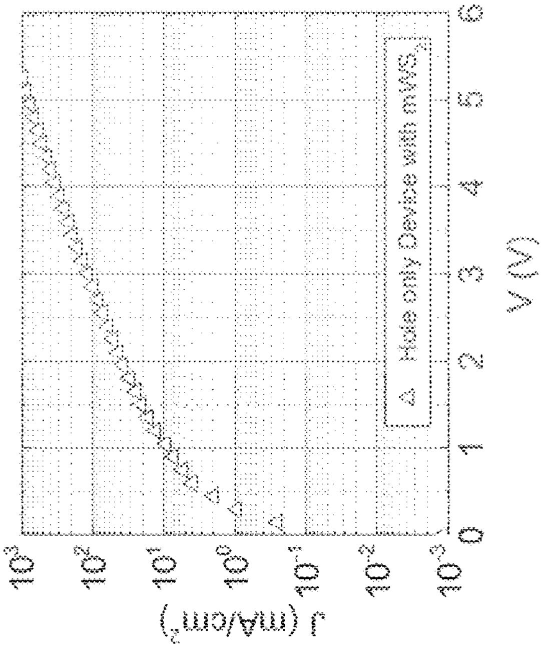

The J-V characteristics of the EOD and HOD are included in FIG. 15A and FIG. 15B. There was a pronounced hypsochromic $mWS_2$ photoluminescence peak shift with current in the EOD, which is absent in the HOD. Therefore, injected electrons in the EOD combined with the generated excitons to form negatively charged excitons, or trions. The binding energy of trions has previously been shown to be 20-30 meV relative to the neutral exciton; a value that corresponds to the energy shift in FIG. 14A. The absence of a peak shift of the $mWS_2$ photoluminescence in the HOD was due to the asymmetric charge trapping in the CBP-$mWS_2$—CBP quantum well structure. The energy barrier for electrons at the CBP LUMO-$mWS_2$ conduction band discontinuity (see FIG. 9B) was larger than the barrier at the CBP HOMO-$mWS_2$ valence band discontinuity for holes. As a result, hole trions did not form as efficiently as electron trions, thus showing no apparent peak shift in FIG. 14B.

Discussion

Figure 16A:
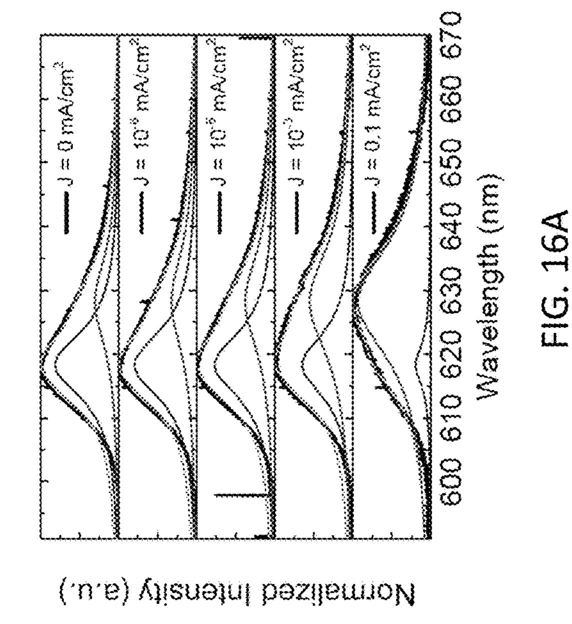
FIG. 16A shows photoluminescence of $mWS_2$ in the electron-only-device as a function of current density with the deconvolution of the spectrum using two Lorentzians with exciton and trion emission peaks. The blue, red and orange lines show the exciton, trion and the summed total spectrum, respectively, from the fits.

CVD-grown $mWS_2$ has a high defect density comprising S vacancies formed during the growth process, limiting the device efficiency. Also, cracks and holes are generated during the dry transfer since a $mWS_2$ is a polycrystal bound by weak van der Waals forces. The S vacancies led to emission from the defect levels in both the EOD and HOD, even when no charges were injected as shown in FIG. 16A. The physical defects led the EQE to vary by orders of magnitude even within the same growth run. The defects were non-radiative, appearing as the dark spots on the device emitting surface, as shown by the image in FIG. 13B.

Figure 16B:
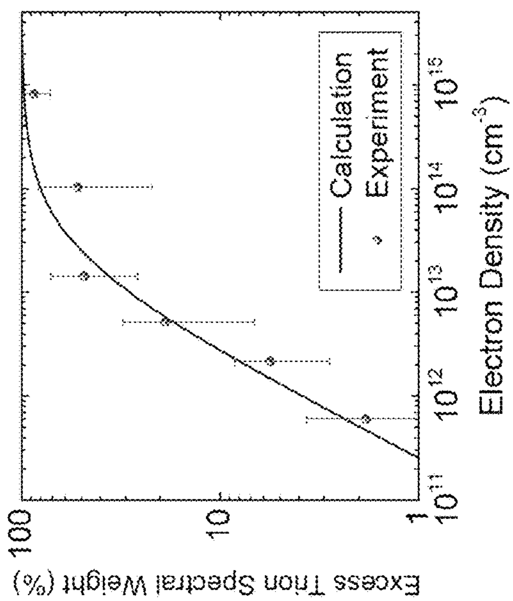
FIG. 16B shows increased spectral weight of trions compared the total emission from excitons and trions, as a function of the injected electron density ($n_{el}$).

The electroluminescence spectra showed emission from $mWS_2$ but not from the organic host in FIG. 12C, demonstrating efficient Førster transfer of the excitons generated at the EML/ETL interface, into $mWS_2$. The spectrum shows a bathochromic shift depending on the drive current. In FIG. 16A, the photoluminescence of $mWS_2$ in the EOD, excited with a 532 nm laser, is shown as a function of current density, with the deconvolution of the spectrum using two Lorentzians with exciton and trion emission peaks at wavelengths of λ1=617 nm and 628 nm, respectively. The trion peak intensity increases with the current density, as expected. The laser selectively excites A excitons of $mWS_2$ (~2.0 eV), but not the higher energy (~2.4 eV) B excitons, allowing for the omission of their spectra in the peak fits. The ratio between the emission intensity of excitons and the increased emission intensity of trions due to the charge injection was calculated using the law of mass action, shown in Equation 5 below:

$$\frac{N_X n_{el}}{N_{X^-}} = \left(\frac{4\mu_X m_e}{\pi\hbar^2\mu_{X^-}}\right)k_B T\exp\left(-\frac{E_B}{k_B T}\right) \quad \text{Equation 5}$$

where $N_X$, $N_{X-}$ and $n_{el}$ are the concentrations of excitons, trions and electrons, with respective masses of $\mu_X$, $\mu_{X-}$, and $m_e$, $k_B$ is the Boltzmann coefficient, T is the temperature, $E_B$ is the trion binding energy (20 meV). The reduced masses of electron trions and excitons are $\mu_{X-}^{-1}=2\cdot m_e^{-1}+m_h^{-1}$ and $\mu_X^{-1}=m_e^{-1}+m_h^{-1}$. Equation 5 describes the ratio between the concentrations of excitons ($N_X$) and trions ($N_{X-}$) in the presence of an electron concentration, It is apparent that the change of $N_X/N_{X-}$ is dependent on $n_{el}$ within the $mWS_2$ film. The change of $N_X/N_{X-}$ is determined from the relative emission intensities of trions and excitons vs. J, which correspond to $\gamma_{tr}N_{X-}$ and $\gamma_{ex}N_X$ where $\gamma_{tr}$ and $\gamma_{ex}$ are their intensity of each particle could be described as $$\frac{I_{X^-}}{I_{total}} = \frac{\gamma_{tr}\cdot N_{X^-}}{\gamma_{ex}\cdot N_X + \gamma_{tr}\cdot N_{X^-}} = \frac{\gamma_{tr}}{\gamma_{ex}}\cdot\frac{N_{X^-}}{N_X}\Big/\left(1+\frac{\gamma_{tr}}{\gamma_{ex}}\cdot\frac{N_{X^-}}{N_X}\right) \quad \text{Equation 6}$$

where $\gamma_{tr}$ and $\gamma_{ex}$ were obtained from fitting parameters in rate equations. Equation 6 yields the relation between the injected current density ($n_{el}$) vs. the amount of increased spectral weight of trions vs. electron density as shown in FIG. 16B. The theoretical fit and the measured data are in close correspondence, showing that the bathochromic shift of the electroluminescence occurs due to electron trion emission.

In addition to the spectral shift, the radiative decay rate of trions are less than 5 times that of the excitons, resulting in a reduction in $mWS_2$ photoluminescence intensity as a function of injected electron density in FIG. 16A. Therefore, the high electron density causes decreased internal quantum efficiency of $mWS_2$ and a corresponding roll-off in EQE at J>0.01 mA/cm$^2$ (FIG. 12A). As a result, placing $mWS_2$ in the region with reduced electron density while maintaining high exciton density enables efficient EQE with reduced roll-off.

Conclusions

A light emitting device was demonstrated with an active layer comprising a CVD grown, large-area $mWS_2$ as the luminescent material, combined with organic buffer layers (charge transport and host matrix layers) that enable efficient charge transport and exciton generation. The use of $mWS_2$ enables principally horizontally aligned transition dipole moments and fast exciton decay leading to enhanced outcoupling and device stability. Moreover, the organic host was used to efficiently generate and inject excitons into the $mWS_2$ via Førster transfer. Thus, the $mWS_2$ was positioned several nanometers distant from the heterointerface which prevented sites for non-radiative recombination and leads to morphological instabilities. LEDs with diameters of 250 μm exhibited average EQE=0.3±0.3% with a peak of 1%. In addition, electron- and hole-only-devices indicated that the injected electrons in $mWS_2$ combine with excitons generating trions, reducing EQE at high current densities. The results show an efficient way of incorporating promising luminescent materials into an organic device structure.

Experiment #3—Enhanced Passivation of TMD Monolayers

Wafer-scale transition metal dichalcogenides (TMD) monolayers offer a potential platform for next generation device applications. Due to intrinsic defects, transition metal dichalcogenides (TMD) monolayers have low (<0.1%) photoluminescence quantum yield (PLQY), hindering their potential for optoelectronic device applications. A superacid surface treatment has been reported as an effective approach to passivate TMDs, leading to increased PLQY. However, the PLQY of superacid-treated TMDs is reduced after exposure to air, solvents, and vacuum, leading to drastic reductions as the excitation power increases. A passivation method of monolayer TMD using organic/transition metal oxide (TMO) mixtures with laser soaking is reported. The passivated TMD monolayer (e.g. $MoS_2$) shows over 50 times of enhancement in PL intensity at high excitation powers (>10$^3$ W/cm$^2$), compared to as-exfoliated monolayers. Mid-gap defect states of TMD monolayers are eliminated by passivation. In addition, the passivated sample is stable in air, vacuum, and solvents. This process may be useful for OLEDs incorporating monolayer or few monolayer emissive layers comprising TMDs.

In this disclosure, a passivation method of monolayer transition metal dichalcogenides (TMD) using organic/transition metal oxide (TMO) mixtures with laser soaking is described. At practical excitation powers (>10$^3$ W/cm$^2$), the photoluminescence (PL) enhancement of monolayer $MoS_2$ reaches up to 60 times after passivation compared to the as-exfoliated sample, which can be attributed to the observed elimination of mid-gap trap states. The method can be applicable to other TMDs such as $WS_2$. The disclosure consists of five parts: (1) Passivation phenomenon and evidences of trap elimination (2) PL enhancement vs. organic/TMO mixing ratio. (3) PL enhancement vs. excitation energy of laser soaking: the role of polaron-pairs and TMO anions (4) Material choices for organic/TMO mixtures. (5) Structures of the passivation layer.

A superacid surface treatment has been reported as an effective approach to passivate TMDs, leading to increased PLQY (Amani, et al. Science 350, 2015, 1065-1068). However, the PLQY of superacid-treated TMDs is reduced after exposure to air, solvents, and vacuum, leading to drastic reductions as the excitation power increases (Goodman, et al., Phys. Rev. B 96, 2017, 1-6). Therefore, a method of practical passivation that actualizes the full potential of TMD monolayers is needed. The practical interest in this method is that it can be useful in increasing the output efficiency of OLEDs incorporating 2D TMDs as the active emitting region in the OLED EML.

Figure 17:
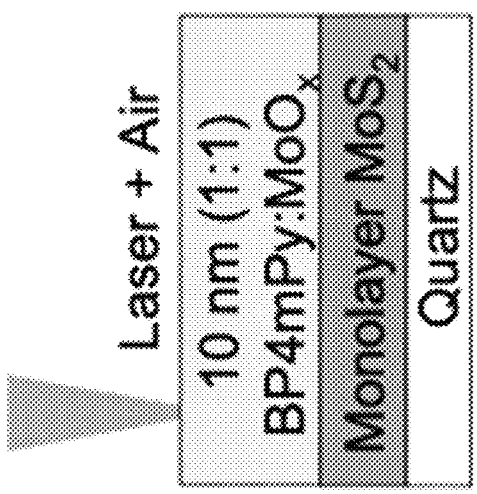
FIG. 17 is a schematic of laser soaking in air on a structure of 10 nm 1:1 (vol %) BP4mPy:$MoO_x$, mixture on a monolayer $MoS_2$.
Figure 18:
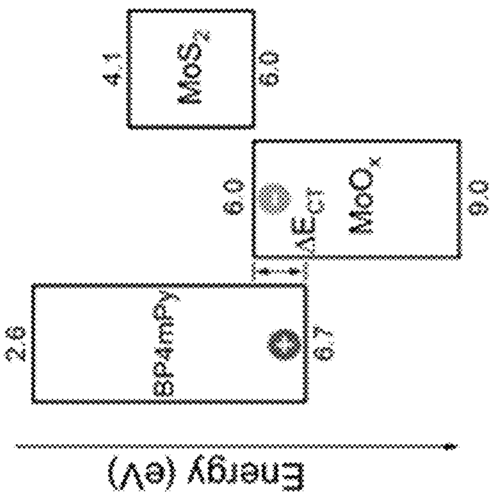
FIG. 18 is an energy level diagram for BP4mPy, $MOO_x$, and $MoS_2$. $MOO_x$, anions, BP4mPy cations and bounded polaron pairs with $\Delta E_{CT}$ (CT: charge transfer) in the mixture indicated.
Figure 19:
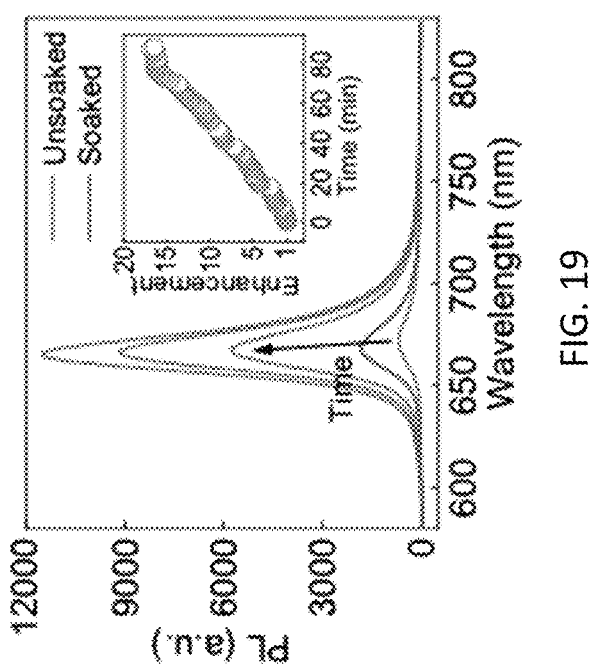
FIG. 19 depicts the PL spectra of $MoS_2$ before and after laser soaking. The inset shows the time evolution of the PL intensity
Figure 20:
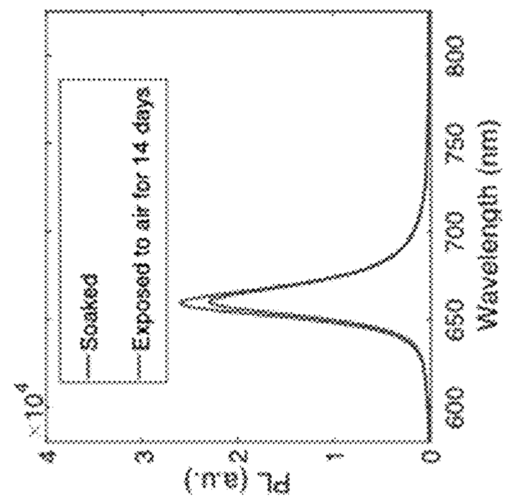
FIG. 20 depicts the PL spectra of $MoS_2$ after laser soaking and exposure to ambient atmosphere for 14 days.

Organic material and transition metal oxide is co-deposited on top of a monolayer of transition metal dichalcogenides by vacuum thermal evaporation (VTE). Note that such organic/TMO mixtures can be deposited using other fabrication methods such as spin-coating of solution processable organic materials and TMOs. FIG. 17 illustrates the structure of a typical sample, comprising a 10 nm 1:1 (vol %) 3,3',5,5'-Tetra[(m-pyridyl)-phen-3-yl]biphenyl (BP4mPy):$MoO_x$, mixture over a $MoS_2$ monolayer. In the mixture, organic materials serve as donors while TMOs serve as acceptors, as indicated by their energy levels shown in FIG. 18. The sample is laser-soaked via a continuous wave laser excitation (2.3 eV, 10$^3$ W/cm$^2$) under ambient conditions. As shown in FIG. 18, $MOO_x$ anions, BP4mPy cations, and their bounded polaron pairs are generated in the mixture. Under continuous laser soaking, a single $MoS_2$ PL spectrum is observed with an increasing intensity over tens of minutes until saturation (see FIG. 19). Note that thermal effect by laser has been ruled out. The resulting enhanced PL is stable in air, vacuum, and solvents (e.g. acetone, isopropanol). As shown in FIG. 20, there is no significant change in PL spectrum and intensity of the laser-soaked sample after exposure to ambient lab atmosphere for 14 days.

Figure 21:
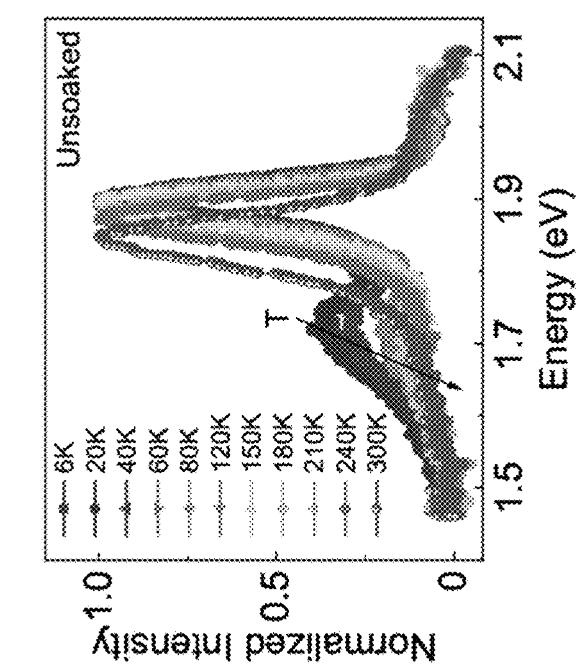
FIG. 21 shows the normalized temperature dependent PL spectra of $MoS_2$ (capped by 1:1 vol % BP4mPy:MoOx mixture) without laser soaking.
Figure 22:
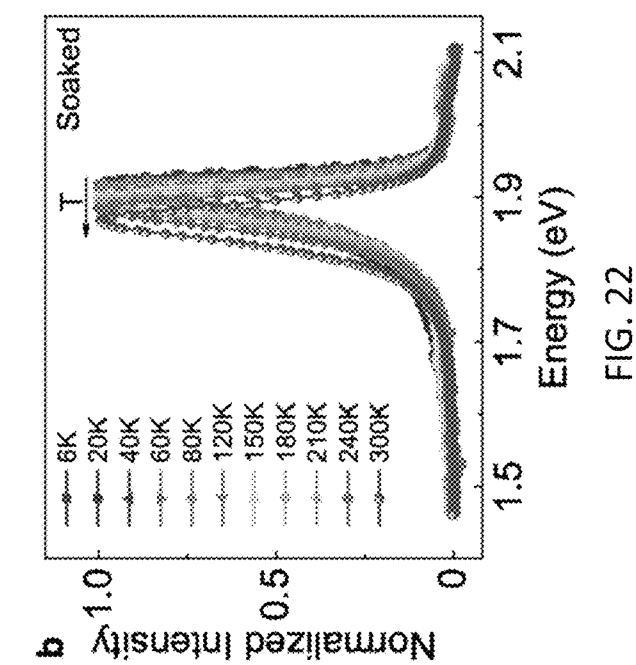
FIG. 22 shows the normalized temperature dependent PL spectra of $MoS_2$ (capped by 1:1 vol % BP4mPy:MoOx mixture) with laser soaking.

Mid-gap trap states are eliminated: FIG. 21 and FIG. 22 show the temperature dependent PL spectra from the $MoS_2$ with and without laser-soaking. The sample without soaking (FIG. 21) exhibits $MoS_2$ PL emission centered between 1.8 and 2.0 eV. A broad PL signal below 1.8 eV emerges at low temperatures, indicating the existence of mid-gap trap states that lead to non-radiative loss at room temperature. In contrast, the trap-state PL are not observed from the soaked simple, suggesting that laser-soaking induced elimination of the mid-gap trap states (FIG. 22).

Figure 23:
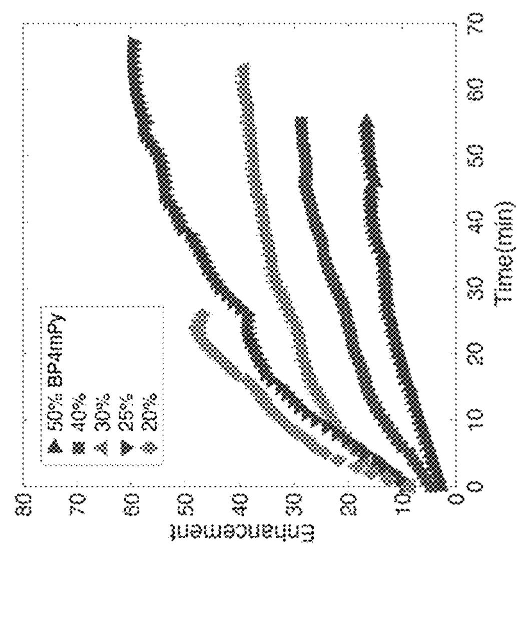
FIG. 23 is a plot of the time evolution of PL intensity of $MoS_2$ for soaking different capping layers with mixtures of BP4mPy:$MoO_x$ with vol % of BP4mPy ranging from 50% to 20%.
Figure 24:
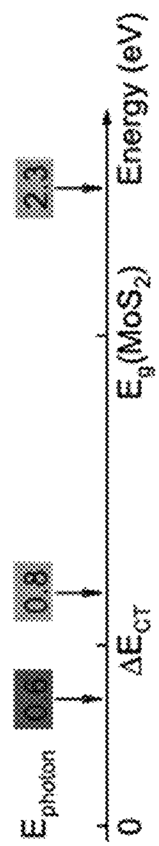
FIG. 24 is a diagram of the energies of CT state ($\Delta E_{CT}$), bandgap of $MoS_2$ ($E_g$) and photons ($E_{photon}$) of soaking lasers. Green and red labels indicate with and without PL enhancement after soaking, respectively.

Organic/TMO mixtures with different ratios result in different initial (as-deposited) and final enhancements (after soaking). FIG. 23 shows the time evolution of PL intensity of $MoS_2$ for soaking different capping layers with varying ratios in the mixture. At T=0 min, the 50%, 40%, 30%, 25% and 20% BP4mPy:$MoO_x$, mixture capping layers shows an enhancement of 2, 4, 8, 9 and 9-folds, respectively, compared to as-exfoliated $MoS_2$. Thus, as-deposited organic/TMO mixtures can enhance PL of TMD in an optimized ratio of the mixture. Note that the mechanisms of such instant PL enhancement (i.e., T=0 min) might be different from the proposed laser-soaking method as it does not require involvement of laser. After laser soaking (2.3 eV, $10^3$ W/cm$^2$), different mixtures yield various final enhancement. The 25% BP4mPy:$MoO_x$, mixture yields a maximum of 60 times PL enhancement compared to pristine $MoS_2$. To conclude, using laser-soaking method, a maximum PLQY of TMD can be achieved by optimizing doping ratio in a properly chosen organic/TMO mixture.

Figure 25:
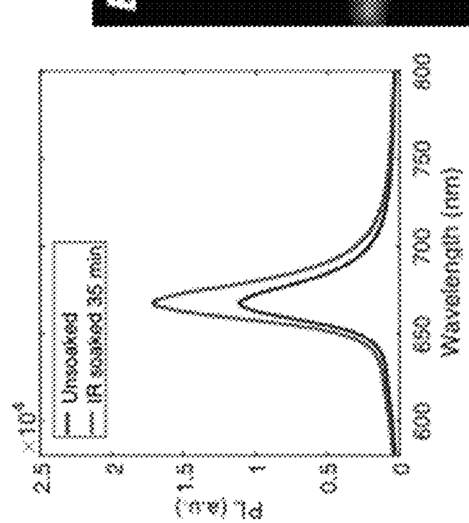
FIG. 25 depicts the PL spectra of $MoS_2$ before and after IR ($E_{photon}$=0.8 eV) laser soaking.
Figure 26:
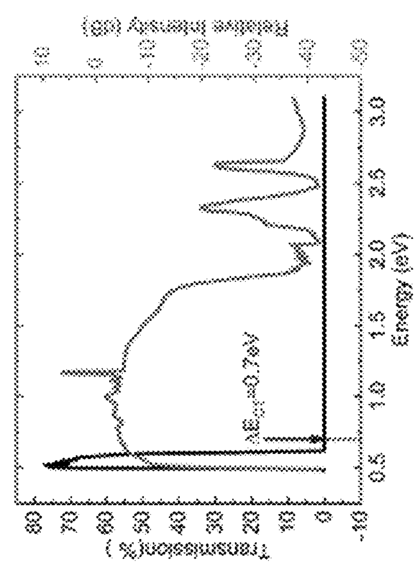
FIG. 26 depicts the emission spectrum (red) of the supercontinuum laser and the transmission spectrum (black) of the notch filter.
Figure 27:
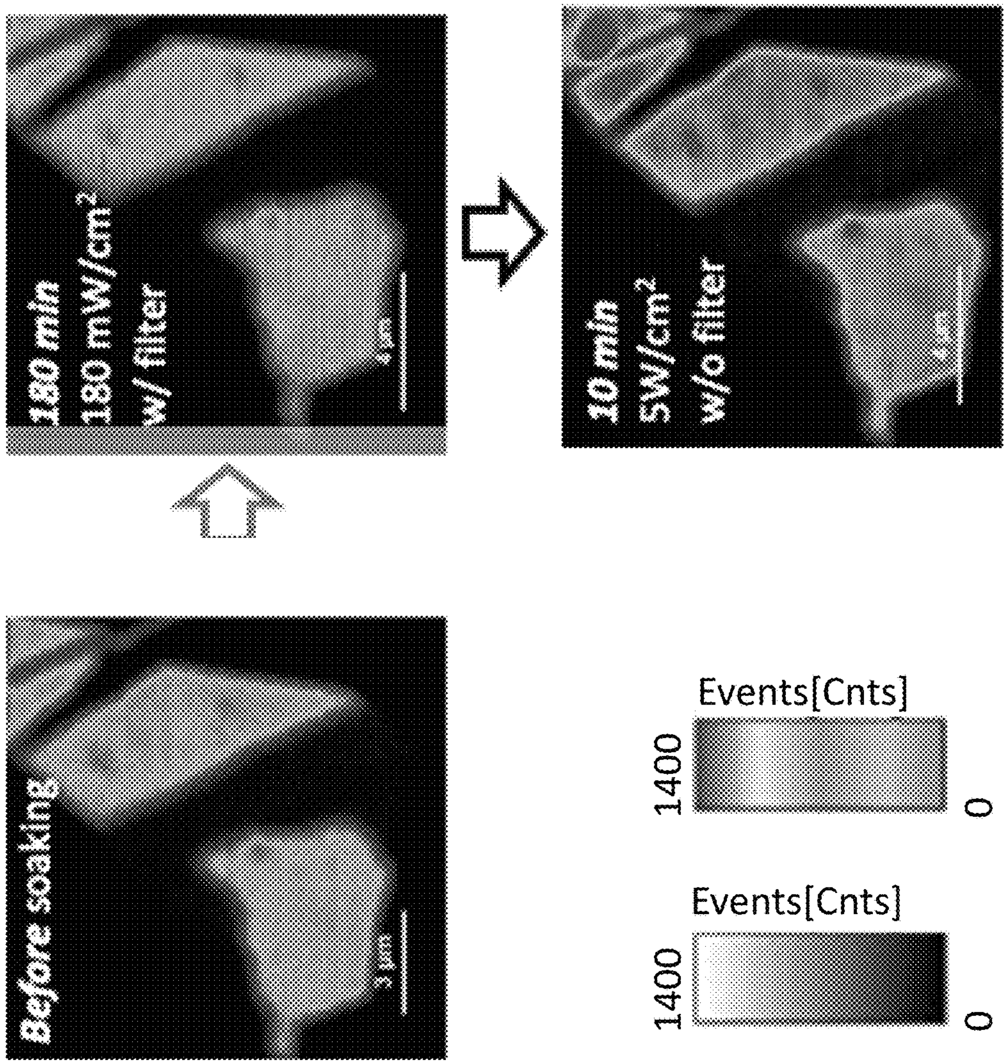
FIG. 27 is a series of PL mappings of $MoS_2$ flakes before soaking (top left), after soaking with supercontinuum laser with filter ($E_{photon}$~0.6 eV) for 3 hours (top right) and soaking for 10 min without filter (bottom).

Effective passivation requires photon energy of laser soaking exceeding the energy offsets ($\Delta F_{CT}$, FIG. 24) between the HOMO levels of organic and conduction band (CB) of TMO so that polaron pairs can be generated in the mixture. Laser energy dependent soakings are shown in FIG. 24, FIG. 25, FIG. 26, and FIG. 27. In addition to laser soaking at 2.3 eV, an IR laser soaking at $E_{photon}$=0.8 eV that generates polaron pairs through intermolecular charge transfer also results in PL enhancement of TMD (FIG. 25). Such a result also suggests excitons ($E_{ex}$=1.9 eV) in TMD are not involved in the passivation process. In addition, a notch filter (2250±250 nm) was applied to a supercontinuum laser (see FIG. 26) to create an equivalent IR laser with photon energy ($E_{photon}$~0.6 eV), which is lower than $\Delta E_{CT}$. A PL mapping of $MoS_2$ flakes was taken before laser soaking. After 3 hours of soaking using such laser, no PL enhancement was observed, as shown in FIG. 27, due to the absence of polaron generation. The light source for soaking is not limited to lasers. Light emitting diodes, incandescent bulbs, among others also works if soaking time are adjusted accordingly.

Figure 28:
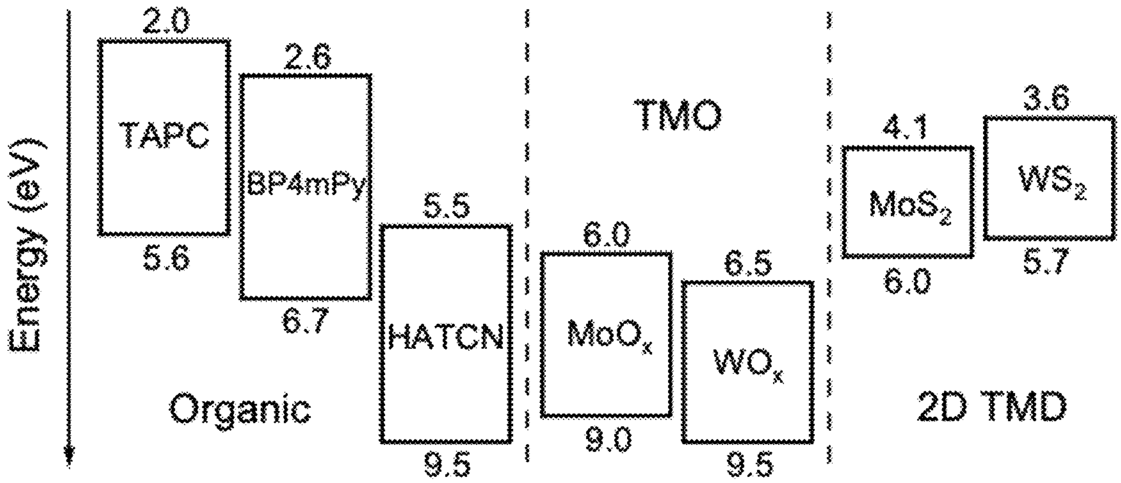
FIG. 28 is an energy diagram showing the energy levels of TAPC, BP4mPy, HATCN, $MoO_x$, $WO_N$, $MoS_2$ and $WS_2$.
Figure 29:
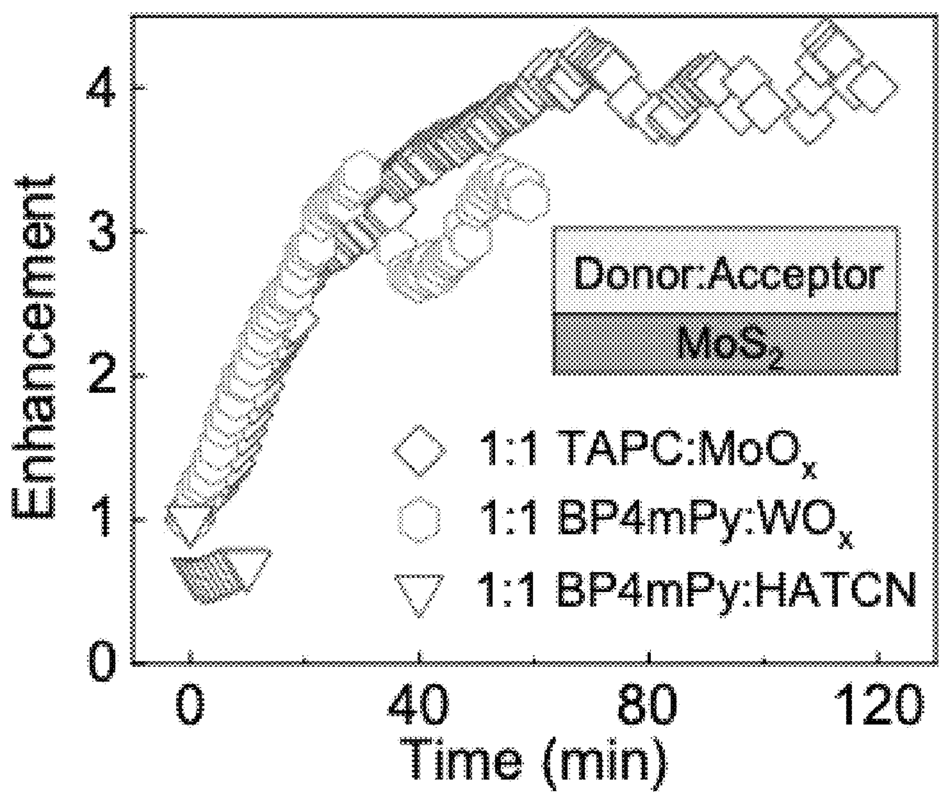
FIG. 29 is a plot of the PL enhancement of $MoS_2$ over laser soaking time for different combinations in the donor: acceptor mixtures (donor=BP4mPy, TAPC; acceptor=$MoO_x$, $WO_x$, HATCN). Sample structure is shown in the inset.
Figure 30:
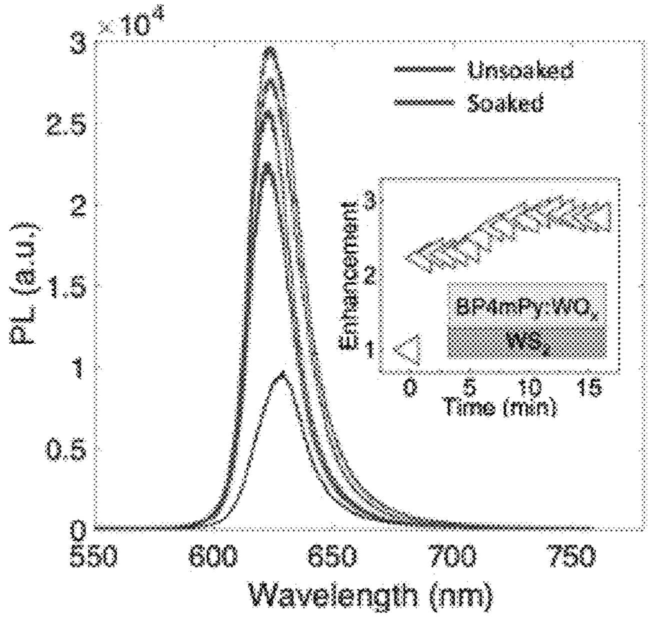
FIG. 30 is a plot of the PL spectra of $WS_2$ before and after laser soaking. Inset shows the time evolution of the enhancement and the sample structure.

The mixture of BP4mPy:$MoO_x$ is not unique to realize the passivation. FIG. 28 provides the energy levels of different organic materials, TMOs and TMDs. As shown in FIG. 29, changing either the organic donor (from BP4mPy to TAPC) or the TMO acceptor (from $MoO_x$ to $WO_x$) result in similar passivation effect. Also, such passivation method is applicable to other sulfur-based TMD monolayers, for example $WS_2$ (FIG. 30). Combinations of organics and TMOs in the mixture can vary, and it is not limited to a binary mixture. A maximum PLQY of passivated TMD monolayers can be achieved by choosing proper combinations with an optimized doping ratio in the mixture. Potential candidates of organic materials and TMOs with respective energy levels are provided in FIG. 31; their respective chemical structures are provided in FIG. 32. Wide energy gap organic and TMO are chosen to avoid the absorption overlap with the TMD. Laser soaking of an organic/organic (for example, BP4mPy:HATCN) mixture, which have a similar energy offset $\Delta E_{CT}$ as the BP4mPy:MoOx mixture, resulted in no observed passivation (see FIG. 29), which suggests that the TMO in the mixtures plays a dominant role in passivating the TMDs, while the organic materials serve as electron donors that promote the TMO anions.

Figure 33:
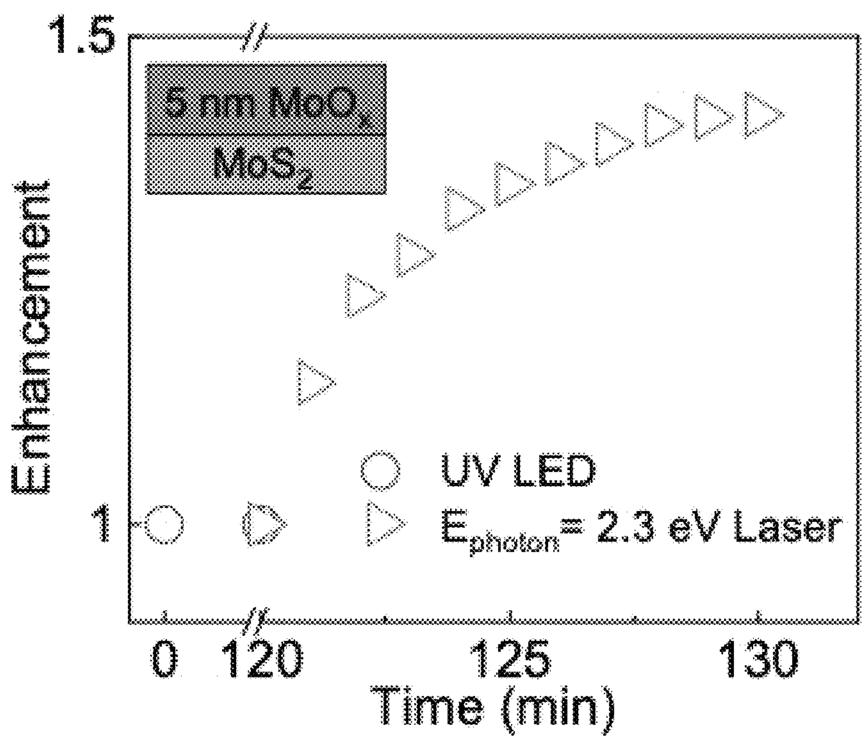
FIG. 33 is a plot showing the PL enhancement of $MoS_2$ over soaking time with passivation layers made of 5 nm $MoO_x$.

In order to determine the necessity of the passivation mixture, a 5 nm neat layer of $MOO_x$ on $MoS_2$, as shown in FIG. 33, was examined. Before laser soaking treatment ($E_{photon}$=2.3 eV), the sample is first soaked by a UV-LED ($E_{photon}$=3.4 eV) for 2 hours at a power density of 4 mW/cm$^2$. No immediate PL enhancement of $MoS_2$ is observed after UV-LED soaking, while 1.4× enhancement of PL is observed after soaking the sample with the 2.3 eV laser. While not wishing to be bound by any particular scientific theory, one possible explanation for this phenomenon may be that during UV soaking, the electrons are excited to the conduction band (CB) of $MOO_x$, analogous to the charge generation process within the organic/TMO mixtures. Residual charges remaining in the UV-soaked $MOO_x$, are further excited by photons at 2.3 eV and passivate the $MoS_2$. These results suggest that a neat layer of TMO can be used as the passivation layer (see FIG. 35) for TMD monolayers, given that additional treatments generate TMO anions.

Figure 34:
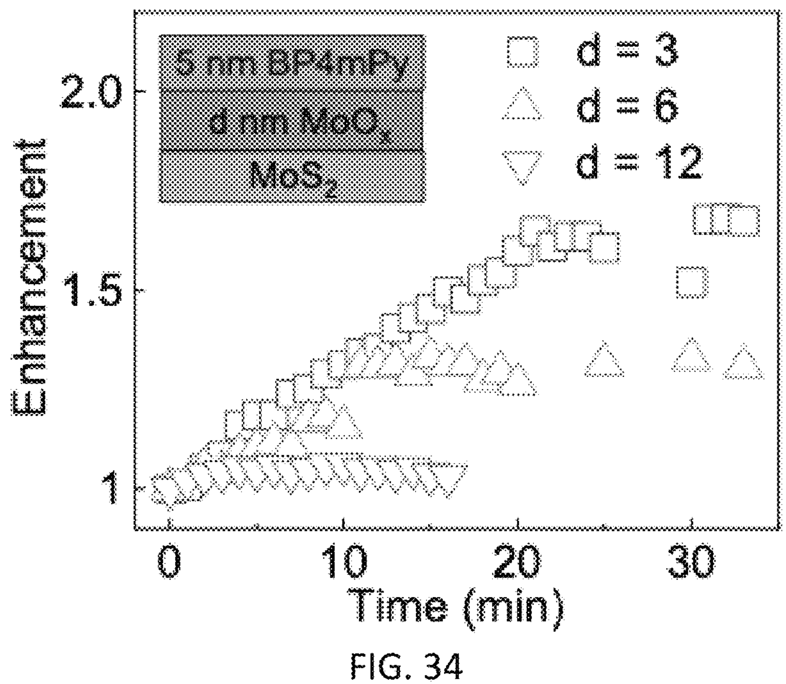
FIG. 34 is a plot showing the PL enhancement of $MoS_2$ over soaking time with passivation layers made oft nm (t=3, 6, 12 nm) $MoO_x$, capped by 5 nm BP4mPy.
Figure 35:
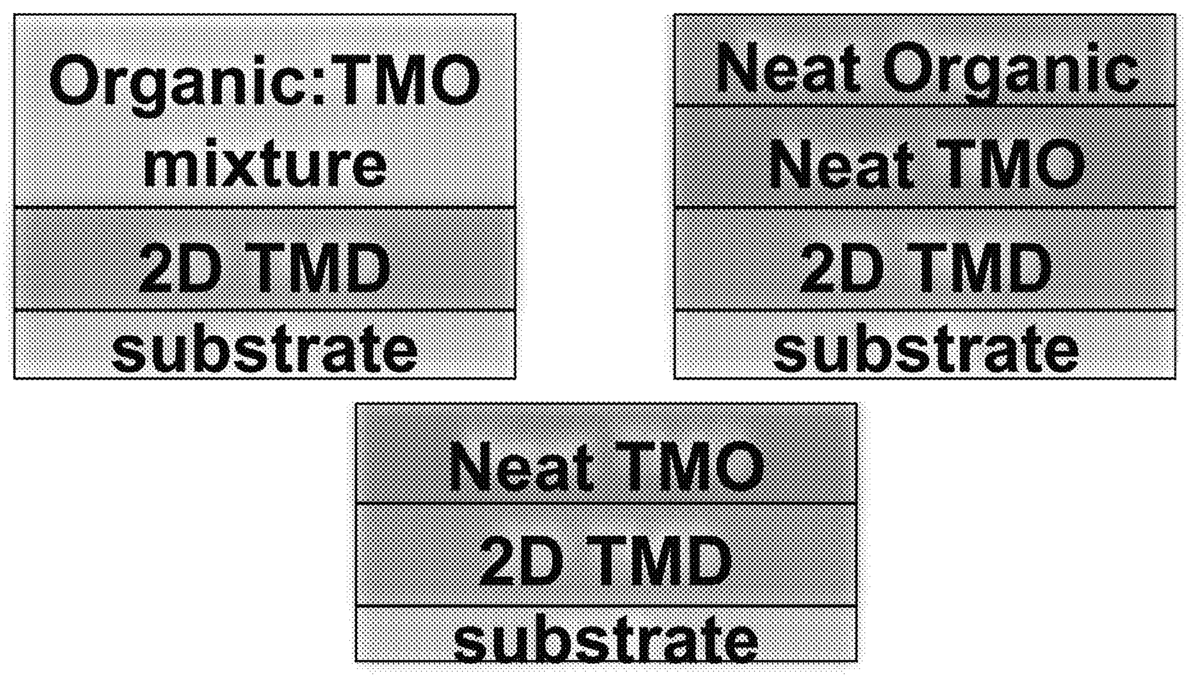
FIG. 35 depicts a series of exemplary passivation layers on 2D TMD monolayers.

The structure of the passivation layer is not limited to mixtures. For example, the mixture can be replaced by a bi-layer structure with TMO layer in contact with TMD monolayer followed by a neat organic layer on top. As shown in FIG. 34, t nm (d=3, 6 and 12) $MoO_x$, is deposited on $MoS_2$, followed by a 5 nm capping BP4mPy layer (see the inset of FIG. 34). Using the same laser soaking at $E_{photon}$=2.3 eV, a decrease of enhancement from 1.6×, 1.4×, to 1.05× is observed in the bi-layer structures with d=3 nm, 6 nm and 12 nm $MOO_x$, respectively. In contrast to an organic/TMO mixture structure, the polaron pairs are only generated at the interface between the BP4mPy and $MOO_x$, neat layers in a bi-layer configuration. Subsequently, electrons diffuse through the neat $MOO_x$ layer and reach surface of $MoS_2$ for the passivation to take place. The descended enhancement observed in the bi-layer with a thicker $MoO_x$ can be attributed to the smaller amount of electrons that arrive on the $MoS_2$ surface. FIG. 35 summarizes the proposed structures for the passivation layer, among which the organic/TMO mixture configuration may yield the best performance.

REFERENCES

The following publications are incorporated by reference here in their entirety:

Mak, K. F., Lee, C., Hone, J., Shan, J. & Heinz, T. F. Atomically Thin MoS 2: A New Direct-Gap Semiconductor. *Phys. Rev. Lett.* 105, (2010).

Withers, F. et al. Light-Emitting Diodes by Band-Structure Engineering in van Der Waals Heterostructures. *Nat. Mater.* 2015, 14 (3), 301-306. https://doi.org/10.1038/nmat4205.

Andrzejewski, D., Hopmann, E, John, M., Kümmell, T. & Bacher, G. WS 2 monolayer-based light-emitting devices in a vertical p-n architecture. *Nanoscale* 11, 8372-8379 (2019).

Brütting, W., Frischeisen, J., Schmidt, T. D., Scholz, B. J. & Mayr, C. Device efficiency of organic light-emitting diodes: Progress by improved light outcoupling. *Phys. Status Solidi A* 210, 44-65 (2013).

Qu, Y., Coburn, C., Fan, D. & Forrest, S. R. Elimination of Plasmon Losses and Enhanced Light Extraction of Top-Emitting Organic Light-Emitting Devices Using a Reflective Subelectrode Grid. *ACS Photonics* 4, 363-368 (2017).

Forrest, S. R. The path to ubiquitous and low-cost organic electronic appliances on plastic. *Nature* 428, 911-918 (2004).

Song, S. H., Joo, M.-K., Neumann, M., Kim, H. & Lee, Y. H. Probing defect dynamics in monolayer $MoS_2$ via noise nanospectroscopy. *Nat. Commun.* 8, (2017).

Zhou, W. et al. Intrinsic Structural Defects in Monolayer Molybdenum Disulfide. *Nano Lett.* 13, 2615-2622 (2013).

Lee, B. et al. Surface passivation of InP using an organic thin film. J. Cryst. Growth 503, 9-12 (2018).

Lunt, R. R., Giebink, N. C., Belak, A. A., Benziger, J. B. & Forrest, S. R. Exciton diffusion lengths of organic semiconductor thin films measured by spectrally resolved photoluminescence quenching. *J. Appl. Phys.* 105, 053711 (2009).

Castellanos-Gomez, A. Why All the Fuss about 2D Semiconductors? *Nat. Photonics* 2016, 10, 202-204. https://doi.org/10.1038/nphoton.2016.53.

Amani, M., et al., A. High Luminescence Efficiency in $MoS_2$ Grown by Chemical Vapor Deposition. *ACS Nano* 2016, 10 (7), 6535-6541. https://doi.org/10.1021/acsnano.6b03443.

Kim, H., et al., A. Highly Stable Near-Unity Photoluminescence Yield in Monolayer $MoS_2$ by Fluoropolymer Encapsulation and Superacid Treatment. *ACS Nano* 2017, 11 (5), 5179-5185. https://doi.org/10.1021/acsnano.7b02521.

Palummo, M., et al., Exciton Radiative Lifetimes in Two-Dimensional Transition Metal Dichalcogenides. *Nano Lett.* 2015, 15 (5), 2794-2800. https://doi.org/10.1021/n1503799t.

Novoselov, K. S., et al., 2D Materials and van Der Waals Heterostructures. *Science* 2016, 353 (6298). https://doi.org/10.1126/science.aac9439.

Wang, J., et al., Electroluminescent Devices Based on 2D Semiconducting Transition Metal Dichalcogenides. *Adv. Mater.* 2018, 30 (47), 1802687. https://doi.org/10.1002/adma 201802687.

Zhou, X., et al., 2D Layered Material-Based van Der Waals Heterostructures for Optoelectronics. *Adv. Funct. Mater.* 2018, 28 (14), 1706587. https://doi.org/10.1002/adfm.201706587.

Wang, C., et al., The Highly-Efficient Light-Emitting Diodes Based on Transition Metal Dichalcogenides: From Architecture to Performance. *Nanoscale Adv.* 2020, 2 (10), 4323-4340. https://doi.org/10.1039/DONA00501K.

Baugher, B. W. H., et al., Optoelectronic Devices Based on Electrically Tunable p-n Diodes in a Monolayer Dichalcogenide. *Nat. Nanotechnol.* 2014, 9 (4), 262-267. https://doi.org/10.1038/nnano.2014.25.

Zhang, Y. J., et al., Electrically Switchable Chiral Light-Emitting Transistor. *Science* 2014, 344 (6185), 725-728. https://doi.org/10.1126/science.1251329.

Yang, W., et al., Electrically Tunable Valley-Light Emitting Diode (VLED) Based on CVD-Grown Monolayer $WS_2$. *Nano Lett.* 2016, 16 (3), 1560-1567. https://doi.org/10.1021/acs.nanolett.5b04066.

Pak, J., et al., Intrinsic Optoelectronic Characteristics of $MoS_2$ Phototransistors via a Fully Transparent van Der Waals Heterostructure. *ACS Nano* 2019, 13 (8), 9638-9646. https://doi.org/10.1021/acsnano.9b04829.

Andrzejewski, D., et al., Scalable Large-Area p-i-n Light-Emitting Diodes Based on $WS_2$ Monolayers Grown via MOCVD. *ACS Photonics* 2019, 6 (8), 1832-1839. https://doi.org/10.1021/acsphotonics.9b00311.

Andrzejewski, D., et al., Flexible Large-Area Light-Emitting Devices Based on $WS_2$ Monolayers. *Adv. Opt. Mater.* 2020, 8 (20), 2000694. https://doi.org/10.1002/adom.202000694.

Giebink, N. C., et al., Direct Evidence for Degradation of Polaron Excited States in Organic Light Emitting Diodes. *J. Appl. Phys.* 2009, 105 (12), 124514. https://doi.org/10.1063/1.3151689.

Wang, Q.; Aziz, H, Degradation of Organic/Organic Interfaces in Organic Light-Emitting Devices Due to Polaron-Exciton Interactions. *ACS Appl. Mater. Interfaces* 2013, 5 (17), 8733-8739. https://doi.org/10.1021/am402537j.

Kim, J., et al., Using Fourier-Plane Imaging Microscopy for Determining Transition-Dipole-Moment Orientations in Organic Light-Emitting Devices. *Phys. Rev. Appi.* 2020, 14 (3), 034048. https://doi.org/10.1103/PhysRevApplied.14.034048.

Castellanos-Gomez, A. Why All the Fuss about 2D Semiconductors? *Nat. Photonics* 2016, 10, 202-204. https://doi.org/10.1038/nphoton.2016.53.

Amani, M., et al., High Luminescence Efficiency in $MoS_2$ Grown by Chemical Vapor Deposition. *ACS Nano* 2016, 10 (7), 6535-6541. https://doi.org/10.1021/acsnano.6b03443.

Kim, H., et al., Highly Stable Near-Unity Photoluminescence Yield in Monolayer $MoS_2$ by Fluoropolymer Encapsulation and Superacid Treatment. *ACS Nano* 2017, 11 (5), 5179-5185. https://doi.org/10.1021/acsnano.7b02521.

Withers, F., et al., $WSe_2$ Light-Emitting Tunneling Transistors with Enhanced Brightness at Room Temperature. *Nano Lett.* 2015, 15 (12), 8223-8228. https://doi.org/10.1021/acs.nanolett.5b03740.

Yang, W., et al., Electrically Tunable Valley-Light Emitting Diode (VLED) Based on CVD-Grown Monolayer $WS_2$. *Nano Lett.* 2016, 16 (3), 1560-1567. https://doi.org/10.1021/acs.nanolett.5b04066.

Gu, J., et al., A Room-Temperature Polariton Light-Emitting Diode Based on Monolayer $W5_2$. *Nat. Nanotechnol.* 2019, 14 (11), 1024-1028. https://doi.org/10.1038/s41565-019-0543-6.

Andrzejewski, D., et al., Scalable Large-Area p-i-n Light-Emitting Diodes Based on $WS_2$ Monolayers Grown via MOCVD. *ACS Photonics* 2019, 6 (8), 1832-1839. https://doi.org/10.1021/acsphotonics.9b00311.

Lieb, M. A., et al., Single-Molecule Orientations Determined by Direct Emission Pattern Imaging. *J. Opt. Soc. Am. B* 2004, 21 (6), 1210-1215. https://doi.org/10.1364/JOSAB.21.001210.

Schuller, J. A., et al., Orientation of Luminescent Excitons in Layered Nanomaterials. *Nat. Nanotechnol.* 2013, 8 (4), 271-276. https://doi.org/10.1038/nnano.2013.20.

Jurow, M. J., et al, Manipulating the Transition Dipole Moment of $CsPbBr_3$ Perovskite Nanociystals for Superior Optical Properties. *Nano Lett.* 2019, 19 (4), 2489-2496. https://doi.org/10.1021/acs.nanolett.9b00122.

Taminiau, T H, et al., Quantifying the Magnetic Nature of Light Emission. *Nat. Commun.* 2012, 3 (1), 979. https://doi.org/10.1038/ncomms1984.

Flämmich, M., et al., Oriented Phosphorescent Emitters Boost OLED Efficiency. *Org. Electron.* 2011, 12 (10), 1663-1668. https://doi.org/10.1016/j.orgel.2011.06.011.

Kim, J., et al., Systematic Control of the Orientation of Organic Phosphorescent Pt Complexes in Thin Films for Increased Optical Outcoupling. *Adv. Mater.* 2019, 31 (32), 1900921. https://doi.org/10.1002/adma.201900921.

Mak, K. F., et al., Tightly Bound Trions in Monolayer $MoS_2$. *Nat. Mater.* 2013, 12 (3), 207-211. https://doi.org/10.1038/nmat3505.

Ross, J. S., et al., Electrical Control of Neutral and Charged Excitons in a Monolayer Semiconductor. *Nat. Commun.* 2013, 4, 1474. https://doi.org/10.1038/ncomms2498.

Berkelbach, T. C., et al., Theory of Neutral and Charged Excitons in Monolayer Transition Metal Dichalcogenides. *Phys. Rev. B* 2013, 88 (4), 045318. https://doi.org/10.1103/PhysRevB.88.045318.

Kang, J., et al., Band Offsets and Heterostructures of Two-Dimensional Semiconductors. *Appl. Phys. Lett.* 2013, 102 (1), 012111. https://doi.org/10.1063/1.4774090.

Wang, Q., et al., Exciton-Polaron-Induced Aggregation of Wide-Bandgap Materials and Its Implication on the Electroluminescence Stability of Phosphorescent Organic Light-Emitting Devices. *Adv. Funct. Mater.* 2014, 24 (20), 2975-2985. https://doi.org/10.1002/adfm.201303840.

Gurarslan, A., et al., Surface-Energy-Assisted Perfect Transfer of Centimeter-Scale Monolayer and Few-Layer $MoS_2$ Films onto Arbitrary Substrates. *ACS Nano* 2014, 8 (11), 11522-11528. https://doi.org/10.1021/nn5057673.

Plechinger, G., et al., Identification of Excitons, Trions and Biexcitons in Single-Layer $WS_2$. *Phys. Status Solidi RRL* 2015, 9 (8), 457-461. https://doi.org/10.1002/pssr.201510224.

Lu, H., et al., Passivating the Sulfur Vacancy in Monolayer $MoS_2$. *APL Mater.* 2018, 6 (6), 066104. https://doi.org/10.1063/1.5030737.

Zeng, H., et al., Optical Signature of Symmetry Variations and Spin-Valley Coupling in Atomically Thin Tungsten Dichalcogenides. *Sci. Rep.* 2013, 3 (1), 1608. https://doi.org/10.1038/srep01608.

Mouri, S., et al., Tunable Photoluminescence of Monolayer $MoS_2$ via Chemical Doping. *Nano Lett.* 2013, 13 (12), 5944-5948. https://doi.org/10.1021/n1403036h.

Siviniant, J, et al., Chemical Equilibrium between Excitons, Electrons, and Negatively Charged Excitons in Semiconductor Quantum Wells. *Phys. Rev. B* 1999, 59 (3), 1602-1604. https://doi.org/10.1103/PhysRevB.59.1602.

Peimyoo, N., et al., Chemically Driven Tunable Light Emission of Charged and Neutral Excitons in Monolayer $WS_2$. *ACS Nano* 2014, 8 (11), 11320-11329. https://doi.org/10.1021/nn504196n.

Amani, M., et al., Near-Unity Photoluminescence Quantum Yield in $MoS_2$. *Science* 2015, 350 (6264), 1065-1068. https://doi.org/10.1126/science.aad2114.

Forrest, S. R., et al., Measuring the Efficiency of Organic Light-Emitting Devices. *Adv. Mater.* 2003, 15 (13), 1043-1048. https://doi.org/10.1002/adma 200302151.

Coburn, C., et al., Charge Balance and Exciton Confinement in Phosphorescent Organic Light Emitting Diodes. *Adv. Opt. Mater.* 2016, 4 (6), 889-895. https://doi.org/10.1002/adom.201600067.

Zhang, Y., et al., Tenfold Increase in the Lifetime of Blue Phosphorescent Organic Light-Emitting Diodes. *Nat. Commun.* 2014, 5, 5008. https://doi.org/10.1038/ncomms6008.

Celebi, K., et al., Simplified Calculation of Dipole Energy Transport in a Multilayer Stack Using Dyadic Green's Functions. *Opt. Express* 2007, 15 (4), 1762. https://doi.org/10.1364/OE.15.001762.

The disclosures of each and every patent, patent application, and publication cited herein are hereby incorporated herein by reference in their entirety. While this disclosure has been described with reference to specific embodiments, it is apparent that other embodiments and variations of this disclosure may be devised by others skilled in the art without departing from the true spirit and scope of the disclosure.

What is claimed is:

1. An organic light emitting device comprising:

an anode and a cathode;

at least one organic charge transport layer positioned between the anode and the cathode;

an organic host layer positioned between the anode and the cathode; and at least one two-dimensional emissive layer positioned at a distance of less than 10 nm from a position with the highest density of excitons within the organic host layer.

2. The organic light emitting device of claim 1, wherein the two-dimensional emissive layer is selected from the group consisting of a transition metal dichalcogenide (TMD) active layer and a direct bandgap inorganic semiconductor.

3. The organic light emitting device of claim 2, wherein the two-dimensional emissive layer comprises a material selected from Gallium Nitride, a group III-V direct bandgap semiconducting alloy or alloys, a group II-VI direct bandgap semiconducting alloy or alloys, or at least one monolayer of $WS_2$.

4. The organic light emitting device of claim 1, wherein the at least one organic charge transport layer comprises first and second organic buffer layers, and the at least one two-dimensional emissive layer is embedded between the first and second organic buffer layers.

5. The organic light emitting device of claim 4, wherein the first organic buffer layer is a hole-transporting layer configured between the at least two-dimensional emissive layer and the anode.

6. The organic light emitting device of claim 5, wherein the hole-transporting layer comprises 1,1-Bis[(di-4-tolylamino)phenyl]cyclohexane.

7. The organic light emitting device of claim 4, wherein the second organic buffer layer is an electron transport layer configured between the cathode and the at least one two-dimensional emissive layer.

8. The organic light emitting device of claim 7, wherein the electron transport layer comprises 4,6-Bis(3,5-di(pyridin-3-yl)phenyl)-2-methylpyrimidine or 4,6-Bis(3,5-di-3-pyridinylphenyl)-2-methylpyrimidine.

9. The organic light emitting device of claim 1, wherein the organic host layer comprises 4,4'-Bis(N-carbazolyl)-1,1'-biphenyl.

10. A method of fabricating the organic light emitting device of claim 1 comprising the step of:

depositing the two-dimensional emissive layer using chemical-vapor-deposition.

11. A consumer product comprising the organic light emitting device of claim 1, the consumer product selected from a flat panel display, a computer monitor, a medical monitor, a television, a billboard, a light for interior or exterior illumination and/or signaling, a heads-up display, a fully or partially transparent display, a flexible display, a laser printer, a telephone, a cell phone, tablet, a phablet, a personal digital assistant (PDA), a wearable device, a laptop computer, a digital camera, a camcorder, a viewfinder, a micro-display that is less than 2 inches diagonal, a 3-D display, a virtual reality or augmented reality display, a vehicle, a video wall comprising multiple displays tiled together, a theater or stadium screen, a light therapy device, and a sign.

12. An organic light emitting device comprising:

an anode and a cathode;

at least one organic charge transport layer positioned between the anode and the cathode;

an organic host layer positioned between the anode and the cathode; and at least two two-dimensional emissive layers positioned within the organic host layer.

13. A consumer product comprising the organic light emitting device of claim 12, the consumer product selected from a flat panel display, a computer monitor, a medical monitor, a television, a billboard, a light for interior or exterior illumination and/or signaling, a heads-up display, a fully or partially transparent display, a flexible display, a laser printer, a telephone, a cell phone, tablet, a phablet, a personal digital assistant (PDA), a wearable device, a laptop computer, a digital camera, a camcorder, a viewfinder, a micro-display that is less than 2 inches diagonal, a 3-D display, a virtual reality or augmented reality display, a vehicle, a video wall comprising multiple displays tiled together, a theater or stadium screen, a light therapy device, and a sign.

14. An organic light emitting device, comprising:

a substrate;

a first electrode disposed over the substrate;

at least one organic layer disposed over the first electrode;

a first portion of an organic host layer disposed over the at least one organic layer;

at least one two-dimensional emissive layer disposed over the first portion of the organic host layer;

a second portion of the organic host layer disposed over the at least one two-dimensional emissive layer;

at least one second organic layer disposed over the second portion of the organic host layer; and a second electrode disposed over the at least one two-dimensional emissive layer wherein the at least one two-dimensional emissive layer is a monolayer; and wherein the at least one two-dimensional emissive layer is positioned at a distance of less than 20 nm from a position with the highest density of excitons within the first and second portions of the organic host layer.

15. The organic light emitting device of claim 14, wherein the two-dimensional emissive layer is selected from a transition metal dichalcogenide (TMD) active layer or an emissive direct bandgap inorganic semiconductor.

16. The organic light emitting device of claim 15, wherein the TMD active layer is at least one monolayer of $WS_2$.

17. The organic light emitting device of claim 14, wherein the two-dimensional emissive layer comprises a material selected from at least one monolayer of $WS_2$, Gallium Nitride, a group III-V direct bandgap semiconducting alloy or alloys, or a group II-VI direct bandgap semiconducting alloy or alloys.

18. The organic light emitting device of claim 14, wherein the first electrode is a transparent anode.

19. The organic light emitting device of claim 14, wherein the at least one organic layer comprises a hole transport layer and the at least one second organic layer comprises an electron transport layer.

20. A consumer product comprising the organic light emitting device of claim 14, the consumer product selected from a flat panel display, a computer monitor, a medical monitor, a television, a billboard, a light for interior or exterior illumination and/or signaling, a heads-up display, a fully or partially transparent display, a flexible display, a laser printer, a telephone, a cell phone, tablet, a phablet, a personal digital assistant (PDA), a wearable device, a laptop computer, a digital camera, a camcorder, a viewfinder, a micro-display that is less than 2 inches diagonal, a 3-D display, a virtual reality or augmented reality display, a vehicle, a video wall comprising multiple displays tiled together, a theater or stadium screen, a light therapy device, and a sign.

* * * * *